United States Patent [19]
Mochizuki et al.

[11] Patent Number: 5,582,880
[45] Date of Patent: Dec. 10, 1996

[54] METHOD OF MANUFACTURING NON-SINGLE CRYSTAL FILM AND NON-SINGLE CRYSTAL SEMICONDUCTOR DEVICE

[75] Inventors: Chiori Mochizuki, Zama; Hidemasa Mizutani, Sagamihara; Tatsumi Shoji, Hiratsuka; Kazuaki Tashiro, Hadano, all of Japan

[73] Assignee: Canon Kabushiki Kaisha, Tokyo, Japan

[21] Appl. No.: 36,236

[22] Filed: Mar. 24, 1993

[30] Foreign Application Priority Data

Mar. 27, 1992 [JP] Japan ................................ 4-100219
Sep. 16, 1992 [JP] Japan ................................ 4-270798
Sep. 16, 1992 [JP] Japan ................................ 4-270799

[51] Int. Cl.⁶ ........................................................ H05H 1/24
[52] U.S. Cl. ............................ 427/569; 427/573; 437/100
[58] Field of Search ............................ 437/100; 427/569, 427/573

[56] References Cited

U.S. PATENT DOCUMENTS 4,933,203  6/1990  Curtins ..................................... 427/569
5,055,421  10/1991  Birkle et al. ........................... 437/101

FOREIGN PATENT DOCUMENTS 2-225674  9/1990  Japan ............................. C23C 16/50
3-64466   3/1991  Japan ............................. C23C 16/24

OTHER PUBLICATIONS

Sze, VLSI Technology, 1988, McGraw–Hill, p. 218–219.

Primary Examiner—R. Bruce Breneman
Assistant Examiner—Anita Alanko
Attorney, Agent, or Firm—Fitzpatrick, Cella, Harper & Scinto

[57] ABSTRACT

A method of manufacturing an amorphous silicon thin film exhibiting excellent quality for use in a TFT, a photosensor or a solar cell at a low cost by a plasma CVD method utilizing high frequency discharge, the method being consisting of steps of using a silicon compound such as $SiH_4$ as raw material gas, making the frequency f (MHz) of a high frequency power source to be 30 MHz or higher, and applying negative voltage to an electrode of a substrate if necessary. Furthermore, it is preferably that the relationship between the distance d (cm) between electrodes and the frequency f (MHz) of the high frequency power source satisfies f(HMz)/d (cm)<30 HMz/cm.

34 Claims, 99 Drawing Sheets

FREQUENCY f (MHz)

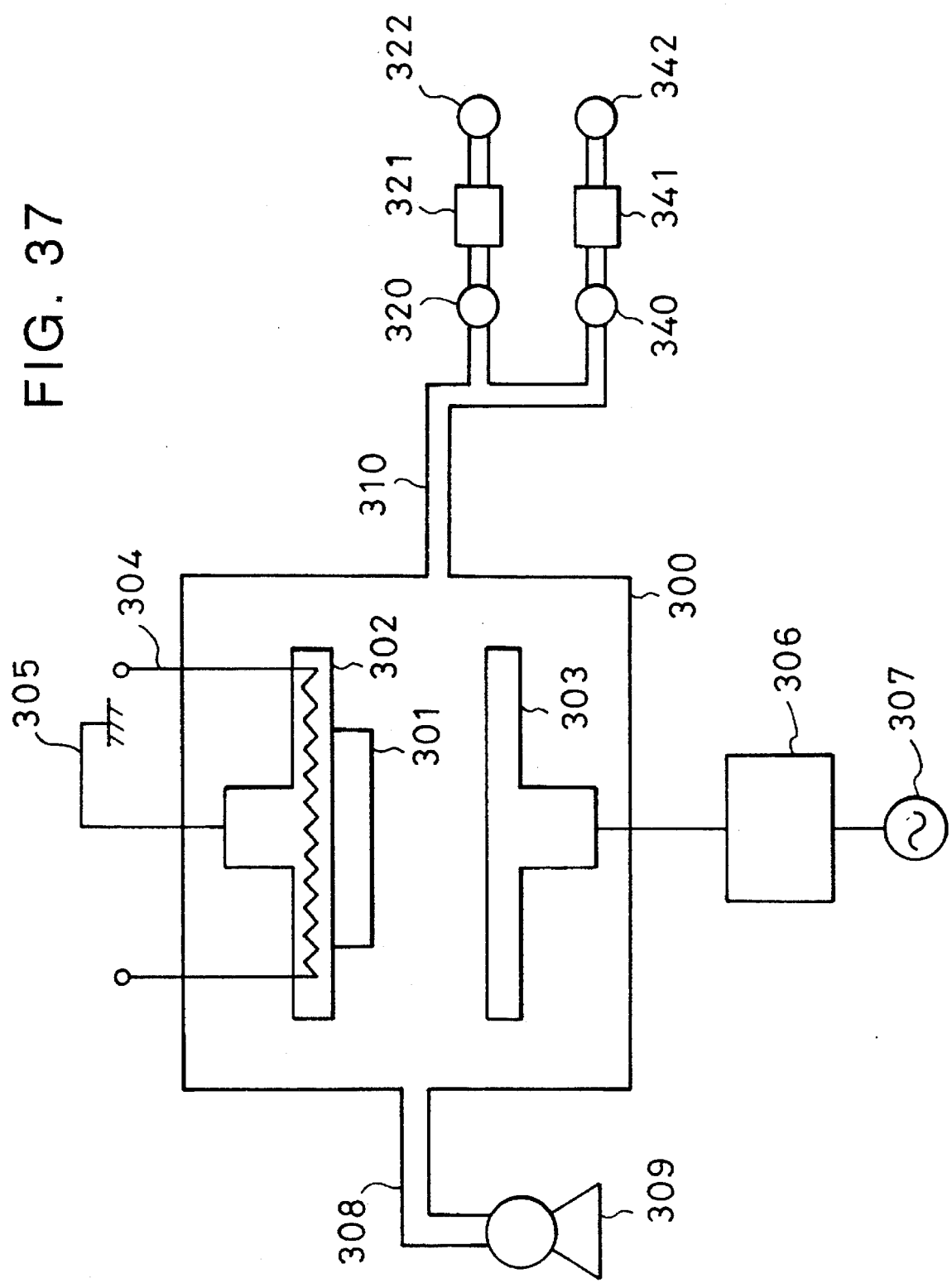

METHOD OF MANUFACTURING NON-SINGLE CRYSTAL FILM AND NON-SINGLE CRYSTAL SEMICONDUCTOR DEVICE

BACKGROUND OF THE INVENTION

1. Field of the Invention

The present invention relates to a method of manufacturing a non-single crystal film including an amorphous film typified by an amorphous silicon film, amorphous silicon nitride film and micro-crystal silicon film, and to a non-single crystal semiconductor device. More particularly, the present invention relates to a method of manufacturing a non-single crystal film for use in a thin film device such as a thin film transistor, an optical sensor and a solar cell, and to a non-single crystal semiconductor device.

2. Related Art

Recently, a semiconductor device using a non-single crystal semiconductor film such as a micro-crystal silicon or amorphous silicon has been energetically researched and developed. In particular, the viewpoint enabling a large area product to be realized at a low cost enhances developments of a solar cell, the photosensitive drum for a copying machine, a thin film transistor for a liquid crystal display, a solid-state image sensing device (a photosensor) for an information processing apparatus such as a facsimile machine, the weight of which is reduced. Hitherto, the non-single crystal silicon film for use in the foregoing semiconductor devices has been deposited by an RF plasma CVD method wherein silane $SiH_4$ or disilane $Si_2H_6$ is used as a film forming gas or a reactive sputtering method where a Si target is sputtered in Ar plasma under the presence of hydrogen gas, or an optical CVD method or a ECR-CVD method. The method for forming amorphous silicon by employing the CVD method was found by R. C. Chittic and others followed by W. E. Spear and others who have enabled the electrical conductivity of the amorphous semiconductor to be pn-controlled by using impurities. Generally, the micro-crystal silicon or the amorphous silicon obtained as above mentioned contains 10% or more hydrogen. A plasma CVD method has been most widely used among various methods for depositing the micro-crystal silicon or the amorphous silicon because a film having relatively satisfactory characteristics can be formed. The plasma CVD method is a method comprising steps of: using silane $SiH_4$ or disilane Si2H6; performing dilution with hydrogen ($H_2$) gas if necessary; generating plasma by using high frequency in an RF range of 13.56 MHz or in a microwave rage of 2.54 GHz; decomposing the film forming gas by utilizing the plasma to generate activator having reactivity; thus depositing on the substrate the micro-crystal silicon or the amorphous silicon. By mixing doping gas made of, for example, phosphine $PH_3$, or diborane $B_2H_6$ or boron fluoride $BF_3$ at the time of forming the film, a micro-crystal silicon film or an amorphous silicon film, where the conductivity type can be determined to be n-type or p-type, the electrical conductivity and the photoconductivity are controlled, can be formed. The films, pn-controlled as described above, are also important films serving as an ohmic layer and a blocking layer of the semiconductor device. The foregoing films are used to manufacture pin-type solar cells, and photodiodes and so forth.

An a-Si film formed by a vacuum evaporation method or a sputtering method and accordingly containing no hydrogen exhibits a very high dangling bond density, for example, having a spin density of about $10^{20}$ cm$^{-3}$.

Therefore, it is considered that hydrogen performs an important role improving the quality of the hydrogenated a-Si film formed by the RF plasma CVD method. In particular, when the temperature of the substrate is made to be about 250° C., the spin density is lowered to about $10^{16}$ cm$^{-3}$ and, therefore, the pn control by means of impurities can be performed. It has been confirmed that the a-Si formed by the RF plasma CVD method contains about 10% hydrogen resulting in an estimation that hydrogen terminates the dangling bond to improve the quality of the film. If hydrogen has the foregoing function, it could be considered that the supply of hydrogen enables the dangling bonds to be decreased even if a film is formed by the vacuum evaporation method or the sputtering method that does not use the reactive gas $SiH_4$ containing hydrogen in the RF plasma CVD method. The foregoing fact was confirmed, resulting in the role of the hydrogen to serve as a dangling bond terminator in the a-Si film to be widely confirmed.

Furthermore, a variety of experiments have been carried out, resulting in the discovery that the process of growth of the film by the RF plasma CVD method using the $SiH_4$ gas as the raw material is usually categorized as follows.

(1) Radical Generation Process

In this process, electrons and $SiH_4$ molecules repeat inelastic collisions in the plasma, resulting in generations of various radicals, ions and atoms. There is a good possibility that the main precursors of the film forming reaction are $SiH_2$ and $SiH_3$ radicals.

(2) Radical Transportation Process

In this process, neutral radicals generated in the plasma are transported to the surface of the substrate due to diffusion while performing a variety of secondary chemical reactions mainly with the $SiH_4$ molecules. It can be estimated that $SiH_3$ radicals mainly reach the surface of the substrate, in view of the generation ratio of the radicals in the plasma and the reaction life in the transportation process. However, increase of the density of the radicals reaching the surface such as the Si, SiH and $SiH_2$ will deteriorate the quality of the formed film due to the difference in the form of the reaction on the surface.

(3) Surface Reaction Process

In this process, the radicals, which have reached the surface of the grown film, are adsorbed by the surface, followed by diffusion of the surface to form chemical bonds with stable sites, resulting in amorphous network to be formed. If the temperature of the substrate is sufficiently high and the surface is covered with hydrogen, the $SiH_3$ radicals are sufficiently diffused in the surface. As a result, the $SiH_3$ radicals are chemically bonded with stable sites, resulting in a film exhibiting high quality to be obtained.

As a result of the foregoing film forming mechanism, the $SiH_3$ radicals serving as the precursors of the deposition reaction of the a-Si film are selectively diffused in the surface of the substrate. The diffusion of the surface of the substrate enables an a-Si film exhibiting high quality to be formed. It is considered important that the surface of the substrate is covered with hydrogen in order to enhance the surface mobility of the radicals. Furthermore, it is considered that the surface reaction is carried out in the following manner that: the $SiH_3$ radicals extract the surface hydrogen in the surface covered with hydrogen followed by chemical reactions between the formed site and the other $SiH_3$ radicals.

Depending upon the foregoing theory, manufacturing conditions such as the film forming temperature, the quantity of the flow of the raw material gas, the pressure and the electric power to be applied have been improved in order to improve the quantity of the a-Si film. However, it has been confirmed that an optimum temperature for forming the film exists and the increase in speed at which the film is formed deteriorates the quantity of the film. That is, there is a film forming temperature at which the spin density becomes minimum as shown in FIG. 1.

If the film forming speed is raised, increase in hydrogen in the film and in the dangling bond density, which deteriorate the characteristics of the thin a-Si film also occurs. For example, the photoconductivity $\sigma_p$ (S/cm), which is one of the basic characteristics of the thin film, deteriorates as shown in FIG. 2.

As a result, the film forming conditions such as the flow rate of the raw material gas, the pressure and the applied electric power to be employed in the foregoing example method of manufacturing the a-Si thin film which are capable of maintaining the characteristics of the device are as follows: the temperature is about 250° C.; and the conditions realizing the film forming speed of about 0.2 to 2 Å/sec. The a-Si film thus formed has a spin density of about $10^{16}$ to $10^{17}$ and content of hydrogen is about 10%. The foregoing physical properties are not considered to be the optimum values. If hydrogen is required to terminate the dangling bond, it can be considered that it is a necessity to contain about 1% hydrogen.

Although hydrogen contained in the film performs an important role to compensate the dangling bond, there arise the following problems due to the concentration of hydrogen.

The film formed by using the RF wave contains hydrogen by 10% or more, which is considered to be the cause of deterioration by light. Further, damage of the film due to ions in the plasma is critical and, accordingly, the density of defects in the film cannot be lowered than about $10^{15}/cm^3$. Accordingly, an attempt has been made to prevent the light deterioration by reducing hydrogen in the film. For example, a method has been suggested in which a hydrogen plasma process and film forming are repeated to reduce hydrogen contained in the film, thus resulting in prevention of the light deterioration (31a-ZD-11, spring 1990, or 28-P-MD-1, autumn 1990 of Lecture Meeting of Concerned Associations of Applied Physics Society). However, the foregoing method encounters a problem in view of a practical point that the apparatus cannot easily be constituted, resulting in a difficulty in mass production to arise. On the other hand, an attempt has been made in which the conventional RF is used to maintain the temperature of the substrate at 350° C. followed by raising the film forming speed in the foregoing state, resulting in reduction in the density of defects in the film (30p-ZT-3,4, spring 1992, Lecture Meeting of Concerned Associations of Applied Physics Society). However, the foregoing method encounters a problem due to the use of the RF that the pressure is raised and the flow rate ratio is changed, resulting in very severe conditions for the film forming plasma. Therefore, abnormal discharges take place and reactions can easily be occur in a gas phase, causing the polymer to be formed followed by received into the film while being formed into particles. As a result, the quality of the film easily deteriorates, resulting in unsolved problems in terms of the reproductivity and mass-production facility.

Accordingly, there have been suggested a variety of methods for improving the quality of the a-Si film by using the foregoing RF plasma CVD method as the base.

A chemical annealing method has been disclosed in p. 1618, Vol. 59 (1990), Applied Physics, reported by a group including Shimizu, Tokyo Institute of Technology. According to the report, an assumption is made that the light deterioration of the a-Si film and the like are caused from the non-uniformity of the network structure of Si, and, therefore, the network structure of Si is finely constituted to stabilize the structure. The foregoing object is achieved by controlling the process of forming the structure in which elimination of hydrogen is accompanied in the surface in which the film grows by supplying hydrogen in the form of atoms which have strong chemical effect mutual with Si. The hydrogen in the form of atoms are generated by a large quantity by microwave plasma followed by conveyance to the deposition portion. A usual RF grow discharge decomposes $SiH_4$, resulting in decomposition of the substrate. Accordingly, the time ($t_1$ second), in which $SiH_4$ is supplied, is controlled, and the film deposition and the process ($T_2$ second) with hydrogen in the form of atoms on the surface of the deposited film are repeated. By repeating the foregoing deposition surface treatment, the content of hydrogen in the a-SI film can be reduced to about 1%. Thus, resulted improvement in the mobility of the carrier and the prevention of the light deterioration have been confirmed.

As a method of modifying the foregoing RF plasma CVD method, an example has been disclosed in which a raised frequency is used in the high-frequency discharge in the RF band range.

That is, a group including Oda, Tokyo Institute of Technology, has disclosed a method in Lecture Meeting of Concerned Associations of Applied Physics Society, autumn 1990, and spring in 1991 (28p-MF-14 and 28p-S-4) where the discharge is performed at a high frequency of 144 MHz, resulting in amorphous silicon to be manufactured followed by evaluation.

However, a simple examination is made at frequencies of 13.56 MHz and 144 MHz and the optimum frequency in the VHF band for enlarging the area and improving the productivity has not been found.

Another disclosure has been disclosed, in Japanese Patent Laid-Open No. 3-64466, which utilizes the effect of the frequency and in which a raised frequency is used, resulting in a spatially uniform discharge and a uniform film forming speed to be realized. However, the foregoing invention has simply discussed the uniform film forming, and no description was made about the influence and the technological effect of the high frequency in the VHF range upon the quality of the film.

In Japanese Patent Laid-Open No. 2-225674, a method using a frequency ranged from 1 kHz to 100 MHz has been described, but no description has been made about the technological operation and effect in the VHF band, resulting in only a technological expansion in the RF band.

In U.S. Pat. No. 4,933,203, high frequency waves in the VHF band were used followed by evaluations of the formed films, resulting in the optimum relationship between the frequency and the distance between electrodes. However, the foregoing relationship is insufficient for problems to be described later as unsolved problems.

Although a variety of disclosures have been made about VHF, large number experiments have been carried out simply by raising the frequency to the VHF band.

Then, the problems will be described more specifically.

With the technological development made recently, there arises a desire of improving the quality of the a-Si thin film in a variety of fields, the solar cell, the liquid crystal TV, and photosensor. However, the conventional a-Si thin film formed by utilizing the RF discharge at 13.56 MHz encounters the following unsolved problems in viewpoint of an application to an a-Si thin film device.

(1) Problems in a viewpoint of the basic characteristics of the thin film:

The attained carrier mobility is insufficient when it is adapted to the thin film transistor. The S/N ratio defined by the photoconductivity and the dark conductivity ratio is too small when it is adapted to the photosensor. A critical light deterioration takes place, in which the characteristics of the photoconductivity ($\sigma_p$) due to irradiation with light, when it is adapted to a solar cell.

(2) Problem in a viewpoint of the manufacturing yield When it is employed in a large-area device, the distribution of the characteristics of the device, realized due to the distribution of the film thicknesses and the qualities of the films, causes the yield to deteriorate.

(3) Problem in a viewpoint of the cost

Since a high grade film adaptable to a thin film device can be formed only at a low film forming speed, the manufacturing performance cannot be improved, resulting in a difficulty in reducing the cost.

That is, in order to improve the characteristics of a large-area a-Si thin film device, to improve the yield and to reduce the cost, the film must be formed at a high speed while improving the basic characteristics of the a-Si thin film.

In order to achieve this, various attempts have been made to improve the manufacturing conditions for the plasma CVD method at 13.56 MHz, such as the flow rate of the raw material gas, the pressure, and the electric power to be applied. However, the rise of the film forming speed increases hydrogen in the film, which is assumed to deteriorate the characteristics of the a-Si thin film, and generation of foreign matters (polysilane), which deteriorate the yield. For example, the increase in the film forming speed deteriorates the photoconductivity $\sigma_p$ (S/cm) which is one of the basic characteristics of a thin film. As described above, a film capable of improving the characteristics of a thin film transistor type photosensor to be formed into a device has not been manufactured as yet. As a result, the foregoing method of manufacturing the a-Si thin film allows a film forming speed of about 0.2 to 2 Å/sec as the speed that is capable of maintaining the characteristics of the device.

Although the RF discharge at 13.56 MHz exhibits an advantage that a film can be formed over a wide area, it encounters a problem that the film forming speed is too low and the substrate, that is, the thin film is critically damaged by ions. The microwave discharge at 2.54 GHz exhibits a high film forming speed and capable of protecting the substrate from damage due to ions. However, it encounters a problem that a large area film cannot easily be formed. Further, the light CVD method suffers from a problem of the quality of the formed a-Si thin film and a problem of provability of forming a film over a large area. Therefore, it can be said that the light CVD method is a method that is developing. Similarly, the ECR-CVD method is able to control freely the damage of the substrate to improve the quality of the a-Si thin film, while encountering a problem that the film cannot be formed over a large area.

The aforesaid conventional manufacturing methods respectively encounter the following problems when microcrystal silicon containing impurities is manufactured. The following method suffers from unsatisfactory efficiency of utilizing the gas, the method being arranged in such a manner that silane gas is used, dilution with hydrogen gas is performed if necessary, plasma is generated at a high frequency of 13.56 MHz in the RF band range to decompose the film forming gas by the generated plasma, and microcrystal silicon, is deposited on the substrate. Therefore, a problem of unsatisfactory doping efficiency arises when the microcrystal silicon containing impurities is manufactured by introducing the impurity gas. Even more detrimental, the conventional method must provide severe condition when microcrystallization is caused to occur in the film, and a desired microcrystal film cannot be easily formed. Therefore, it is difficult to improve the doping efficiency. Then, a case where n-type microcrystal silicon film is formed will be considered. It was formed under standard conditions: silane gas was used by 3 sccm, phosphine gas of 150 sccm diluted by hydrogen gas to 100 ppm was used, the pressure was 0.5 Torr, and the RF power was 50 mW/cm$^2$, resulting in a doping efficiency of 10%. It can be said that 90% of phosphorus in the film does not serve as the dopant.

An amorphous silicon nitride film has been used to serve as a gate insulating film for a thin film transistor or to serve as a passivation film of the foregoing device. Hitherto, the amorphous silicon nitride film for use in the forgoing semiconductor devices has been deposited by the RF plasma CVD method in which a gas formed by mixing silane SiH$_4$ or silane fluoride SiF$_4$ with ammonia NH$_3$ or nitrogen N$_2$ is used as the film forming gas. Although the silicon nitride can be manufactured by another method, that is, heat CVD method, the heat CVD method must set the temperature, at which the amorphous silicon nitride is allowed to grow, to a high temperature of about 850° C. Therefore, the foregoing method cannot be employed when the aforesaid device is manufactured by using the amorphous silicon semiconductor having a low heat resistance of about 400° C. However, the RF plasma CVD method is allowed to set the growth temperature to about 300° C., resulting in that it can be employed. Since the decomposition and the reaction take place easier when ammonia is used than a case where nitrogen is used, a plasma CVD method is usually employed. The plasma CVD method is a method in which a mixture gas of silane SiH$_4$ and ammonia NH$_3$ is used, dilution with hydrogen is performed if necessary, and plasma is generated at a high frequency of 13.56 MHz, and the film forming gas is decomposed by the plasma to generate an activator having reactivity so as to deposit the amorphous silicon nitride film on the substrate. However, the ammonia gas is a corrosive gas, resulting in a difficulty in handling. Therefore, there sometimes occur a problem for the manufacturing apparatus. On the contrary, the nitride gas exhibits an advantage in the handling facility. In addition, the nitride gas can be purified easier than the ammonia gas and, therefore, the entry of the impurities into the formed film can be reduced. The impurities in the film must be reduced because they exert bad influence upon the electric characteristics of the amorphous silicon nitride insulating film. It has been that, when the film is formed by using the ammonia gas, the content of hydrogen in the film increases in comparison to that when the same is formed by using the nitrogen gas. If hydrogen in the film increases, the density lowers, resulting in deteriorations in the precision and heat resistance. What is worse, hydrogen is diffused in the film, causing a variety of unstable phenomena to occur. Therefore, hydrogen must be reduced in the film. As described above, a variety of advantages can be attained when the mixture gas of the silane gas and the nitrogen gas is used. In this viewpoint, it is more advantageous when a mixture gas of silane fluoride gas and nitrogen gas containing no hydrogen is used.

Since the composition of the amorphous silicon nitride thin film is varied depending upon the manufacturing method and condition, it is usually expressed as SiNx film. The physical properties of the SiNx film are considerably changed depending upon the composition and the content of hydrogen. The methods of depositing the SiNx film are typified by a reduced-pressure or normal pressure CVD method by using the foregoing SiH$_4$—NH$_3$ mixture gas, a plasma CVD method and a light CVD method. The RF plasma CVD method, in which the discharge frequency of 13.56 MHz of the foregoing SiH$_4$—NH$_3$ mixture gas is utilized, has been most widely employed because the reaction can easily occur and satisfactory controllability can be attained.

However, the foregoing SiNx film sometimes encounters the following problems: when the SiNx film is used as the gate insulating film of a thin film transistor (hereinafter abbreviated to "TFT") using an a-Si thin film, the characteristics of the a-Si TFT change the device characteristics depending upon the SiNx gate insulating film. If the threshold voltage is changed, the ON-OFF ratio is lowered or the responsibility deteriorates, the yield deteriorates, resulting in a critical problem to occur. Also a TFT type photosensor encounters changes in the photoelectric current and the dark current which are the basic characteristics thereof due to the change in the threshold voltage. The foregoing problems occurring in the device characteristic are usually considered to be causes from the characteristics of gate insulating film or from the interface between the gate insulating film and the a-Si film.

Specifically, it has been considered that the change in the threshold is caused from injection of electrons or positive holes from a-Si to SiNx or capture of the same by the trap level of SiNx. Therefore, it has been considered that a high quality film having a large optical band gap of the SiNx film and having a small electronic spin density is effective to minimize the change.

In terms of the content of hydrogen in the foregoing film, if the content of hydrogen in the SiNx film is large, the density of the film is lowered, resulting in that the voltage resistance to deteriorate. The foregoing hydrogen is diffused in the film, causing a variety of unstable phenomena to occur. Therefore, it is preferable that hydrogen in the film is reduced.

Another assumption is made that the characteristics of the TFT can be improved by shifting the stress of the SiNx film toward somewhat the compression side.

Therefore, the basic physical properties of the SiNx thin film have been investigated from a variety of viewpoints such as the film forming conditions and the experiment conditions, resulting in that a SiNx thin film having a large optical band gap, a small spin density, a low hydrogen content and the stress positioned somewhat adjacent to the compression side will realize a satisfactory result.

There arises the following problem experienced with the aforesaid conventional method in which the mixture gas of the silane gas or the silane fluoride and the nitrogen gas is used, dilution with the hydrogen gas is performed if necessary, plasma is generated at a high frequency of 13.56 MHz, the film forming gas is decomposed by the plasma, and thereby the amorphous silicon nitride film is deposited on the substrate:

Since the nitrogen gas cannot be easily decomposed as compared with the ammonia gas, a large high-frequency electric power must be supplied. However, the raising of the supplied electric power will enlarge the quantity of gas removed from the wall of the chamber, resulting in an enlargement of impurities introduced into the film. Furthermore, damage due to the plasma becomes critical, thus deteriorating the characteristics of the film. Further, silicon fluoride is more chemically stable than silane, resulting in a low decomposition efficiency in the plasma. Therefore, if it is used, the efficiency of using the gas is unsatisfactorily deteriorates. What is worse, the film forming speed is lowered undesirably.

Although a variety of attempts have been made with the conventional RF plasma CVD method using the frequency of 13.56 MHz for the purpose of meeting the foregoing physical properties required for the thin film, the following problems occur:

The hydrogen content C$_H$ (%) in the film shows the highest dependency upon the substrate temperature T$_S$, and it also depends upon the type of the raw material, resulting in a relationship as shown in FIG. 3. As can be understood from FIG. 3, the density of hydrogen can simply be lowered by changing the raw material gas from NH3 to N2 and by raising the temperature. However, there is an upper limit of about 400° C. in terms of use of a large-size glass, the structure and the manufacturing facility. Furthermore, there is a lower limit of about 250° C. in terms of the device characteristics. The reason for this is that the thin film has a high spin density if the temperature is low level, thus deteriorating the reliability of the device characteristics. That is, the range designated with black dots is considered to be the range with which the device characteristics and the manufacturing facility can be maintained at the satisfactory level.

The relationship between stress (dyn/cm$^2$) and the hydrogen content C$_H$ (%) is shown in FIG. 4. In proportion to reduction in the content of hydrogen, the stress is shifted from tensile stress to compression stress. However, the stress of a high quality SiNx film obtainable from the foregoing temperature range from 250° C. to 400° C. or lower and using the NH$_3$ is mainly tensile stress. If N$_2$ is used, a large compression stress is attained. The black dots in FIG. 4 are points at which the high quality SiNx thin film can be realized, while the diagonal-line regions designate controllable hydrogen contents and stress. That is, it can be understood that the SiNx thin film having the somewhat compression stress, that is, a compression stress of 5×10$^9$ dyn/cm$^2$, at which satisfactory device quality can be attained, cannot be manufactured.

If NH$_3$ is used, the content of hydrogen in the film can be controlled by changing the ratio of NH$_3$ and SiH$_4$, as shown in FIG. 5. As can be understood from FIG. 5, lowering of the content of hydrogen lowers the ratio N/Si, resulting in that the optical band gap is narrowed and the quality of the film deteriorates. Therefore, the ratio of NH$_3$ and SiH$_4$ cannot be lowered. Similarly, the control of the stress by enlarging the content of hydrogen deteriorates the quality of the film such as the ratio N/Si in the case where N$_2$ is used.

That is, there is a problem in that the film forming conditions cannot be obtained, with which the stress can be somewhat shifted to the compression side, the ratio N/Si at this time can be made to be in the neighborhood of the stoichiometric ratio, the optical band gap can be enlarged, and the spin density can be lowered.

SUMMARY OF THE INVENTION

An object of the present invention is to provide a method of manufacturing a non-single-crystal thin film capable of overcoming the foregoing problems, improving the basic characteristics of a non-single-crystal thin film such as an amorphous silicon (a-Si) thin film, a microcrystal silicon (μc-Si) thin film, and an amorphous silicon nitride (a-SiNx) thin film at a low cost, and capable of forming the film at high speed, and to provide a non-single-crystal semiconductor apparatus.

Another object of the present invention is to provide a method of manufacturing a non-single-crystal thin film capable of manufacturing a high quality film using no complicated structure apparatus and no complicated film forming conditions and to provide a non-single-crystal semiconductor apparatus.

Another object of the present invention is to provide a method of manufacturing a non-single-crystal thin film whereby the density of dangling bonds in an a-Si film can be lowered, and weak bonds generated due to a fact that hydrogen bonds to silicon are decreased by reducing the content of hydrogen to improve photoconductivity, prevent light deterioration of the photoconductivity, and improve carrier mobility so that the non-single-crystal thin film has stable characteristics for a long time and the same can be formed at high speed.

Another object of the present invention is to provide a manufacturing method whereby the efficiency of using a film forming gas can be improved, the manufacturing cost can be reduced, a further improved microcrystal silicon film can easily be manufactured to obtain an excellent semiconductor device.

Another object of the present invention is to provide a manufacturing method whereby the decomposition efficiency of nitrogen gas or silicon fluoride gas can be improved, the efficiency of using a film forming gas can be improved, gas removal from the chamber due to the effect of ions in the plasma can be prevented, plasma damage can be prevented, the manufacturing cost can be reduced, a further excellent amorphous silicon nitride film can easily be manufactured and an excellent semiconductor device can be obtained.

Another object of the present invention is to provide a manufacturing method where frequency 13.56 MHz for use in the conventional RF plasma CVD method is replaced by a higher frequency discharge whereby the efficiency of decomposing the raw material gas can be improved so that the hydrogen content in a convention SiNx thin film using $NH_3$ is reduced, and the stress is controlled so that a SiNx thin film adaptable to a large-area device and having further improved quality can be obtained at low cost.

Another object of the present invention is to improve the conventional VHF film forming method and to provide optimum conditions for the issue for the inventor of the present invention to solve.

Another object of the present invention is to provide a method of manufacturing a non-single-crystal film by a plasma CVD method that utilizes a high frequency discharge, the method comprising the steps of: using at least silicon gas as a raw material gas; setting film forming pressure P (Torr) to a level from 0.25 Torr to 2.5 Torr; setting frequency f (MHz) of the high frequency power source to a value from 30 MHz to 120 MHz; making supplied electric power $P_W$ (W/cm$^2$) to be smaller than a value defined by 10/f (MHz); and making distance d (cm) between electrodes to be larger than a value defined by f/30.

Another object of the present invention is to provide a method of manufacturing a non-single-crystal film by a plasma CVD method that utilizes a high frequency discharge, the method comprising the steps of: using at least silicon gas as a raw material gas; setting film forming pressure P (Torr) to a level from 0.25 Torr to 2.5 Torr; setting frequency f (MHz) of the high frequency power source to a value from 30 MHz to 120 MHz; making supplied electric power P (W/cm$^2$)<10 MHz.W/cm$^2$f (MHz); making distance d (cm) between electrodes to be larger than a value defined by f/(MHz)/30 MHz; and making residence time τ (sec) to be from 0.05 sec to 2.5 sec assuming that the residence time τ for which raw material gas Q (sccm) is retained in discharge space V (cm$^3$) is defined as τ=78.947× $10^{-3}$ (sec/Torr×min)×V (cm$^{-3}$)×P (Torr)/Q (sccm). That is, 78.947×10$^{-3}$=60 sec/760 Torr and sccm=standard cc/minute.

Another object of the present invention is to provide a method of manufacturing a non-single-crystal film by depositing the non-single crystal film by using gas containing Si by a plasma CVD method, the method comprising the step of: applying VHF waves having frequency f higher than 30 MHz by electric power of 1/f (W/cm$^2$) (f: MHz) or more to meet f (MHz)/d (cm)<30 MHz/cm assuming that the distance between electrodes is d (cm) to generate plasma.

Another object of the present invention is to provide a method of manufacturing a non-single-crystal film by depositing the non-single crystal film by using gas containing Si by a plasma chemical vapor phase method, the method comprising the steps of: maintaining substrate temperature Ts at a level from 300° C. to 600° C.; and supplying VHF waves having frequency f of 30 MHz or higher to generate plasma.

Another object of the present invention is to provide a method of manufacturing a non-single-crystal film by a plasma CVD method utilizing high frequency discharge, the method comprising the steps of: providing silicon compound gas as raw material gas; making frequency f (MHz) of a high frequency power source to be 30 MHz or higher; and applying voltage to an electrode of a substrate in such a manner that the surface of the substrate is made to be a negative potential.

Another object of the present invention is to provide a method of manufacturing a non-single-crystal film for depositing an amorphous silicon nitride film by a plasma CVD method by using a mixture of gas at least gas containing Si and nitrogen gas, the method comprising the step of: applying VHF waves having frequency f higher than 30 MHz to meet f/d<30 assuming that the distance between electrodes is d (cm) to generate plasma.

Another object of the present invention is to provide a method of manufacturing a non-single-crystal film for depositing amorphous silicon nitride film by a plasma CVD method by using a mixture of gas containing at least a silicon compound and ammonia as raw material gas, the method comprising the step of: applying VHF waves having frequency f higher than 30 MHz and lower than 120 MHz to meet f/d<30 assuming that the distance between electrodes is d (cm) to generate plasma.

Another object of the present invention is to provide a non-single-crystal semiconductor apparatus comprising a non-single-crystal semiconductor layer manufactured by a plasma CVD method utilizing high frequency discharge using frequency ranging from 30 MHz to 120 MHz.

Other and further objects, features and advantages of the invention will be appear more fully from the following description.

BRIEF DESCRIPTION OF THE DRAWINGS

FIG. 37 is a structural view which illustrates a plasma CVD apparatus;

DETAILED DESCRIPTIONS OF PREFERRED EMBODIMENTS

Figure 1:
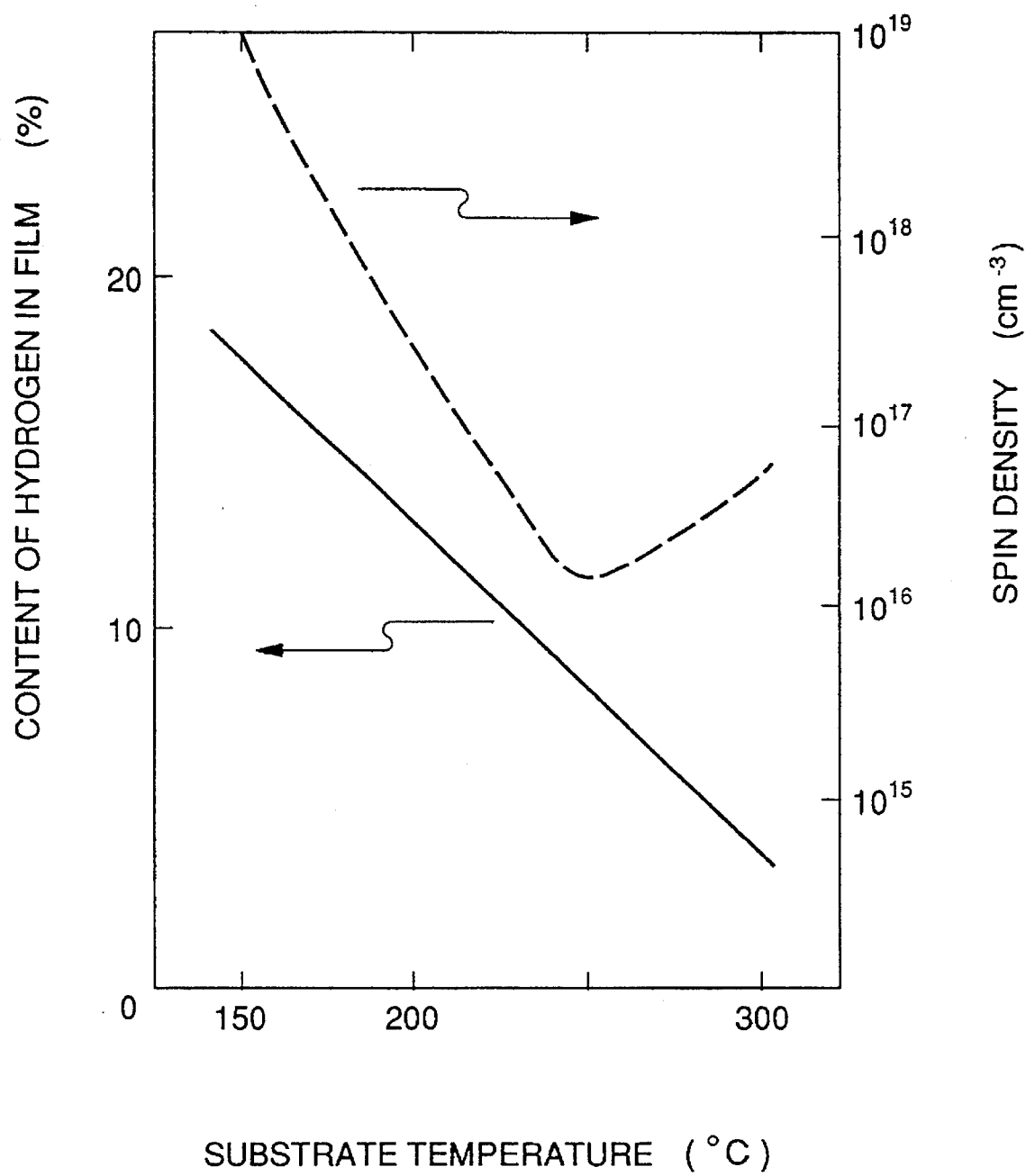
FIG. 1 illustrates the relationships among the film forming temperature, the hydrogen content and the spin density.
Figure 2:
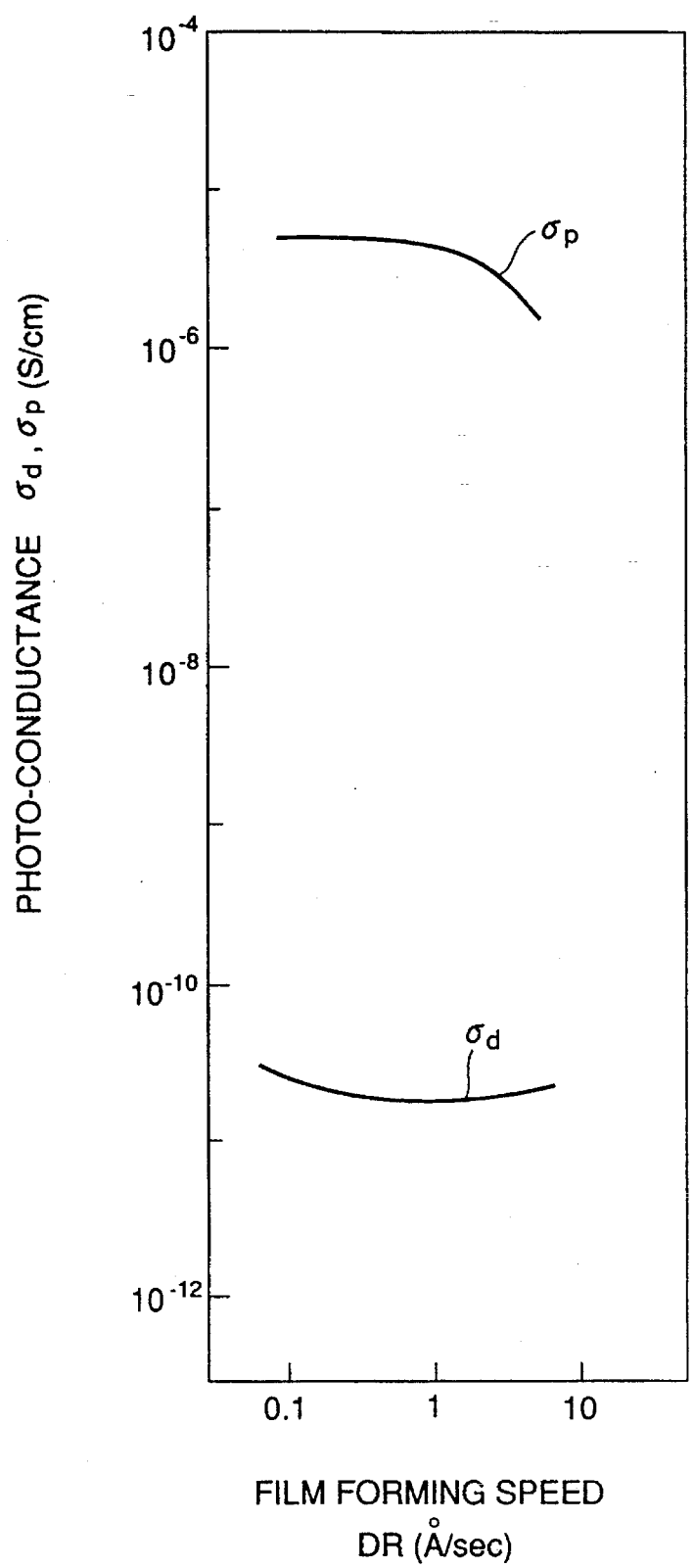
FIG. 2 illustrates an example of the relationship between the film forming speed and the photoconductivity.
Figure 3:
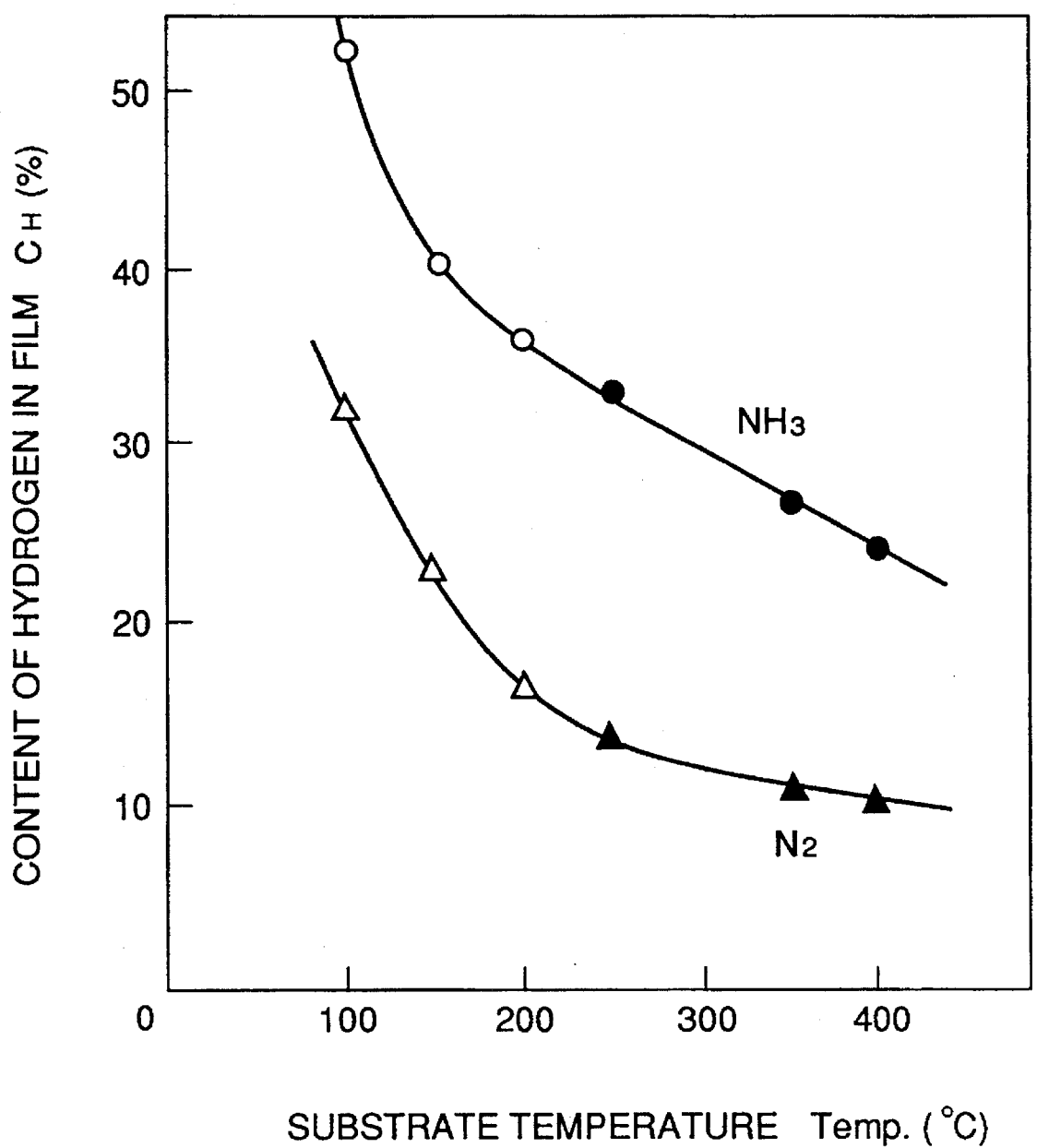
FIG. 3 illustrates an example of the relationship between the temperature of a substrate and the hydrogen content.
Figure 4:
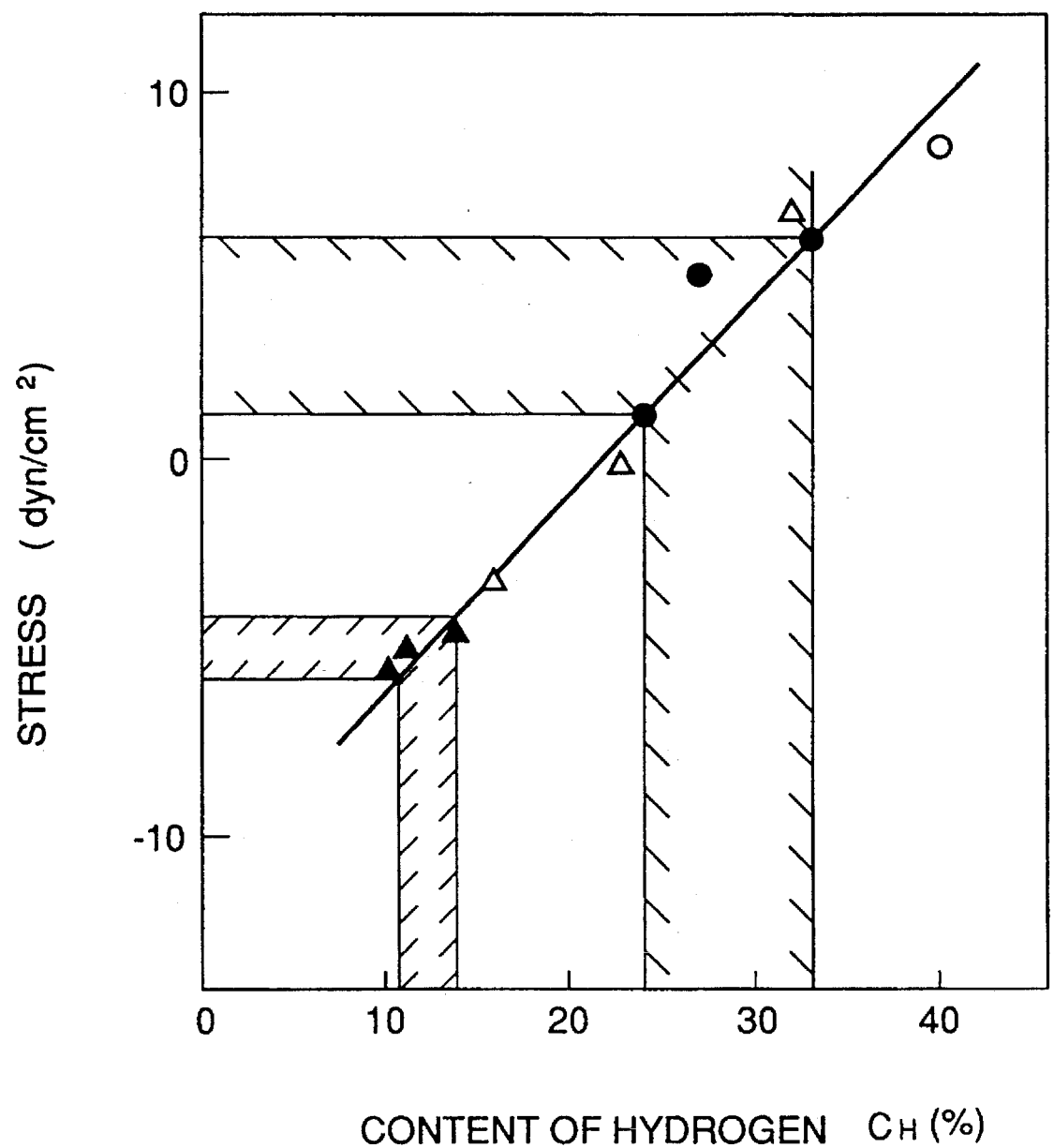
FIG. 4 illustrates an example of the relationship between the substrate temperature and stress.

Preferred embodiments of the present invention will now be described with reference to the drawings.

The structure of a non-single-crystal semiconductor device according to the present invention will be made during the description about a method of manufacturing an amorphous silicon film.

First, the process of growth of a film by a plasma CVD method will be schematically described, and then the present invention will be described.

In general, the process of the growth of an a-Si thin film can be categorized as follows: The description will be made about a case where $SiH_4$ is used as the raw material gas.

(1) Radical Generation Process in Glow Discharge of $SiH_4$

In this process, the energy distribution of electrons in the plasma is formed into a shape approximating a Maxwell-Boltzmann distribution having the peaks at several eV. The electrons as described above and $SiH_4$ molecules repeat inelastic collisions, resulting in generations of various radicals, ions and atoms. There is a good possibility that the main precursors of the film forming growth are $SiH_2$ and $SiH_3$ radicals.

(2) Process for Transporting Generated Radicals to Substrate

In this process, neutral radicals generated in the plasma are transported to the surface of the substrate due to diffusion while performing a variety of secondary chemical reactions mainly with the $SiH_4$ molecules. It can be estimated from the generation ratio of the radicals in the plasma and the reaction life in the transportation process that $SiH_3$ radicals mainly reach the surface of the substrate. However, increase of the density of radicals which have reached the surface such as the Si, SiH and $SiH_2$ will deteriorate the quality of the formed film due to the difference in the form of the reaction on the surface.

(3) Process of Growth of Film on Surface of Substrate

In this process, the radicals, which have reached the surface of the grown film, are adsorbed by the surface, followed by diffusion of the surface to form chemical bonds with stable sites, resulting in amorphous network to be formed. If the surface is covered with hydrogen, the $SiH_3$ radicals are sufficiently diffused in the surface. As a result, the $SiH_3$ radicals are chemically bonded with stable sites, resulting in a film exhibiting high quality to be obtained.

The foregoing process is performed by controlling the external parameter of the plasma to cause mainly the $SiH_3$ radicals to reach the film growing surface. If the surface of the substrate is so covered with hydrogen that the radicals are diffused, a high quality a-Si thin film can be formed.

The inventors of the present invention have paid attention to the frequency of the power source in the plasma CVD as means for efficiently increasing the $SiH_3$ radicals. As an actual monitoring means, the quantity of the SiH3 radical was indirectly judged from the film forming speed and the quantity of light emitted by a plasma light emission analysis. That is, the intensity of light of Si* and SiH* (hereinafter respectively called [Si*] and [SiH*] among the light emission lines Si*, SiH*, $H_2$* and H* and the film forming speed. (DR) have a correlative relationship. The main radicals contributing to the film forming are $SiH_3$. Therefore, the quantity of the $SiH_3$ radicals was indirectly confirmed. Since only the $SiH_3$ radicals must be increased, an assumption is made that the quality of the Si film does not extremely deteriorate as compared with the conventional technology. The reason for this is that the deterioration in the quantity of the film is estimated to be due to the generations of the Si radicals and $SiH_2$ radicals as described above.

The inventors of the present invention have investigated the film forming process by using a plasma light analysis as means for monitoring the process on the basis of a recognition that it is important for forming a high quality a-Si thin film to control the radicals. As a result of this analysis, the light emission lines Si*, SiH*, $H_2$* and H* in a silicon compound plasma were found. Furthermore, the relationship in the intensity of light between SiH* (414 nm) and H* (656 nm) among the foregoing light emission lines, that is, the intensity considerably relates to the quality of the a-Si thin film. In particular, it is preferable to employ film forming conditions with which the ratio of the light intensities [H*]/[SiH*] (the light intensities of the SiH* and H* radicals are respectively called [SiH*] and [H*]) is minimized. If the relationship in the light intensities holds $[SiH*] \geq [H*]$, a satisfactory a-Si thin film can be obtained.

Figure 6:
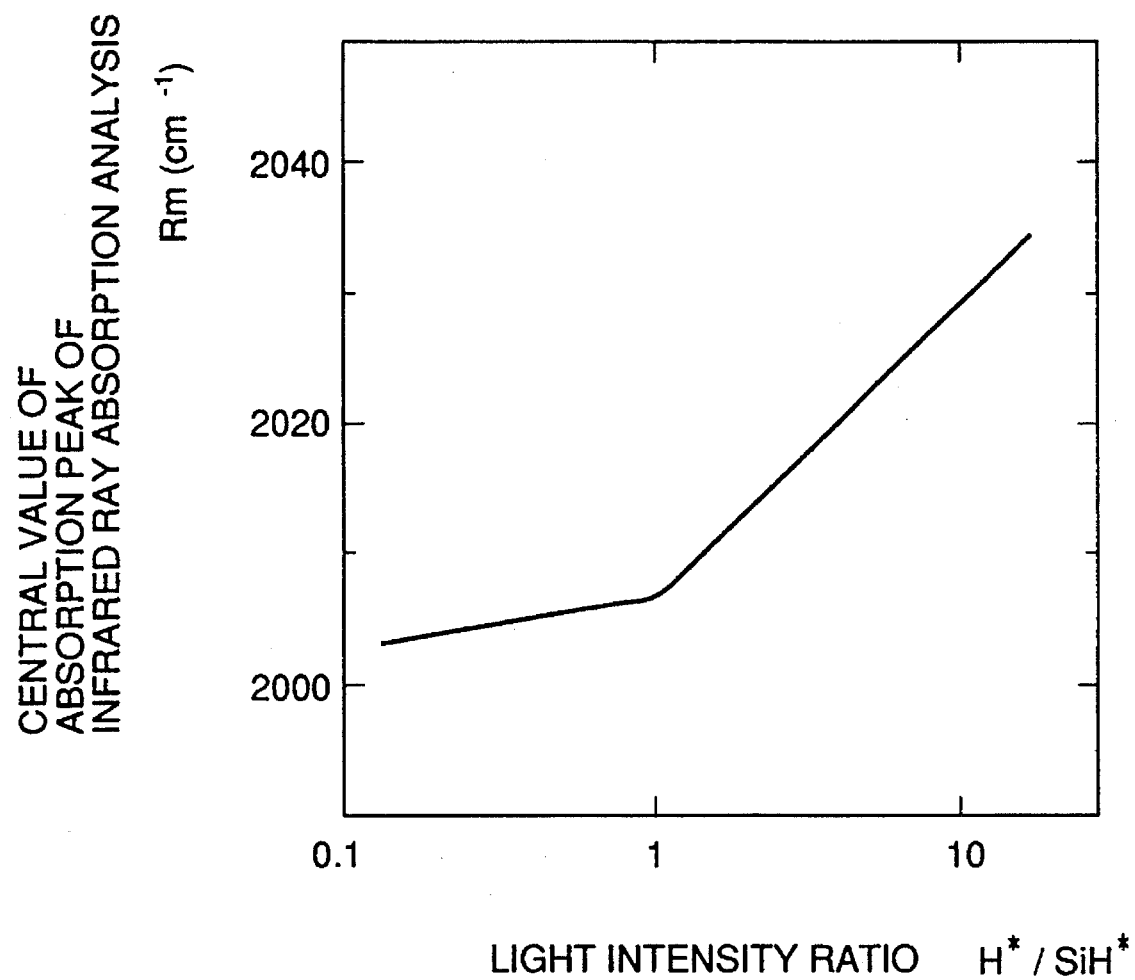
FIG. 6 illustrates an example of the relationship between the light intensity ratio and a state where hydrogen is bonded.

FIG. 6 illustrates the relationship between the intensity of light [H*]/[SiH*] and the form of the bonding of hydrogen in the thin film, that is, the relationship with the quality of the film.

In general, the absorption peak appearing at 2000 $cm^{-1}$ to 2100 $cm^{-1}$ in the infrared ray absorption analysis of the a-Si thin film can be considered to be caused from the stretching vibrations (2000 $cm^{-1}$) and the stretching vibrations (2100 $cm^{-1}$) of the Si—$H_2$ bond, while the central value Rm ($cm^{-1}$) appearing at $2000^{-1}$ cm to $2100^{-1}$ cm can be considered to show the ratio of the SiH bond and the $SiH_2$ bond contained in the thin film. If the central value Rm has been shifted from 2000 $cm^{-1}$ to 2100 $cm^{-1}$ the $SiH_2$ bonds are increased, and the a defect of a type, in which the chain bonds or circular bonds of Si are contained in the film, arises, resulting in the deterioration in the quality of the film.

That is, the shift of the central value Rm toward $2100^{-1}$ with the increase in the light intensity ratio [H*]/[SiH*] means that the quality of the a-Si film deteriorates with the increase in the light intensity ratio [H*]/[SiH*]. In the view point of the inventor of the present invention, a substantially satisfactory a-Si thin film can be obtained if $[SiH*] \geq [H*]$.

Then, the distance between the electrodes which is the premise of the present invention will now be described.

Figure 7:
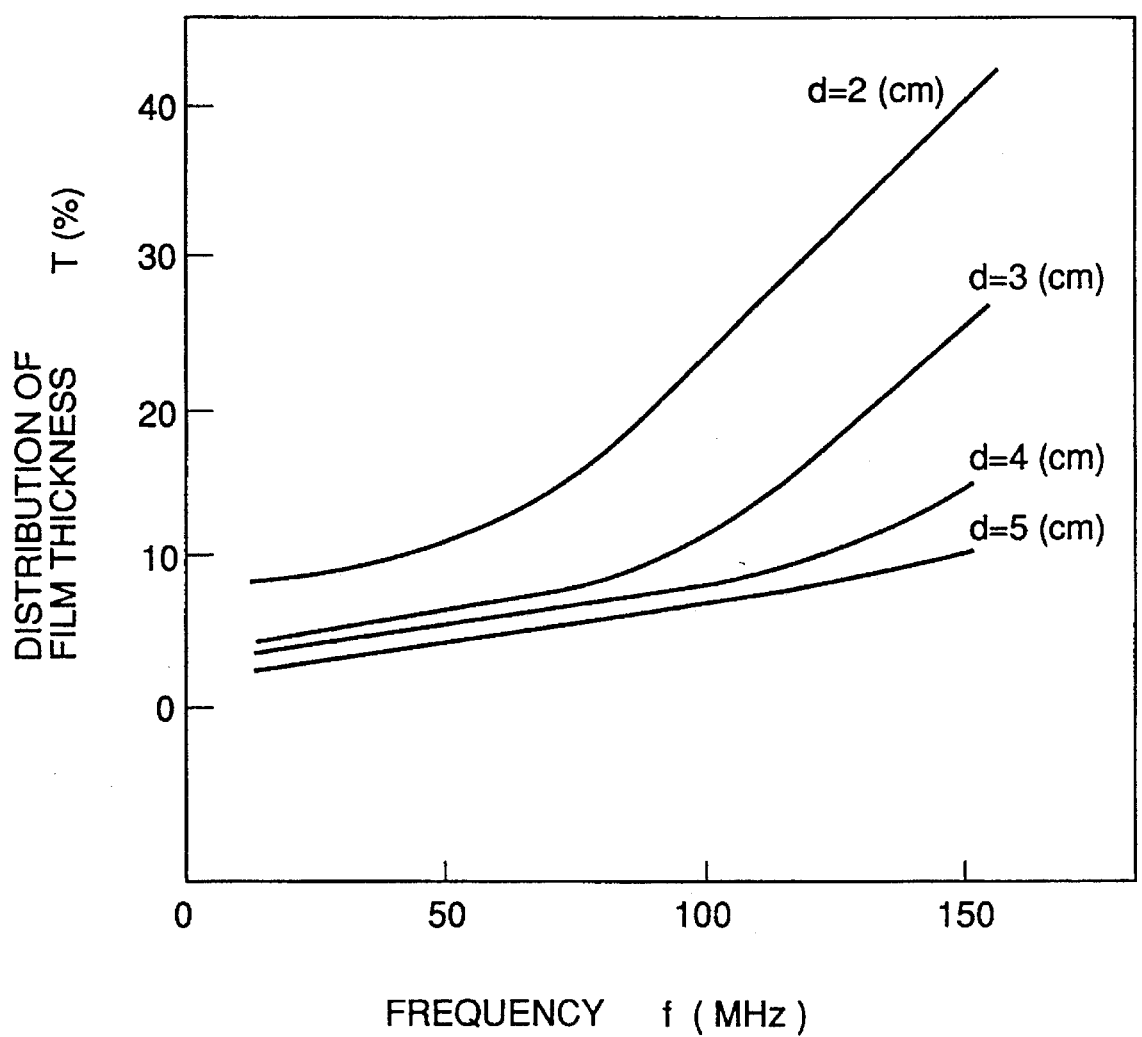
FIG. 7 illustrates an example of the relationship between applied frequency f and the film thickness distribution.

If the frequency f is high with respect to a certain distance d between electrodes, the film thickness distribution T in the substrate becomes large as shown in FIG. 7, resulting in a problem when a large area film is formed. Accordingly, the inventor of the present invention has modified a variety of film forming parameters, resulting in a fact to be found that the distance between the electrodes affects the film thickness distribution. Furthermore, a fact was found that lengthening of the distance between the electrodes will reduce the film thickness distribution. The relationship between them was obtained under condition that the film thickness distribution T (%) in the film is included in 10% under a variety of the conditions according to the present invention, resulting in that the distribution is too large to be employed when d=2 cm. When d is larger than 3 cm, a substantially excellent distribution can be obtained if d meets the relationship f (MHz)/d (cm)<30.

Figure 8:
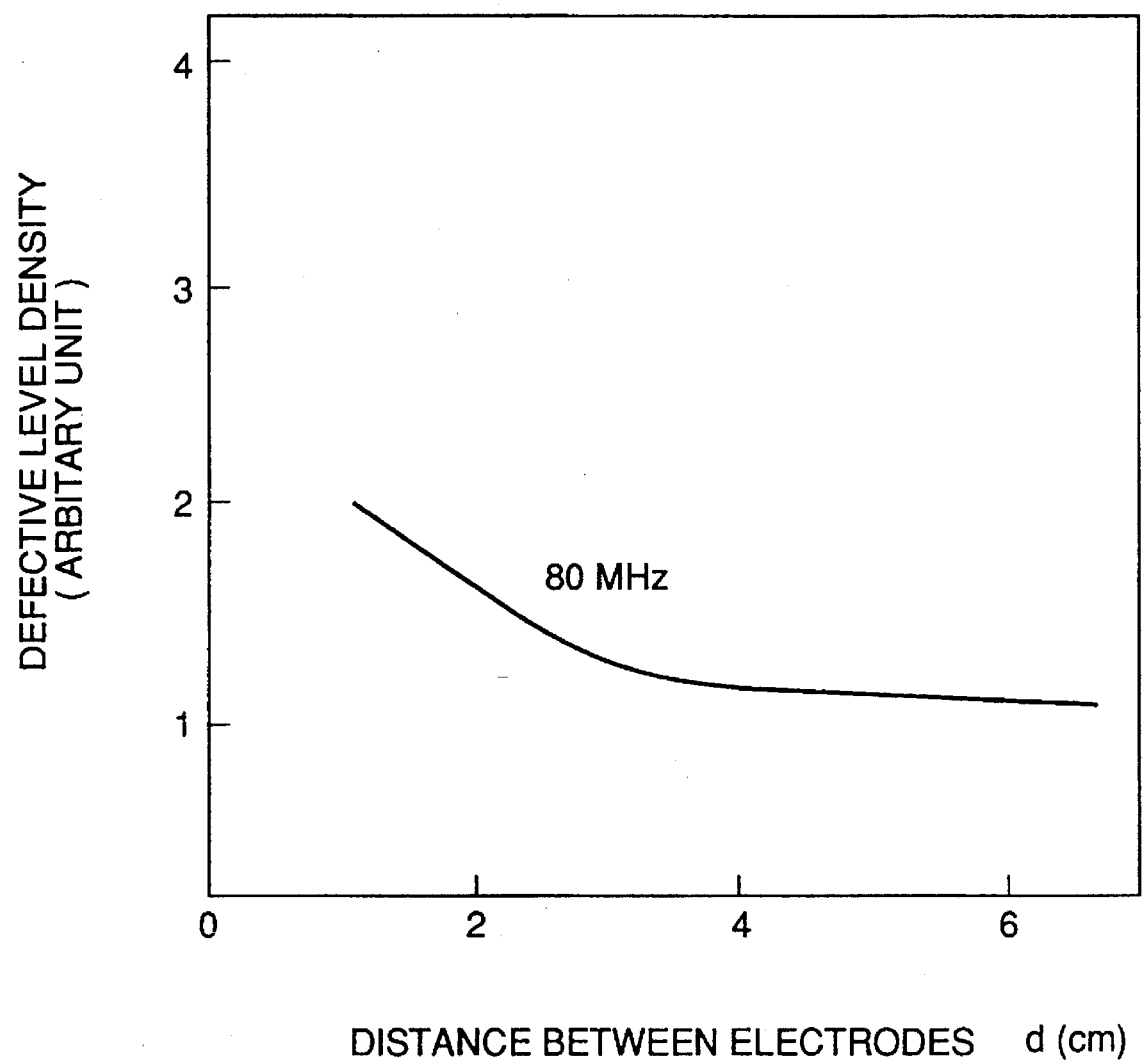
FIG. 8 illustrates an example of the relationship between the distance between electrodes and the density of defective level in the film.

FIG. 8 illustrates the relationship between the distance between the electrodes and the density of defective level in the film under a variety of conditions while applying a frequency of 80 MHz. It can be found that the density of the defects gradually decreases if the distance between the electrodes is 4 cm or longer. It is understood that the preferred distance between the electrodes is 4 cm or longer. Accordingly, the investigation was made in such a manner that the distance between the electrodes is 4 cm or 5 cm.

Figure 9:
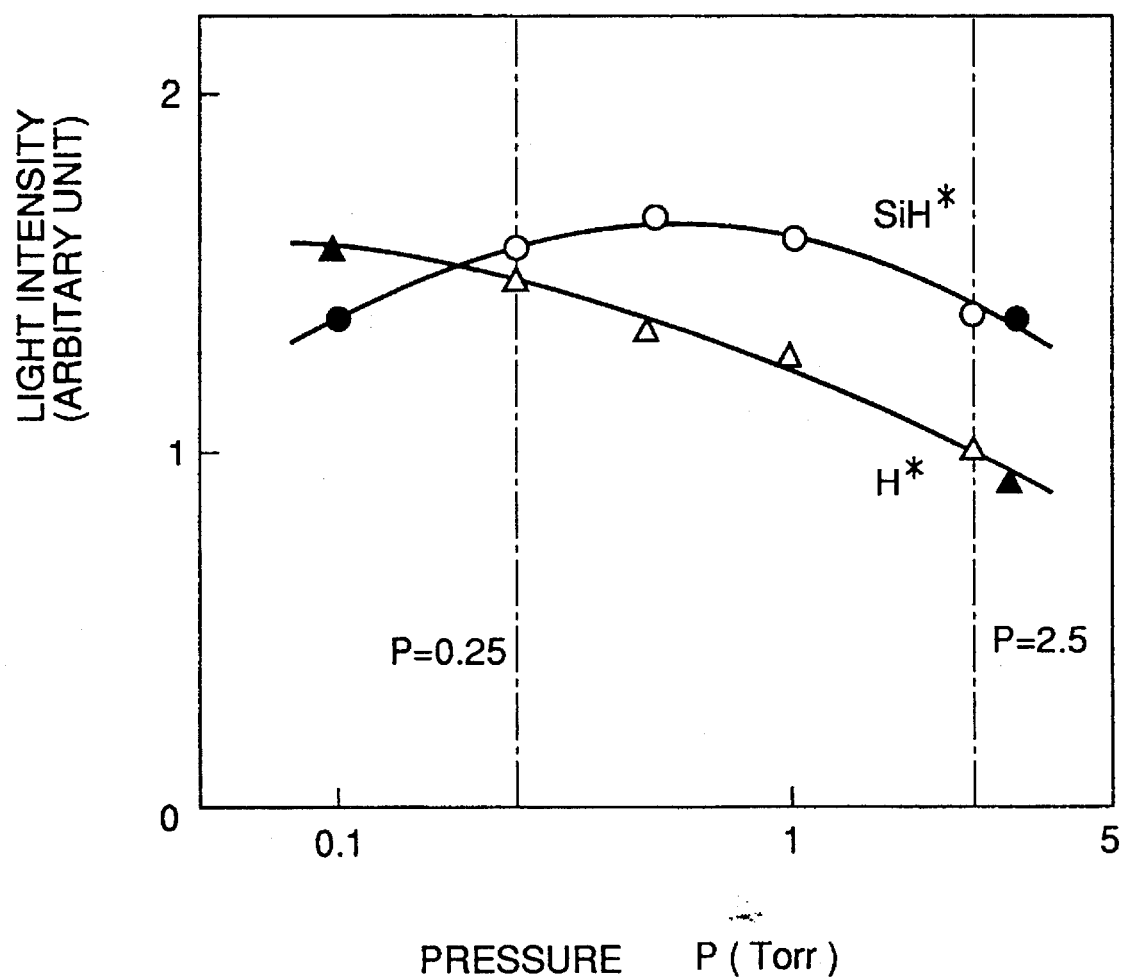
FIG. 9 illustrates an example of the relationship between the pressure and the light intensity.

While considering the foregoing film forming mechanism, the surface of the substrate must be sufficiently covered with hydrogen in order to obtain a high quality a-Si thin film. Therefore, a mixture gas obtained by diluting $SiH_4$ by $H_2$ is introduced at a ratio of $SiH_4:H_2=1:9$ into a plasma reaction chamber and discharge was performed under the conditions: the frequency f=80 MHz and the supplied electric power PW=0.07 W/$cm^2$. The relationship between pressure P (Torr) and the intensity of light of the SiH* and H* radicals is shown in FIG. 9. In order to obtain the satisfactory quality of the a-Si film, the pressure P (Torr) enabling the relationship of the intensity of light $[SiH*] \geq [H*]$ is in a range of $P \geq 0.25$ Torr. If P>2.5 Torr, foreign matters (polysilane) deteriorating the yield are generated. If the pressure P is in a range P<0.25 Torr, the quality of the film deteriorates such as the enlargement of the content of hydrogen and the increase in the $SiH_2$ bonds. That is, a high quality a-Si film can be obtained if the pressure P is 0.25 Torr or higher and as well as 2.5 Torr or lower. Similarly, the relationships between the frequencies f=13.56, 30, 50, 100, 120 and 150 and the light intensities are obtained, resulting in that the rise in f raised the light intensity but the ratio [H*]/[SiH*] was not changed considerably.

Figure 10:
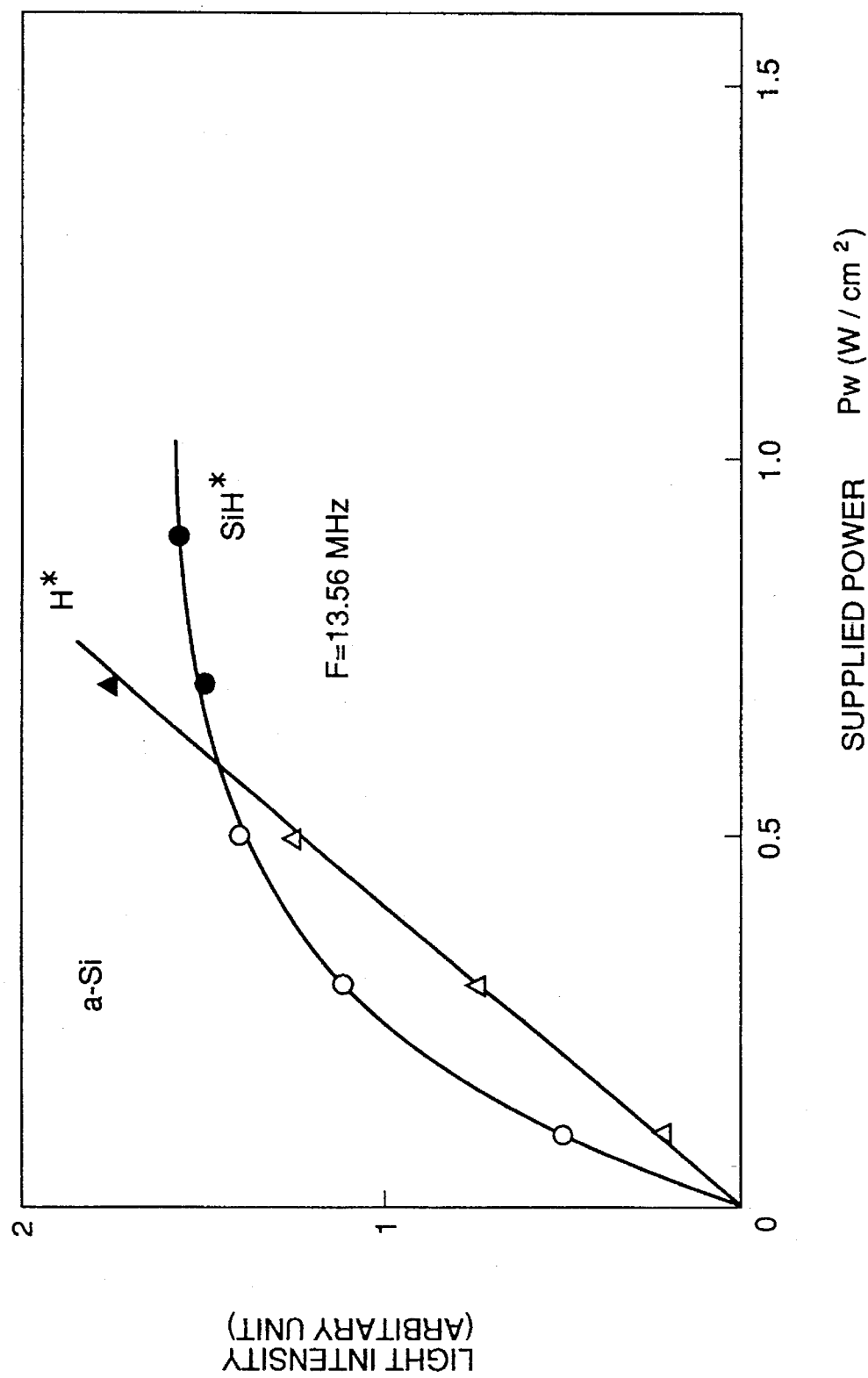
FIG. 10 illustrates an example of the relationship between power and the light intensity.
Figure 11:
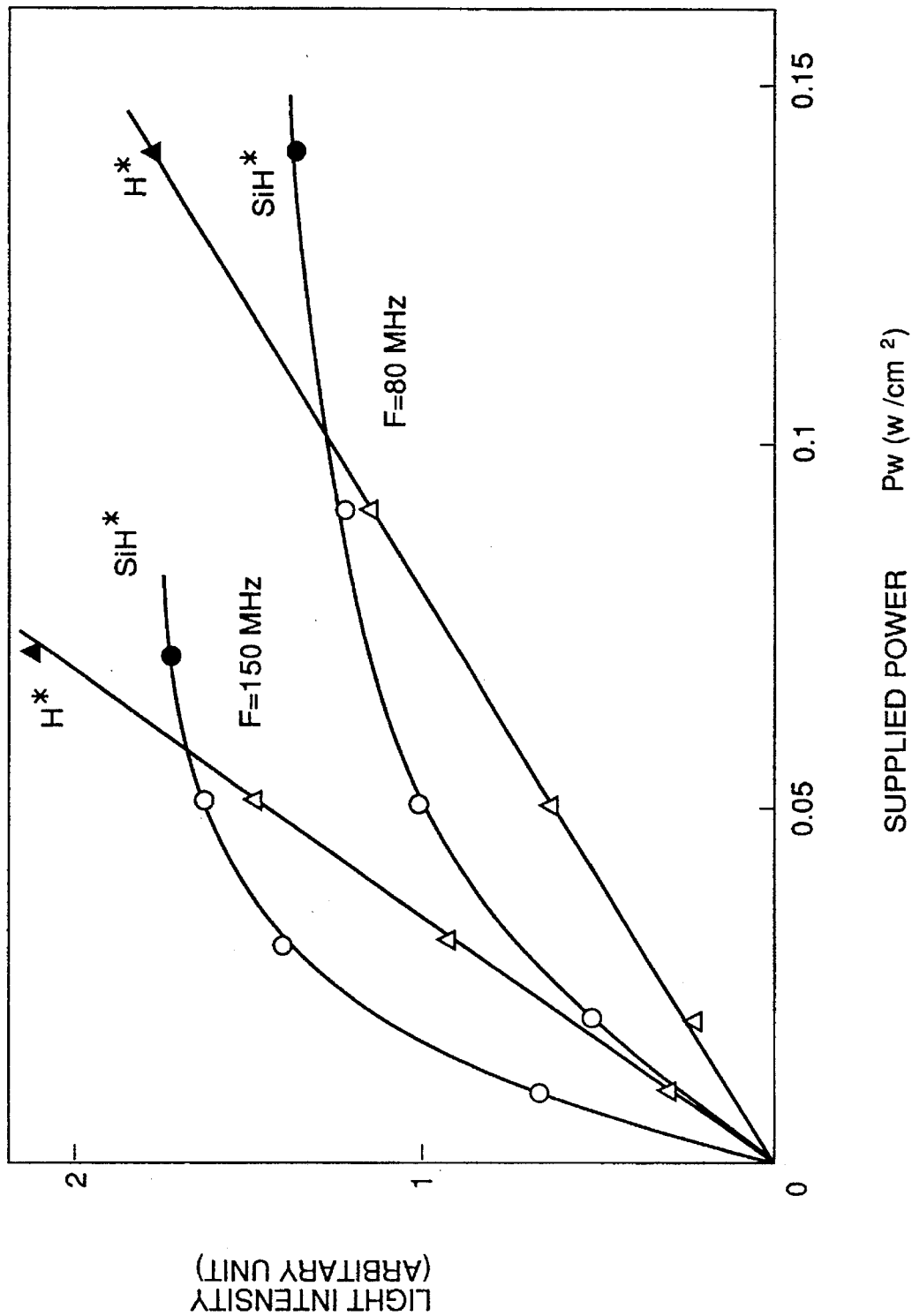
FIG. 11 illustrates an example of the relationship between the power and the light intensity.
Figure 12:
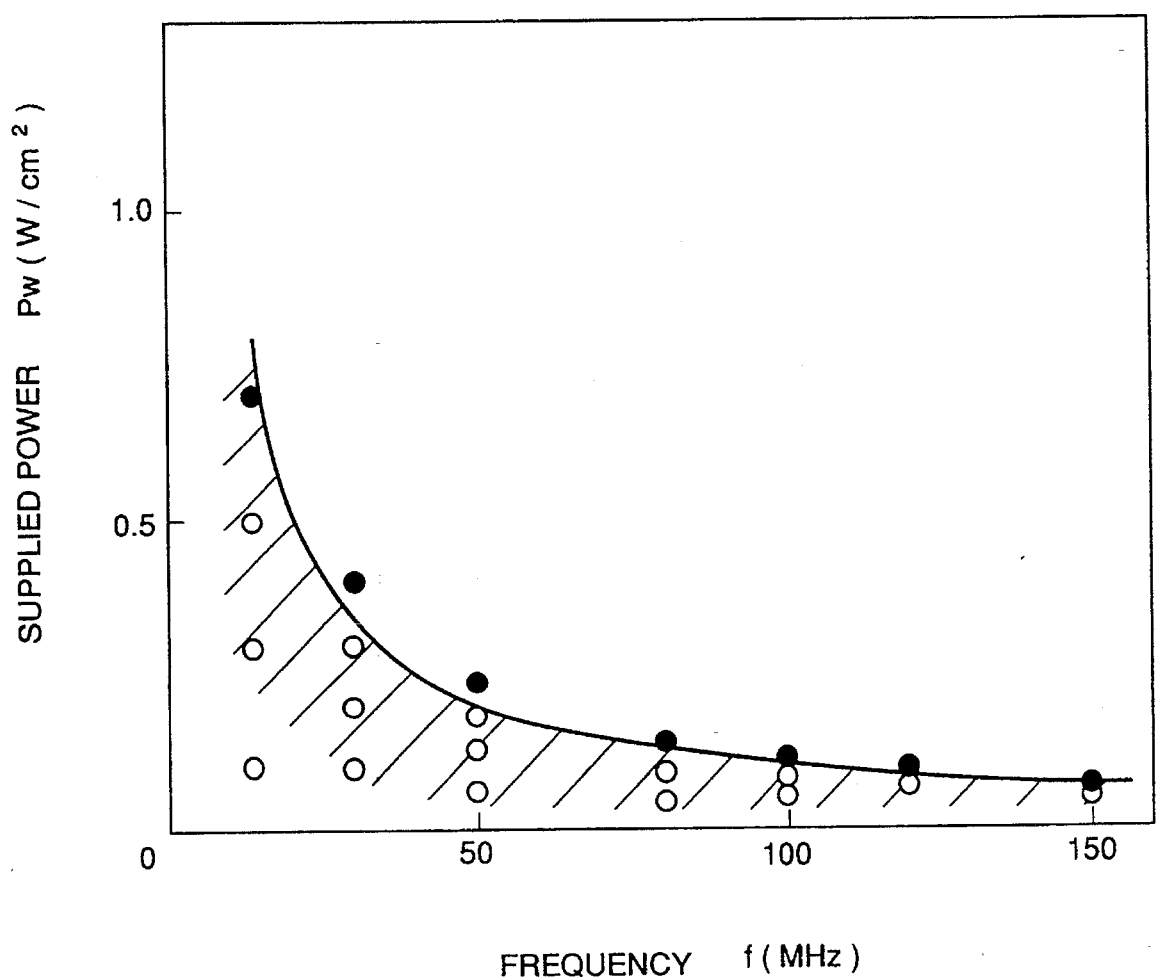
FIG. 12 illustrates an example of the relationship between the frequency and the power.

FIGS. 10 and 11 show the relationship between supplied electric power $P_W$ and the light intensities of the SiH* radical and the H* radical when the frequency of the high frequency power source is varied as f=13.56, 80 and 150 MHz while fixing the pressure as P=0.5 Torr for example. Referring to FIGS. 10 and 11, white plots o and Δ show the condition [SiH*]≧[H*], while black plots o and Δ show the condition [SiH*]<[H*]. The relationship between each frequency f and the supplied electric power $P_W$ at which [SiH*]≧[H*] is held is shown in FIG. 12. As can be seen from FIG. 12, the supplied electric power $P_W$ (W/cm$^2$) with respect to each frequency f must be a value smaller than a value defined by the relationship 10/f (MHz) in order to obtain the a-Si thin film although its physical means has not be cleared yet. The foregoing range is shown by diagonal lines. The white o plots in FIG. 12 show the conditions under which a high quality a-Si thin film could be obtained, while black o plots show the conditions under which an a-Si thin film, the quality of which was unsatisfactory, was obtained. As the optimum conditions for the high quality a-Si thin film, the supplied electric power $P_W$ with which the light intensity [H*]/[SiH*] is the minimum value was selected followed by forming the film.

Figure 13:
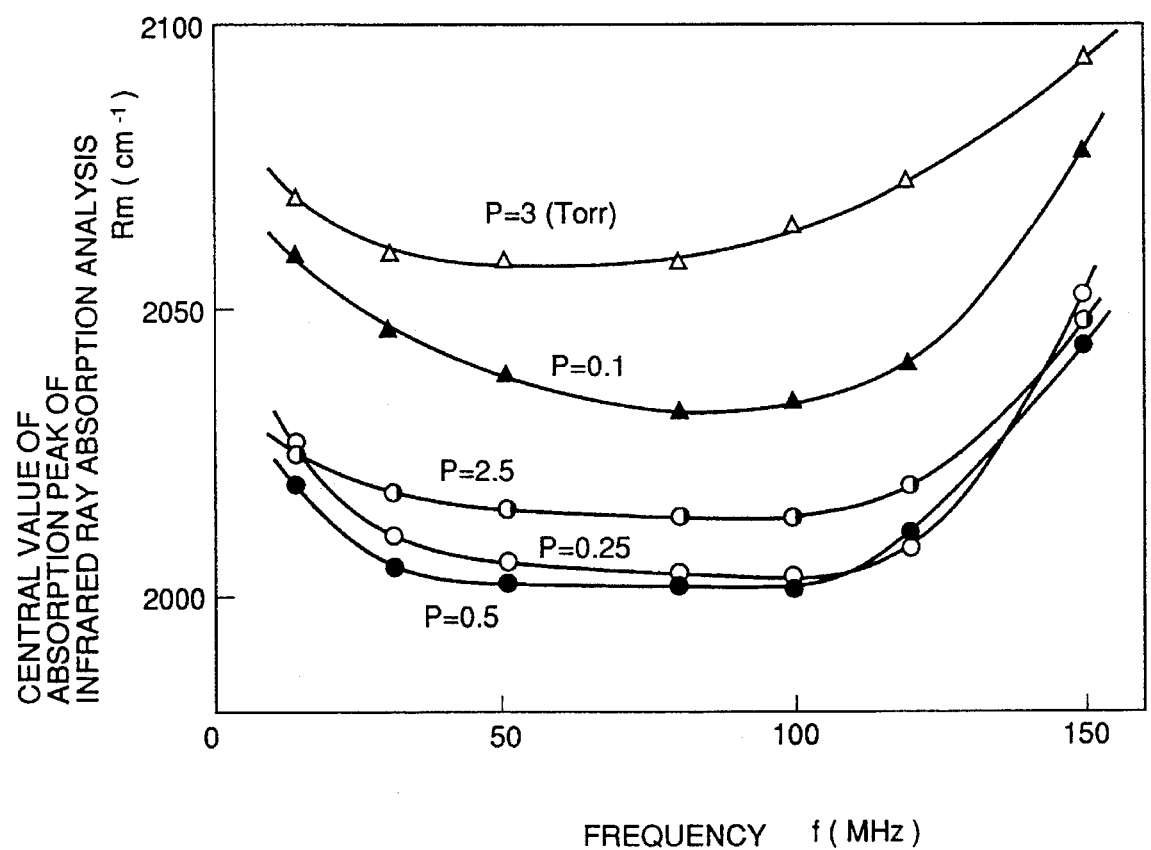
FIG. 13 illustrates an example of the relationship between the frequency and the state where hydrogen is bonded.

The relationship between the power source frequency f at each pressure for forming the a-Si thin film and the central value Rm in the infrared ray absorption analysis is shown in FIG. 13. The electric power supplied at this time is the optimum electric power to be supplied with which the ratio [H*]/[SiH*] can be minimized. For example, an electric power of 0.04 W/cm$^2$ is supplied when frequency is 80 MHz and the pressure is 0.5 Torr. In a region in which the frequency f is lower than 30 MHz, the film is defective because the substrate is excessively damaged by incidental ions and the content of the SiH$_2$ bond in the film is too large. In a region in which the frequency f is higher than 120 MHz, the content of the SiH$_2$ bonds in the film is too large, resulting in the deterioration in the quality of the film. The reason for this is that the Si, SiH and SiH$_2$ radicals increase due to the excessive decomposition of the SiH$_4$ molecules but the SiH$_3$ radicals are reduced. The aforesaid region encounters problems of the film thickness and the distribution of the quality of the formed film at the time of forming the film over a large area.

Figure 14:
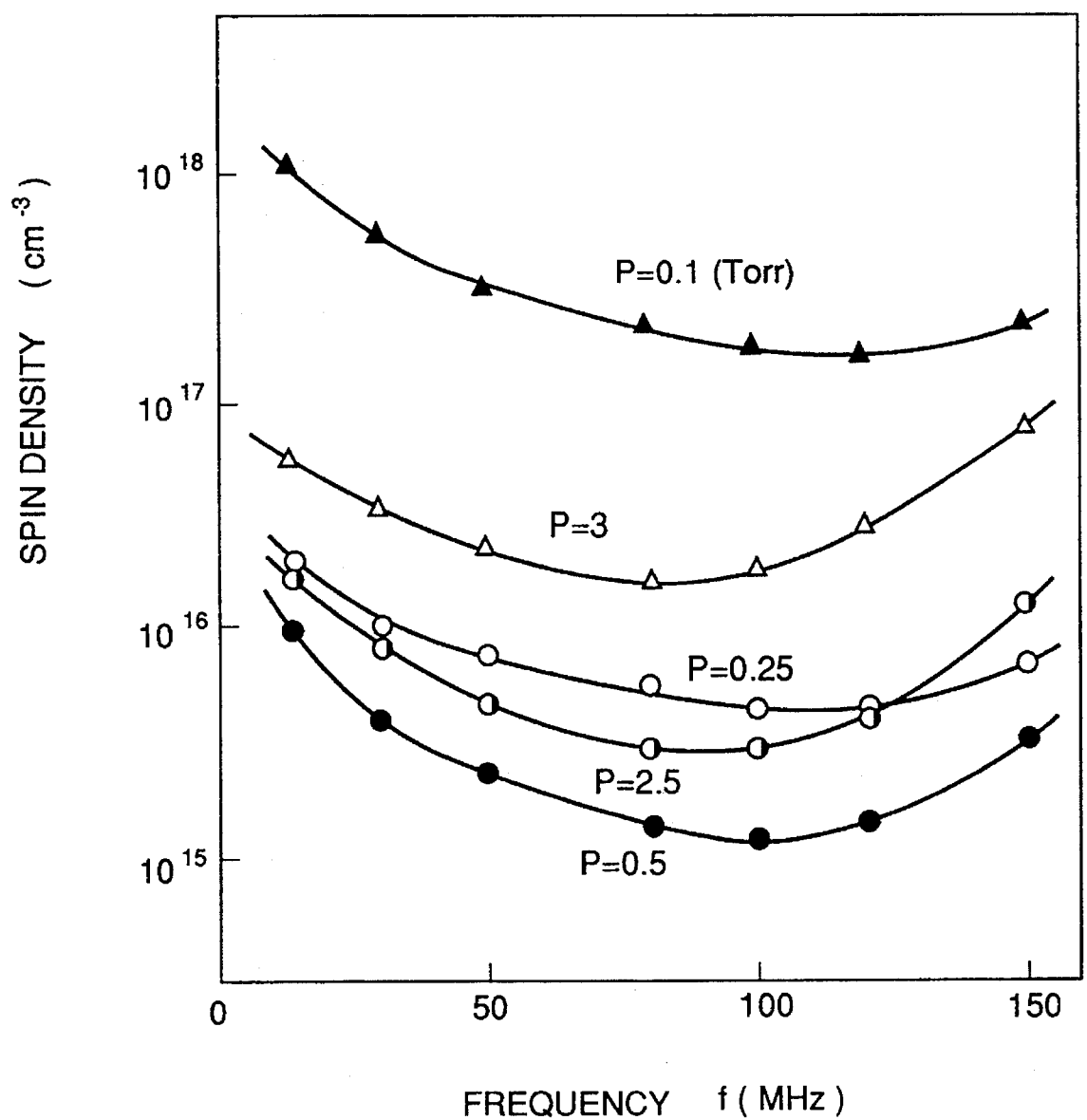
FIG. 14 illustrates an example of the relationship between the frequency and the spin density.

In the range in which the film forming pressure is from 0.25 to 2.5 Torr, a high quality a-Si film can be obtained as shown in FIG. 13. However, the high quality a-Si film cannot be obtained at the other film forming pressures because of a consideration that the substrate is damaged excessively by the incidental ions in the pressure range of p<0.25. In the pressure range p>2.5, polysilane is considered to be generated. FIG. 14 illustrates the relationship between the frequency f and the spin density while using each film forming pressure as the parameter in a manner similar to the foregoing graphs.

Figure 15:
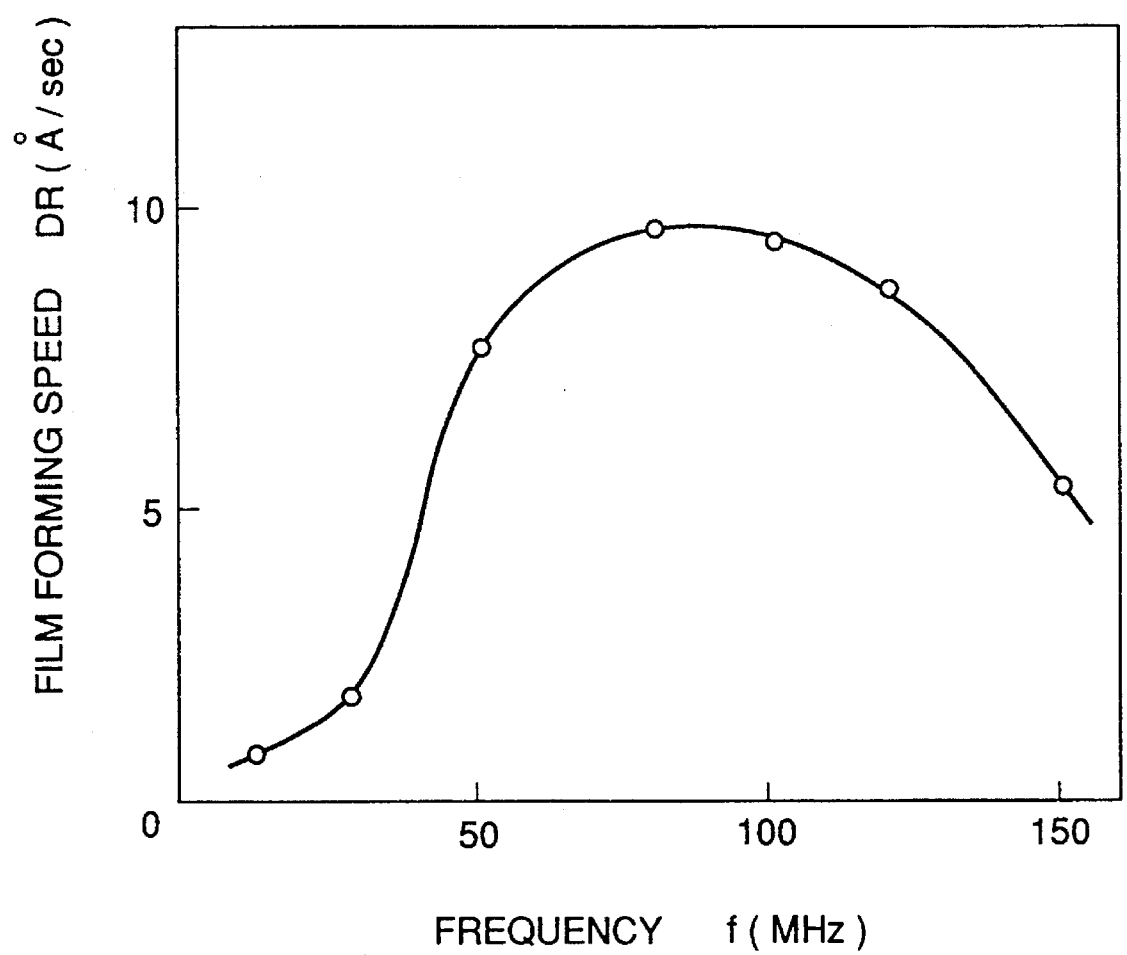
FIG. 15 illustrates an example of the relationship between the frequency and the film forming speed.
Figure 16:
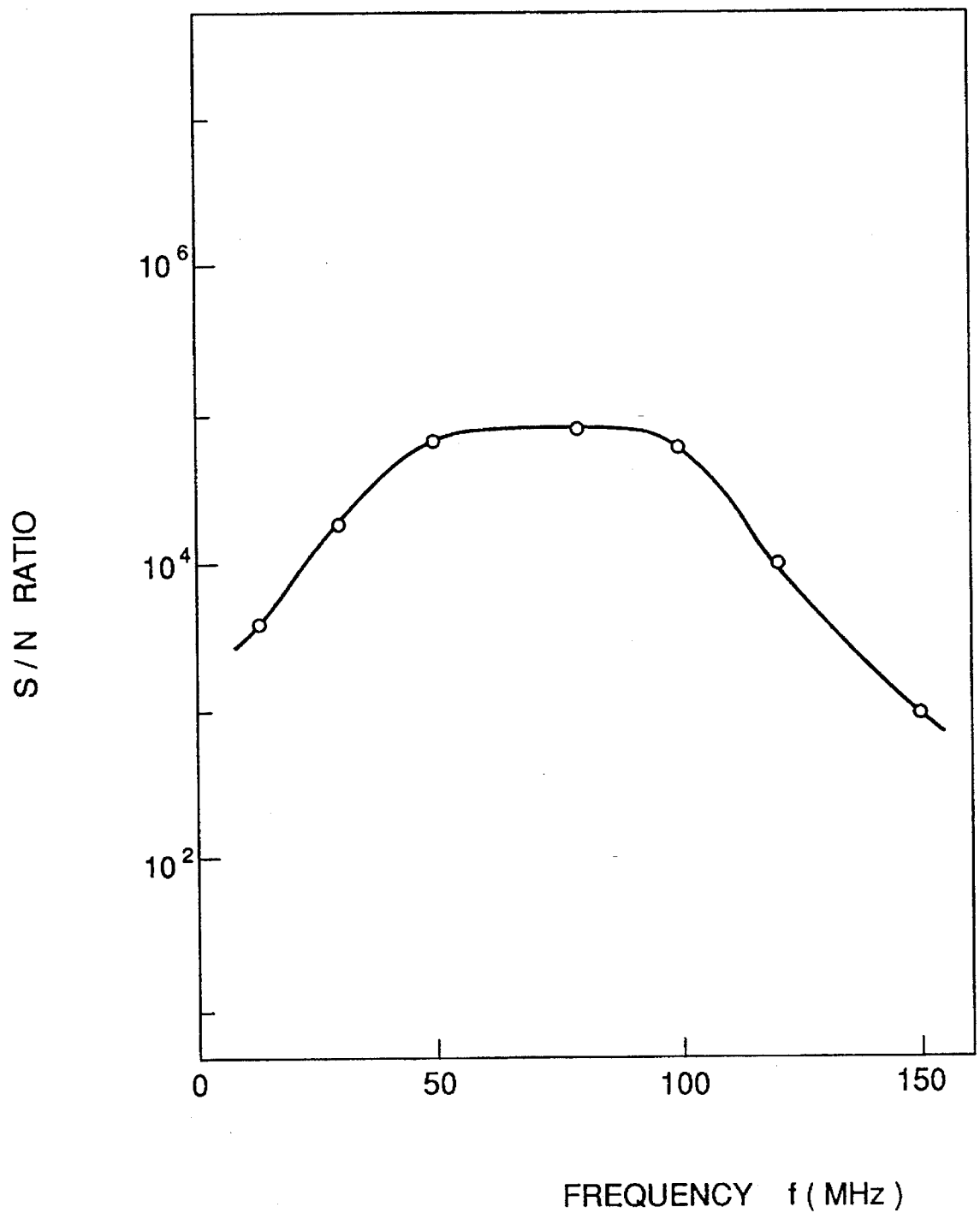
FIG. 16 illustrates an example of the relationship between the frequency and the photoelectric characteristics.
Figure 17:
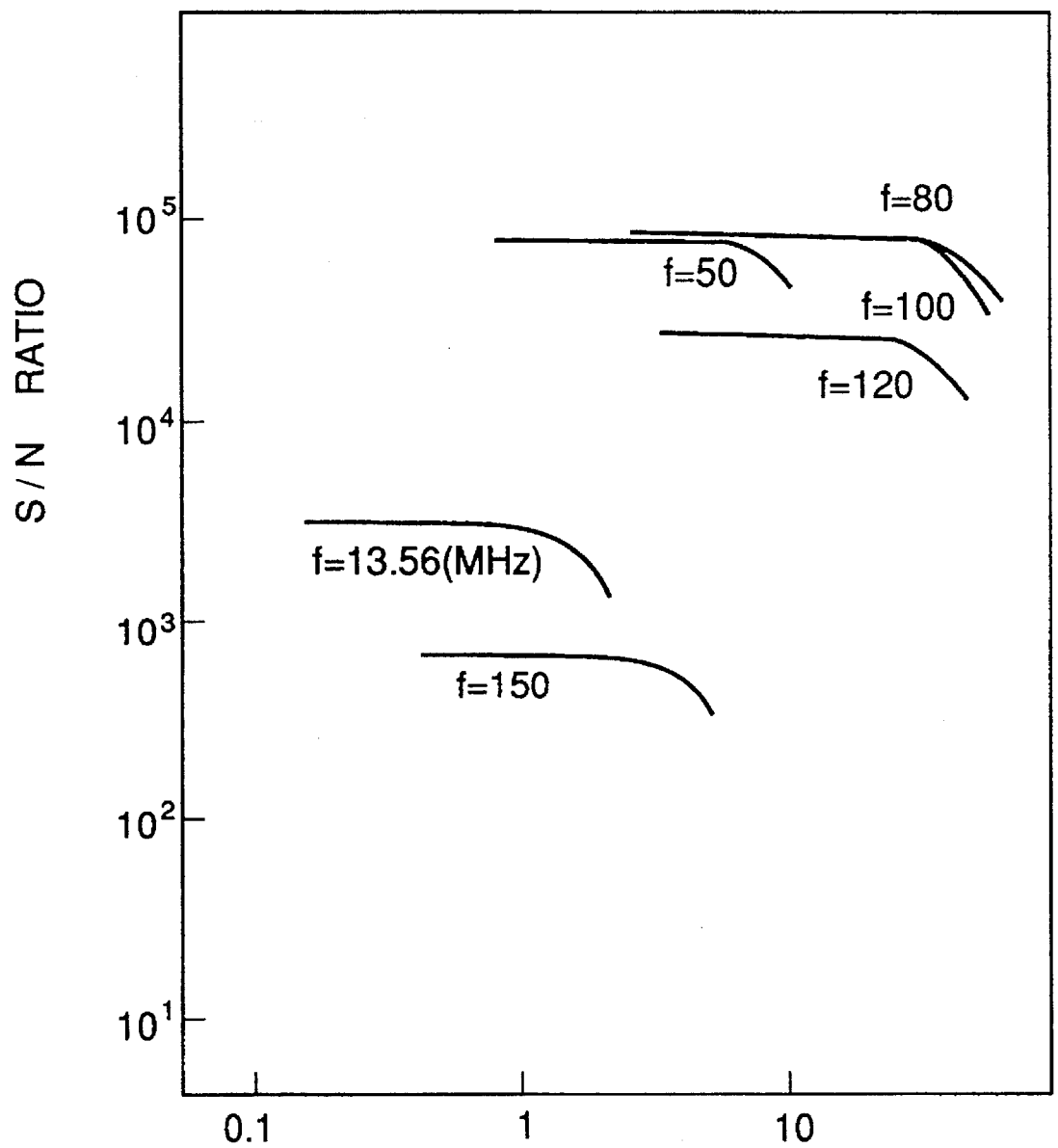
FIG. 17 illustrates an example of the relationship between the film forming speed and the photoelectric characteristics.

The relationship between the frequency f and the film forming speed DR when the pressure is 0.5 Torr and the supplied electric power is 0.04 W/cm$^2$ is shown in FIG. 15 for example. The dependency of the S/N ratio of the photoconductivity $\sigma_p$ (S/cm) and the dark conductivity $\sigma_d$ (S/cm) is shown in FIG. 16. The relationship between the film forming speed and the S/N ratios with respect to the frequencies are shown in FIG. 17.

As a result, an a-Si thin film exhibiting excellent quality and revealing satisfactory manufacturing facility can be manufactured when the frequency is ranged from 30 MHz to 120 MHz. It is preferable that the frequency is from 50 MHz to 100 MHz to improve the photoelectric characteristics.

Then, the residence time τ (sec) was confirmed under the following conditions that the pressure p=0.5 Torr, the frequency f=80 MHz and the electric power $P_W$=0.04 W/cm$^2$. The residence time τ (sec) is the time in which the raw material gas Q (sccm) is retained in the discharge space V (cm$^3$) in a case where the raw material gas Q (sccm) introduced into the discharge space V (cm$^3$) is controlled to maintain the pressure P (Torr) at a constant level, the residence time τ being expressed by the following equation:

$$\tau = 78.947 \times 10^{-3} \times V \times P/Q$$

Figure 18:
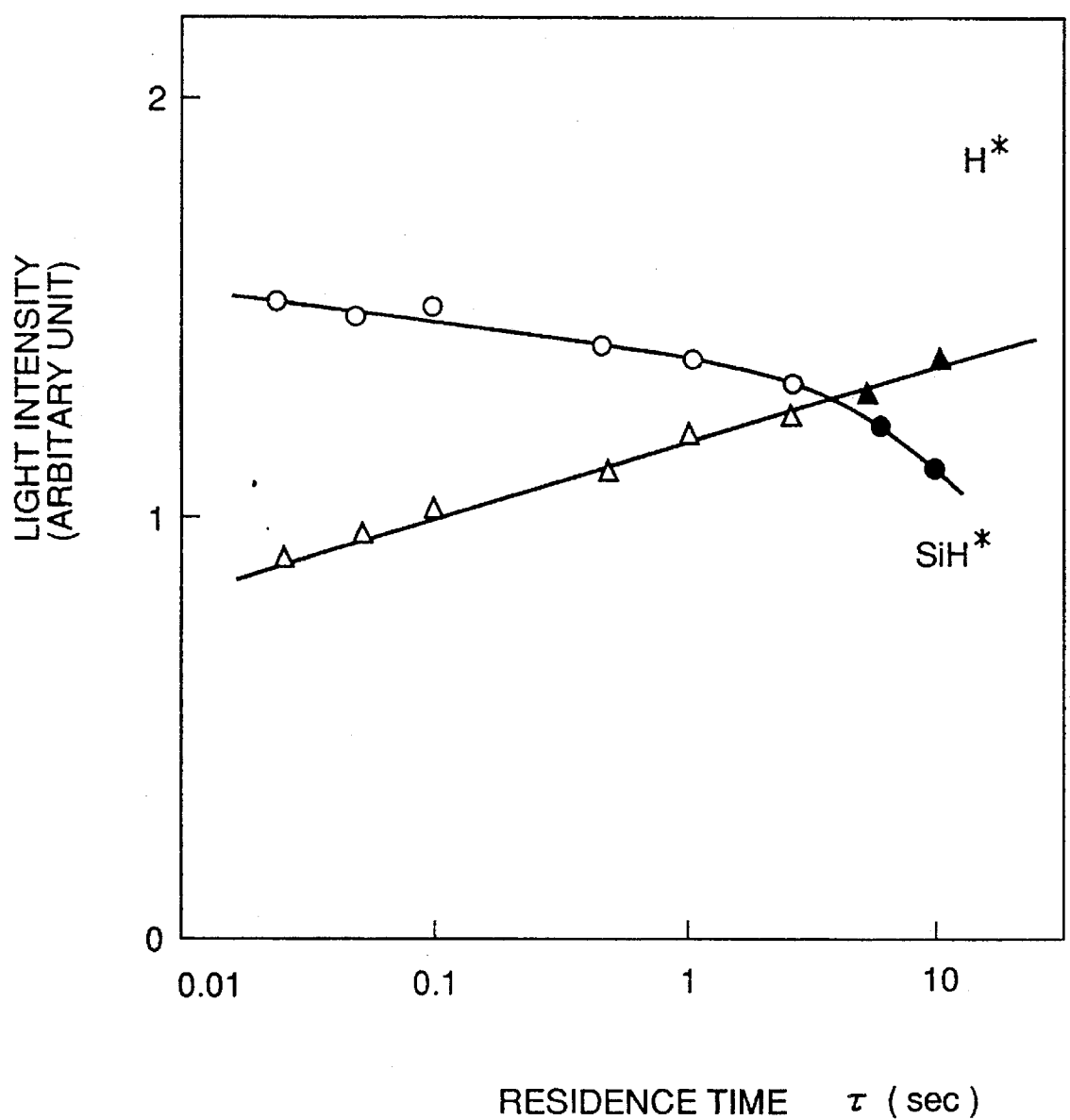
FIG. 18 illustrates an example of the relationship between the residence time and the light intensity.
Figure 19:
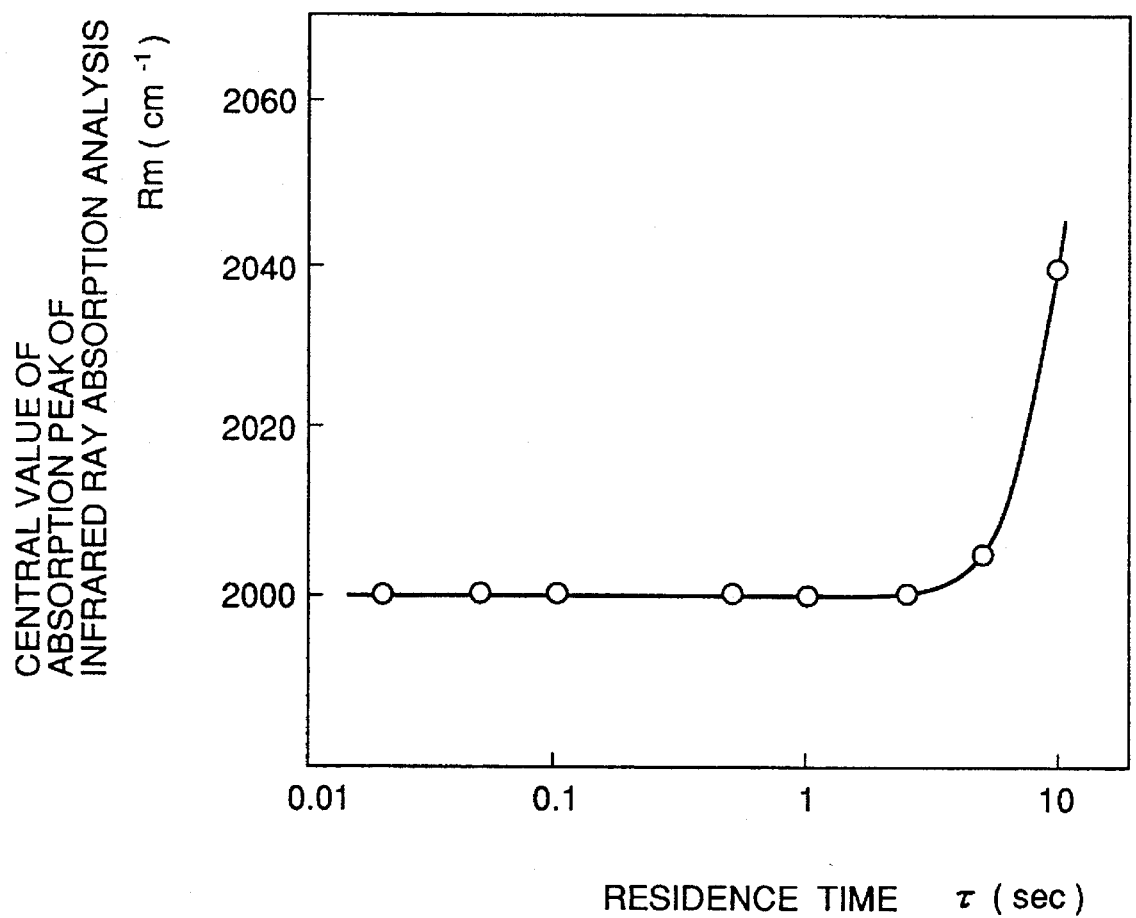
FIG. 19 illustrates an example of the relationship between the residence time and the state where hydrogen is bonded.

The relationship between the residence time τ and the light intensity of the SiH* radicals and the H* radicals is shown in FIG. 18. Since the relationship with the light intensity must hold the relationship [SiH*]≧[H*] in order to obtain a high quality a-Si thin film, the residence time τ must be 2.5 sec or shorter. Referring to FIG. 18, while plots o and Δ designate the conditions under which the relationship [SiH*]≧[H*] can be held, while black plots o and Δ designate the conditions under which the relationship [SiH*]<[H*] can be held. The change in the quality of the film due to the residence time τ expressed by the central value Rm in the infrared ray absorption analysis is resulted as shown in FIG. 19. As can be seen from FIG. 19, in the range in which the residence time τ>2.5, the ratio of the SiH$_2$ bonds rises in the a-Si thin film, resulting in the deterioration in the quality of the film. Similarly, the S/N ratio of the photoconductivity $\sigma_p$ (S/cm) and the dark conductivity $\sigma_d$ (S/cm) deteriorated in the case where τ>2.5 sec.

That is, the fact that the preferred residence time τ is 2.5 sec or shorter can be understood.

Figure 21:
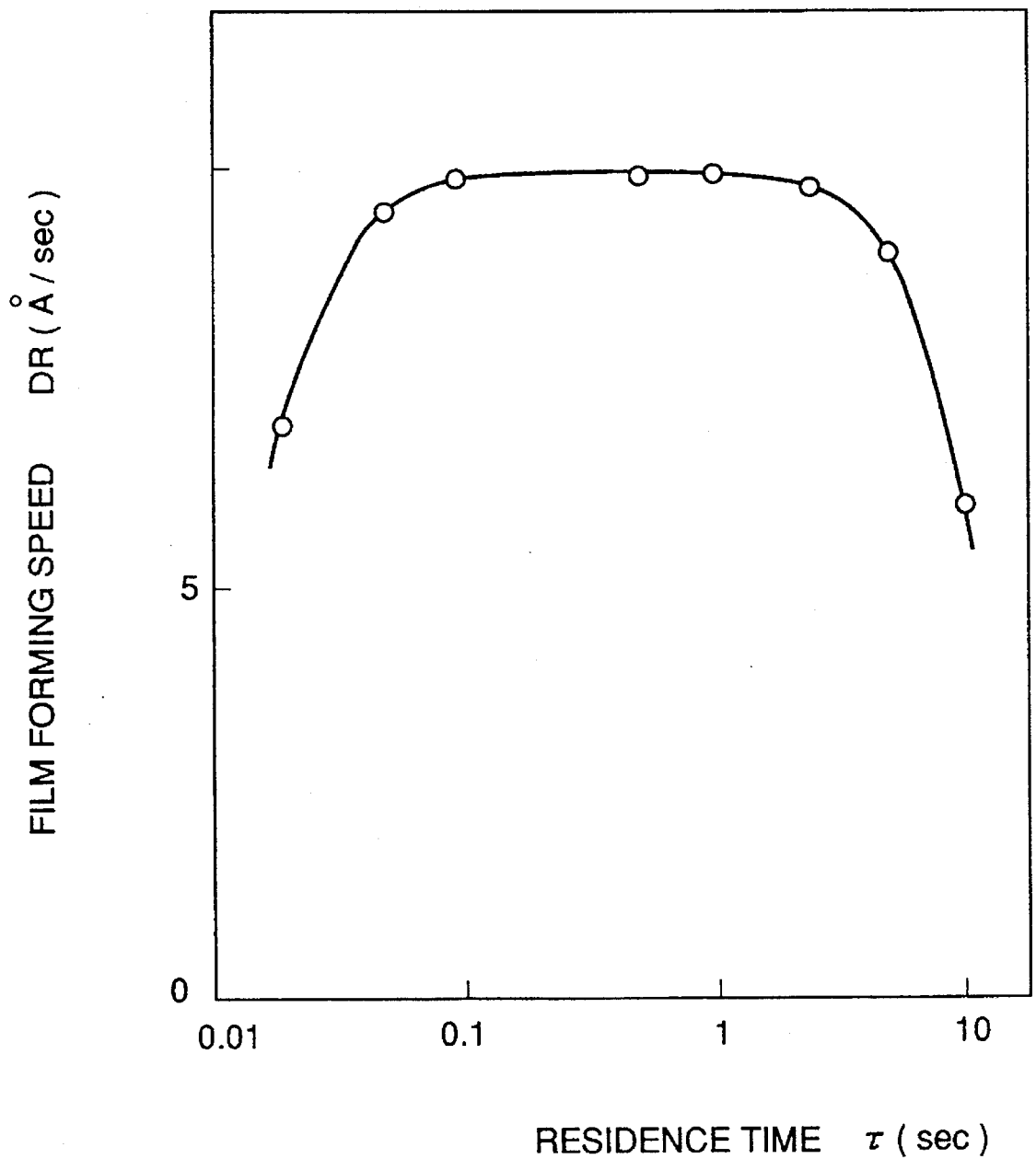
FIG. 21 illustrates an example of the relationship between the residence time and the film forming speed.
Figure 22:
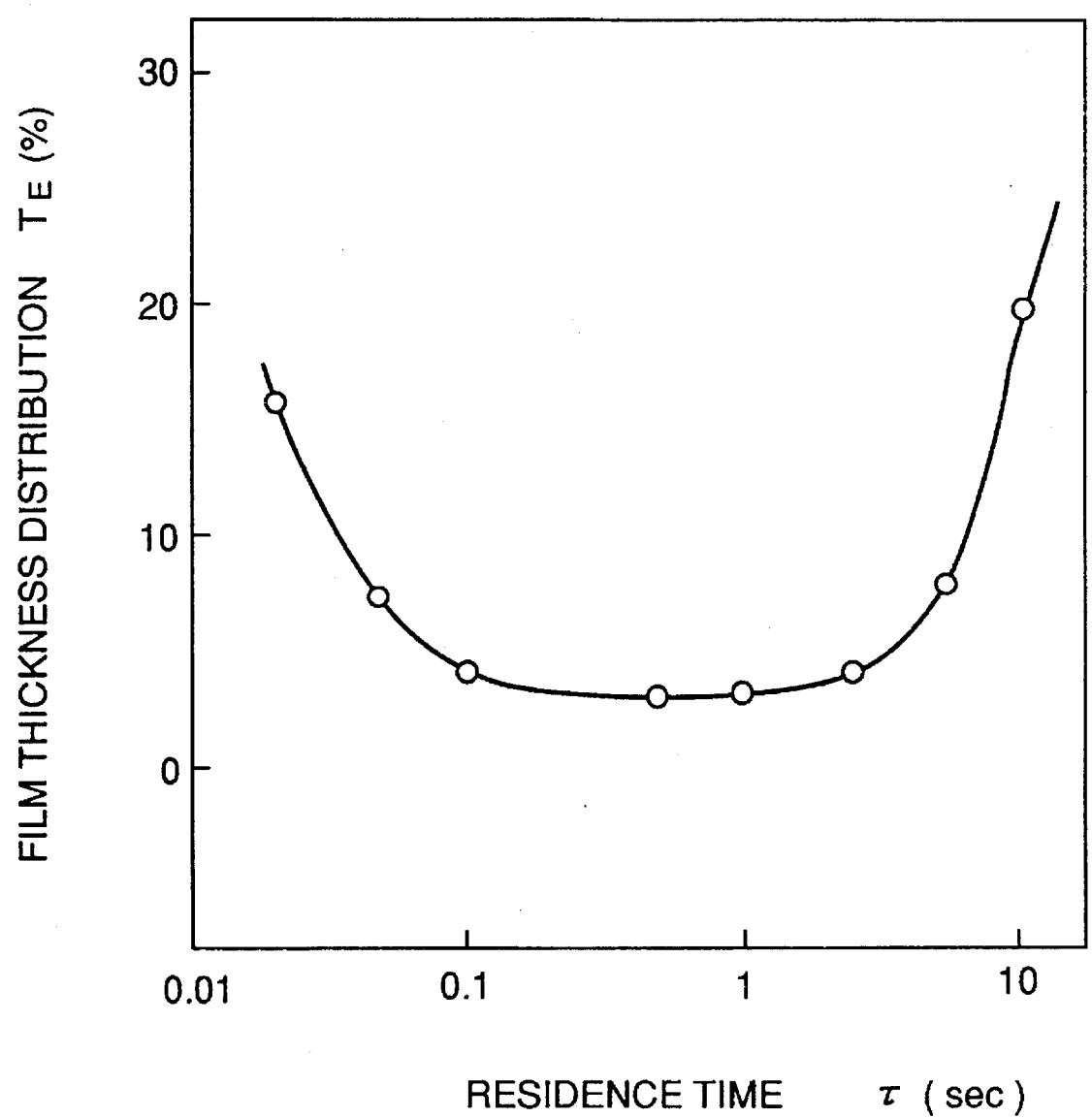
FIG. 22 illustrates an example of the relationship between the residence time and the film thickness distribution.

The relationship between the residence time τ and the film forming speed DR is shown in FIG. 21. The relationship between the residence time τ and the film thickness distribution $T_E$ (%) in the substrate is shown in FIG. 22. Assuming that the maximum film thickness and the minimum film thickness respectively are $T_{MAX}$ and $T_{MIN}$, the film thickness distribution in the substrate is expressed by: $T_E=(1-T_{MIN}/T_{MAX}) \times 100$. The size of the substrate is 30 cm×30 cm. As can be seen from FIG. 21, the film forming speed starts lowering if the residence time τ is shorter than 0.05 sec. Similarly, the film forming speed lowers when the residence time τ is longer than 0.05 sec. The reason for this can be considered that the reactive radicals generated due to the discharge are discharged prior to its reach to the surface of the substrate if the residence time τ is short. If the residence time τ is long, an assumption is made that the wanting of the raw material simply lowers the film forming speed. The same assumptions can be made in the case shown in FIG. 22. If the residence time τ is shorter than 0.05 sec, a distribution following the raw material gas flow is generated. If the residence time τ is longer than 5 sec, the distribution is generated startling at the portion to which the raw material gas is introduced. It is preferable that the distribution is 10% or less as a reference.

That is, the film forming speed is lowered in the region τ<0.05 sec, resulting in the wide film thickness distribution. Therefore, the residence time τ must be 0.05 sec or longer in terms of forming a large-area film and the manufacturing facility.

Figure 20:
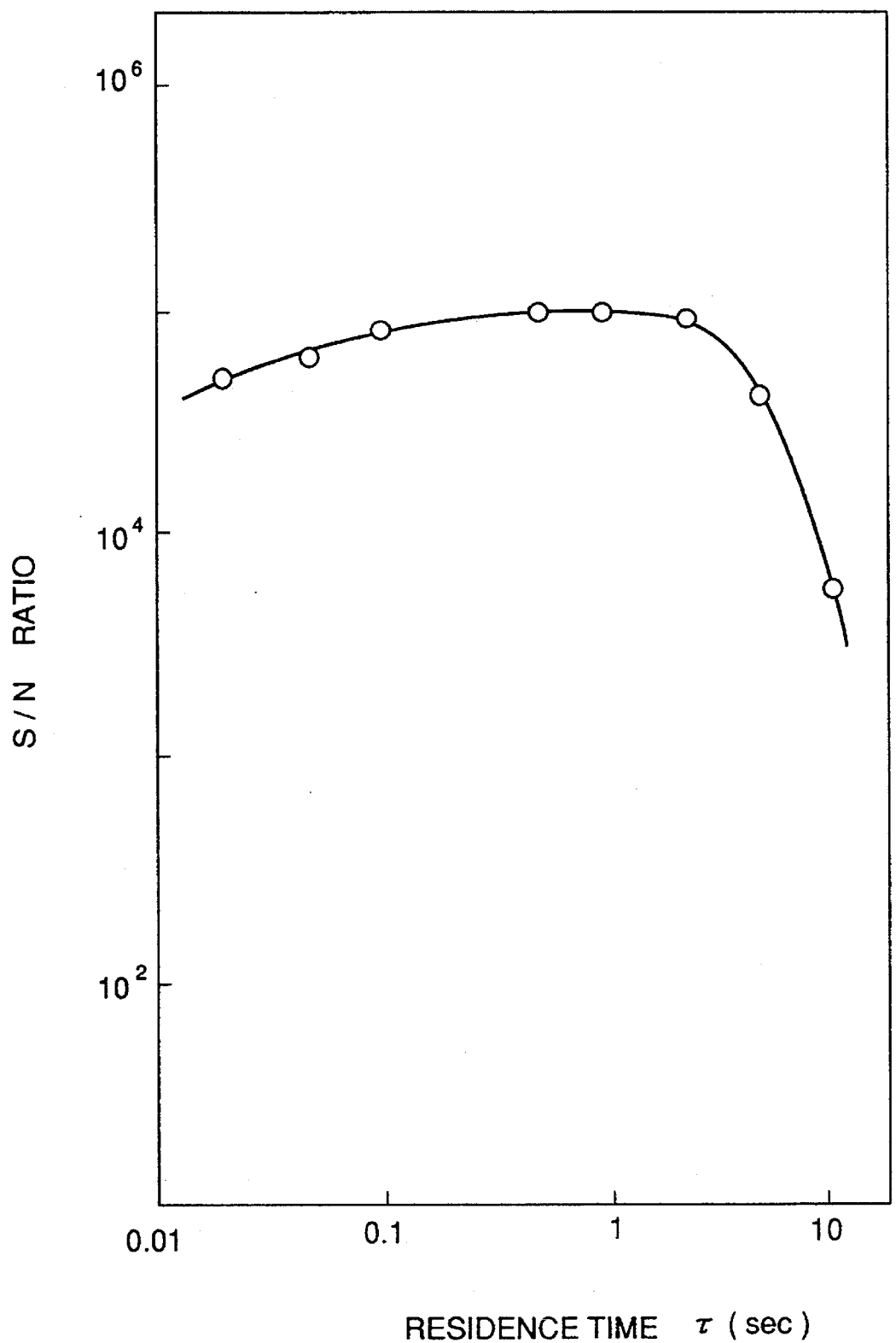
FIG. 20 illustrates an example of the relationship between the residence time and the photoelectric characteristics.

As a result, a large-area thin film device can be manufactured uniformly at an excellent yield by making the residence time τ (sec) to be from 0.05 sec to 2.5 sec. It is preferable that the residence time τ is from 0.1 sec to 2.5 sec, resulting in the improvement in the photoelectric characteristics as shown in FIG. 20.

If the conventional point of view is employed in which the quality of the film can be improved by hydrogen covering the surface terminates the dangling bonds in the a-Si film, hydrogen can be sufficiently adsorbed when the temperature of the substrate is low, and, therefore, the density of the dangling bond is low. However, the density of the dangling bond is unexpectively raised.

The reason for this is considered by the inventor of the present invention that the role of hydrogen covering the surface is not to terminate directly the dangling bond but to improve the surface mobility of the $SiH_3$ radicals serving as the reaction precursors. If a consideration is made that the enhancement of the surface mobility decreases the dangling bonds, an estimation can be made that the rise in the dangling bond at a lower substrate temperature is due to a fact that the surface mobility of the reaction precursor is too low due to the low temperature although the surface of the substrate is covered with hydrogen.

In the foregoing view point, it is important to improve the surface mobility of the $SiH_3$ radicals in order to manufacture the high quality a-Si thin film.

In order to terminate the dangling bonds, the surface mobility of the $SiH_3$ radicals must be improved and the $SiH_3$ radicals which reach and are adsorbed by the substrate must be increased.

It is considered that the adsorption and removal of hydrogen are always performed in the surface of the substrate. An assumption is made that the dangling bonds are generated if hydrogen in the surface is removed followed by being left from the termination by hydrogen or the $SiH_3$ radicals.

(1) Surface Condition $$\sigma\text{-SiH} \rightarrow \sigma\text{-Si} + (\tfrac{1}{2})H_2 \qquad (1)$$

$$\sigma\text{-SiH} \leftarrow \sigma\text{-Si} + (\tfrac{1}{2})H_2 \qquad (2)$$

where symbol $\sigma$ is an active point of Si in the surface of the substrate. If the temperature of the substrate is low, Equation (2) proceeds in main. If the temperature is high, Equation (1) proceeds in main. Schematically, the surface of the formed film is covered with hydrogen if the temperature is a low temperature of 300° C. or lower. If the temperature is a high temperature of 300° C. or higher, the dangling bonds are formed in the surface of the formed film. The foregoing state is, although indirectly, clearly expressed by the relationship between the film forming speed and the temperature of the substrate. The film forming speed is raised in proportion to the rise of the temperature of the substrate when the temperature of the surface is higher than 300° C. If the temperature is lower than 300° C., the film forming speed is made constant regardless of the temperature of the substrate. The reason for this can be expected since the surface of the formed film is a constant surface when the temperature of the substrate is lower than 300° C. In general, the surface is covered with hydrogen and, therefore, the $SiH_3$ radicals perform bimolecular reactions for drawing hydrogen and reacted with the other $SiH_3$ radicals. It can be understood that the state of the surface of the formed film is changed when the temperature of the substrate rises in the case where the temperature is higher than 300° C. That is, if hydrogen in the surface is separated and the $SiH_3$ radicals are reacted in the foregoing portion, hydrogen is removed, thus resulting in the rise in the film forming speed.

Then, the $SiH_3$ radicals generated in the plasma is diffused in the surface of the substrate followed by reaction with the active point.

(2) Surface Reaction $$\sigma\text{-SiH} + SiH_{3(act)} \rightarrow \sigma\text{-SiH}_3 + (\tfrac{1}{2})H_2 \qquad (3)$$

$$\sigma\text{-Si} + SiH_{3(act)} \rightarrow \sigma\text{-SiH}_3 \qquad (4)$$

At this time, $SiH_{3(act)}$ in Equations (3) and (4) are considered to be $SiH_3$ radicals in a state where it is able to react with the active point of the surface of the substrate, that is, reactive radicals adsorbed by the surface and therefore capable of shifting to the active point. It can be understood that the dangling bonds expressed by Equation (2) by the reaction expressed by Equation (4) can be terminated by increasing $SiH_{3(act)}$. That is, a large quantity of the $SiH_3$ radicals must be diffused in the substrate and the $SiH_3$ radicals adsorbed to the surface of the substrate must be activated. The effect obtainable from Equation (2) increase only hydrogen in the film.

The present invention is so arranged that the $SiH_3$ radicals are increased in the plasma CVD method using silicon compound as the main raw material gas by the following manner: the frequency f of the high frequency power source is made to be 30 MHz or lower, preferably from 50 MHz to 100 MHz, and negative voltage is applied to the electrode of the substrate in order to control the irradiation of the surface of the substrate with ions for the purpose of causing the $SiH_3$ radicals to be activated in the surface of the formed film and to be diffused in the surface. Thus, the characteristics of the thin film can be further improved and, accordingly, the film can be formed at a high speed.

Figure 23:
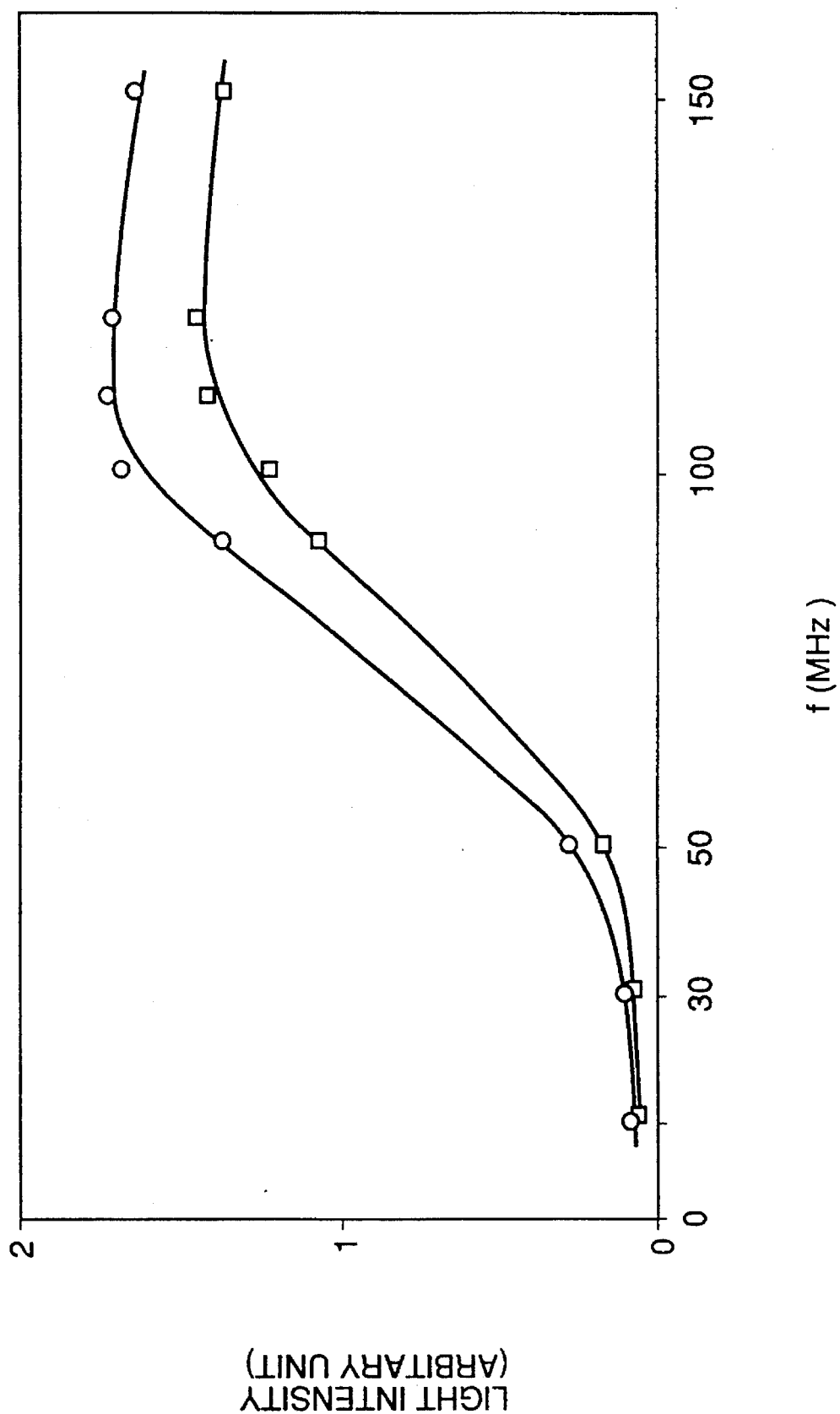
FIG. 23 illustrates an example of dependency of the light intensity [SiH*] of SiH* radicals and the light intensity [H*] of hydrogen radicals upon applied frequency f.
Figure 24:
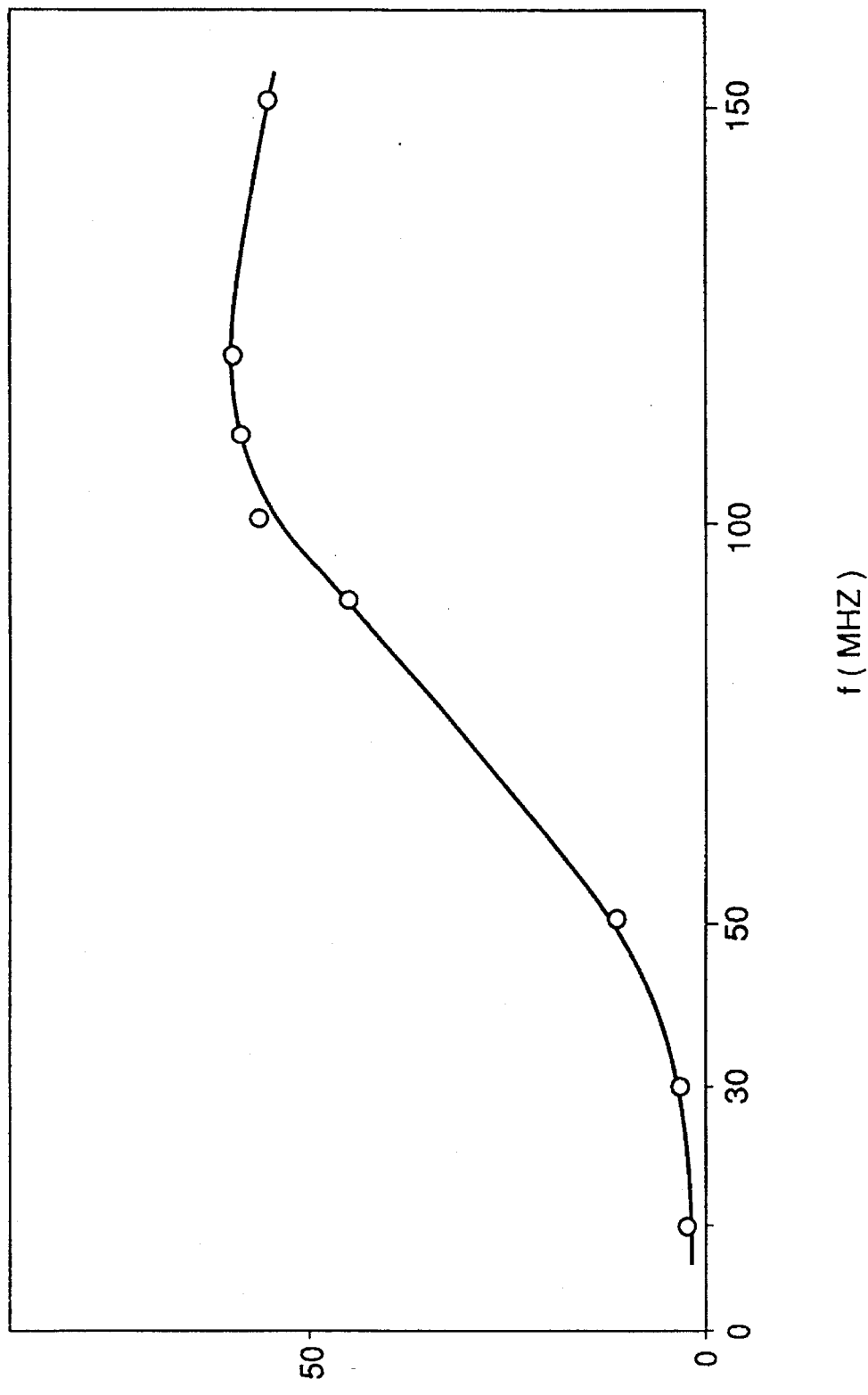
FIG. 24 illustrates dependency of film forming speed R upon the applied frequency f.

FIG. 23 shows the dependency of the light intensity [SiH*] of the SiH* radicals (414 nm) and the light intensity [H*] of the hydrogen radicals upon the high frequency f applied. FIG. 24 shows the dependency of the film forming speed R upon the applied high frequency f. The conditions are set at this time that the flow rate of $SiH_4$ is 10 sccm, the pressure is 0.5 Torr, and the high frequency electric power to be supplied is 10 m/cm².

As shown in FIG. 23, the rise in the applied high frequency f causes the SiH* radicals and H* radicals in the plasma to start increasing at about f=30 MHz. However, a maximal value is attained at about from f=80 MHz to 100 MHz followed by a tendency of decreasing. Since the rate of the decompositions of the silane gas and the hydrogen gas depend upon the electron density ne in the plasma, the SiH* radicals and H* radicals also depend upon the electron density ne. Therefore, it can be considered that the electron density ne in the plasma shows the dependency upon the applied high frequency f, and the light intensity of the radicals depends upon the high frequency as shown in FIG. 23.

If the film forming conditions are varied from those shown in FIG. 15, the film forming speed R is changed with respect to the applied high frequency f as shown in FIG. 24.

Also in this case, the film forming speed R starts increasing at about f=30 MHz in proportion to the applied high frequency f, resulting in the maximal value at about from f=80 MHz to 100 MHz. Accordingly, the effect of the present invention can be satisfactorily exhibited when the frequency is ranged from 30 MHz to 120 MHz. It can be considered that the film forming speed in the silane gas is in proportion to [SiH*] and the tendency shown in FIG. 24 depends upon the tendency of [SiH*] even if the film forming conditions are changed. Therefore, it can be considered that the applied frequency relates to the silane radical contributing to the film forming, and thus the film forming speed is changed.

Figure 25:
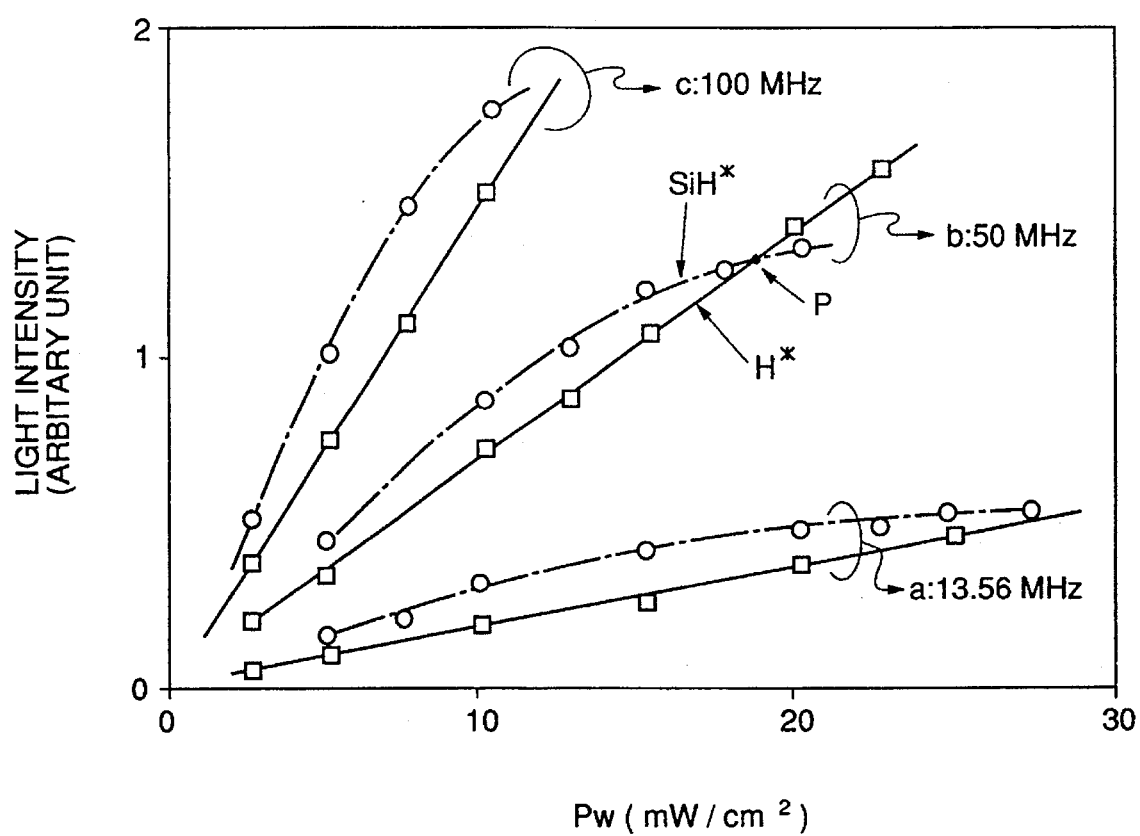
FIG. 25 illustrates an example of dependency of the light intensity [SiH*] of SiH* radicals and the light intensity [H*] of hydrogen radicals upon applied high frequency electric power $P_W$.

FIG. 25 illustrates the dependency of the light intensity [SiH*] of the SiH* radicals and the light intensity [H*] of the hydrogen radicals H* upon the applied high frequency electric power $P_W$ when the high frequency is varied as 13.56 MHz, 50 MHz and 100 MHz. As shown in FIG. 25, the enlargement of the applied high frequency electric power will increase both [SiH*] and [H*] while [H*] shows higher dependency than [SiH*]. Also a fact can be understood from FIG. 25 that the correlative relation as shown in FIGS. 10 and 11 is attained eve if the film forming conditions are changed.

Figure 5:
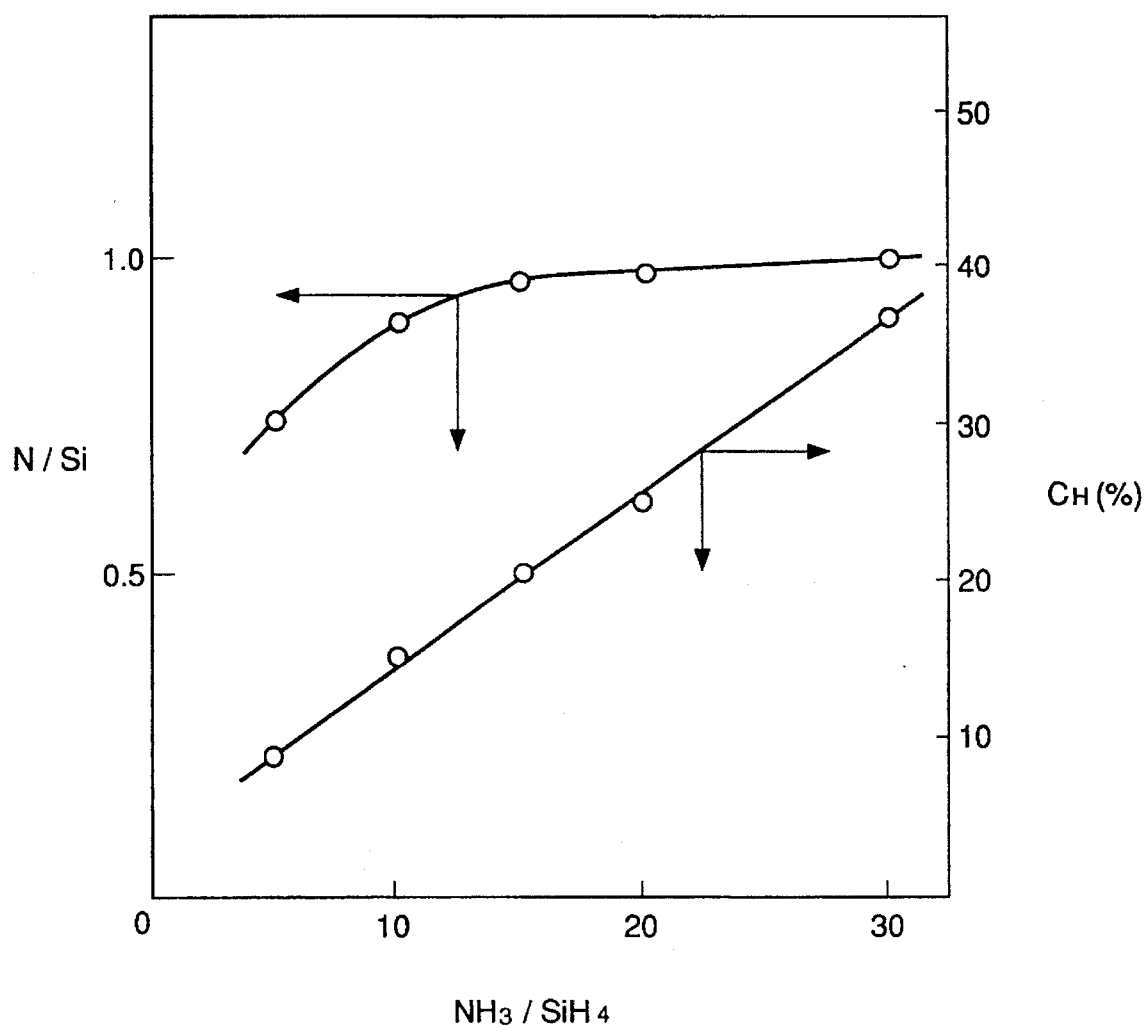
FIG. 5 illustrates an example of the relationship among the gas ratio, composition ratio and the hydrogen content.

In general, the amorphous silicon must be manufactured under certain conditions. First, the [H*] in the plasma and the film forming speed R must hold a relationship [H*]/R≤a (a is a constant). The reason for this is that microcrystallization occurs if the content of hydrogen covering the surface of the formed film exceeds a certain quantity. Since the film forming speed R is in proportion to [SiH*] in the case of a plasma which uses the silane gas, the foregoing condition may be rewritten as [H*]/[SiH*]≤a. Under the foregoing condition, a'=1. By raising the applied high frequency, the efficiency of decomposing the gas can be improved, the film forming speed can be raised and thus the time required to form the film can be shortened. If an attention is paid to point P at which [H*]/[SiH*]=1 in FIG. 5, the point P is shifted to the upper left portion of FIG. 25 with the rise in the applied radio frequency f. The applied electricity $P_W$ at the point P and the applied radio frequency f are changed while substantially maintaining the relationship $P_W$=10/f ($P_W$:W/cm², f:MHz). The points that satisfy [H*]/[SiH*]=a are changed similarly as well as the point P. That is, the ratio [H*]/[SiH*] lower than a certain value can be realized at a certain radio frequency f with high frequency electric power smaller than the upper limit present. If the film forming speed at the conventional frequency of 13.56 MHz is raised by enlarging the applied high frequency electric power, the [H*]/[SiH*] is raised, resulting in the conditions under which microcrystallization occurs easily and, therefore, resulting in the deterioration in the quality of the film as described above. The present invention is very effective to lower the ratio and to raise the film forming speed.

Figure 26:
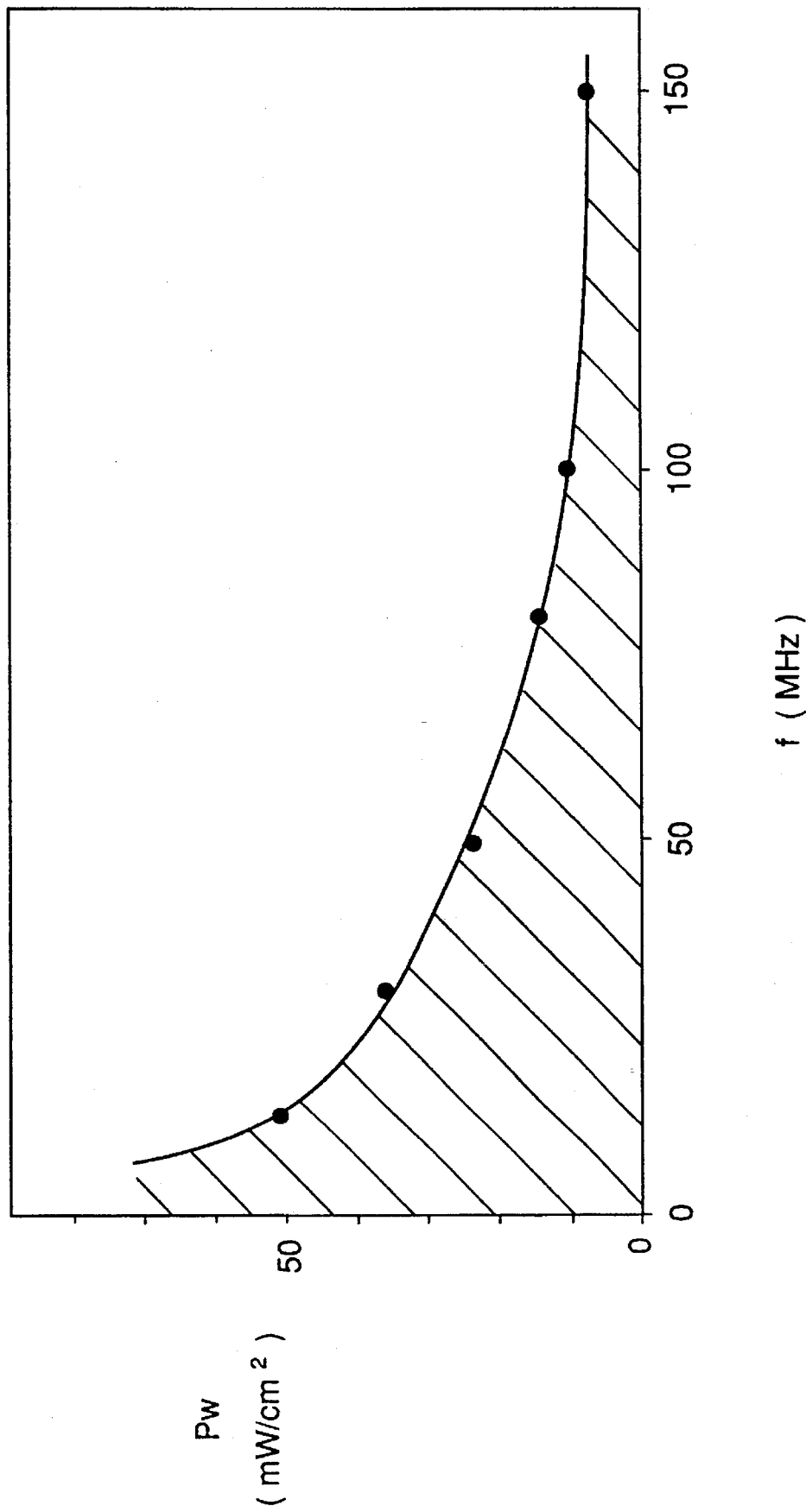
FIG. 26 illustrates an example of the relationship between the applied high frequency electric power $P_W$ and the applied frequency f.

The high frequency electric power was obtained under a variety of conditions, resulting a region as shown in FIG. 26, the upper limit of which is designated by a curve expressed by $P_W$=10/f, and which is designated by diagonal lines of FIG. 26 is the region in which the present invention can be realized. The fact that an excellent film can be manufactured with smaller high frequency electric power is very effective when a large apparatus is used to form a film over a large area. That is, the size of the high frequency power source can be reduced with respect to the size of the apparatus, thus resulting in the reduction of the cost of the apparatus. In terms of the influence upon the characteristics of the film, the fact that the film can be manufactured in a region, in which the small electric power is supplied, will reduce the total energy of ions in the plasma. Therefore, the surface of the film can be protected from the damage due to the incidental ions, and, accordingly, a film having excellent characteristics can be formed. Furthermore, the high frequency electric power, that makes the discharge to be unstable and that allows abnormal discharge to occur, does not need to be used. Therefore, the film forming speed can easily be raised while maintaining a satisfactory reproductivity. Then, the foregoing state will now be described.

Figure 27:
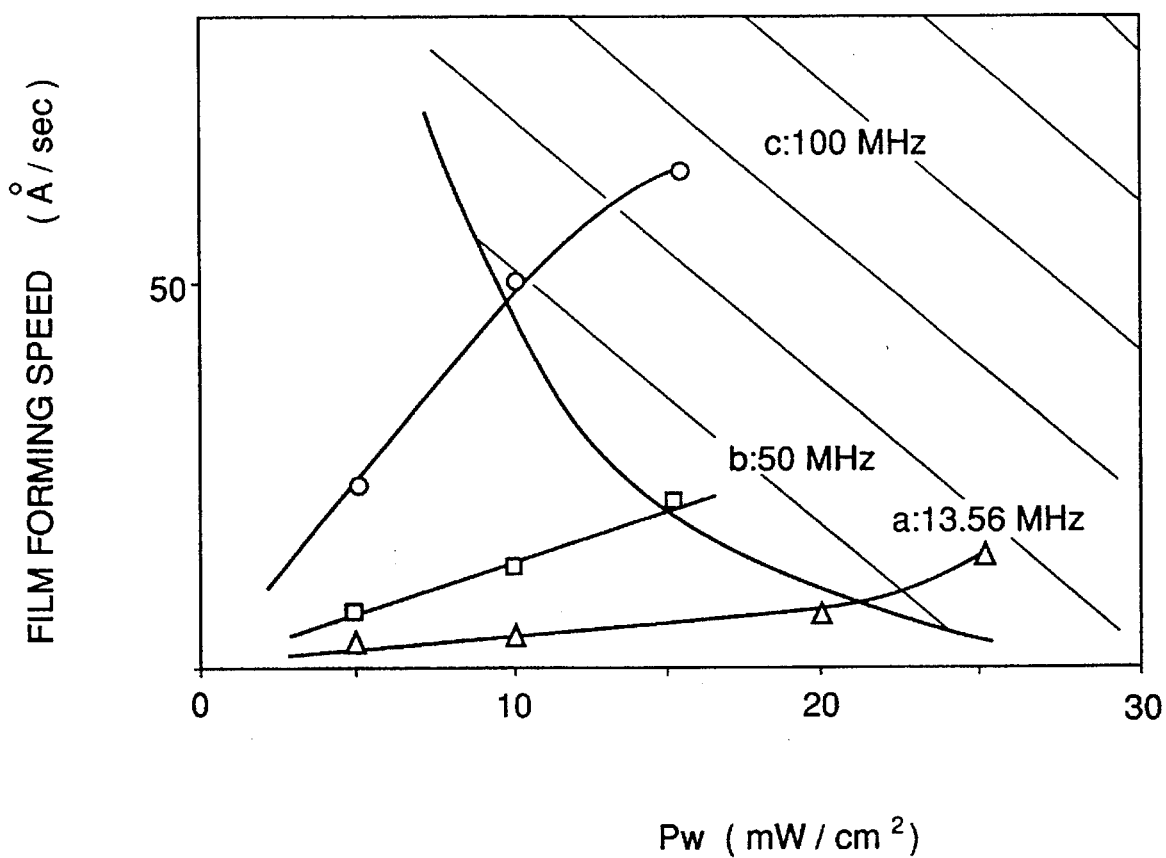
FIG. 27 illustrates an example of dependency of the film forming speed and the applied high frequency electric power $P_W$.

FIG. 27 illustrates the dependency of the film forming speed upon the applied high frequency electric power $P_W$ when the applied frequency f is 13.56 MHz, 50 MHz and 100 MHz. At this time, the following conditions are employed: the flow rate of $SiH_4$ is 10 sccm and the pressure is 0.5 Torr. Referring to FIG. 27, symbol a denotes the result when the frequency is 13.56 MHz, b denotes that when the frequency is 50 MHz and c denotes that when the frequency is 100 MHz. In each of the aforesaid cases, it can be found that the film forming speed rises substantially in proportion to the applied high frequency electric power.

Usually, the film forming speed is raised by enlarging the applied high frequency electric power. In the case where the convention frequency of 13.56 MHz is used, the high frequency electric power of about 30 mW/cm² or more has been required as can be seen from a of FIG. 27 when a film forming speed of, for example, 20 Å/sec is realized. However, the portion designated by diagonal lines is supplied with excessively large electric power to the plasma, resulting in unstable discharge. As a result, an abnormal discharge can easily take place, the polysilane in the gas phase is generated by a large quantity, and therefore the quality of the film deteriorates. If high frequency wave is used and electric power of 30 MW/cm² is supplied to obtain a film forming speed of 30 Å/sec, the resulted values are included in the unstable discharge region designated by the diagonal lines of FIG. 27. Therefore, a film exhibiting excellent quality could not be stably obtained while maintaining excellent productivity. However, the rise in the applied high frequency enabled the film forming speed to be raised while necessitating smaller high frequency electric power without a fear of the abnormal discharge and the generation of the polysilane.

Figure 28:
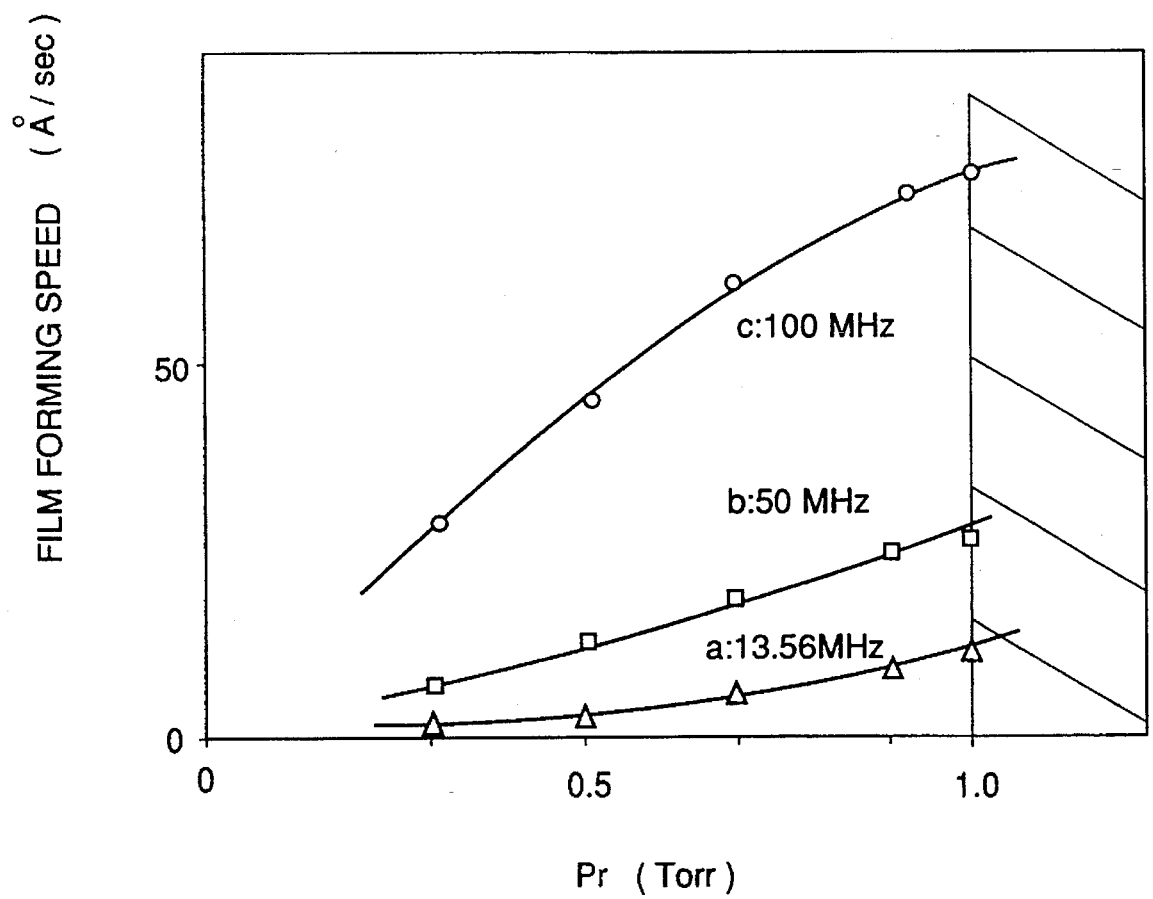
FIG. 28 illustrates an example of dependency of the film forming speed upon pressure Pr.

FIG. 28 illustrates the dependency of the film forming speed upon the pressure. At this time, the conditions are set as follows: the flow rate of $SiH_4$ is 10 sccm, and the applied electric power is 10 mW/cm². The symbol a of FIG. 28 shows the results when the frequency is 13.56 MHz, b shows the results when the frequency is 50 MHz and c show the results when the frequency is 100 MHZ. In the case where the conventional frequency of 13.56 MHz is used, a pressure of several Torr has been required to realize the film forming speed of, for example, about 30 Å/sec. However, in the region designated by diagonal lines of FIG. 28 in which the pressure is large than substantially 1 Torr, the gas phase reaction easily occurs, and the generation of polysilane becomes excessively followed by reaching the surface of the formed film and introducing. As an alternative to this, it is deposited on the wall of the chamber, followed by separation of the film and introduction into the film which is being formed, resulting in the frequent deterioration in the quality of the film. If the RF wave is used at the time of forming a film under a pressure of several Torr to obtain the foregoing film forming speed of 30 Å/sec, the entrance into the foregoing gas-phase reaction region takes place. Therefore, the film cannot be formed stably while exhibiting excellent reproductivity in the foregoing region. However, the rise in the applied high frequency enabled the film forming speed to be raised while necessitating smaller high frequency electric power without a fear of the abnormal discharge and the generation of the polysilane.

In terms of preventing the damage caused from ions, the movement of ions in the plasma is paid attention. In general, ions in the high frequency plasma are vibrated by the electric field which is being oscillated by the high frequency wave in the plasma. The foregoing state can be expressed by the following equation, where A is the amplitude of the oscillating ions:

$$A=V/\omega$$

where

V: the highest speed in one period of the high frequency

ω: the angular frequency of the high frequency: f=2 πω

Assuming that a parallel and flat type film forming apparatus is used and the distance between its electrodes is d, the following condition must be satisfied:

d>A

Thus, ions in the plasma do not reach the surface of the substrate but move within the plasma. The foregoing state is usually called a state where ions are captured or trapped in the plasma. As can be seen from the foregoing relationship expression, the rise of the applied high frequency enables the state where ions are trapped to be realized regardless of the size of the apparatus. As a result, the quantity of ions to be made incident on the substrate could be reduced. The present invention is intended to positively utilize the aforesaid state. By reducing the quantity of the incidental ions and the energy, the defects caused from them could be reduced.

Figure 29:
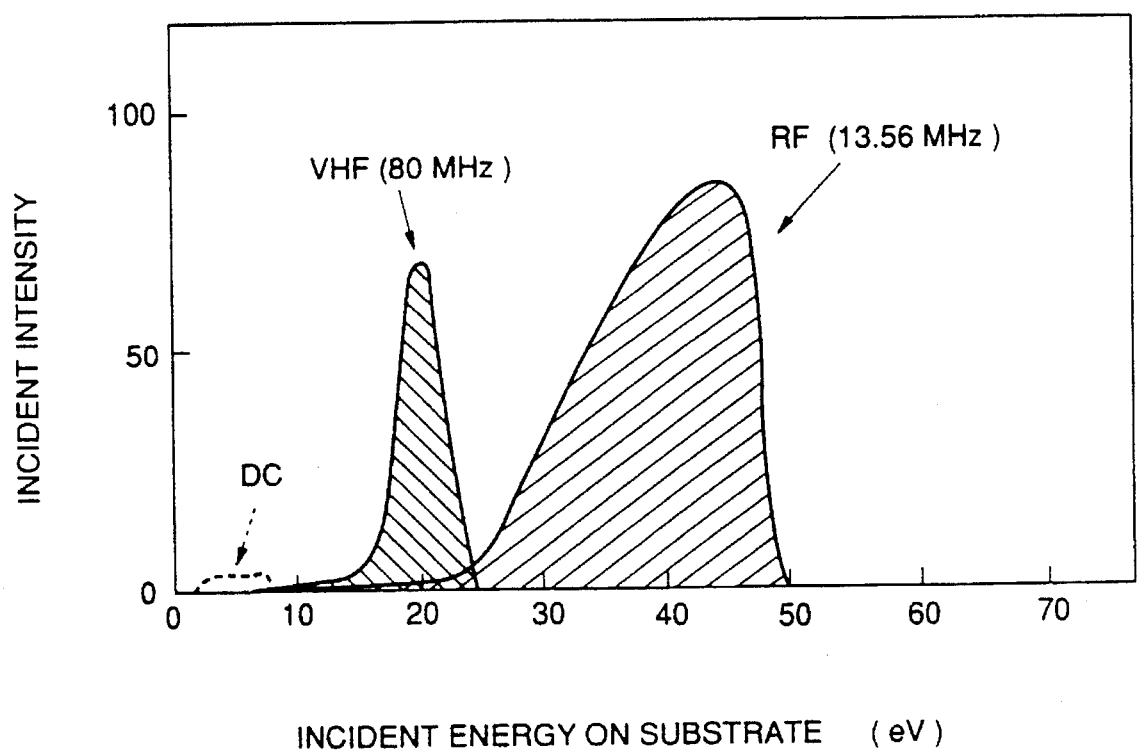
FIG. 29 illustrates an example of the incidental energy and the distribution of ions made incident on the substrate.

FIG. 29 illustrates the foregoing state. A mass analyzer was set at the position of the substrate and the incidental energy of ions flying to the foregoing position and the distribution of the quantities of incidental ions were obtained. In order to easily perform analysis, data about argon gas was obtained. Also the reaction gas according to the present invention basically shows a similar tendency. The conventional applied high frequencies f=13.56 MHz and f=80 MHz according to the present invention are different from each other in the energy and quantity of ions made incident upon the substrate. It is apparent that the condition of f=80 MHz shows a smaller average incidental energy and small quantity of incidental ions.

As described above, the use of the VHF high frequency plasma enabled the film forming speed to be raised easily, stably while maintaining excellent reproductivity as compared with the case where the conventional RF wave plasma is used. Furthermore, the ion damage could be reduced and the film thickness distribution is restricted, resulting in an excellent film to be obtained.

Although the description has been made about the case where the Silane gas is used, a similar effect can be realized even if a system is employed in which dilution with a dilution gas such as hydrogen is performed. However, a high film forming speed can be realized with a low pressure, resulting in that the conventional necessity of adjusting the pressure by performing dilution with hydrogen can be eliminated. Thus, the film can easily be formed by using 100% silane.

The inventors of the present invention have realized a high quality film formed at a high speed by employed a method using the foregoing VHF wave plasma. Furthermore the inventors have found a further improved method. The method will now be described, in which the influence of the temperature of the substrate upon the film forming method was investigated. It has been said that the temperature of the substrate at the time of forming the film has a certain optimum level and the optimum temperature in a method using usual RF wave is 200° C. to 250° C. As for the foregoing fact, results of the experiments carried out about the dependency of the density of defects in the film upon the temperature of the substrate by the inventors are shown in FIG. 11. Referring to FIG. 11, symbol a denotes the results of a film formed by using the convention RF wave of 13.56 MHz. The density of the defects in the film can be minimized at about 250° C. while exhibiting excellent results in the characteristics of the film such as the photoconductivity. The inventors further investigated the state where the density of the defects in the film depends upon the raised frequency applied and the state where the temperature influences the defects. Referring to FIG. 11, symbol b denotes data when the frequency was 50 MHz, and c denotes data when the frequency was 100 MHz. A fact was found that the rise in the frequency will raise the substrate temperature $T_{opt}$ at which the density of the defects in the film can be minimized. Furthermore, another fact was found that the minimum value of the density of the defects can be reduced. If the temperature of the substrate is raised to a level higher than $T_{opt}$, the density of the defects again rises. Although data about only three points was obtained, fine research of the frequency dependency resulted in that the dependency of the density of the defects upon the temperature of the substrate is, if the frequency is lower than 30 MHz, substantially the same as that when the frequency is 13.56 MHz. Therefore, the foregoing dependency upon the temperature of the substrate first occurs in the VHF band higher than 30 MHz. If the frequency is lower than 30 MHz, the quality of the film could not be improved due to the foregoing mechanism.

Figure 30:
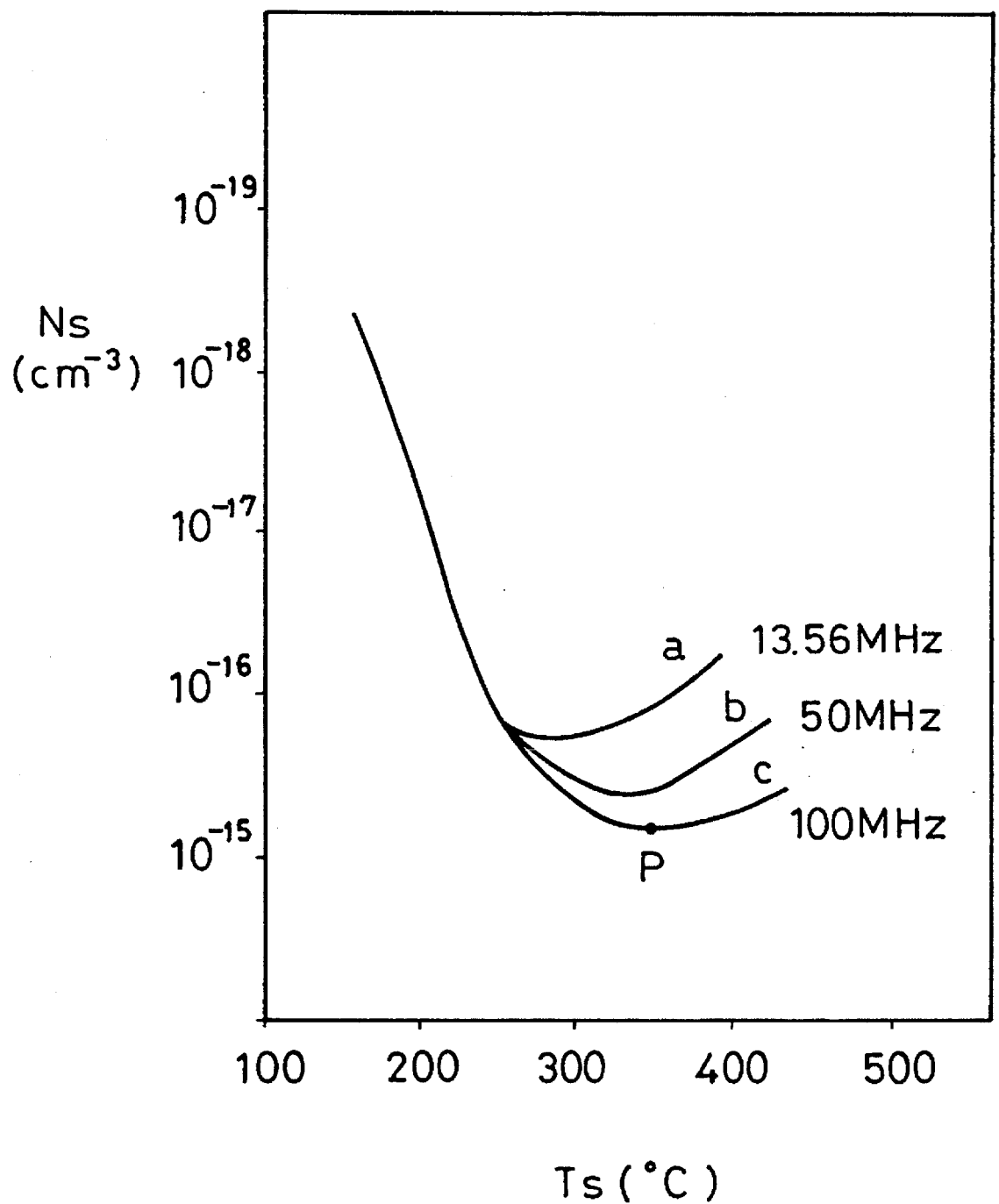
FIG. 30 illustrates an example of dependency of the density of defects in the film upon the temperature of the substrate.
Figure 31:
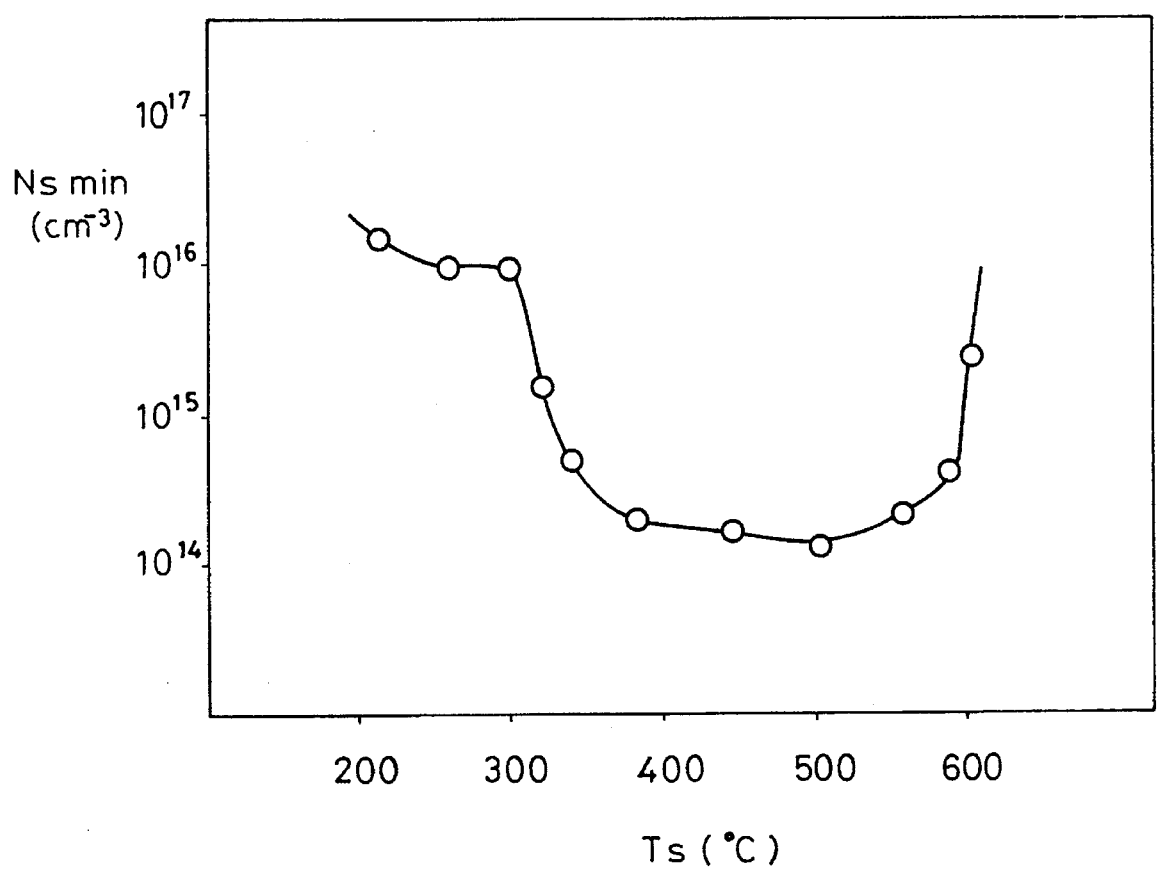
FIG. 31 illustrates an example of dependency of the lowest density of defects upon the temperature of the substrate.

The dependency of the minimum defect density Nsmin (point P of FIG. 30) was obtained while applying a frequency higher than 30 MHz under a variety of conditions, resulting in as shown in FIG. 31. If the temperature is 300° C. or lower, the density of the defects is not lowered than a value obtainable from a conventional RF discharge. If the temperature is raised about 300° C., the density is lowered. As a result of the experiment according to the present invention, the density of the defects in the film could be lowered to a value from $10^{14}$ to $10^{15}/cm^3$ by one or two digits as compared with the conventional results if the temperature is higher than 300° C. If the temperature is about 550° C., the density of the defects starts rising, and the same rises excessively when the temperature exceeds 600° C. The X-ray analysis of the sample obtained at 600° C. resulted in peaks of crystal to be observed. Since it has been said the crystallization temperature of amorphous silicon is from 550° C. to 600° C., the foregoing excessive increase in the defects can be explained that the defects in the grain boundary of the crystal are increased due to the crystallization.

Although it has not been cleared the mechanism of the effect of lowering the density of the defects in the film by using the foregoing frequency higher than 30 MHz and by making the temperature of the substrate to be 300° C. or higher, it can be considered as follows:

As described above, the surface of the growing film is covered with hydrogen if the temperature of the substrate is from 300° C. to 250° C., the growth of the film depends upon the mutual action of hydrogen in the surface and silane radicals $SiH_3^*$ which has reached the surface. That is, it can be considered that the following reaction takes place:

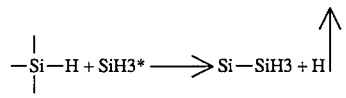

As described above, hydrogen is extracted by the silane radical to be bonded here. Hydrogen which has not been extracted, is received into the film as it is followed by forming hydrogen in the film. If the temperature is higher than 350° C., the major portion of hydrogen in the surface is removed, resulting in the dangling bond to be generated in the surface. At this time, the surface dangling bond and the silane radical are directly bonded to each other as expressed by the following reaction formula:

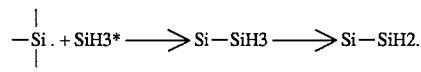

Furthermore, hydrogen attached to the foregoing radicals are simultaneously separated, resulting in new dangling bonds to be generated in the surface. If the temperature is further raised, the conventional method using the RF wave discharge encounters a fact that the supply of the silane radicals becomes insufficient to supplement the generation of the dangling bonds due to the hydrogen removable. As a result, the dangling bonds, which have not been terminated, are received into the film as it is. If the temperature is further raised, the foregoing tendency becomes more apparent, resulting in an excessively high density of the defects in the film as designated by curve a of FIG. 30 if the temperature is higher than 300° C. Thus, the quality of the formed film inevitably deteriorates. As described above, the quality of the film could not be improved when the temperature is higher than 300° C. in a case where the film is formed by the conventional RF wave discharge.

It has been known that the use of the VHF wave discharge enlarges the quantity of the silane radicals in the gas phase as shown in FIG. 23. Furthermore, it can be considered that the quantity of $SiH_3^*$ capable of reaching the surface of the formed film per unit area is, of course, increased. Therefore, sufficient radicals to terminate the dangling bonds in the surface can easily be supplied.

In general, the surface diffusion coefficient D of particles in the surface of the grown film at the substrate temperature Ts is expressed as follows:

$$D = va0 \exp(-Ea/kTs)$$

a0: distance between bonded sites v: oscillation frequency at the site

Ea: activating energy required to perform jumping from one site to next site

Figure 32:
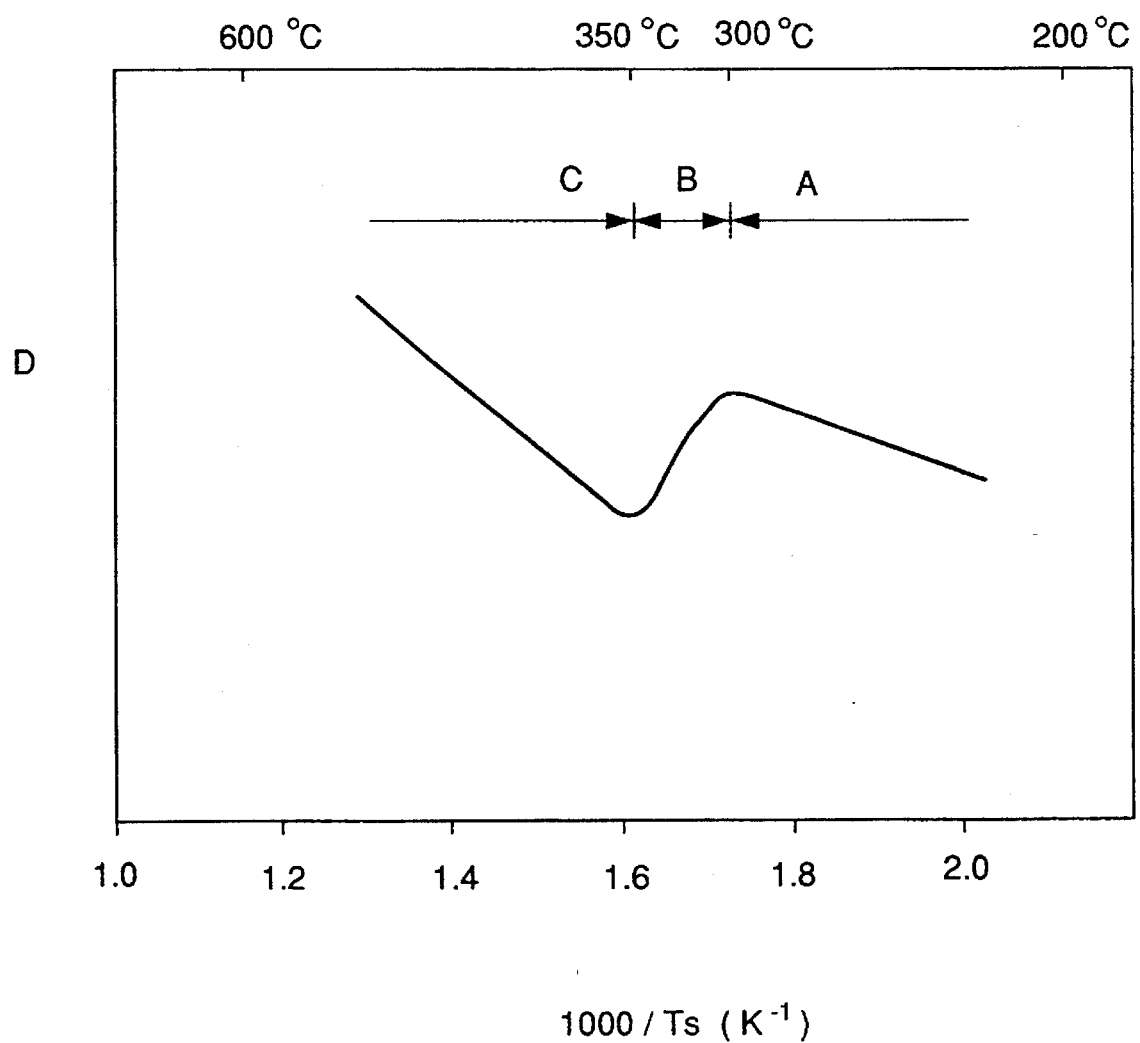
FIG. 32 illustrates an example of dependency of the surface diffusion coefficient upon the temperature of the substrate.

The bonding site is considered as the dangling bond on the surface in the foregoing case. A schematic view of the dependency of D upon the temperature of the substrate, which is usually considered, is shown in FIG. 32. The dependency is considered to simply increase to about 300° C., but starts decreasing at about 300° C., and again increases at about 350° C. It is considered that hydrogen covering the surface affects Ea to be made smaller as compared with a state where the dangling bonds are exposed. Furthermore, the presence of hydrogen in the surface does not change the number of the exposed dangling bonds, resulting in the constant number. If the temperature is raised to a level higher than 300° C. causing hydrogen in the surface to be removed, the dangling bonds in the surface start increasing, resulting in that the distance between the sites, that is, the distance between the dangling bonds is shortened. Furthermore, the exposed dangling bonds have large bonding force and the activating energy is made to be larger as compared with the case where the surface is covered with hydrogen. Therefore, it can be considered that D starts decreasing at about 300° C. and starts increasing at about 350° C. at which hydrogen has been completely removed, while having new activating energy and maintaining the distance between sites.

Figure 33:
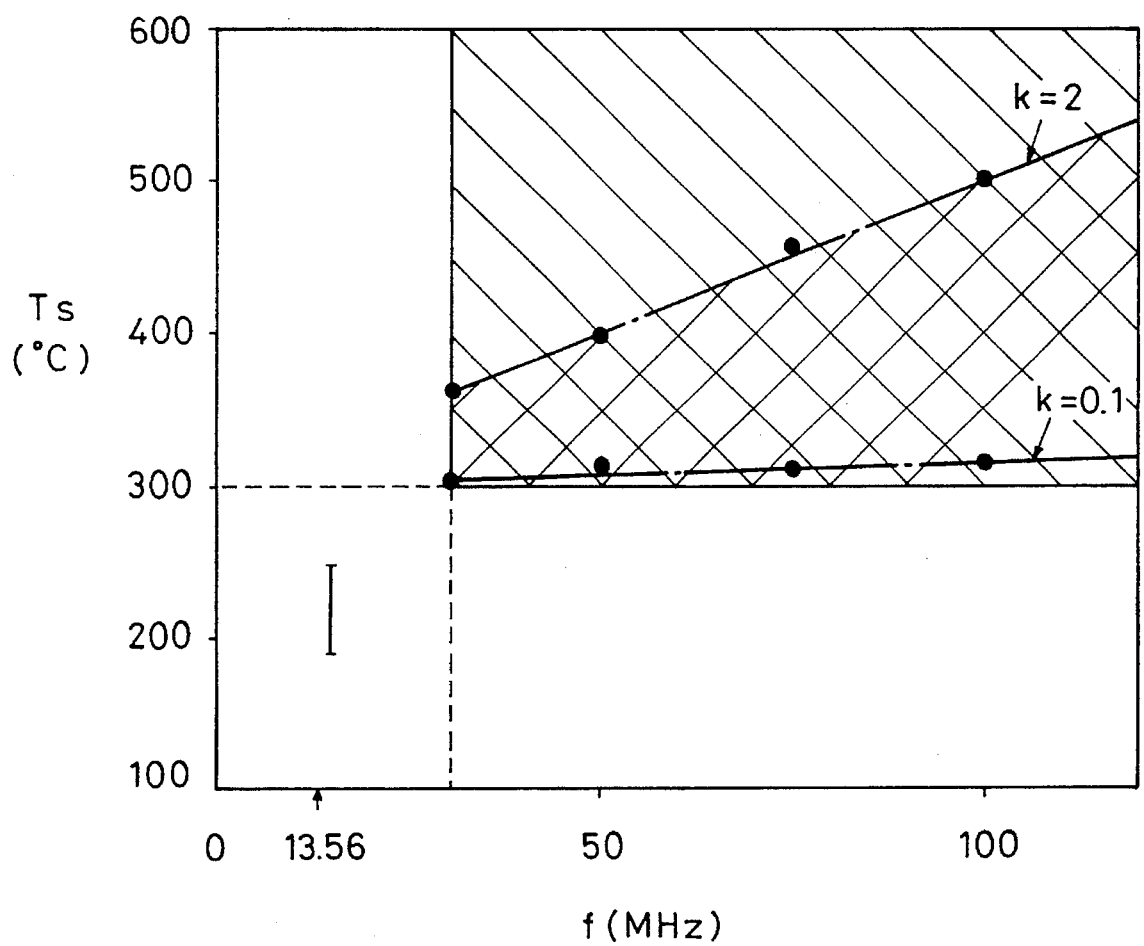
FIG. 33 illustrates an example of the relationship between the temperature of the substrate and the applied frequency.

According to the present invention, it can be considered that the use of region C shown in FIG. 32 to maintain the temperature of the substrate at 300° C. or higher, to remove hydrogen in the surface, to expose the dangling bonds, and to supply a large quantity of radicals, resulting in that the radicals effectively meet the defects on the surface of the formed film to terminate the defects. FIG. 32 shows an effect attained when the temperature is 300° C. or higher. Even if the temperature is further raised, the enlargement of the quantity of the supply raises the diffusion coefficient so that the radicals which have reached the surface are quickly diffused and the dangling bonds are efficiently terminated. As a result of the consideration thus made, the phenomenon designated by b and c of FIG. 30 can be explained in which the rise of the frequency raises the substrate temperature $T_{opt}$ at which the density of the defects in the film is minimized. Accordingly, the forgoing phenomenon was formulated to obtain the optimum conditions for improving the quality of the film. As a result of experiments carried out about the relationship between the substrate temperature Topt (° C.) at which the density of the defects can be minimized and the applied frequency f (MHz) under a variety of conditions, a fact was found that the optimum temperature of the substrate and the optimum frequency hold a constant relationship Topt=kf+a ($0.1 \leq k \leq 2$, a=300). FIG. 33 illustrates the foregoing state. The net pattern of FIG. 33 designates the area which meets the foregoing relational expression.

As a result of the forgoing facts, it is preferable for the present invention to realize a state where hydrogen has been removed, that is, to make the temperature of the substrate to be 300° C., more preferably 350° C. at which surface hydrogen can be completely removed. As a result, defects, which have not been terminated conventionally and received into the film, can be terminated, resulting in the density of the final defects in the film to be lowered.

If the temperature is higher than 600° C., the crystallization of the film is commenced, causing the defects in the film to be increased. Therefore, the preferred temperature of the substrate according to the present invention is 300° C.$\leq$Ts$\leq$600° C., more preferably 350° C.$\leq$Ts$\leq$550° C. It is preferable that the frequency is 30 MHz or higher with which the radicals in the gas phase increase as shown in FIG. 23. The foregoing condition is designated by the diagonal portion of FIG. 33.

Figure 34:
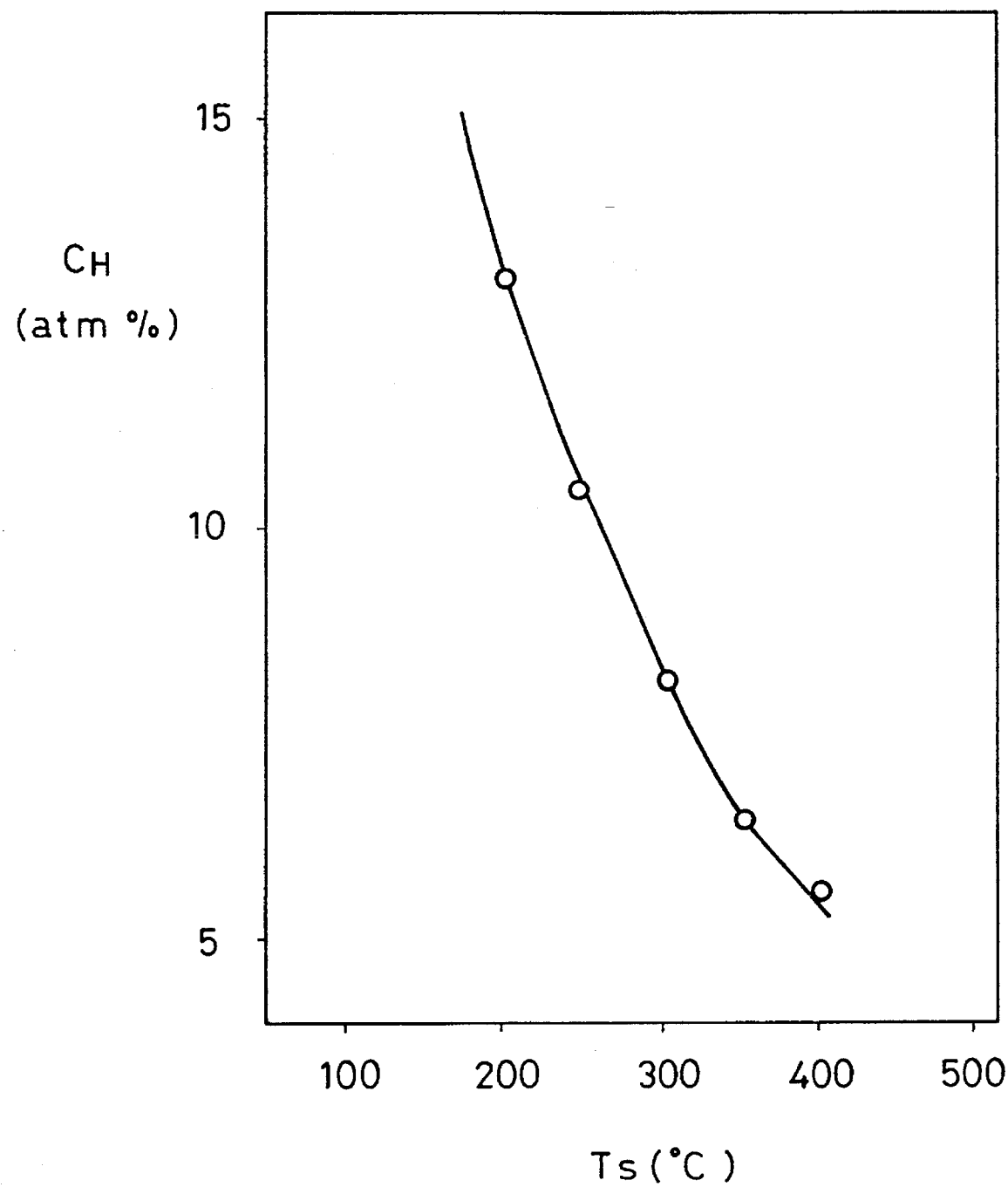
FIG. 34 illustrates an example of dependency of the hydrogen density in the film upon the temperature of the substrate.

An advantage of the present invention is that hydrogen in the film can easily be reduced in addition to the foregoing operations. FIG. 34 illustrates the dependency of the content $C_H$ of hydrogen in the film upon the temperature of the substrate. In also the conventional technology, the content of hydrogen in the film depends upon the temperature of the substrate, and, therefore, the content can be reduced by raising the temperature of the substrate. However, as can be considered from the foregoing mechanism, the conventional method encounters the removal of hydrogen in the surface if the temperature is raised to a level higher than 250° C. if the RF wave discharge is used, resulting in that hydrogen to be received into the film to be decreased and that the quantity of supplied radicals to terminate the generated dangling bonds becomes wanting. As a result, the density of the defects in the film rises as designated by a of FIG. 30, resulting in lowering of the photoconductivity. Therefore, the characteristics required for the device utilizing light cannot be attained. Therefore, the temperature has not been raised to a level as described above. However, with the method according to the present invention, the temperature of the substrate can be raised while preventing the rise in the density of the defects in the film by further lowering the density. Therefore, the initial density of defects in the film could be lowered and hydrogen received into the film could be reduced. As a result, weak bonds generated considered to be due to hydrogen in the film can be decreased, causing the light deterioration of the photoelectric current to be prevented.

That is, by employing high frequency wave of 30 MHz in the VHF band, the silane radicals can stably be increased as compared with the conventional RF band, resulting in the film forming speed to be stably raised while maintaining the reproductivity. Furthermore, the film is formed by enclosing ions, which deteriorate the characteristics of the film, into the plasma, the damage due to ions can be prevented, and the plasma damage on the interface can be prevented. Therefore, an excellent film could be stably formed. By preferably maintaining the substrate temperature Ts (°C.) at a high temperature from 300° C. to 600° C., more preferably by maintaining that to hold the relationship ts=k(MHz)f (MHz)+9° C. (0.1≦k(HMz)≦2, a=300° C.), the content of hydrogen in the film could be lowered. Furthermore, the density of the defects in the film could be simultaneously prevented. Therefore, an excellent film having a large photoconductivity and improved light deterioration prevention characteristics could be formed.

That is, it is preferable for the present invention that the VHF wave is so applied that the substrate temperature Ts (°C.) and the applied frequency f (MHz) hold the relationship ts =kf+a°C. (0.1≦kMHz≦2, a=300° C.) to provide a further high quality amorphous silicon.

It is preferable for the present invention to generate plasma by supplying electric power smaller than 10/f (W/cm$^2$) (f: MHz). Further, it is preferable that the VHF wave is so applied that the ratio of the light intensity [H*] of the hydrogen radical and that [SiH*] of the silane radical hold the ratio [H*]/[SiH*]≧1 to generate the plasma. Thus, a higher quality amorphous silicon can be formed.

It is preferable for the present invention that the VHF wave is so applied that the distance d between the electrodes meets the relationship f/d<30 to generate the plasma. Thus, a higher quality amorphous silicon can be formed.

Embodiment 1

An embodiment of a field-effect-type transistor using an a-Si thin film manufactured by the film forming method according to the present invention will now be described.

Figure 35:
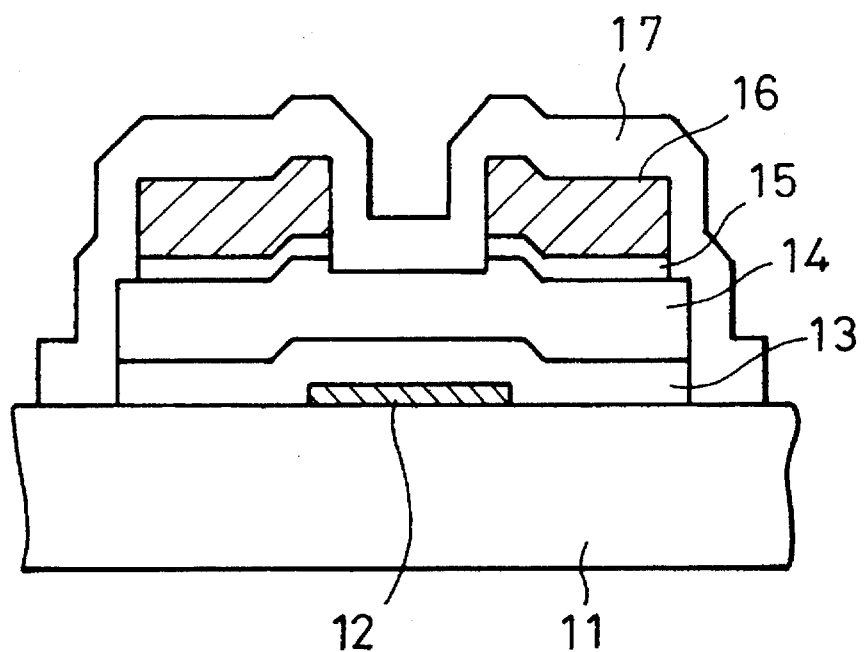
FIG. 35 is a schematic cross sectional view which illustrates a thin film transistor.

FIG. 35 is a cross sectional view which illustrates an inversed-stagger-type TFT.

A gate electrode 12 is formed on an insulating substrate 11. Furthermore, an insulating layer 13 and a semiconductor layer 14 are formed on the gate electrode 12. The semiconductor layer 14 has a source and drain electrode 16 while interposing an ohmic contact layer 15 thereon. Furthermore, a protection layer 17 is formed for protection. Then, a method of manufacturing the TFT will now be described with reference FIGS. 36A to 36D.

Figure 36A:
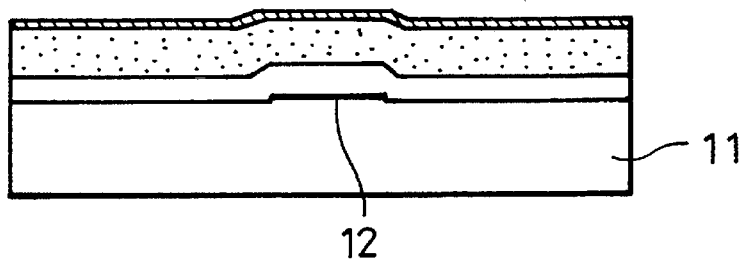
FIGS. 36A to 36D are schematic views which illustrate the process of an example of method of manufacturing the thin film transistor.

First, a Cr thin film (about 1,000 Å) is, as shown in FIG. 36A, on the 7059-glass substrate 11 manufactured by Corning by a sputtering apparatus followed by patterning, thus resulting in a gate electrode 12 to be formed.

Then, a plasma CVD apparatus is used to form a silicon nitride thin film SiNx (about 3,000 Å) to form a gate insulating layer 13. Then, a non-doped amorphous silicon and an i-type a-Si (about 6,000 Å) to serve as a semiconductor layer 14, and phosphorus-doped microcrystal silicon and n$^+$-type μc-Si (about 1000 Å) thin films to serve as an ohmic contact layer 15 are sequentially formed by the same apparatus.

Figure 36B:
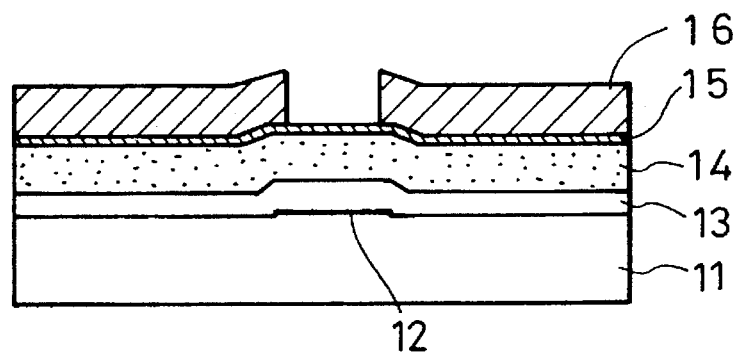

Then, as shown FIG. 36B, an Al thin film (about 1 μm) was formed by a sputtering apparatus followed by patterning, so that a source and drain electrode 16 is formed. The channel width and the channel length L were made to be W/L=100.

Figure 36C:
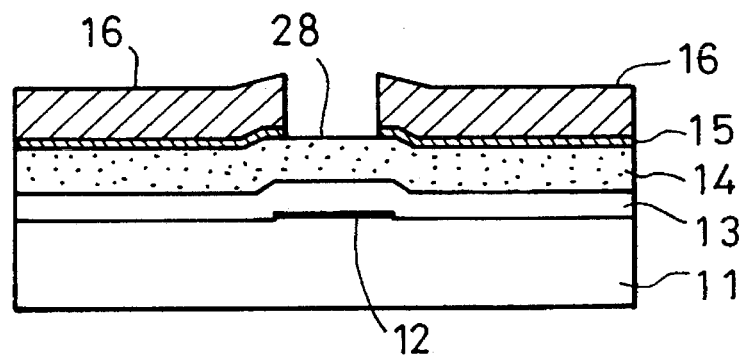

Then, as shown in FIG. 36C, unnecessary portions of the n$^+$-type μc-Si layer are etched by reactive ion etching so that a gap portion 28 is formed.

Figure 36D:
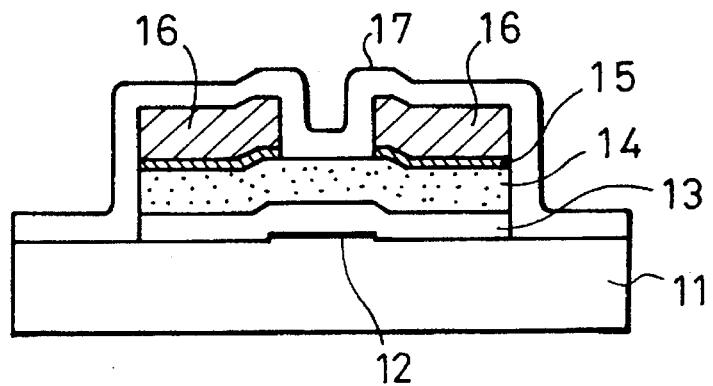

Then, as shown in FIG. 36D, unnecessary portions of the SiNx/i-type a-Si/n$^+$-type μc-Si layer were isolated, and then the protection layer 17 was deposited, so that a thin film transistor as shown in FIG. 35 is manufactured.

A method of manufacturing the a-Si thin film, which is the essential portion of the present invention, will now be described.

As described above, the a-Si thin film is formed by the parallel flat plate type plasma CVD apparatus arranged as shown in FIG. 37. FIG. 37 illustrates a film forming chamber for forming the i-type a-Si thin film, where a mechanism for successively forming the SiNx/i-type a-Si/n$^+$-type μc-Si layer and the other film forming chambers are omitted from illustration. Referring to FIG. 37, reference numeral 300 represents a vacuum chamber, 301 represents a substrate, 302 represents an anode electrode, 303 represents a cathode electrode, 304 represents a substrate heater, 305 represents a terminal for earth, 306 represents a matching box, 307 represents a high frequency power source, 308 represents an exhaust port, 309 represents an exhaust pump, 310 represents a raw material gas introduction port, 320, 340, 322 and 342 represent valves, and 321 and 341 represent mass-flow controllers.

The substrate is introduced from the precedent SiNx film forming chamber (omitted from illustration), and the pressure in the chamber is lowered to 1×10$^{-6}$ Torr. Then, raw material gases SiH$_4$ and H$_2$ were supplied by 2 and 18 sccm by the mass flow controllers 321 and 341 followed by maintaining the pressure at 0.5 Torr or lower. Then, the substrate heater 304 is operated to maintain the temperature of the substrate at 200° C. followed by applying waves having a frequency of 80 MHz by a high frequency power source 307 with electric power of 0.04 W/cm$^2$ so that the i-type a-Si film is formed to have a thickness of 6000 Å. After the film has been formed, the pressure in the chamber is similarly lowered to 1×10$^{-6}$ Torr or lower. Then, the substrate is sifted to the next n$^+$-type μ-Si film forming chamber. In this embodiment, the distance between the electrodes is made to be 4 cm.

Figure 38:
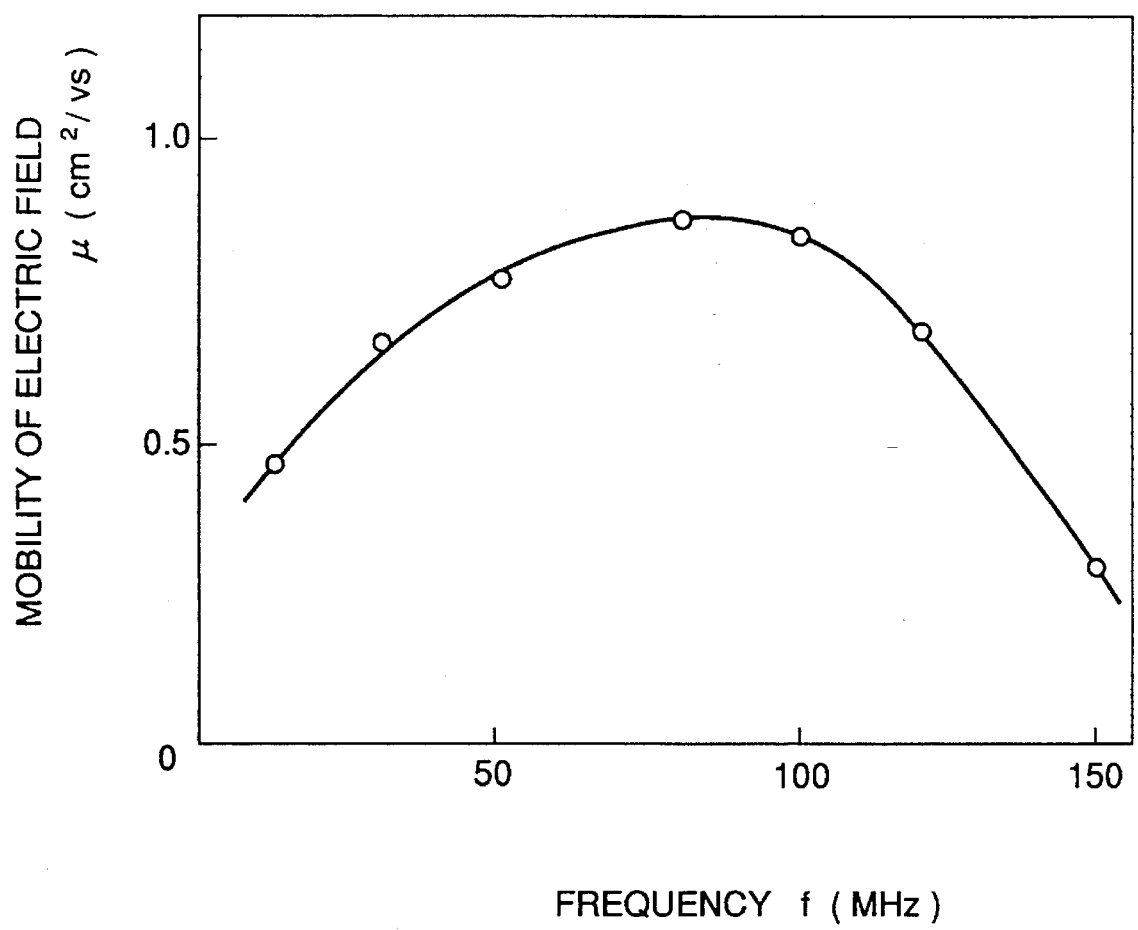
FIG. 38 illustrates an example of the initial characteristics of a TFT using an amorphous silicon thin film according to the present invention.

Thus, the thin film transistor can be manufactured. Although the high frequency discharge using 80 MHz is employed as the embodiment of the present invention, the frequency f can be changed by changing the supplied electric power PW (W/cm$^2$) to a value defined by the relationship 10/f (MHZ), preferably electric power with which the light intensity ratio [H*]/[SiH*] can be minimized. The dependency of the electric field mobility μ (cm$^2$/Vsec) of the TFT using the a-Si thin film formed at each frequency f upon the frequency f (MHz) is shown in FIG. 38. As can be seen from FIG. 38, the electric field mobility μ can be improved when the frequency is from 30 MHz to 120 MHz. The electric field mobility at 80 MHz was improved to 0.88 cm$^2$/Vsec which is the twice of 0.47 cm$^2$/Vsec of the a-Si thin film formed by the conventional discharge by using 13.56 MHz. The reason for this can be considered as known that it is caused from the difference in the ion energy made incident on the substrate at the time of the argon (Ar) discharge shown in FIG. 29. The high frequency discharge using 80 MHz according to the present invention is characterized in that the ion energy which reaches the substrate is small and also the energy dispersion is restricted as compared with the conventional discharge that uses 13.56 MHz. Therefore, the SiNx thin film serving as the gate insulating film can be protected from the ion damage when the a-Si thin film is stacked, and therefore the characteristics of the interface can be improved.

The frequency can be determined depending upon the fact that the improvement must be made in the characteristics of the film or the manufacturing facility or the characteristics of the device.

Embodiment 2

A second embodiment of an electric-field-effect-type transistor using an a-Si thin film manufactured by the film forming method according to the present invention will now be described.

The structure of the inverse-stagger-type TFT to be manufactured, the manufacturing process, and the structure of the parallel-flat-type plasma CVD apparatus for use to manufacture the a-Si thin film are the same as those shown in FIGS. 36 and 37. Therefore, their descriptions are omitted here, and the description will be made about the different portion, that is, the method of manufacturing the a-Si film. Also the distance between the electrodes is made to be 4 cm in this embodiment.

The substrate is introduced from the precedent SiNx film forming chamber (omitted from illustration), and the pressure in the chamber is lowered to $1 \times 10^{-6}$ Torr. Then, raw material gases $SiH_4$ and $H_2$ were supplied by 2 and 18 sccm by the mass flow controllers 321 and 341 at a ratio of $SiH_4:H_2=1:9$ followed by maintaining the pressure at 0.5 Torr or lower. The flow rate was adjusted to made the residence time $\tau$ to be 1.0 sec. Then, the substrate heater 304 is operated to maintain the temperature of the substrate at 200° C. followed by applying waves having a frequency of 80 MHz by a high frequency power source 307 with electric power of 0.04 W/cm$^2$ so that the i-type a-Si film is formed to have a thickness of 6000 Å. After the film has been formed, the pressure in the chamber is similarly lowered to $1 \times 10^{-6}$ Torr or lower. Then, the substrate is sifted to the next $n^+$-type μ-Si film forming chamber.

Figure 100:
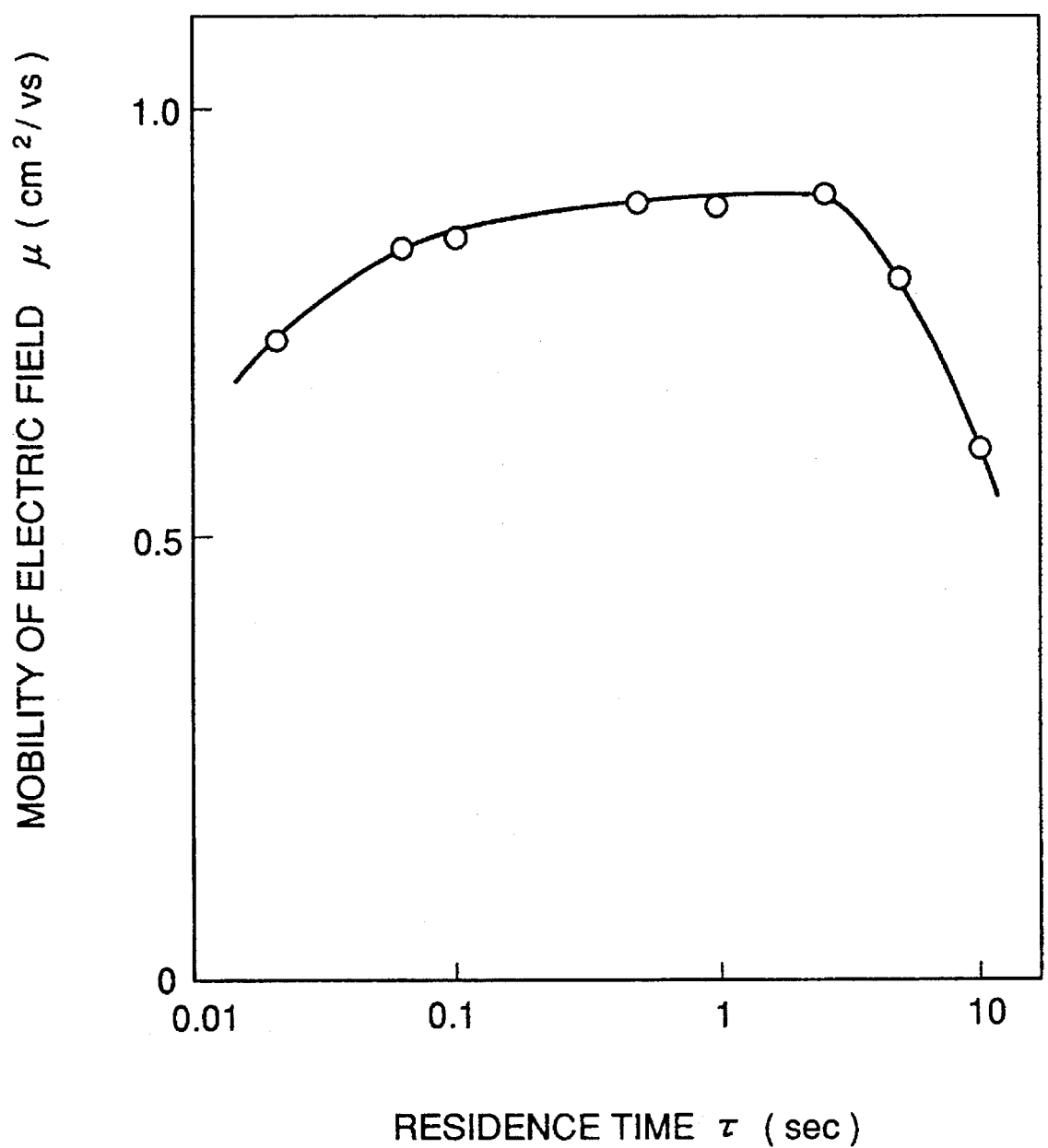
FIG. 100 illustrates an example of the electric field mobility of the TFT provided with the amorphous silicon thin film according to the present invention.

Thus, the thin film transistor can be manufactured. Although the high frequency discharge using 80 MHz is employed as the embodiment of the present invention, the frequency f can be changed by changing the conditions such as the supplied electric power to a value with which the light intensity ratio $[H^*] \geq [SiH^*]$ can be met, preferably a value with which the light intensity ratio $[H^*]/[SiH^*]$ is minimized. The relationship between the residence time $\tau$ (sec) and the average electric field mobility μ (cm$^2$/Vsec) in the substrate is shown in FIG. 100. Considering the distribution of the characteristics, an excellent electric field mobility μ (cm$^2$/Vsec) can be obtained when the residence time $\tau$ (sec) is from 0.05 sec to 2.5 sec.

Embodiment 3

Figure 39:
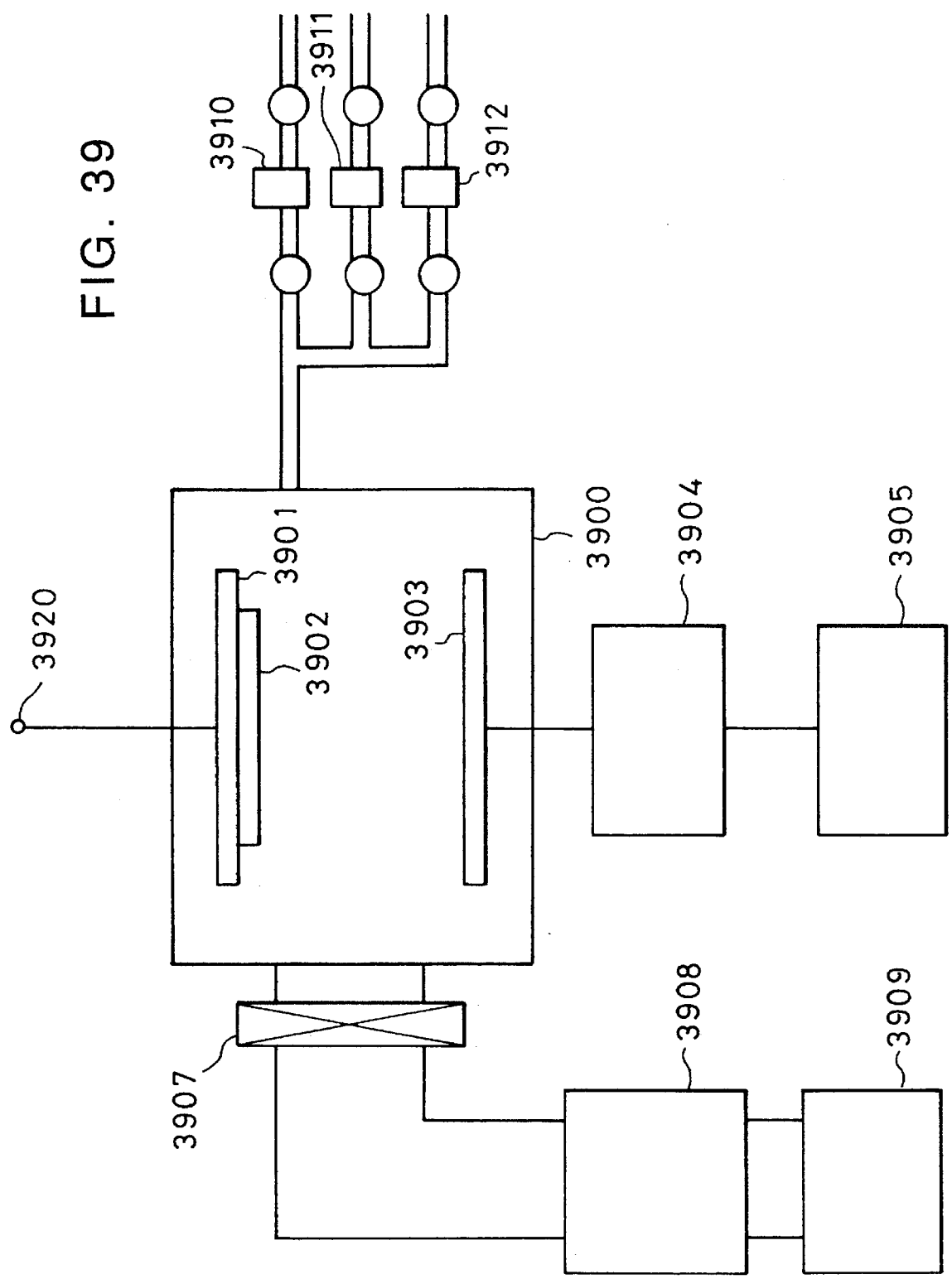
FIG. 39 is a schematic structural view which illustrates a film forming apparatus.

A manufacturing apparatus for use in this embodiment is shown in FIG. 39. The basic structure is arranged similarly to the conventional parallel-flat-type plasma CVD apparatus. As shown in FIG. 39, reference numeral 3900 represents a vacuum chamber, 3901 represents an anode electrode, 3902 represents a substrate, and 3903 represents a cathode electrode. Reference numeral 3920 represents a power supply terminal with which bias voltage can be applied to the substrate if necessary. The anode electrode 3901 includes a substrate heater (omitted from illustration). Reference numeral 3904 represents a matching device, 3905 represents a rotary pump, 3910, 3911 and 3912 represent mass-flow controllers to which gases are supplied from gas cylinder (omitted from illustration). The electrode area is about 300 cm$^2$ and the distance between the electrodes is 5 cm.

In this embodiment, $SiH_4$, as the raw material gas, and Ar, as the dilution gas, are introduced into the vacuum chamber 3900 followed by discharge at frequency f (MHz) by a high frequency power source 3905. The temperature of the substrate is raised to 250° C. by the substrate heater, and the bias for the substrate is made to be 0 V in order to simplify the description. In order to obtain satisfactory a-Si thin film, the pressure P (Torr) and the electric power $P_W$ (W/cm$^2$) are so selected that the relationship between the light intensities holds $[H^*] \geq [SiH^*]$, preferably a value with which the light intensity ratio $[H^*]/[SiH^*]$ is minimized. The pressure is from about 0.25 Torr to about 2.5 Torr, and the electric power of about 0.3 W/cm$^2$ was supplied.

Figure 40:
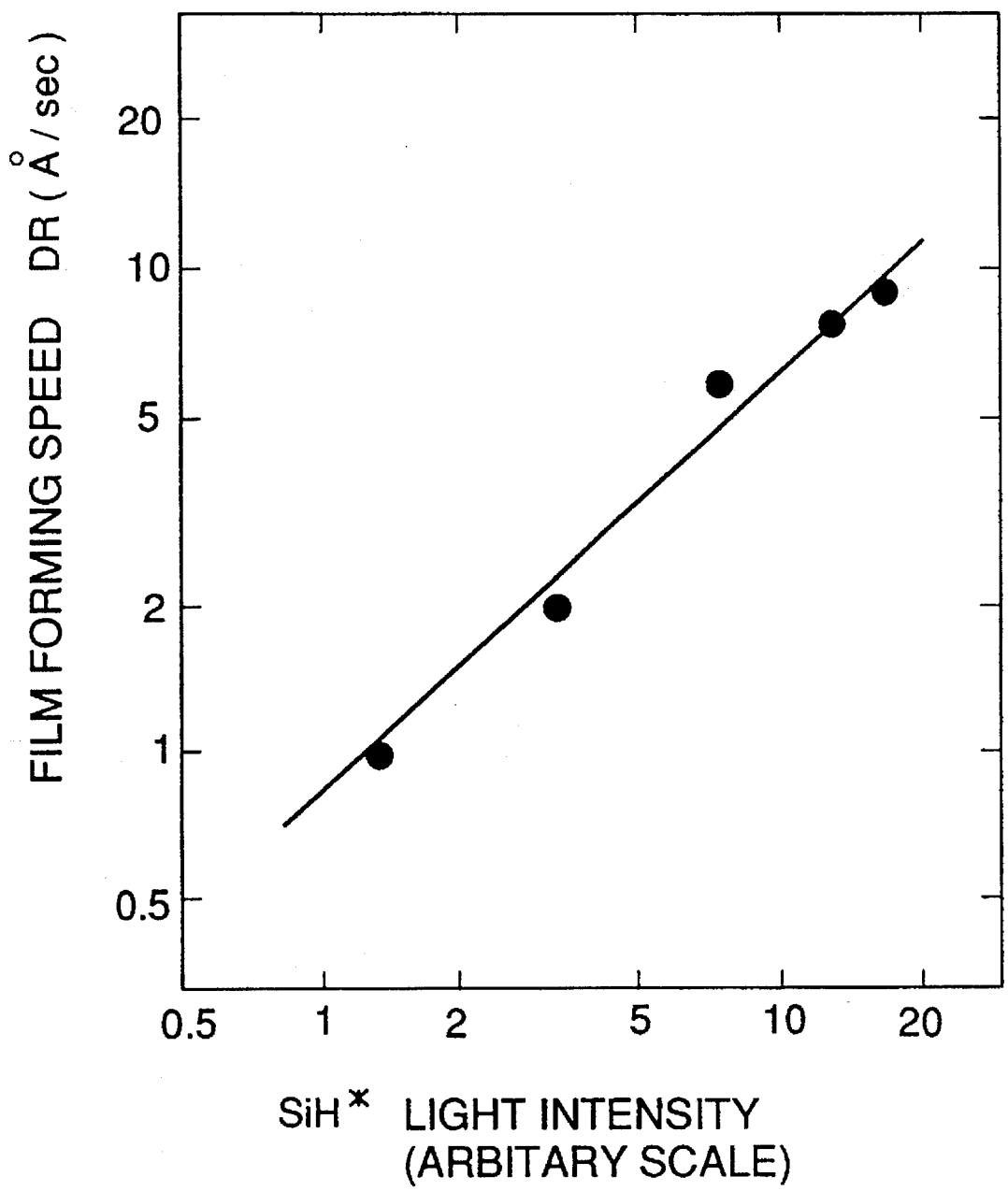
FIG. 40 illustrates an example of the relationship between the light intensity and the film forming speed.

FIG. 15 illustrates the relationship between the power source frequency f and the film forming speed DR. FIG. 40 illustrates the relationship between the light intensity of SiH* and the film forming speed DR. An estimation can be made that the rise in the discharge frequency will increase the SiH3 radicals. Furthermore, it can be expected that the SiH3 radicals and the film forming speed have a correlated relationship. The resulted lowering of the film forming speed DR in the region in which the discharge frequency f exceeds 120 MHz is estimated that it is a peculiar problem of the apparatus for use in the present invention that an effective power supplied is reduced.

Figure 41:
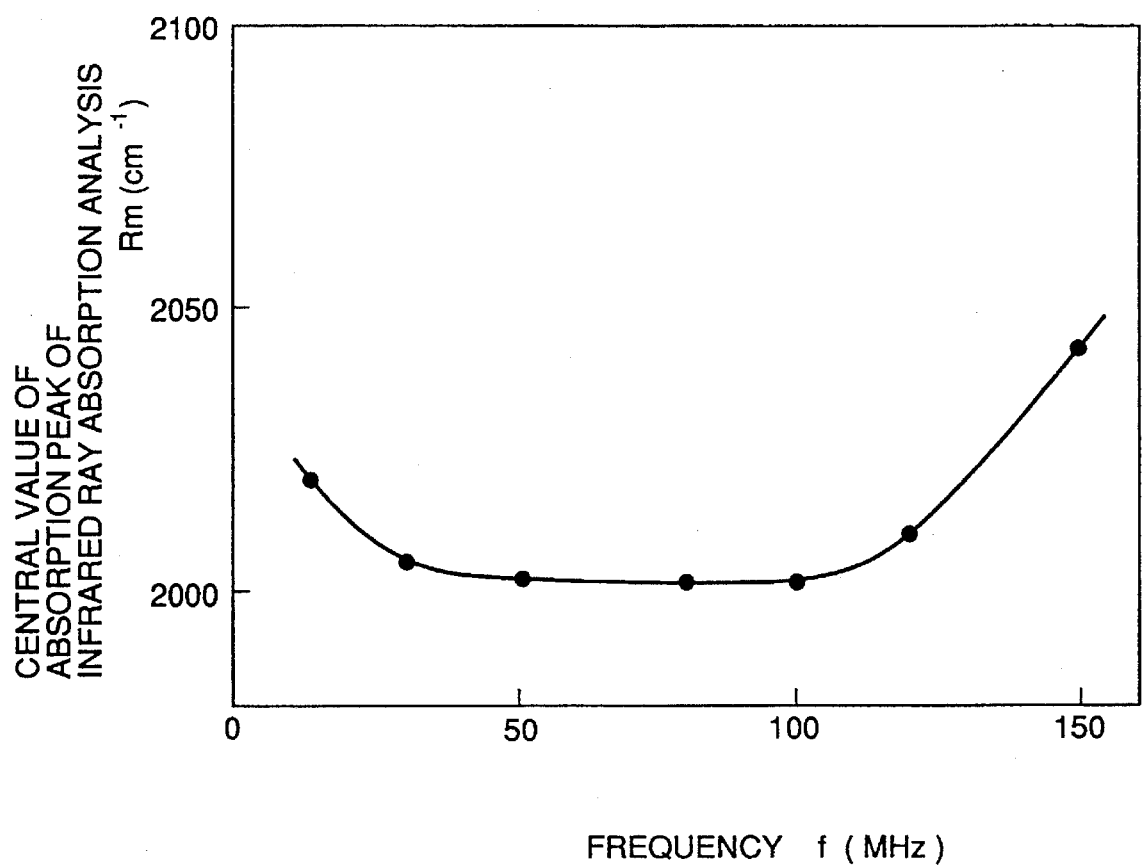
FIG. 41 illustrates an example of the relationship between the frequency and the state where hydrogen is bonded.
Figure 42:
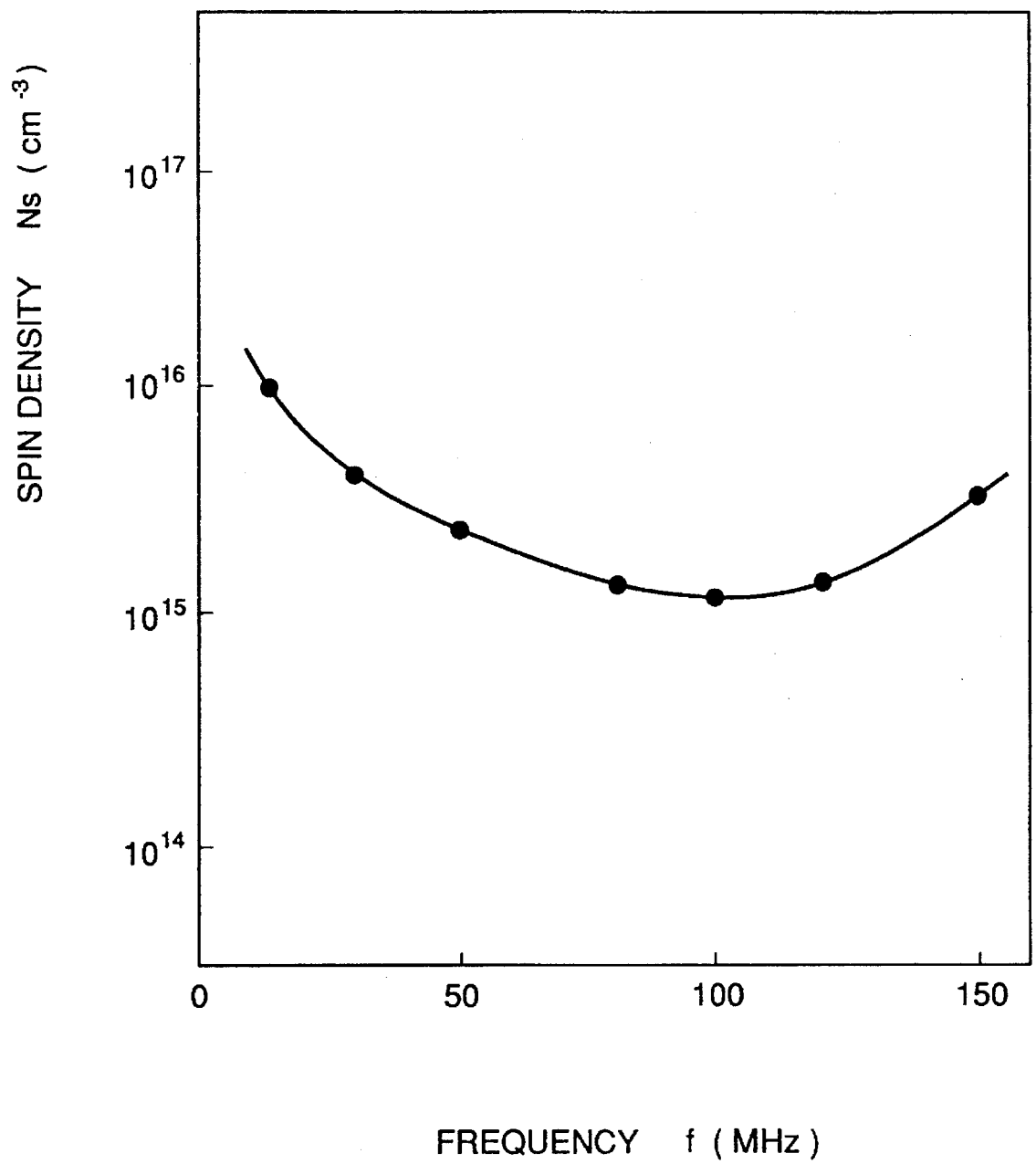
FIG. 42 illustrates an example of the relationship between the frequency and the spin density.

The relationship relating to the quality of the film among the discharge frequency f and the central value Rm in the infrared ray absorption analysis is shown in FIG. 41. The relationship between the discharge frequency f and the spin density Ns is shown in FIG. 42. As a result, it can be understood that the quality of the film is improved when the discharge frequency is from 30 MHz to 120 MHz. If the frequency is less than 30 MHz, the damage of the substrate due to the incident ion (to be described later) is critical, the content of the $SiH_2$ bonds in the film is large and therefore the film has many defects. If the discharge frequency f is higher than 120 MHz, the content of the $SiH_2$ bonds in the film is large, also resulting in the deterioration in the quality of the film. The reason for this has not been cleared yet whether the $SiH_4$ molecules are highly decomposed resulting in the increases in the Si, SiH and $SiH_2$ radicals, or the surface mobility of $SiH_3$ deteriorates due to the fact that ion energy made incident upon the surface of the substrate is too small.

The dependency of the S/N ratio of the photoconductivity $\sigma_p$ (S/cm) and the dark conductivity $\sigma_d$ (S/cm) is shown in FIG. 16. If the discharge frequency is from 50 MHz to 100 MHz, the improvement in the photoelectric characteristic can be expected.

As a result, the film forming speed can be raised while maintaining the quality of the a-Si film when the frequency is ranged from 30 MHz to 120 MHz in the case where the substrate bias Vb=0 V.

The fact has been described that the high quality a-Si film can be realized by increasing the $SiH_3$ radicals and improving the mobility on the surface of the substrate. Accordingly, the inventors of the present invention caused the $SiH_3$ radicals for forming a high quality film to increase by employing the discharge frequency of 30 MHz or higher. Furthermore, negative bias is applied to the substrate to activate a large quantity of reactive radicals $SiH_3$ adsorbed to the surface, resulting in improving the mobility in the surface of the substrate. As a result, an excellent a-Si film could be formed. In other words, the negative bias is applied to the substrate to cause ions to positively collide ions with the surface of the formed film, resulting in the diffusion of the $SiH_3$ radicals in the surface by the kinetic energy.

Figure 43:
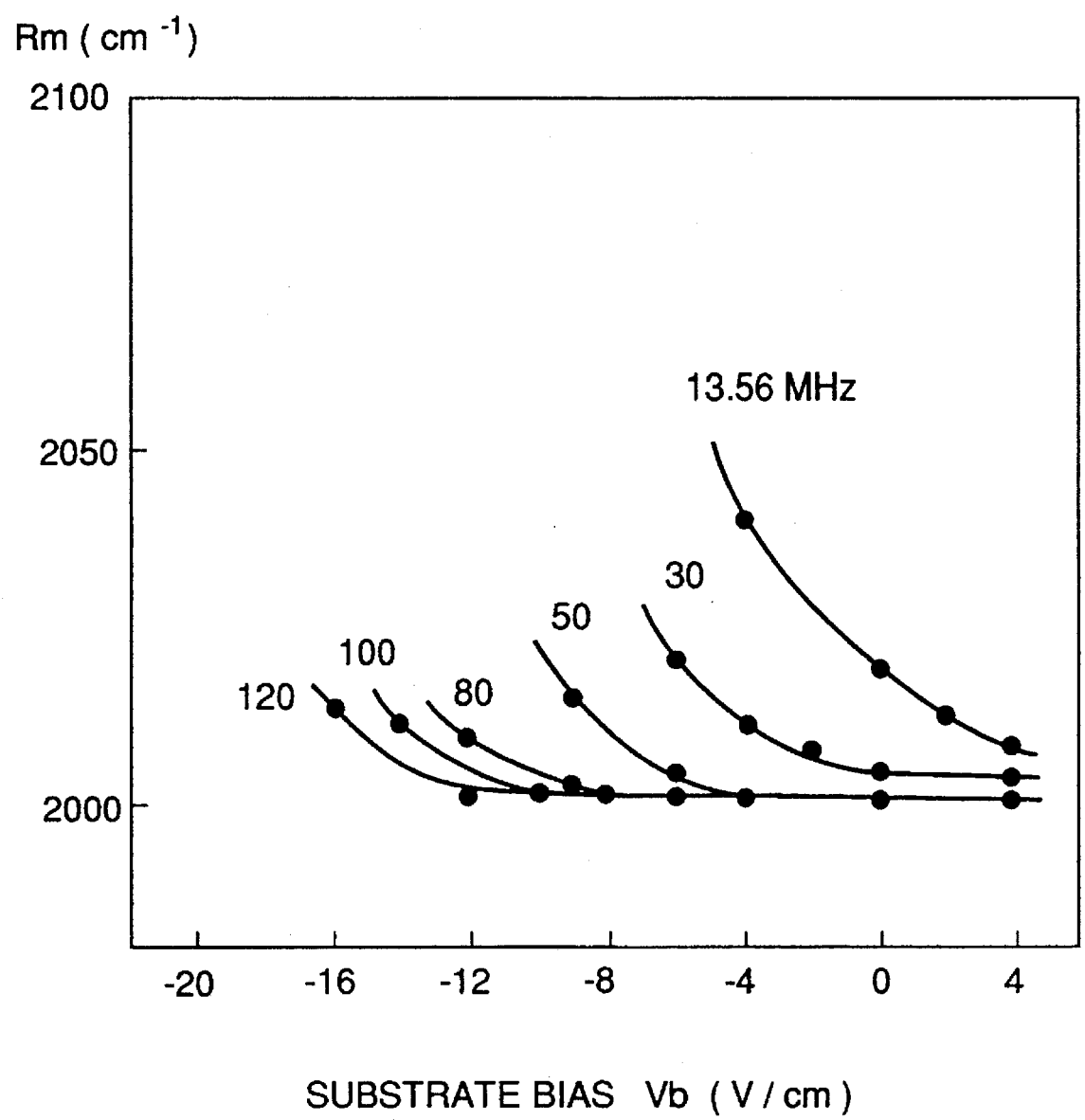
FIG. 43 illustrates an example of the relationship between the substrate bias and the state where hydrogen is bonded.
Figure 44:
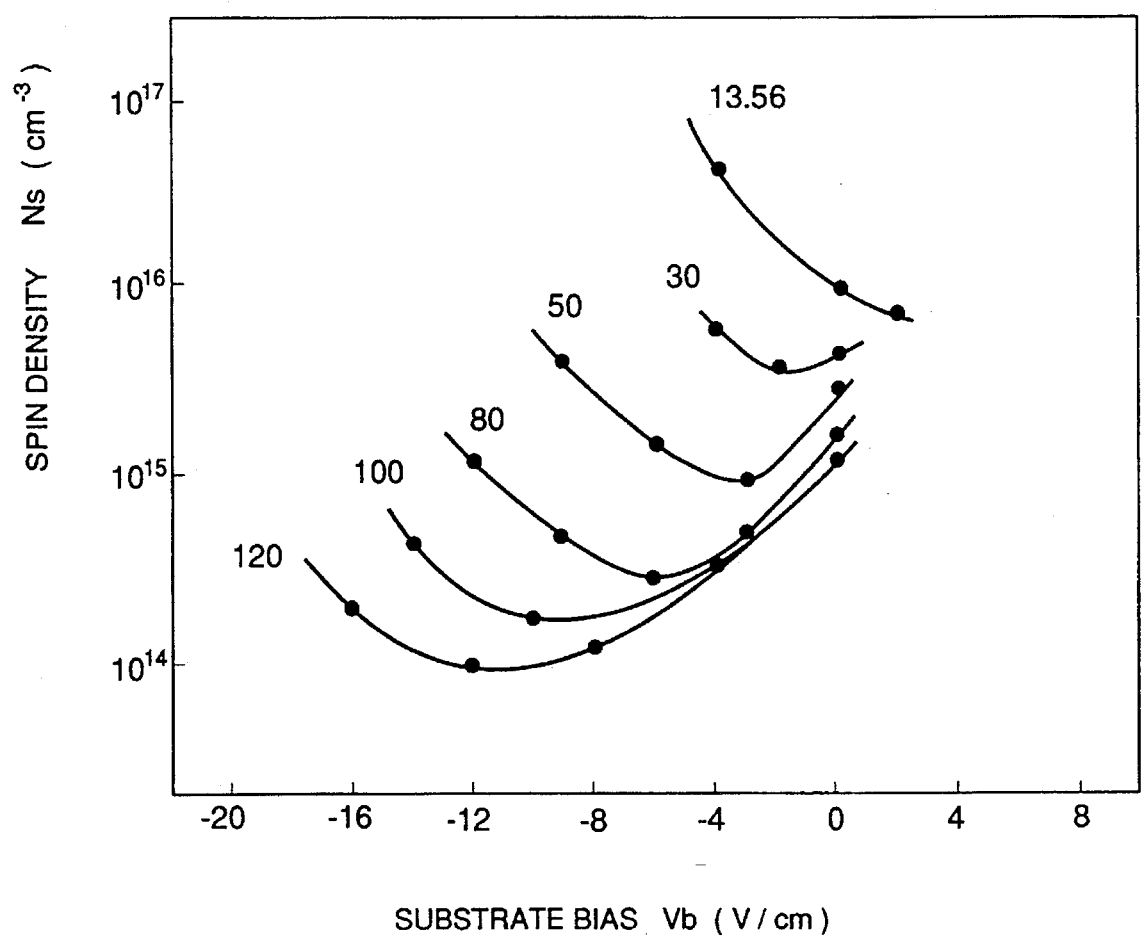
FIG. 44 illustrates an example of the relationship between the substrate bias and the spin density.
Figure 45:
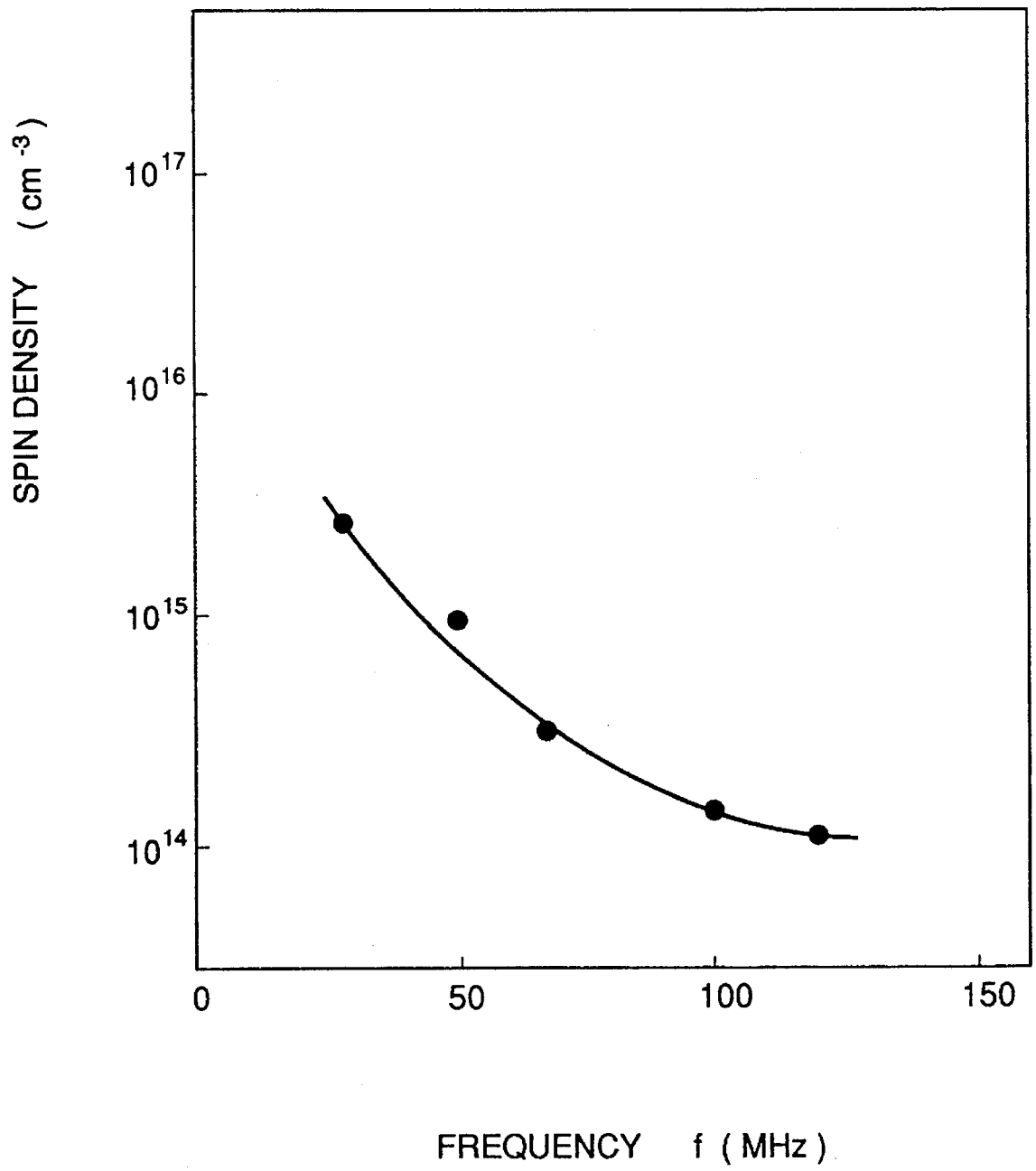
FIG. 45 illustrates an example of the relationship between the frequency and the spin density.

FIG. 43 illustrates the relationship between the substrate bias Vb and the central value Rm in the infrared ray absorption analysis at discharge frequencies from 30 MHz to 120 MHz and 13.56 MHz. FIG. 44 illustrates the relationship between the substrate bias Vb and the spin density Ns. The substrate bias is expressed by the distance d (cm) between electrodes and the applied voltage V (v) as Vb=V/d (v/cm). An important fact is that there is an optimum substrate bias. If a negative bias is applied, the improvement in the quality of the film can be expected. However, if the negative substrate bias is too large, the quality of the film deteriorates. FIG. 45 shows the relationship between the discharge frequency f and the spin density Ns when the optimum substrate bias is applied with which the spin density Ns can be minimized and the central value Rm of the infrared ray absorption analysis is not enlarged.

When the conventional frequency of 13.56 MHz is used, the quality of the film can be improved by applying positive bias in place of applying the negative bias. The aforesaid fact has been known in the RF plasma CVD method which uss 13.56 MHz as a usual method of improving the quality of the film. On the same view point, a method may be employed in which a third electrode is provided between the substrate and the cathode to which positive bias is applied.

The description will be made about the reason why the optimum substrate bias is different as positive and negative between the case where the frequency band range according to the present invention is used and the case where the conventional frequency of 13.56 MHz is used. Prior to describing it, the ion damage of the substrate by the discharged frequency will be described.

As shown in FIG. 29, the average incidental ion energy is low when f=80 MHz and a sharp energy distribution is attained. On the contrary, a multiplicity of large energy ions is present at 13.56 MHz and an undesirable distribution is attained. Inventors of the present invention estimate that ions oscillate at the conventional frequency of 13.56 MHz following the frequency and the ions are completely stopped due to the increase in the discharge frequency.

That is, as for the foregoing difference in the substrate bias due to the discharge frequency shown in FIGS. 43 and 44, if the negative bias is applied to the substrate when the low frequency of 13.56 MHz is used, unnecessary large energy ions are incident. Therefore, it is preferable that the substrate bias is made positive to prevent incidence of high energy ions if the negative bias is applied. The ion damage of the surface of the formed film considered to be the most critical disadvantage for the RF plasma CVD method is considered to be due to the foregoing large energy ions.

Since a uniform ion energy distribution is attained when a high frequency of 30 MHz or higher is used, control can easily be performed. By positively colliding ions with the substrate by using the negative bias, energy is given to $SiH_3$ which is the reactive radical for the surface of the growing film, resulting in an effect to be obtained in that the mobility of the $SiH_3$ radicals can be improved in the surface of the substrate. Accordingly, a too small negative bias for the substrate cannot improve the surface mobility of the $SiH_3$ radicals. If the negative substrate bias is too large, the ion damage occurs. Therefore, the existence of the optimum bias Vc can be understood at which the spin density shows the minimum value depending upon the discharge frequency. It is preferable that ions to irradiate the substrate are ions having the atomic weight similar or larger than that of Si ions rather than irradiating light elements such as hydrogen or helium which can easily be diffused in the film. Although the process of the change of the state of the substrate surface due to the ion irradiation and the mechanism of the activation of the $SiH_3$ radical have not been cleared yet, the inventors of the present invention estimates that the outermost surface of the substrate, that is, the several atomic layers of the surface, are brought to a high temperature state, that is, an activated state. Therefore, hydrogen removes from the surface, and the $SiH_3$ radicals, which have reached the surface, are adsorbed and given the energy, resulting in diffusion. Although the radical diffusion distance is short because the surface is reactive, a considerably many radicals are present as compared with the conventional technology, the $SiH_3$ radicals can be diffused uniformly in the surface activated points.

Figure 46:
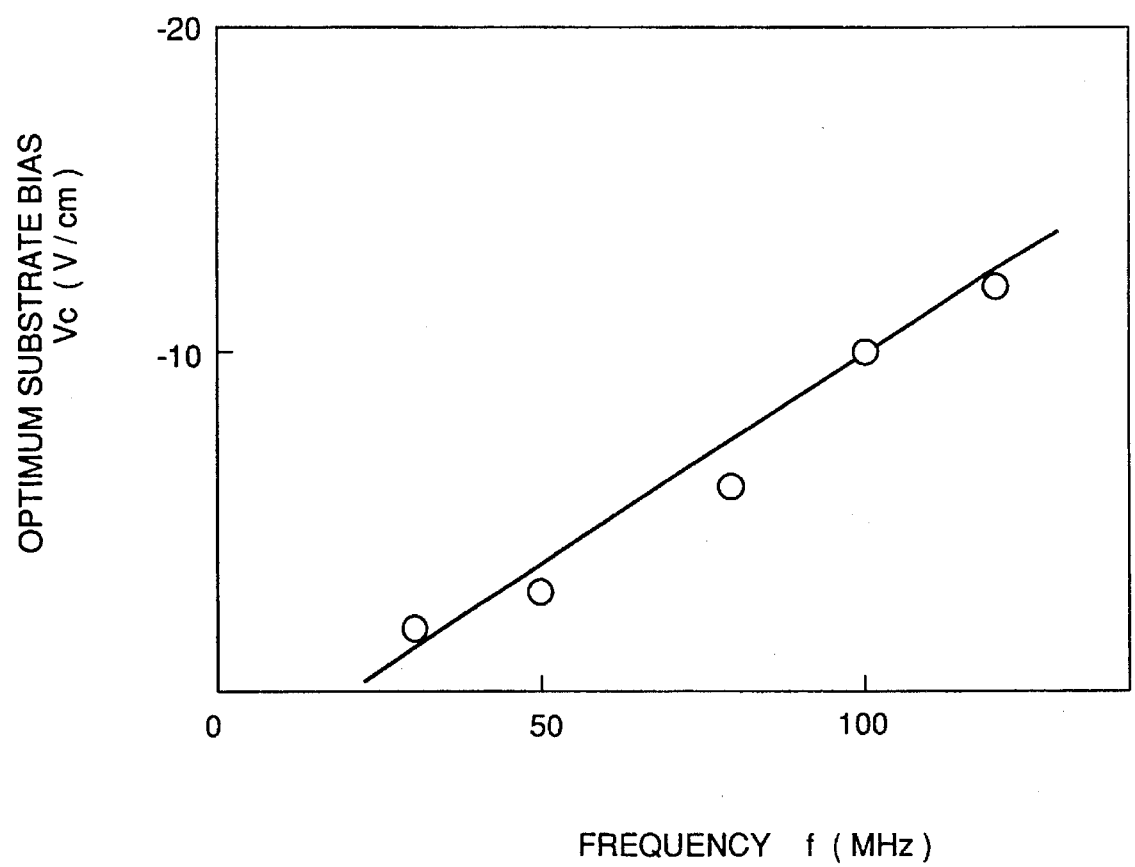
FIG. 46 illustrates an example of the relationship between the frequency and the optimum substrate bias.

At the discharge frequency according to the present invention at which the $SiH_3$ radicals can be increased efficiently, that is, the frequency range higher than 30 MHz, the optimum bias voltage Vc is raised toward the minimum side in proportion to the increase in the discharge frequency as shown in FIG. 46. Since it also depends upon the distance between the electrodes, a relationship 0>Vb/d≧about −12 (v/cm) must be held assuming that the voltage to be applied to the electrode of the substrate is Vb (v) and the distance between the electrodes is d (cm), resulting in the improvement in the quality of the film to be expected.

Figure 47:
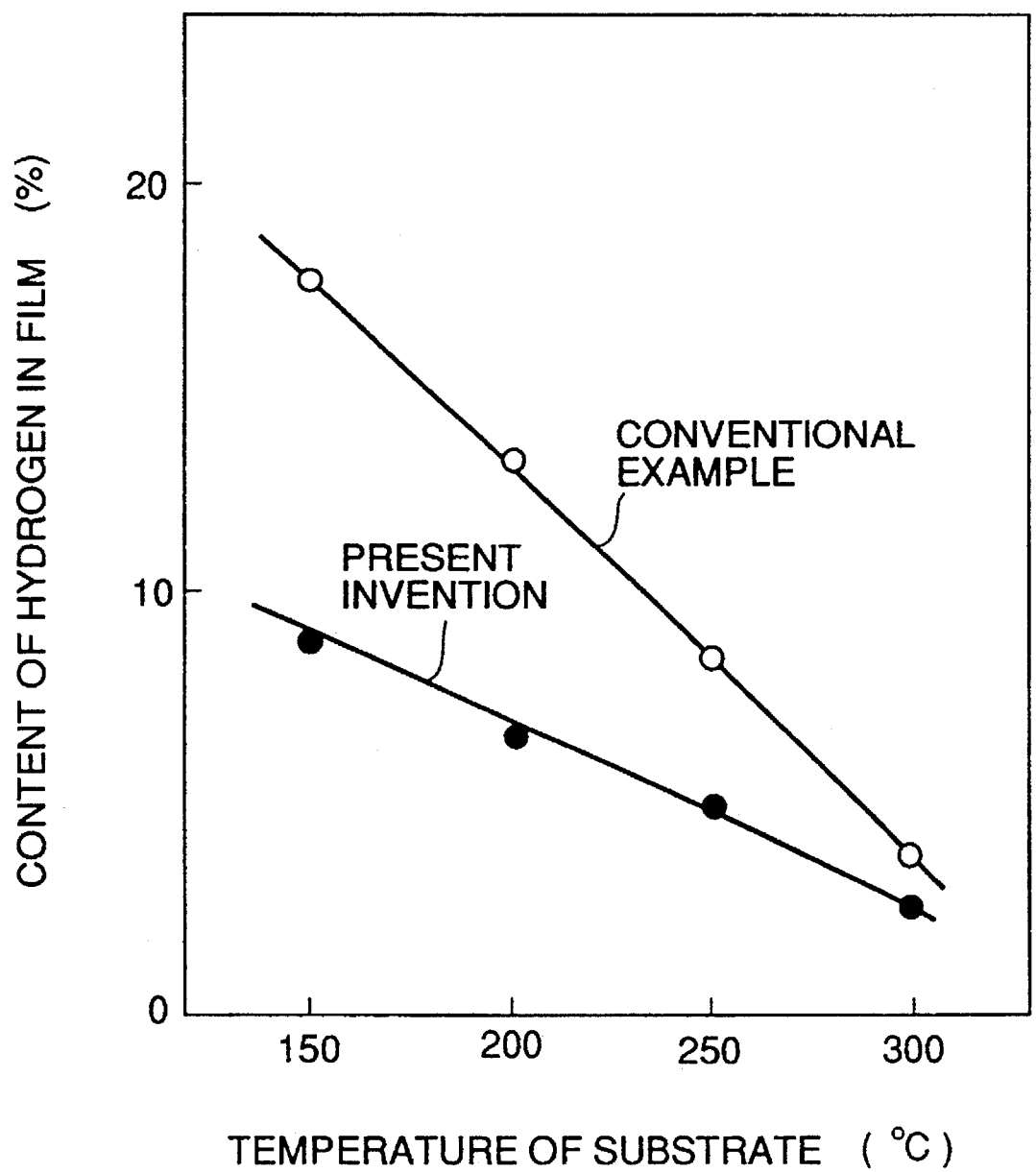
FIG. 47 illustrates an example of the relationship between the substrate temperature and the hydrogen density according to the present invention.
Figure 48:
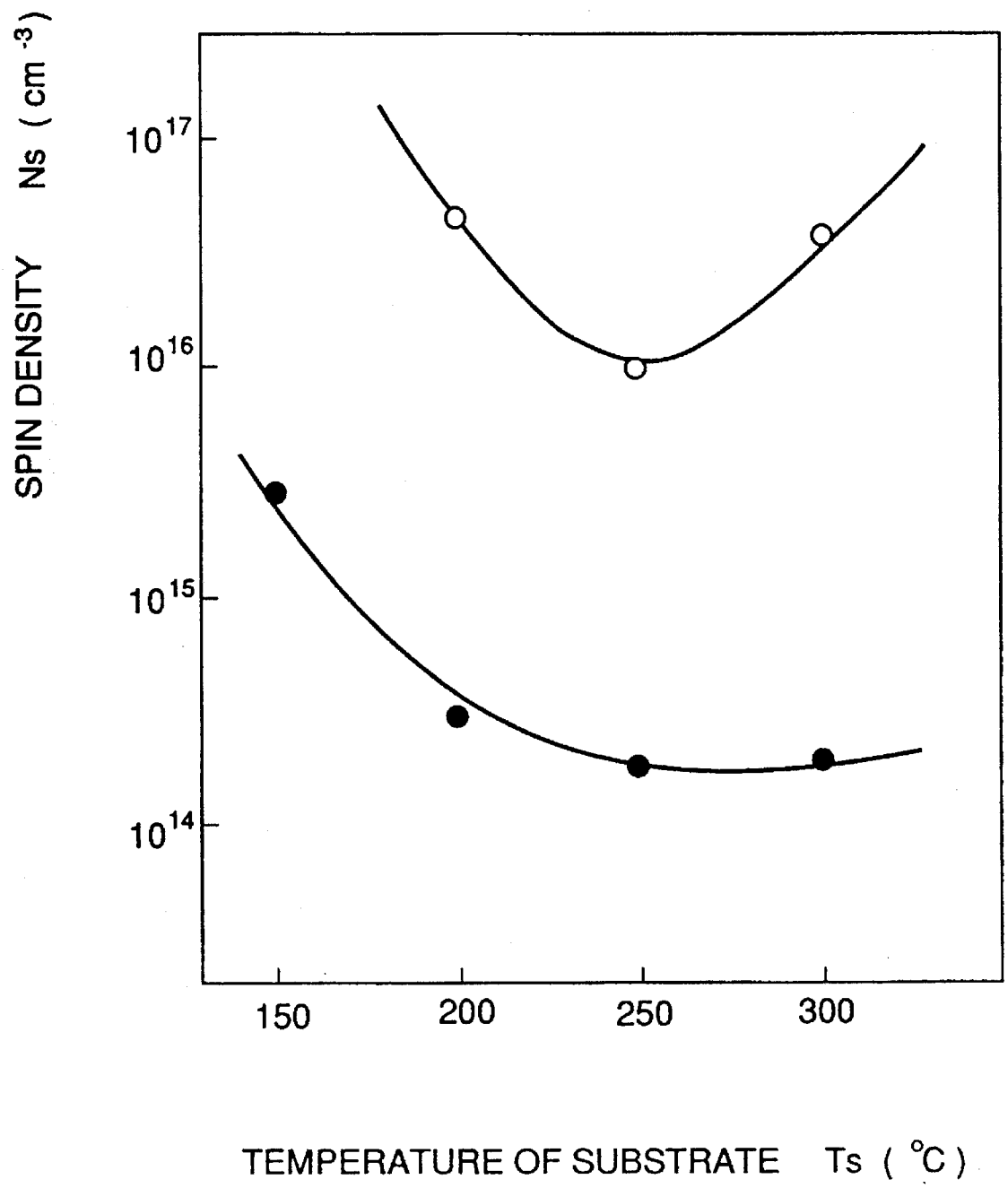
FIG. 48 illustrates an example of the relationship between the substrate temperature and the spin density according to the present invention.

As the characteristics of the present invention, hydrogen content $C_H$ in the film with respect to each discharge frequency f with the optimum bias Vc applied is a substantially uniform value of several %, resulting in a considerable improvement as compared with tens of % of the hydrogen content $C_H$ attained from the conventional glow discharge under conditions that the substrate bias Vb=0 v and f=13.56 MHz. Furthermore, a fact that the hydrogen content $C_H$ does not considerably depend upon the substrate temperature Ts was confirmed. FIG. 47 shows an embodiment of the present invention in which the discharge frequency f is 80 MHz and the substrate bias Vc is −40 v and shows the conventional example in which the discharge frequency f=13.56 MHz and the substrate bias Vb=0 v. FIG. 48 shows the relationship between the substrate temperature Ts and the spin density Ns. A similar fact can be understood that it does not considerably depend upon the substrate temperature Ts. It can be considered that the reason why an a-Si film having satisfactory excellent film quality can be obtained although the substrate temperature Ts is lower than the conventional temperature is that the substrate bias Vb is effective as means for improving the surface mobility of the $SiH_3$ radicals.

Figure 49:
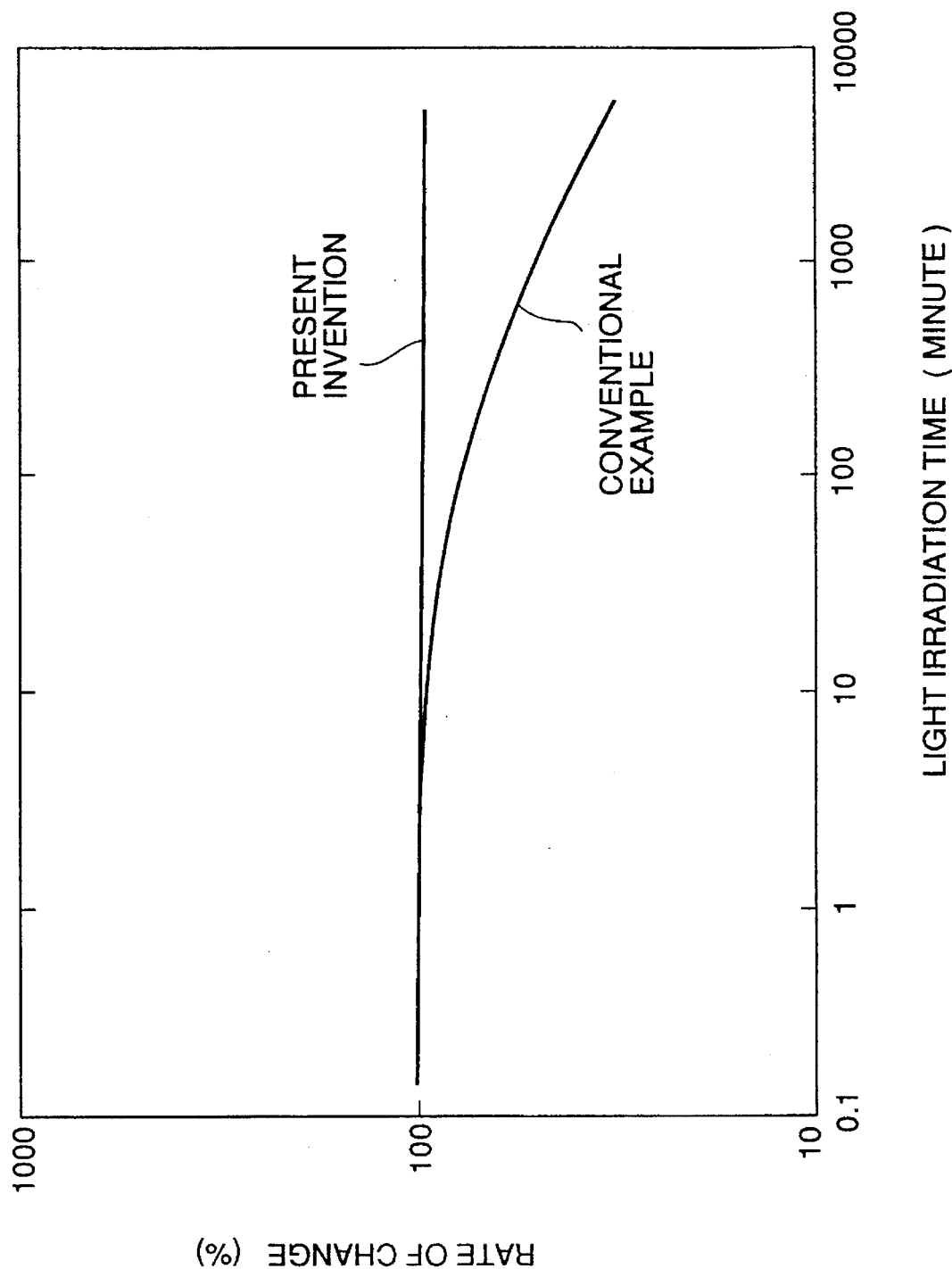
FIG. 49 illustrates an example of light deterioration according to the present invention.

Then, the light deterioration was evaluated. Specifically, a comparison was made by measuring the change in the dark conductivity after irradiation of white light of 10 mW/cm² at Vd=10 (v) for a predetermined time. Where the change at this time was evaluated with respect to the initial dark conductivity. As can be seen from FIG. 49, the a-Si film according to the present invention does not deteriorate as compared with the conventional a-Si film as expected, resulting in a defect-reduced film in which the hydrogen content and the spin density are low.

Then, an embodiment of a field-effect-type transistor which uses the a-Si film manufactured by the film forming method as described above will now be described. Since the field-effect-type transistor according to this embodiment is arranged similarly to that shown in FIGS. 35 and 36, its detailed description is omitted here.

The method of manufacturing the a-Si thin film will now be described, which is the essential portion of this embodiment.

Figure 50:
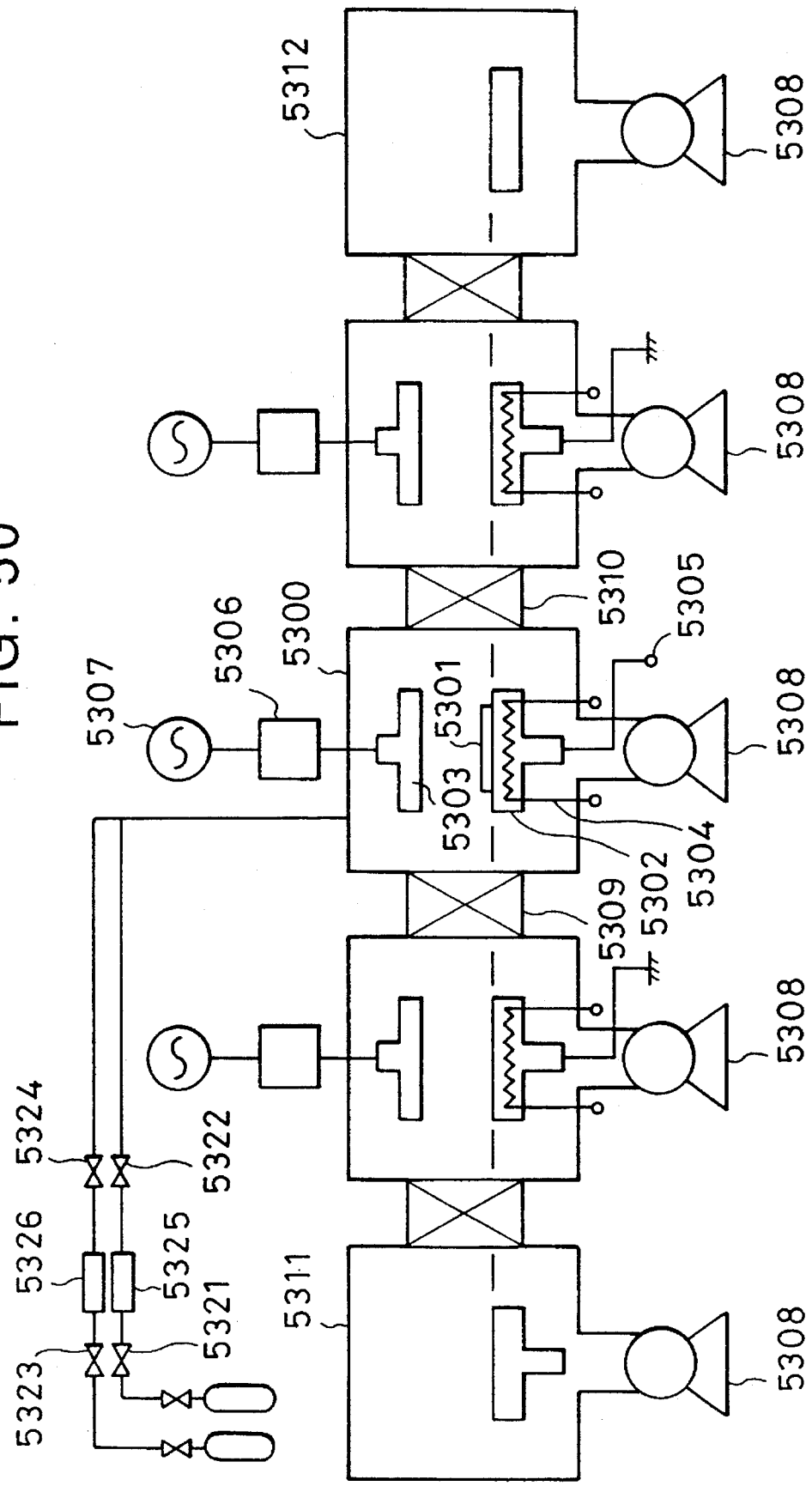
FIG. 50 schematically illustrates the structure of a continuous film forming apparatus.

The SiNx/i-type a-Si/n⁺-type μc-Si layer is formed by a load-lock-type plasma CVD apparatus arranged as shown in FIG. 50. In FIG. 50, the detailed mechanism for continuously forming the SiNx/i-type a-Si/n⁺-type μc-Si layer is omitted. The description is omitted except for the chamber for forming the i-type a-Si layer according to the present invention. Referring to FIG. 50, reference numeral 5300 represents a vacuum chamber, 5301 represents a substrate, 5302 represents an anode electrode, 5303 represents a cathode electrode, 5304 represents a substrate heater, 5305 represents a bias-application terminal, 5306 represents a matching box, 5307 represents a high frequency power source, 5308 represents an exhaust pump, 5309 and 5310 represent partition valve between the front and rear chambers. Reference numeral 5320 represents a raw material gas introduction port, 5321, 5322, 5323 and 5324 represent valves and 5325 and 5326 represent mass-flow controllers.

The substrate is, as described above, introduced from load chamber 5311 followed by film forming in the precedent SiNx film forming chamber, and the pressure in the chamber is lowered to $1\times10^{-6}$ Torr. Then, raw material gases $SiH_4$ and Ar are supplied by the mass-flow controllers 5325 and 5326 followed by maintaining the pressure at 0.5 Torr. Then, the substrate heater 5304 is operated to maintain the temperature of the substrate at 300° C. followed by applying waves having a frequency of 80 MHz by a high frequency power source 5307 with electric power of 0.04 W/cm² so that the i-type a-Si film is formed to have a thickness of 6000 Å. After the film has been formed, the pressure in the chamber is similarly lowered to $1\times10^{-6}$ Torr or lower. Then, the substrate is sifted to the next $n^+$-type μc-Si film forming chamber so that the film is formed. Then, it is taken out from the next unload chamber 5312.

Thus, the thin film transistor can be manufactured. Although the high frequency discharge using 80 MHz is employed as the embodiment of the present invention, the frequency f can be changed by changing the supplied electric power $P_W$ (W/cm²) and the pressure P (Torr) to make the light intensity ratio [H*]/[SiH*] at the light emission spectrum analysis to be a minimum value to apply the optimum substrate bias Vc. The electric field mobility μ of the a-Si thin film formed by the conventional f=13.56 MHz and the substrate bias Vb=0 v is 0.5 cm²/Vsec, it can be made to be 1.3 cm²/Vsec when f=80 MHz and the substrate bias Vb=−8 v/cm according to the present invention is applied.

Figure 51:
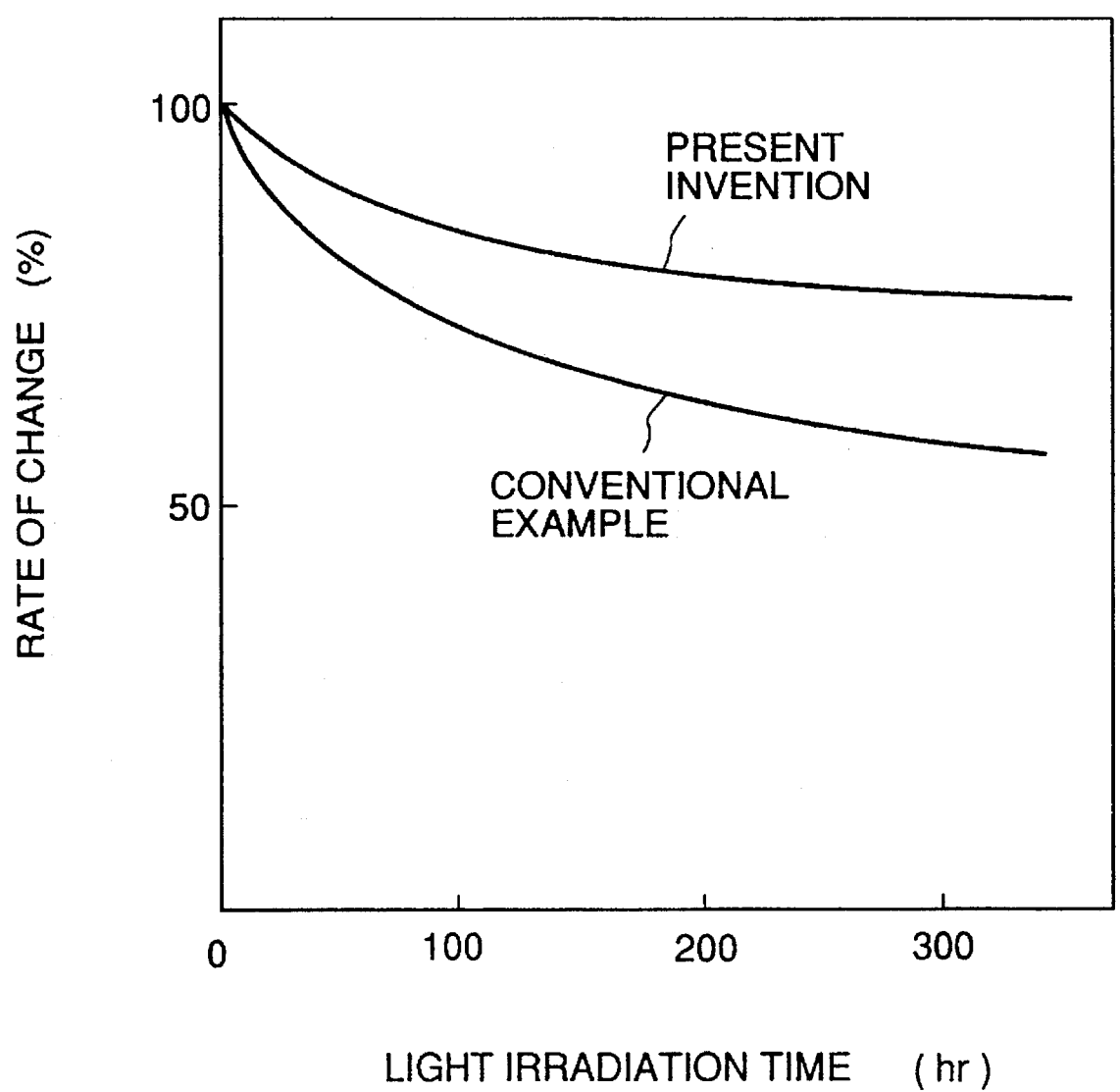
FIG. 51 illustrates an example of light deterioration according to the present invention.

Further, an effect of improving the quality of the a-Si thin film is attained in the difference in the light deterioration shown in FIG. 51. As shown in FIG. 51, a TFT manufactured by using the foregoing f=80 MHz and Vb=−8 V/cm was used as an embodiment of the present invention to confirm the effect. FIG. 51 shows the change in the photoconductivity attained when the gap portion 500 nm of the TFT is irradiated with 500 lx with respect to the initial stage, where the change is expressed as the function of the irradiation time. It can be understood that the light deterioration can considerably be prevented.

A method may be employed in which a third electrode is provided between the anode electrode and the cathode to which positive bias is applied. As a result, a similar effect can be obtained. At this time, the distance between the electrodes must be made to be the distance from the third electrode to the cathode electrode.

Embodiment 4

Figure 52:
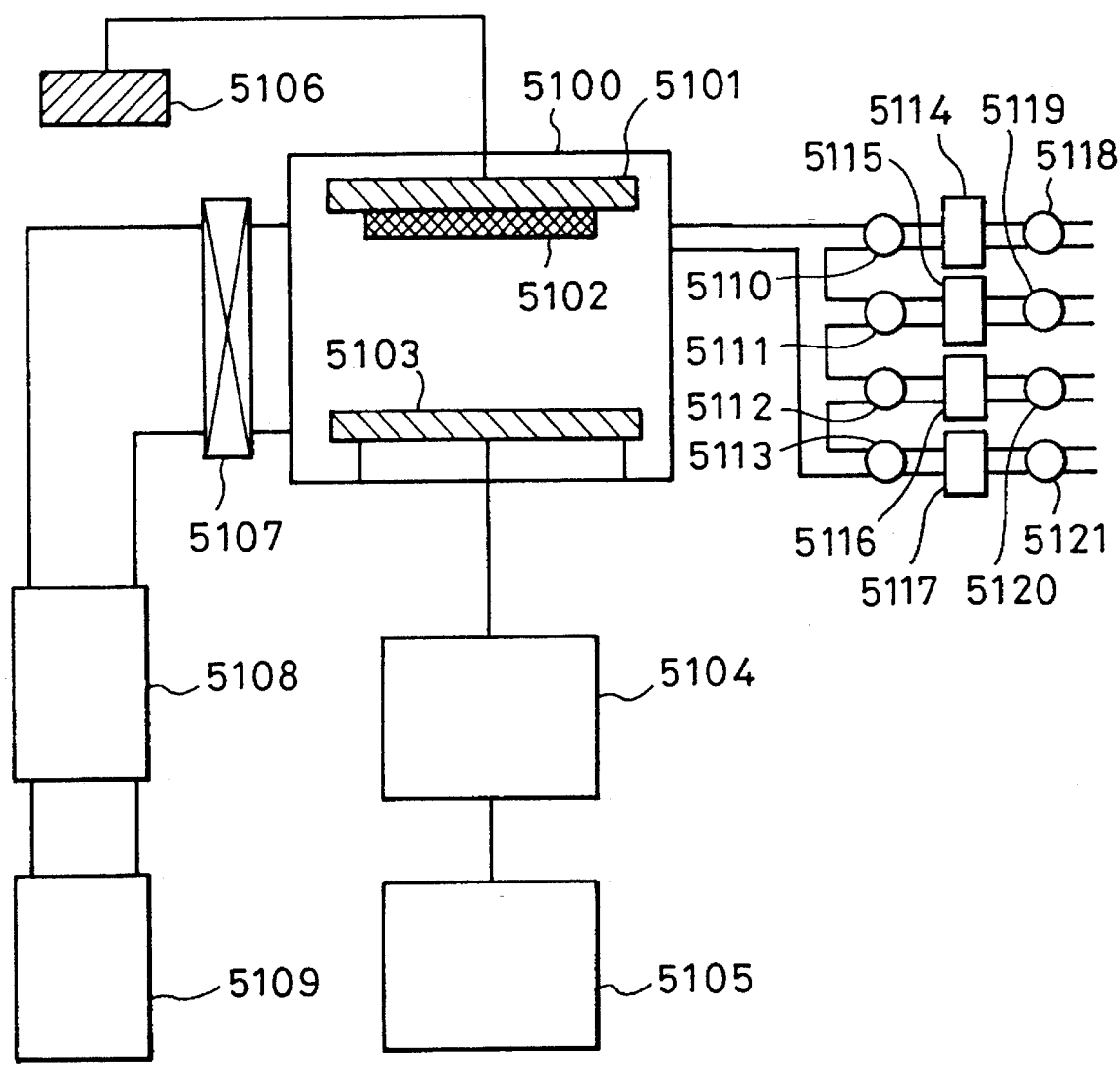
FIG. 52 is a schematic structural view which illustrates an apparatus to which the manufacturing method according to the present invention is adapted.

FIG. 52 illustrates a manufacturing apparatus for use in this embodiment, the apparatus having the basic structure arranged similarly to the conventional parallel-flat plate-type plasma CVD apparatus.

Referring to FIG. 52, reference numeral 5100 represents a vacuum chamber, 5101 represents an anode electrode, 5102 represents a substrate, and 5103 represents a cathode electrode. The anode electrode 5101 is grounded by 5106. Reference numeral 5104 represents a matching device, and 5105 represents a high frequency power source. Reference numeral 5107 represents a gate valve, 5108 represents a turbo molecular pump, and 5109 represents a rotary pump. Reference numerals 5110 and 5118 represent silane gas line valves, 5111 and 5119 represent hydrogen gas line valve, 5112 and 5120 represent phosphine gas line valve, 5113 and 5121 represent ammonia gas line valves, and 5114, 5115, 5116 and 5117 represent mass-flow meters. By carefully applying and treating the VHF wave, the present invention may be applied to a variety of apparatuses such as apparatus of a type for use to manufacture the photosensitive drum, the internal electrode type, external electrode type, capacity coupled type, induction coupled type apparatus. According to this embodiment, the distance between the electrodes is made to be 4 cm.

Figure 53A:
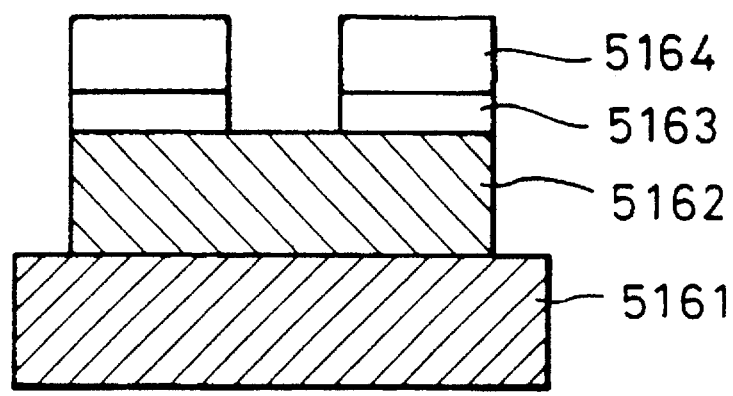
FIG. 53A is a schematic structural view which illustrates a coprana-type sensor.
Figure 53B:
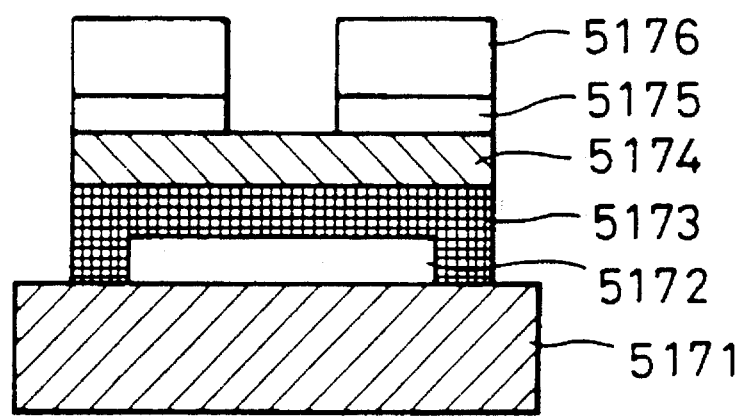
FIG. 53B is a schematic view which illustrates the structure of a thin film transistor.

As a result of the foregoing experiments and the consideration, an amorphous silicon including no impurity was manufactured by the manufacturing method according to the present invention to evaluate solely the formed film. FIG. 53 (a) illustrates the schematic structure of the device. Referring to FIG. 53(a), reference numeral 5161 represents a substrate, 5162 represents an intrinsic amorphous silicon layer, 5163 represents a $n^+$-type microcrystal silicon layer, and 5164 represents an aluminum electrode.

The foregoing device is manufactured by, first, fastening the glass substrate 5102 to the anode electrode in the chamber 5100, and the pressure was exhausted by the exhaust pump 5109 to lower the pressure to $10^{-6}$ Torr. The temperature of the substrate was changed from 250° C. to 400° C. The $SiH_4$ gas was allowed to flow by 10 sccm, the internal pressure of the chamber was made to be 0.5 Torr followed by maintaining for 30 minutes. Then, the high frequency electric power was supplied and the matching device was adjusted to commence discharge followed by discharge for a required time, so that a film was formed.

The frequency was changed from f=13.56 MHz to f=150 MHz to manufacture samples at the high frequency electric power of 10 mW/cm².

Then, an aluminum comb-type electrode was formed by evaporation followed by measuring the dark conductivity and the activating energy at the room temperature (25° C.).

Figure 54:
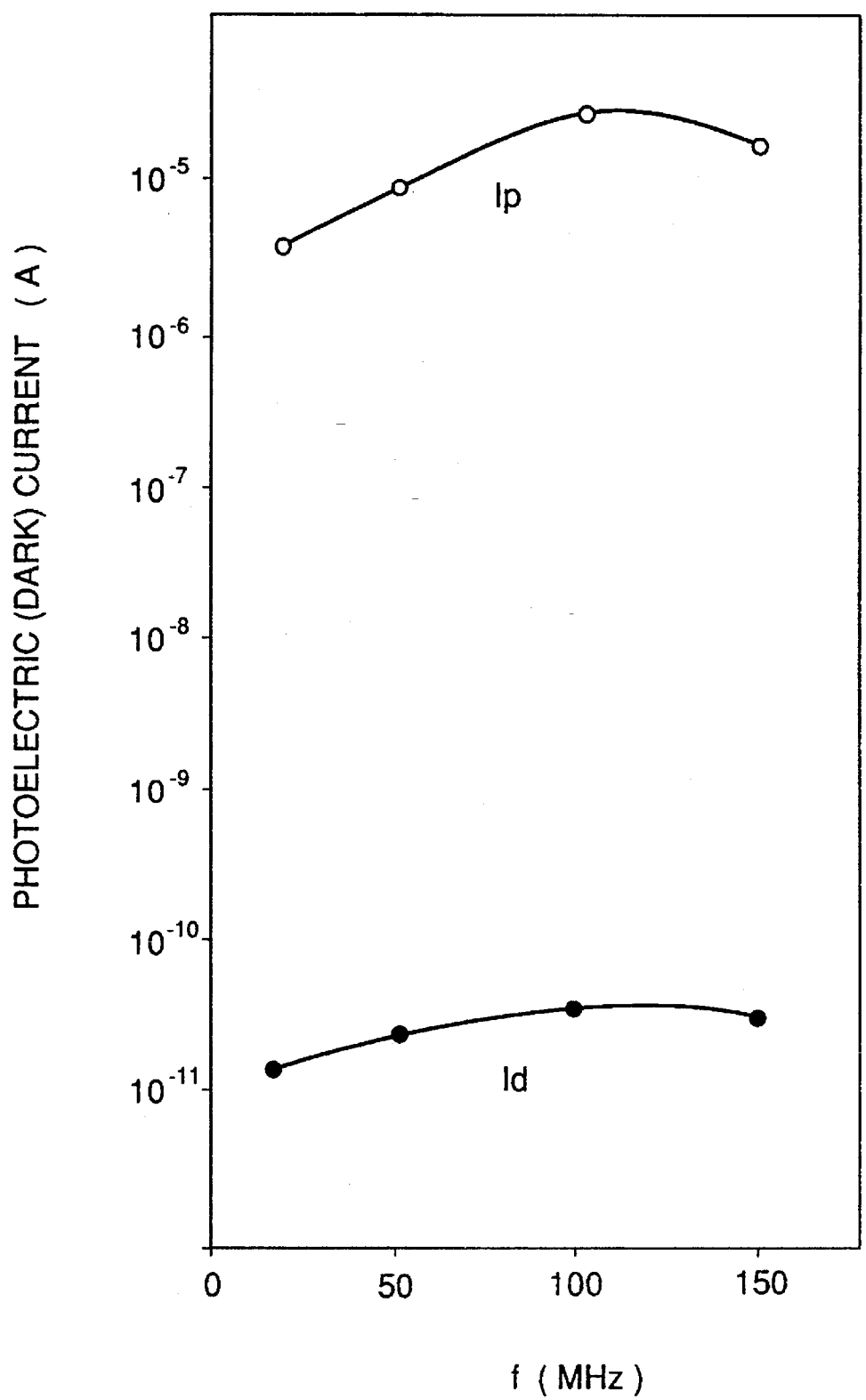
FIG. 54 illustrates an example of dependency of the photoconductivity upon the applied high frequency f.

FIG. 54 illustrates the dependency of the photoconductivity of the film upon the applied frequency. The temperature of the substrate is set to a level which the density of the defects in the film can be minimized at the corresponding frequency. In inverse proportion to the frequency, the initial defective level is lowered, but the photoconductive is raised.

Figure 55:
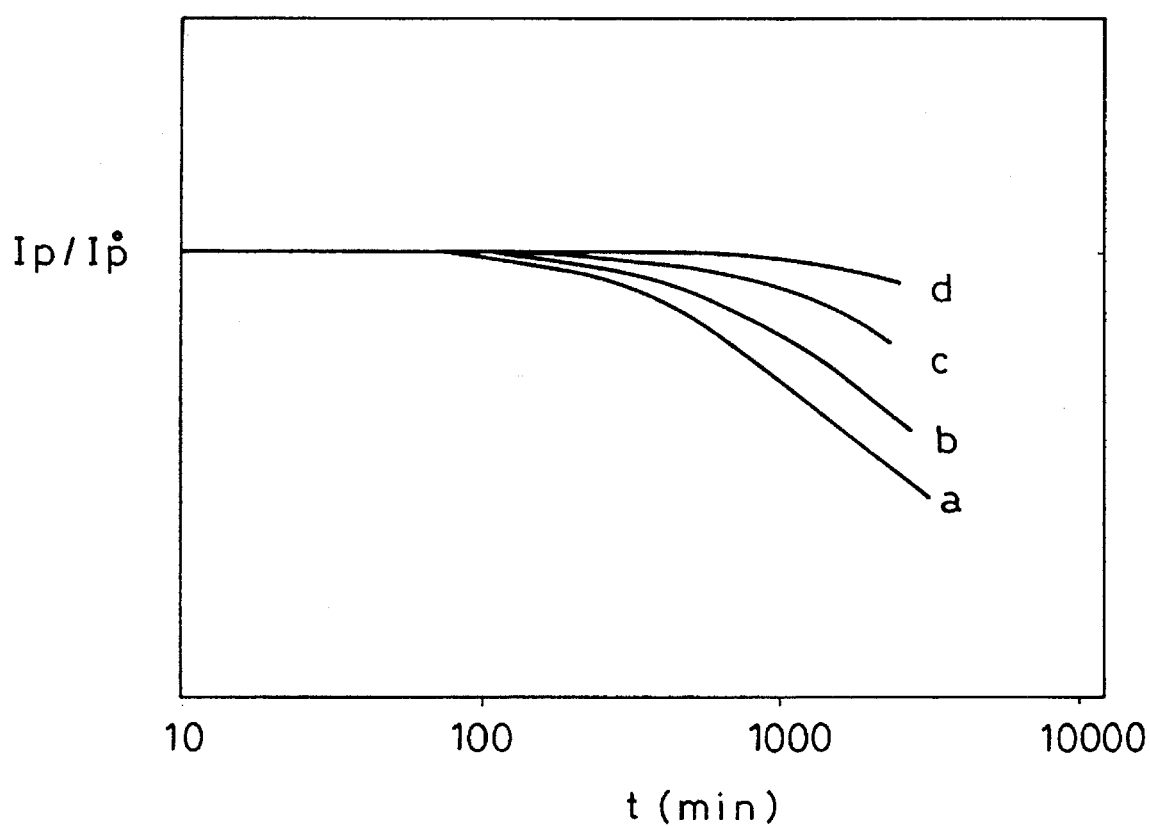
FIG. 55 illustrates an example of the time change of the photoconductivity.

With the rise in the applied frequency, ions in the plasma are trapped, which is considered that the number of ions made incident upon the substrate and the energies of the same have been reduced as described with reference to FIG. 29. FIG. 55 illustrates the change of the photoelectric current due to the time lapse (standardized by the initial photoelectric current, where Ip is the photoelectric current and $IP^0$ is the initial photoelectric current). Where a is the film formed at the conventional frequency of 13.56 MHz, b, c and d are films formed by at the frequencies raised in this order and the substrate temperatures. It can be understood that the deterioration is decreased by raising the frequency and the substrate temperature. The improvement in the quality of the film can be attained when the frequency is higher than 30 MHz. Therefore, a fact was found that the effect of the mechanism according to the present invention can be attained by using the frequency higher than the foregoing level. The increase of the substrate temperature reduces the contents of hydrogen in the film, resulting in the reduction in the weak bonds due to hydrogen. Therefore, it can be considered that the generation of defects due to light can be prevented. As described above with reference to FIG. 30, the high density radical plasma is realized, thus resulting in prevention of the defect generation due to heat at the foregoing temperature. Therefore, a satisfactory low density of the defects can be realized from the initial stage.

Embodiment 5

A fifth embodiment in which the amorphous silicon film according to the present invention is employed to form the i-layer of a thin film transistor will now be described. FIG. 53 (b) illustrates the structure of a device. Referring to FIG. 53 (b), reference numeral 5171 represents a substrate, 5172 represents a gate electrode, 5173 represents an amorphous silicon nitride layer, 5174 represents a intrinsic amorphous silicon layer, 5175 represents a $n^+$-type microcrystal silicon layer, and 5176 represents an aluminum electrode.

The foregoing device is manufactured by, first, forming an aluminum layer on a glass substrate by a vacuum evaporation method to have a thickness of 1000 Å followed by patterning, thus resulting in a gate electrode to be formed.

Then, the glass substrate 5101 is fastened to the anode electrode in the chamber 5100 followed by lowering the pressure to $10^{-6}$ Torr by using the exhaust pumps 5108 and 5109. The substrate temperature was set to 350° C., and the $SiH_4$ gas was allowed to flow by 3 sccm, the $H_2$ gas was allowed to flow by 150 sccm and the nitrogen gas was allowed to flow by 60 sccm. The internal pressure of the chamber was made to be 0.2 Torr followed by maintaining for 30 minutes followed by waiting for the state in which the temperature of the substrate is stabled. Then, the high frequency electric power is supplied and the matching device was adjusted to commence the discharge for a required time, so that the film was formed. At this time, the frequency f was set to 13.56 MHz and the high frequency electric power was set to 30 MW/cm². After the discharge has been completed, the gas was discharged and the pressure was lowered to $10^{-6}$ Torr.

Then, the substrate temperature was maintained at 350° C., and the $SiH_4$ gas was allowed to flow by 10 sccm, the internal pressure of the chamber was set to 0.5 Torr followed by maintaining for 5 minutes to wait for the state where the substrate temperature was stabled. Then, a high frequency of 80 MHz was supplied with electric power of 10 mW/cm² and the matching device was adjusted to commence the discharge for a required time. As a result, an intrinsic amorphous silicon having a thickness of 5000 Å was formed. Then, the gas was discharged followed by lowering the pressure to $10^{-6}$ Torr. Similarly, samples having different i-layers by changing the frequency from 30 MHz to 100 MHz were manufactured.

Then, substrate temperature was set to 250° C., and the $SiH_4$ gas was allowed to flow by 3 sccm, and the phosphine gas diluted to 100 ppm with the H2 gas was allowed to flow by 150 sccm. The internal pressure of the chamber was made to be 0.5 Torr followed by maintaining for 30 minutes followed by waiting for the state in which the temperature of the substrate is stabled. Then, a high frequency of 13.56 MHz was supplied with electric power of 30 MW/cm² and the matching device was adjusted to commence the discharge for a required time of 30 minutes. As a result, a $n^+$-type amorphous silicon having a thickness of 1500 Å was formed. Then, the gas was discharged followed by lowering the pressure to $10^{-6}$ Torr.

Then, the substrate was ejected from the film forming apparatus, and an aluminum layer was formed by a vacuum evaporation method to have a thickness of 1 μm followed by patterning the aluminum layer. As a result, source and drain electrodes were formed.

Finally, the foregoing electrodes were used as the mask to remove the $n^+$-type amorphous silicon by etching.

Figure 56:
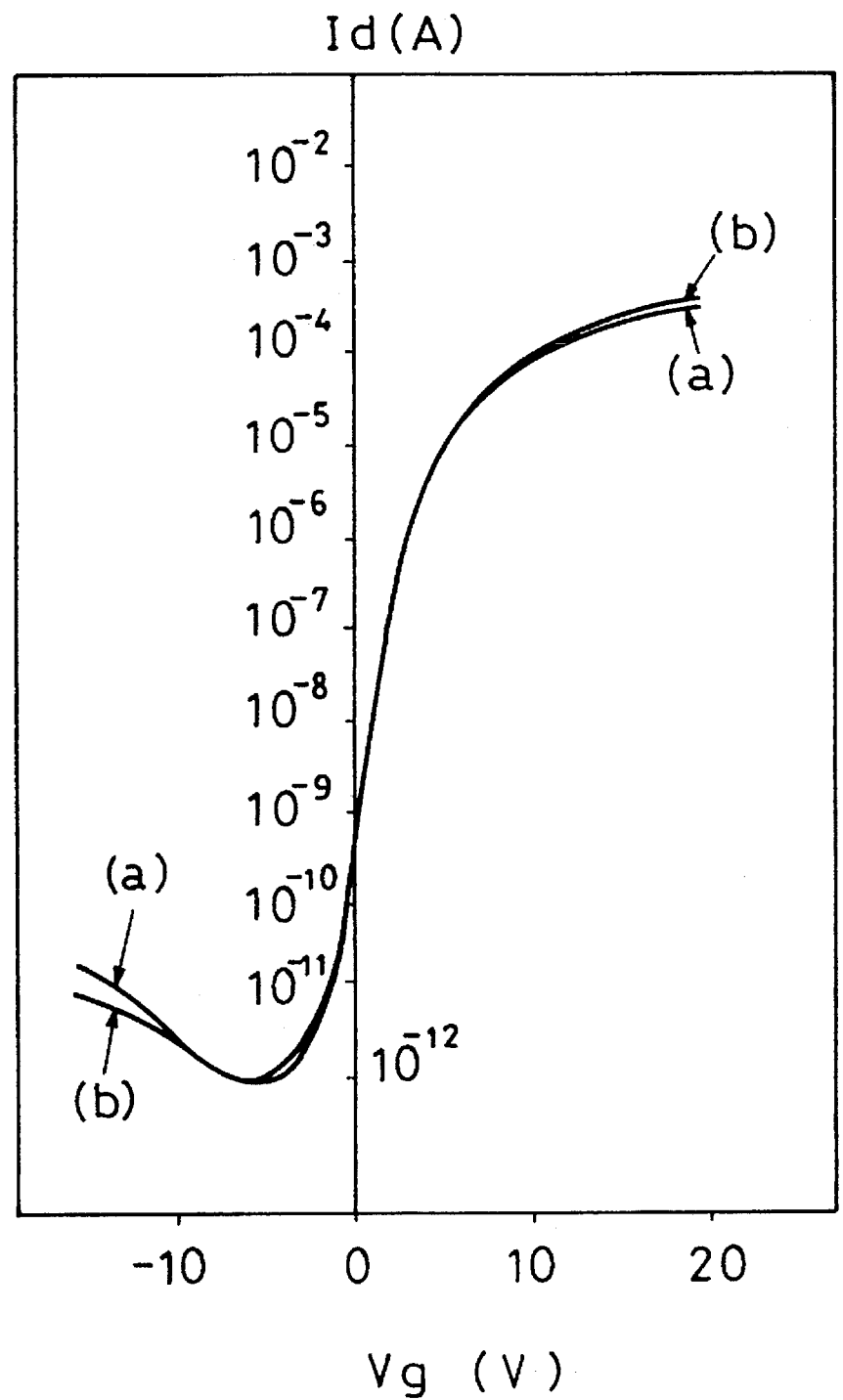
FIG. 56 illustrates an example of the characteristics of the thin film transistor according to this example.

The characteristics of a thin film transistor formed by a typical frequency f=100 MHz are shown in FIG. 56A, where satisfactory characteristics are shown. Referring to FIG. 56B shows data about the conventional characteristics.

Figure 57:
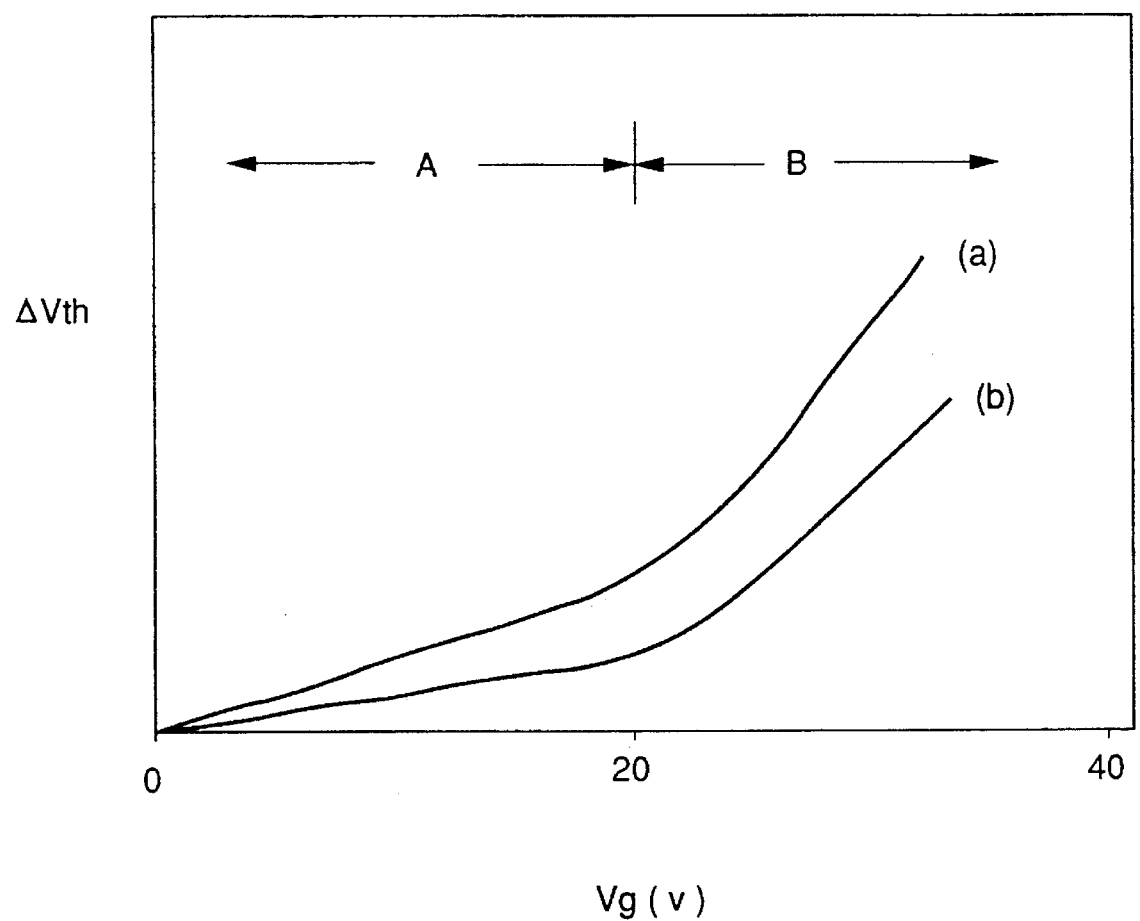
FIG. 57 illustrates an example of dependency of Vth shift when the operation is being performed upon Vg.
Figure 58:
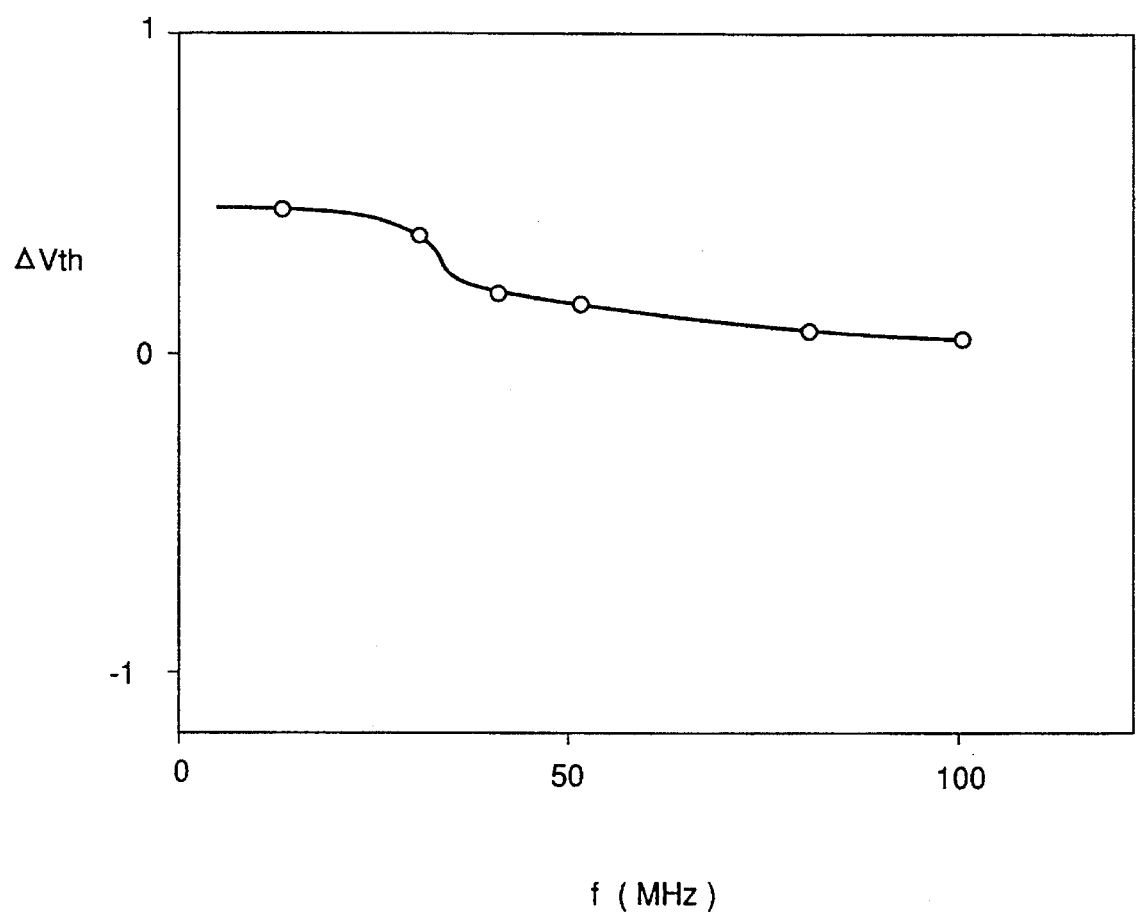
FIG. 58 illustrates an example of dependency of Vth shift upon the applied high frequency F.

FIG. 57 shows the dependency of the shift of the threshold voltage Vth upon Vg when the ON-state is maintained for 100 hours. Referring to FIG. 57, (a) is data of the conventional device. Although the shift was made toward the positive side with time, the shift can be considerably improved as designated by (b) of FIG. 57. In general, the shift of VtH can be considered to be due to two factors. Referring to FIG. 57, region A is a region in which the weak bonds in the i-layer adjacent to the nitride film are broken during the operation, the level density distribution in the gap is changed and the shift of Vth occurs. In region B, the carrier, that is, electrons in this case because an N-channel operation is being performed, are introduced into the insulating film and captured by the capturing level in the film and therefore a fixed charge is formed in the foregoing portion. However, the manufacturing method according to the present invention is able to reduce hydrogen in the film and the weak bonds in the i-layer due to hydrogen can be reduced, resulting in the fact that the bonds cannot easily be broken. As a result, the shift of Vth in the region A could be reduced. Furthermore, the nitride film in the formed i-layer could be protected from the ion damage, resulting in reduction in defects in the nitride film. Therefore, the shift of Vth in the region B could be also reduced. The dependency of the shift of Vth upon the applied frequency is shown in FIG. 58. It can be understood that the foregoing effect can be attained at about f=30 MHz. Since the i-layer can be formed at the same temperature as that set when the nitride film has been formed after the nitride film has been formed, the time required to wait for the stabilization of the temperature can significantly be shortened. A fact has been pointed that, if the film forming temperatures are excessively different from the nitride film and the i-layer, the difference in the thermal stress generated after the temperature has been restored to the room temperature will deteriorate the characteristics of the interface between the nitride film and the i-layer. However, the difference in the thermal stress can be eliminated according to the present invention, thus resulting in the improvement in the characteristics of the interface.

Embodiment 6

A sixth embodiment of the present invention will now be described.

According to this embodiment, a manufacturing apparatus basically similar to that shown in FIG. 52 was used, and the distance between the electrodes was made to be 4 cm.

Figure 59:
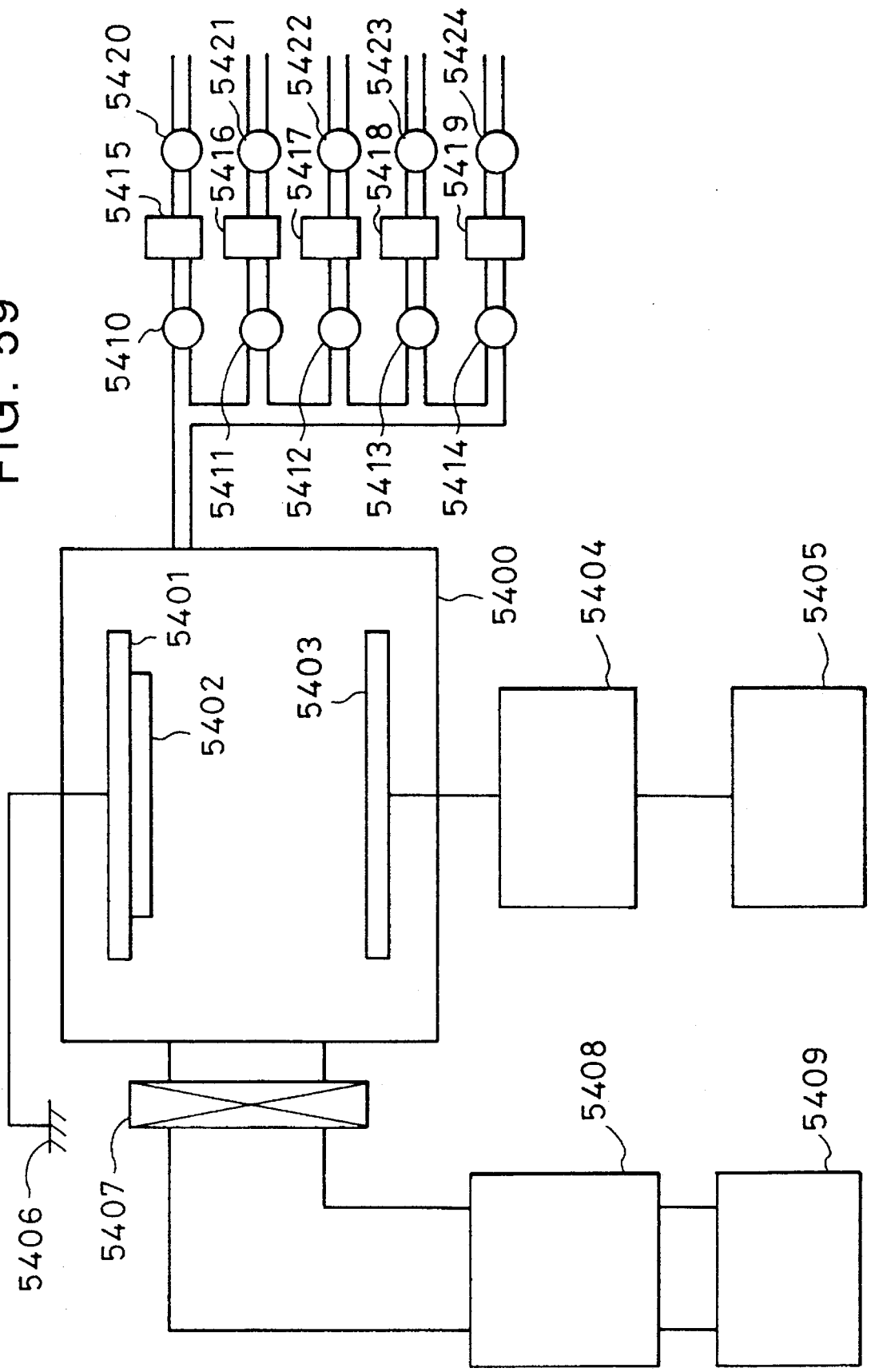
FIG. 59 is a schematic structural view which illustrates an apparatus to which the manufacturing method according to the present invention is adapted.

Referring to FIG. 59, reference numeral 5400 represents a vacuum chamber, 5401 represents an anode electrode, 5402 represents a substrate, and 5403 represents a cathode electrode. The anode electrode 5401 is grounded by 5406. Reference numeral 5404 represents a matching device, and 5405 represents a high frequency power source. Reference numeral 5407 represents a gate valve, 5408 represents a turbo molecular pump, and 5409 represents a rotary pump. Reference numerals 5410 and 5420 represent silane gas line valves, 5411 and 5421 represent hydrogen gas line valve, 5412 and 5422 represent phosphine gas line valve, 5413 and 5423 represent diborane gas line valves, 5414 and 5424 represent silicon fluoride or nitrogen gas line valves, and 5415 to 5419 represent mass-flow meters. By carefully applying and treating the VHF wave, the present invention may be applied to a variety of apparatuses such as apparatus of a type for use to manufacture the photosensitive drum, as well as the parallel-flat plate-type apparatus.

Figure 60:
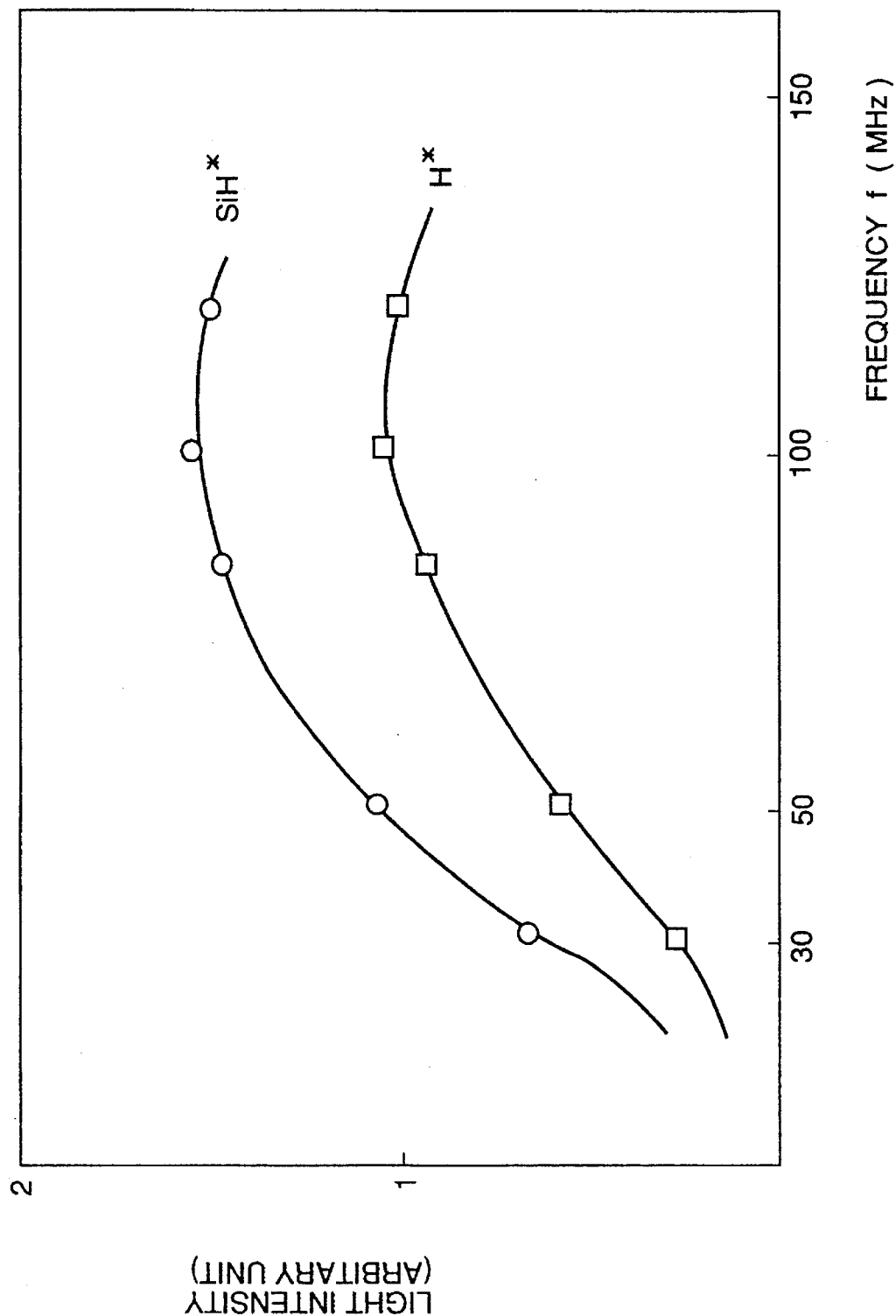
FIG. 60 illustrates an example of dependency of the light intensity [SiH*] of SiH* radicals and the light intensity [N*] of nitrogen radicals upon applied high frequency f.
Figure 61:
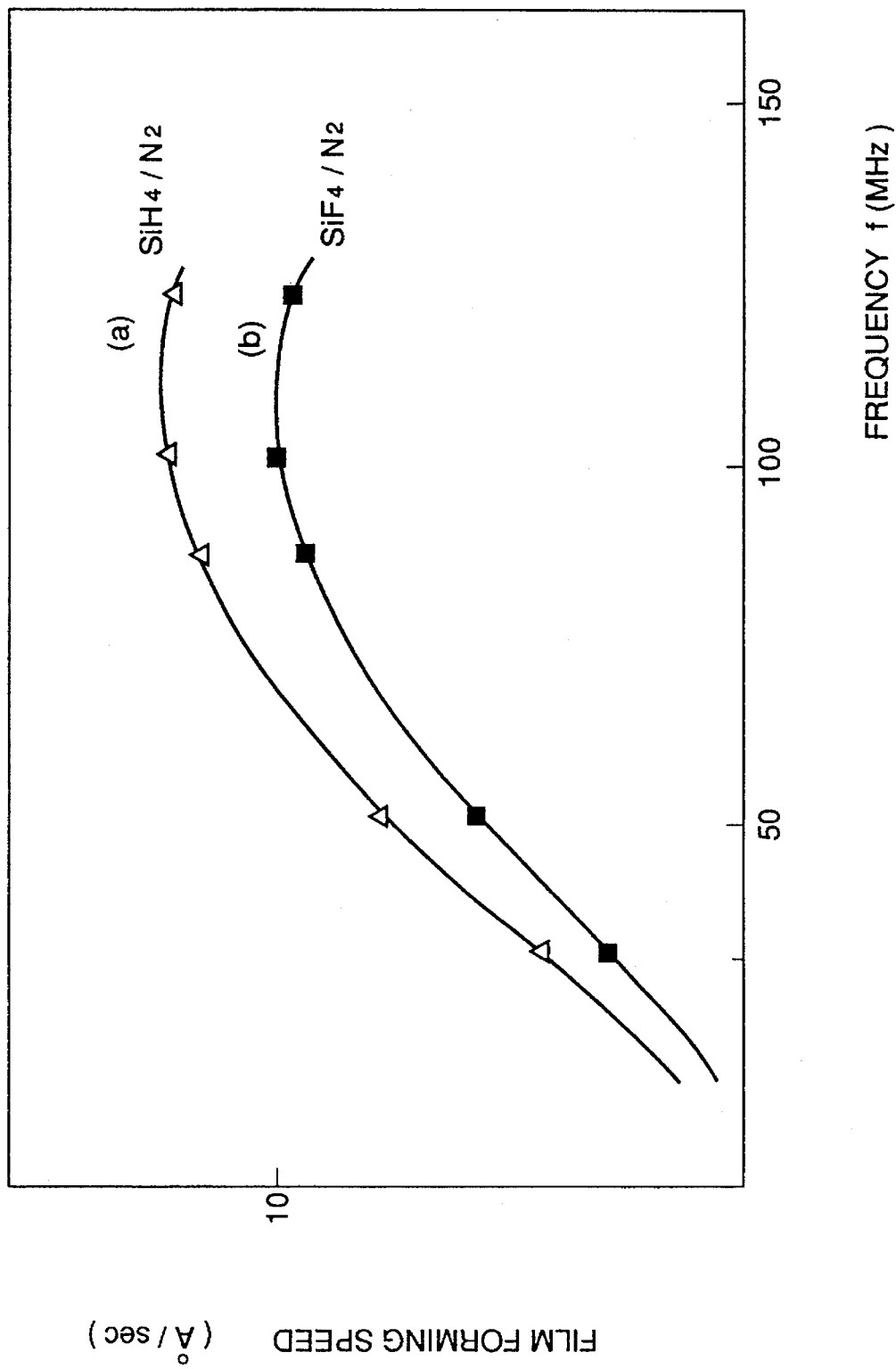
FIG. 61 illustrates an example of dependency of the film forming speed R upon the applied high frequency f.
Figure 62:
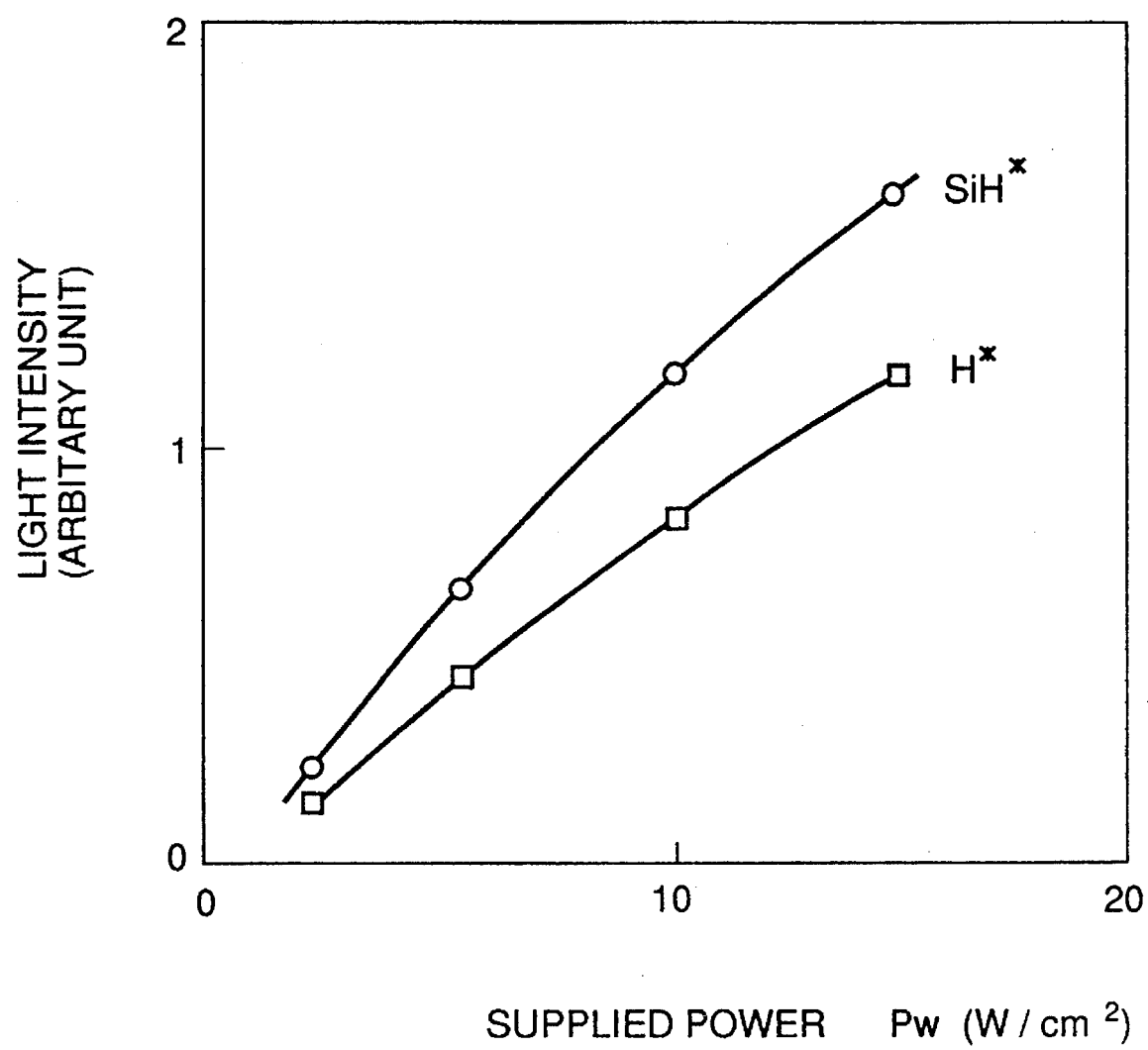
FIG. 62 illustrates an example of dependency of the light intensity [SiH*] of SiH* radicals and the light intensity [N*] of nitrogen radicals upon applied high frequency electric power $P_W$.

First, the principle of the manufacturing method according to the present invention will be described. FIG. 60 illustrates the dependency of the light intensity [SiH*] of the SiH* radicals (414 nm) and the light intensity [N*] of the nitrogen radicals upon the high frequency f applied. FIG. 61 shows the dependency of the film forming speed R upon the applied high frequency f. FIG. 62 illustrates the dependency of the light intensity [SiH*] of the SiH* radicals (414 nm) and the light intensity [N*] of the nitrogen radicals upon the supplied high frequency electric power $P_W$. The conditions are set at this time that $SiH_4$ is 3 sccm, hydrogen is 30 sccm, nitrogen is 60 sccm and the pressure is 0.2 Torr, and the high frequency electric power to be supplied is 10 m/cm². in the case shown in FIG. 60. Furthermore, f=80 MHz in the case shown in FIG. 62.

As shown in FIG. 60, the rise in the applied frequency f causes the SiH* radicals and nitrogen radicals in the plasma to start increasing. However, a maximal value is attained at about from f=80 MHz followed by a tendency of decreasing. Since the rate of the decompositions of the silane gas and the nitrogen gas depend upon the electron density ne in the plasma, the SiH* radicals and N* radicals generated due to the decomposition also depend upon the electron density ne. Therefore, it can be considered that the electron density ne in the plasma shows the dependency upon the applied frequency f, and the light intensity of the radicals depends upon the frequency as shown in FIG. 60.

As shown in FIG. 61, also the film forming speed is raised in proportion to the applied frequency f, resulting in a maximum value at about f=100 MHz. However, in a region higher than 100 MHz, the film thickness distribution on the substrate becomes excessively, and the polysilane can easily be generated, resulting in dust which causes pin holes to be formed easily. What is worse, the characteristics of the film were unsatisfactory and non-uniform. Therefore, it is preferable that the frequency is from 30 MHz to 100 MHz to exhibit the effect of the present invention. In general the film forming speed in the silane gas is in proportion to [SiH*] and the tendency shown in FIG. 61 depends upon the tendency of [SiH*] shown in FIG. 60.

As shown in FIG. 62, there is a tendency that the enlargement of the applied high frequency electric power will increase both [SiH*] and [N*].

By raising the applied frequency, the film forming speed can be raised. Furthermore, the applied electric power can be reduced. The foregoing fact is very effective when a large apparatus is used to form a film over a large area. That is, the size of the high frequency power source can be reduced with respect to the size of the apparatus, thus resulting in the reduction of the cost of the apparatus. In terms of the influence upon the characteristics of the film, the fact that the film can be manufactured in a region, in which the small electric power is supplied, will reduce the total energy of ions in the plasma. Therefore, the surface of the film can be protected from the damage due to the incidental ions, and, accordingly, a film having excellent characteristics can be formed.

In terms of preventing the damage caused from ions, the movement of ions in the plasma is considered. In general, ions in the high frequency plasma are vibrated by the electric field being oscillated by the high frequency wave in the plasma. The foregoing state can be expressed by the following equation, where A is the amplitude of the oscillating ions:

$$A \approx V/w$$

where

V: the highest speed in one period of the high frequency w: the angular frequency of the high frequency: $f=2\pi\omega$ Assuming that a parallel and flat type film forming apparatus is used and the distance between its electrodes is d, the following condition must be satisfied:

$$d > A$$

Thus, ions in the plasma do not reach the surface of the substrate but move within the plasma. The foregoing state is usually called a state where ions are captured or trapped in the plasma. As can be seen from the foregoing relationship expression, the rise of the applied high frequency enables the state where ions are trapped to be realized regardless of the size of the apparatus. As a result, the quantity of ions to be made incident on the substrate could be reduced, thus resulting in the prevention of the ion damage of the surface of the film and inside portion of the film.

FIG. 29 illustrates the foregoing state. A mass analyzer was set at the position of the substrate and the incidental energy of ions flying to the foregoing position and the distribution of the quantities of incidental ions were obtained. In order to easily perform analysis, data about argon gas was obtained. Also the reaction gas according to the present invention basically shows a similar tendency. The conventional applied high frequency f=13.56 MHz and f=80 MHz according to the present invention are different from each other in the energy and quantity of ions made incident upon the substrate. It is apparent that the condition of f=80 MHz shows a smaller average incidental energy and small quantity of incidental ions.

The foregoing effect is also applied to the chamber wall as well as the substrate. The number and the energy of ions colliding with the chamber wall can be reduced, thus resulting in reduction of the gas removal from the chamber wall while eliminating the necessity of providing a special means for the vacuum apparatus. The present invention is intended to utilize positively the foregoing states.

As described above with reference to FIG. 7, if the frequency f is high with respect to a certain distance d between electrodes, the distribution becomes large, resulting in a problem to arise when a large area film is formed. Accordingly, the inventors of the present invention have modified a variety of film forming parameters, resulting in the discovery that the distance between the electrodes affects the film thickness distribution. Furthermore, it was found that lengthening of the distance between the electrodes will reduce the film thickness distribution. The relationship between them was obtained under condition that the film thickness distribution T (%) in the film is included in 10% under a variety of the conditions according to the present invention, resulting in that the distribution is too large to be employed when d=2 cm. When d is larger than 3 cm, a substantially excellent distribution can be obtained if d meets the relationship f/d<30.

As a result of the experiments and the consideration, the amorphous silicon nitride was formed by using a mixture gas of silane gas, hydrogen gas and nitrogen gas.

As shown in FIG. 59, the glass substrate 5402 is fastened to an anode electrode 401 in the chamber 5400 followed by lowering the pressure to $10^{-6}$ Torr by using the exhaust pump 5409. The substrate temperature was set to 350° C., and the $SiH_4$ gas was allowed to flow by 3 sccm, the $H_2$ gas was allowed to flow by 30 sccm and the nitrogen gas was allowed to flow by 60 sccm. The internal pressure of the chamber was made to be 0.2 Torr followed by maintaining for 30 minutes. Then, the high frequency electric power is supplied and the matching device was adjusted to commence the discharge for a required time, so that the film was formed.

At this time, the frequency f was set to 13.56 MHz and f=80 MHz. The high frequency electric power was set to 30 MW/cm$^2$ at f=13.56 MHz, and 2 mW/cm$^2$ at f=80 MHz. In order to compare the characteristics of the films, the same film forming speed of 1 Å/sec was employed.

An aluminum comb-type electrode was formed on the film by evaporation, and the resistance ratio was measured at the room temperature (25° C.). Also the optical band gap $E_{gopt}$ was formed by the forgoing samples. The quantity of impurities in the film was measured by a secondary-ion mass analyzer.

Table 1 shows the resistance ratio of the film and the optical band gap $E_{gopt}$ formed under the foregoing conditions. The oxygen content and the hydrogen content in the film and the spin density in the film are shown.

TABLE 1

|  | Resistance ratio ρ (Ωcm) | Optical band gap Egopt (eV) | Spin density Nss (cm$^{-1}$) | Content of oxygen (atom %) | Content of hydrogen (atom %) |
| --- | --- | --- | --- | --- | --- |
| sample 1 | $2 \times 10^{15}$ | 5.1 | $6 \times 10^{16}$ | 0.1 | 17 |
| sample 2 | $3 \times 10^{16}$ | 5.0 | $1 \times 10^{16}$ | 0.05 | 14 |
| comparative sample | $5 \times 10^{14}$ | 5.2 | $5 \times 10^{17}$ | 1.0 | 25 |

By raising the applied frequency f, ions in the plasma are in a state where ions are trapped, causing the flux of ions made incident upon the surface of the substrate and the chamber wall to be decreased. The impurities in the film can be assuredly reduced because they are not ejected from the chamber wall. The spin density in the film was realized due to the reduction in the impurities in the film and prevention of the ion damage of the formed film. The reason why the resistance ratio is further raised is that the unconformability of bonds such as Si—Si and Si—N can be improved due to the prevention of the ion damage.

Figure 63:
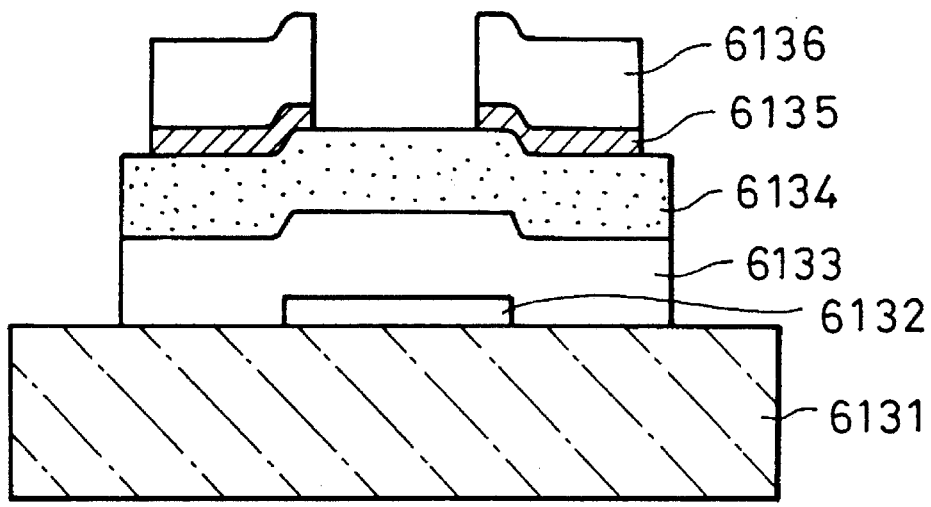
FIG. 63 is a schematic cross sectional view which illustrates a thin film transistor.

Then, the amorphous silicon nitride film formed under the foregoing conditions was used to serve as the gate insulating film of a thin film transistor to be evaluated. FIG. 63 illustrates the structure of the device.

First, an aluminum layer was formed on a glass substrate 6131 by a vacuum evaporation method to have a thickness of 1000 Å followed by patterning, thus resulting in a gate electrode 6132 to be formed.

Then, the glass substrate 6131 was fastened to the anode electrode in the chamber 5400 shown in FIG. 59 followed by lowering the pressure to 10$^{-6}$ Torr by using the exhaust pumps 5408 and 5409. The substrate temperature was set to 350° C., and the SiH$_4$ gas was allowed to flow by 3 sccm, the H$_2$ gas was allowed to flow by 30 sccm and the nitrogen gas was allowed to flow by 60 sccm. The internal pressure of the chamber was made to be 0.2 Torr followed by maintaining for 30 minutes followed by waiting for the state in which the temperature of the substrate is stabled. Then, the high frequency electric power was supplied and the matching device was adjusted to commence the discharge for a required time, so that the film was formed. At this time, the frequency f was set to several values relative to f=80 MHz. The high frequency electric power was so set as to make the film forming speed of 10 Å/sec. After the discharge has been completed, the gas was discharged and the pressure was lowered to 10$^{-6}$ Torr.

Then, the substrate temperature was maintained at 250° C., and the SiH$_4$ gas was allowed to flow by 3 sccm, the H$_2$ gas was allowed to flow by 30 sccm, and the internal pressure of the chamber was set to 0.5 Torr followed by maintaining for 30 minutes to wait for the state where the substrate temperature was stabled. Then, a high frequency of 13.56 MHz was supplied with electric power of 10 mW/cm$^2$ and the matching device was adjusted to commence the discharge for a required time of 3.5 hours. As a result, an intrinsic amorphous silicon 6134 having a thickness of 5000 Å was formed. Then, the gas was discharged followed by lowering the pressure to 10$^{-6}$ Torr.

Then, substrate temperature was set to 250° C., and the SiH$_4$ gas was allowed to flow by 3 sccm, and the phosphine gas diluted to 100 ppm with the H$_2$ gas was allowed to flow by 150 sccm. The internal pressure of the chamber was made to be 0.5 Torr followed by maintaining for 30 minutes followed by waiting for the state in which the temperature of the substrate is stabled. Then, a high frequency of 13.56 MHz was supplied with electric power of 30 MW/cm$^2$ and the matching device was adjusted to commence the discharge for a required time of 30 minutes. As a result, a n$^+$-type amorphous silicon 6135 having a thickness of 1500 Å was formed. Then, the gas was discharged followed by lowering the pressure to 10$^{-6}$ Torr.

Then, the substrate was ejected from the film forming apparatus, and an aluminum layer 6136 was formed by a vacuum evaporation method to have a thickness of 1 μm followed by patterning the aluminum layer. As a result, source and drain electrode 6136 was formed. Finally, the foregoing electrode was used as a mask to remove the n$^+$-type amorphous silicon 6135 by etching.

Figure 64:
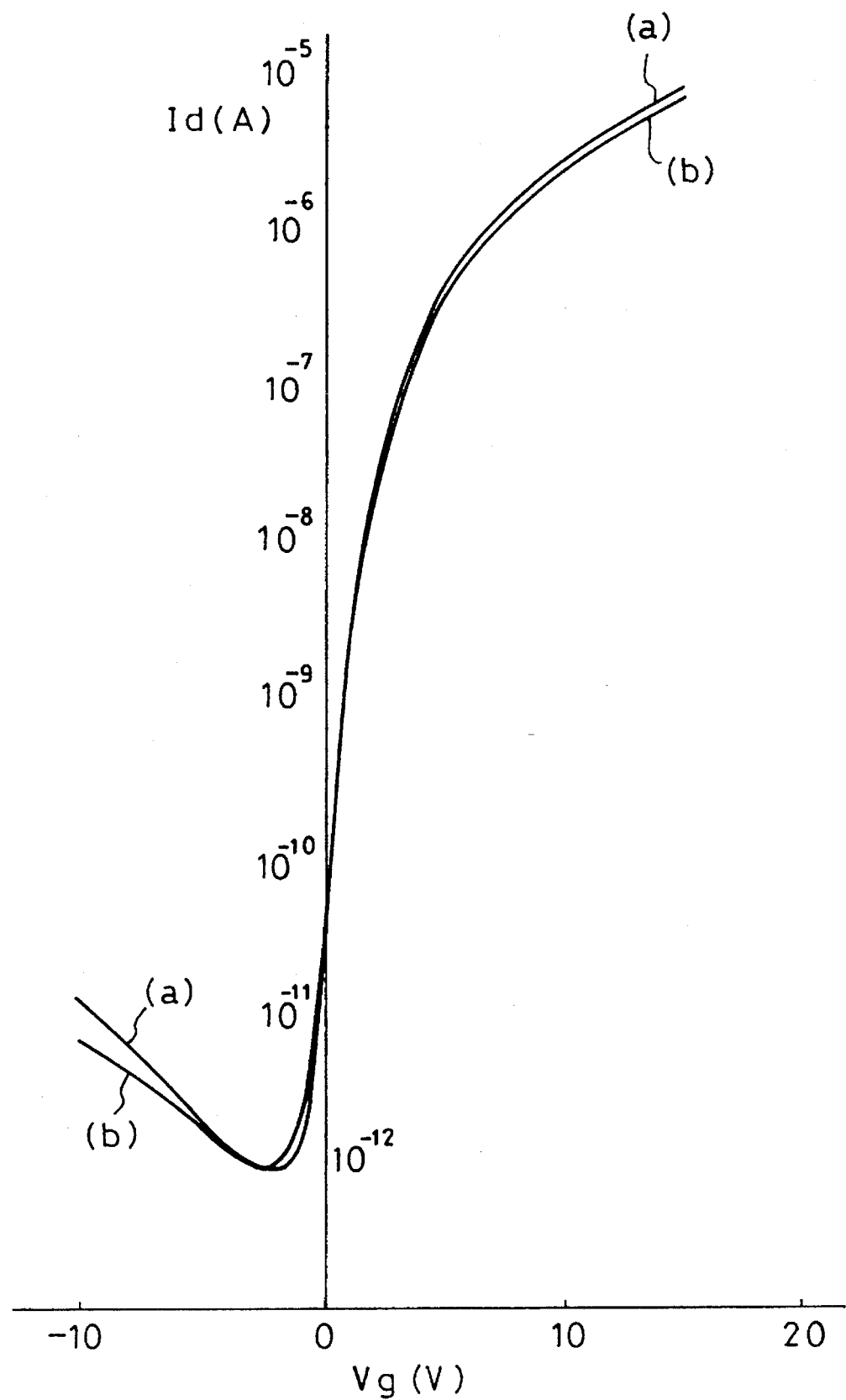
FIG. 64 illustrates an example of the characteristics of the thin film transistor according to the present invention.
Figure 65:
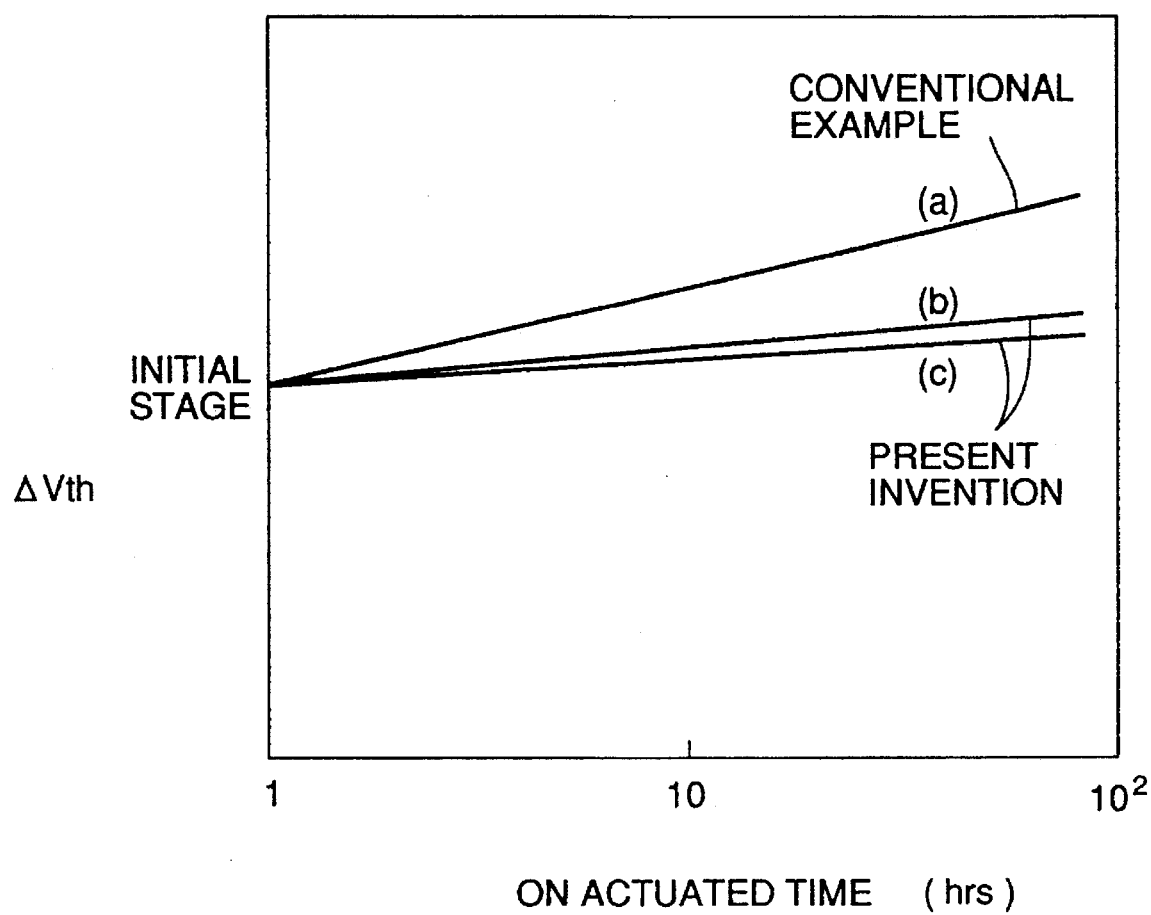
FIG. 65 illustrates an example of the Vth shift when the operation is being performed.
Figure 66:
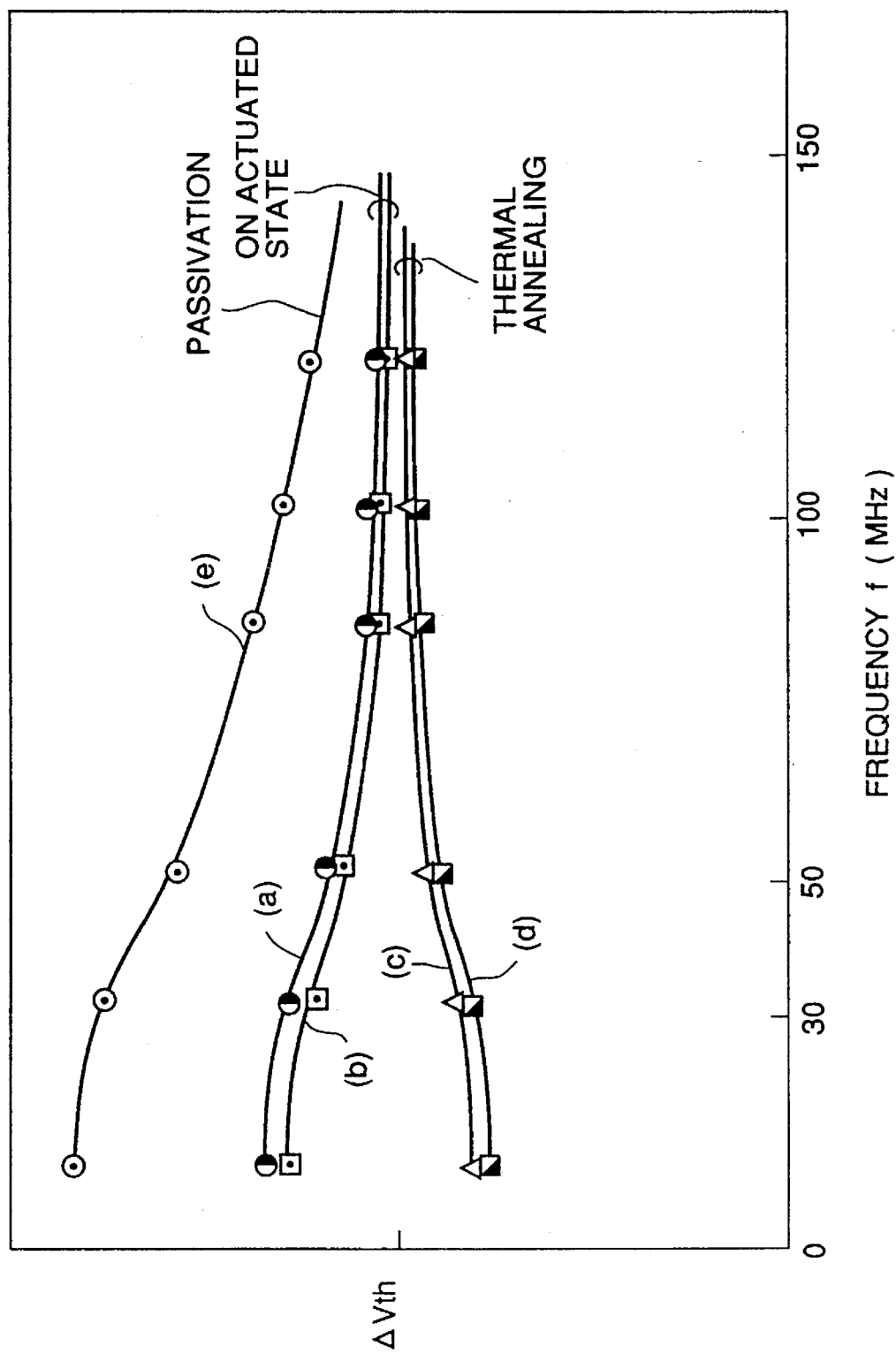
FIG. 66 illustrates dependency of the Vth shift upon the frequency.

The characteristics of a thin film transistor formed by using a typical frequency f=80 MHz are shown in FIG. 64A, where satisfactory characteristics are shown. (b) of FIG. 65 shows the shift of the threshold voltage Vth when the ON-state is maintained for 100 hours. Referring to FIG.65, (a) is data of the conventional device. Although the shift was made toward the positive side with time, the shift can be considerably improved according to this embodiment. In general, the shift of Vth can be considered to be due the fact the carrier, that is, electrons in this case because an N-channel operation is being performed, are introduced into the insulating film and captured by the capturing level in the film and therefore a fixed charge is formed in the foregoing portion. However, the manufacturing method according to the present invention is able to reduce impurities in the film and the ion damage of the formed film. Thus, it can be considered that the defects in the film were reduced and the characteristics are improved. The dependency of the shift of Vth upon the applied frequency is shown in (a) of FIG. 66. It can be understood that the foregoing effect can be attained at about f=30 MHz.

Figure 67:
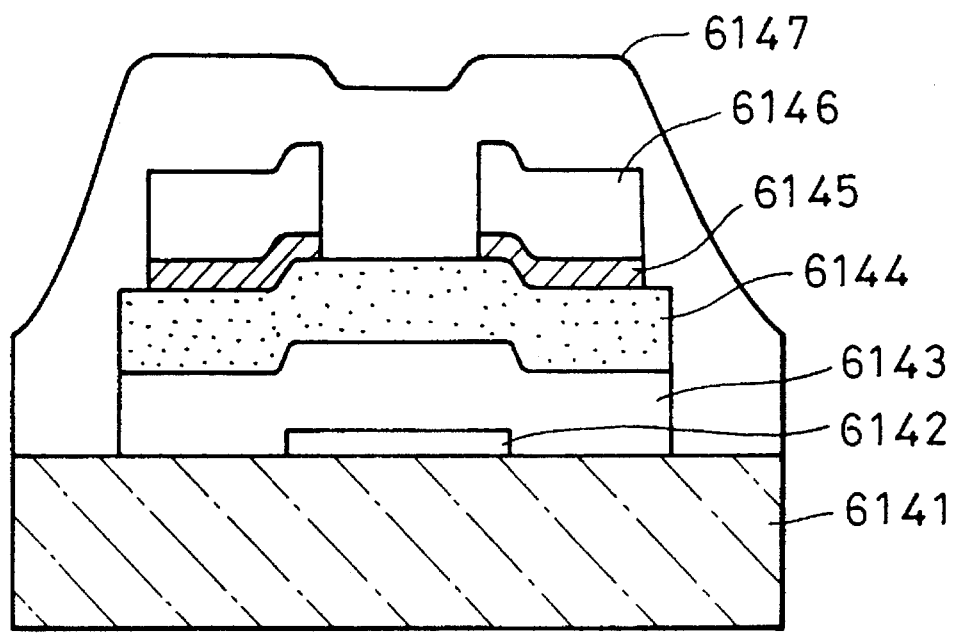
FIG. 67 is a schematic cross sectional view which illustrates a thin film transistor provided with a passivation film.

The amorphous silicon silicon nitride film formed under the same conditions was used to serve as a passivation film for a thin film transistor followed by evaluation. However, the undesirable influence of the temperature of the substrate upon the thin film transistor was prevented by setting it to 250° C. FIG. 67 shows the structure of the device.

First, an aluminum layer was formed on a glass substrate 6141 by a vacuum evaporation method to have a thickness of 1000 Å followed by patterning, thus resulting in a gate electrode 6142 to be formed.

Then, the glass substrate 6141 was fastened to the anode electrode in the chamber 400 shown in FIG. 59 followed by lowering the pressure to 10$^{-6}$ Torr by using the exhaust pumps 5408 and 5409. The substrate temperature was set to 250° C., and the SiH$_4$ gas was allowed to flow by 3 sccm, the H$_2$ gas was allowed to flow by 30 sccm and the nitrogen gas was allowed to flow by 60 sccm. The internal pressure of the chamber was made to be 0.5 Torr followed by maintaining for 30 minutes followed by waiting for the state in which the temperature of the substrate is stabled. Then, the high frequency electric power was supplied and the matching device was adjusted to commence the discharge for a required time, so that the gate insulating film 6143 was formed. At this time, the frequency f was set to f=13.56 MHz, and the high frequency electric power was so set to 30 MW/cm². After the discharge has been completed, the gas was discharged and the pressure was lowered to $10^{-6}$ Torr.

Then, the substrate temperature was set to 250° C., and the SiH$_4$ gas was allowed to flow by 3 sccm, the H$_2$ gas was allowed to flow by 30 sccm, and the internal pressure of the chamber was set to 0.5 Torr followed by maintaining for 30 minutes until for the state where the substrate temperature was stabled. Then, the usual high frequency of 13.56 MHz was supplied with electric power of 10 mW/cm² and the matching device was adjusted to commence the discharge for a required time of 3.5 hours. As a result, an intrinsic amorphous silicon 6144 having a thickness of 5000 Å was formed. Then, the gas was discharged followed by lowering the pressure to $10^{-6}$ Torr.

Then, substrate temperature was set to 250° C., and the SiH$_4$ gas was allowed to flow by 3 sccm, and the phosphine gas diluted to 100 ppm with the H$_2$ gas was allowed to flow by 150 sccm. The internal pressure of the chamber was made to be 0.5 Torr followed by maintaining for 30 minutes followed by waiting for the state in which the temperature of the substrate is stabled. Then, the usual high frequency of 13.56 MHz was supplied with electric power of 30 MW/cm² and the matching device was adjusted to commence the discharge for a required time of 30 minutes. As a result, a n$^+$-type amorphous silicon 6145 having a thickness of 1500 Å was formed. Then, the gas was discharged followed by lowering the pressure to $10^{-6}$ Torr.

Then, the substrate was ejected from the film forming apparatus, and an aluminum layer 6146 was formed by a vacuum evaporation method to have a thickness of 1 μm followed by patterning the aluminum layer. As a result, source and drain electrode 6146 was formed.

Finally, the foregoing electrode was used as a mask to remove the n$^+$-type amorphous silicon 6145 was by etching. The foregoing process is the same as the foregoing process for manufacturing the thin film transistor.

Then, a passivation film 6147 was deposited as the foregoing substrate by the manufacturing method according to the present invention. First, the substrate was again fastened to the anode electrode in the chamber 5400, and then the pressure was lowered to $10^{-6}$ Torr by using the exhaust pumps 5408 and 5409. The substrate temperature was set to 200° C., and the SiH$_4$ gas was allowed to flow by 3 sccm, the H$_2$ gas was allowed to flow by 30 sccm and the nitrogen gas was allowed to flow by 60 sccm. The internal pressure of the chamber was made to be 0.2 Torr followed by maintaining for 30 minutes followed by waiting for the state in which the temperature of the substrate is stabled. Then, the high frequency electric power was supplied and the matching device was adjusted to commence the discharge for a required time, so that the film was formed. At this time, the frequency f was set to several values relative to f=80 MHz, so that a plurality of samples were manufactured. After the discharge has been completed, the gas was discharged and the pressure was lowered to $10^{-6}$ Torr.

Figure 68:
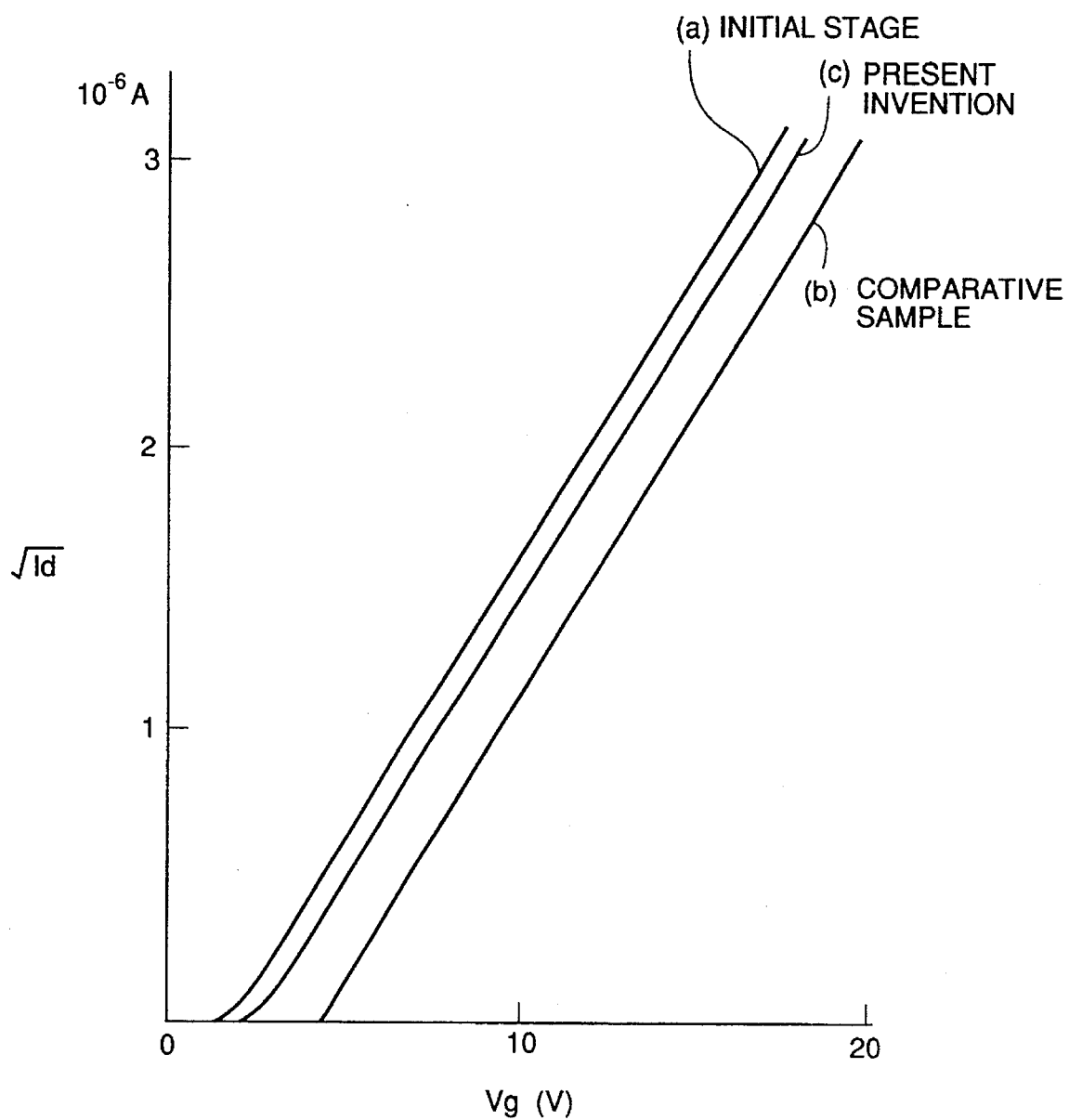
FIG. 68 illustrates an example of the effect of the passivation film according to the present invention provided for the thin film transistor.

Then, the substrate temperature was maintained at 250° C., and the SiH$_4$ gas was allowed to flow by 3 sccm, the H$_2$ gas was allowed to flow by 30 sccm, and the internal pressure of the chamber was set to 0.5 Torr followed by maintaining for 30 minutes to wait for the state where the substrate temperature was stabilized. Then, a high frequency of 13.56 MHz was supplied with electric power of 10 mW/cm² and the matching device was adjusted to commence the discharge for a required time of 3.5 hours. As a result, an intrinsic amorphous silicon 6134 having a thickness of 5000 Å was formed. Then, the gas was discharged followed by lowering the pressure to $10^{-6}$ Torr. As comparative examples, samples formed by forming a passivation film formed by using the frequency of f=13.56 MHz and the high frequency electric power of 30 MW/cm² to the similar thin film transistor was evaluated. The characteristics attained from the structure having the passivation film formed by using a typical frequency f=80 MHz are shown in (c) of FIG. 68. (b) of FIG. 68 shows the result of the samples manufactured by a method according to the comparative sample. (a) of FIG. 68 shows the initial characteristics attained without the passivation film. The threshold voltage of the comparative sample was shifted to the positive side due to the passivation film attached because of the ion damage in the plasma. However, the passivation film according to the present invention reduced the shift considerably. The dependency of the shift of Vth upon the applied frequency is shown in (e) of FIG. 66. It can be understood that the foregoing effect can be attained at about f=30 MHz. As a result of the experiment, it can be considered that the ions made incident upon the substrate can be reduced by raising the frequency at about f=30 MHz, and the ion damage at the time of forming the film can be reduced.

Embodiment 7

A seventh embodiment of the present invention will now be described.

A mixture gas of silicon fluoride, hydrogen gas and nitrogen gas was used to manufacture an amorphous silicon nitride film by the manufacturing method according to the present invention.

Figure 69:
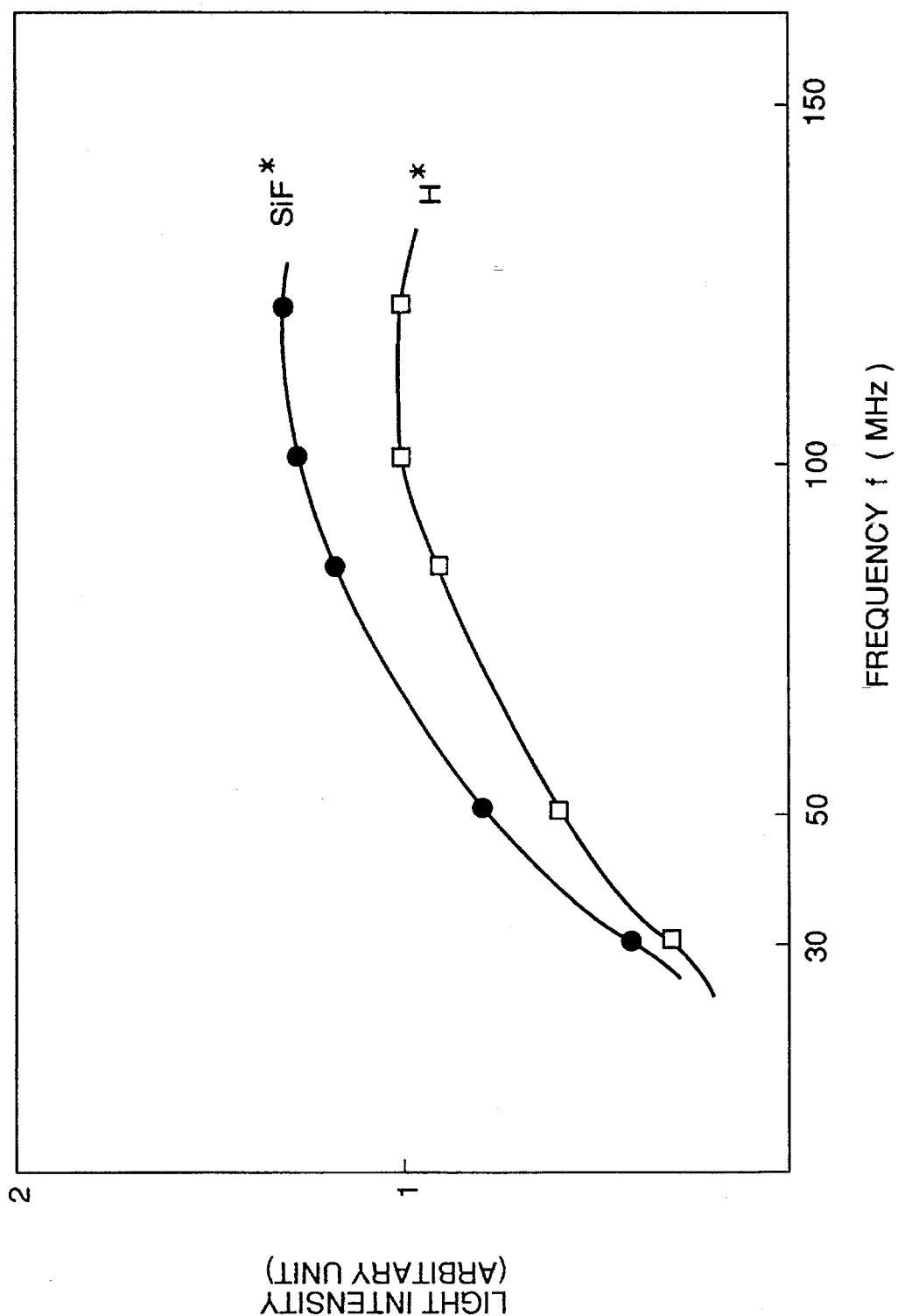
FIG. 69 illustrates an example of dependency of the light intensity [SiF*] of SiF* radicals and the light intensity [N*] of nitrogen radicals upon applied high frequency f.
Figure 70:
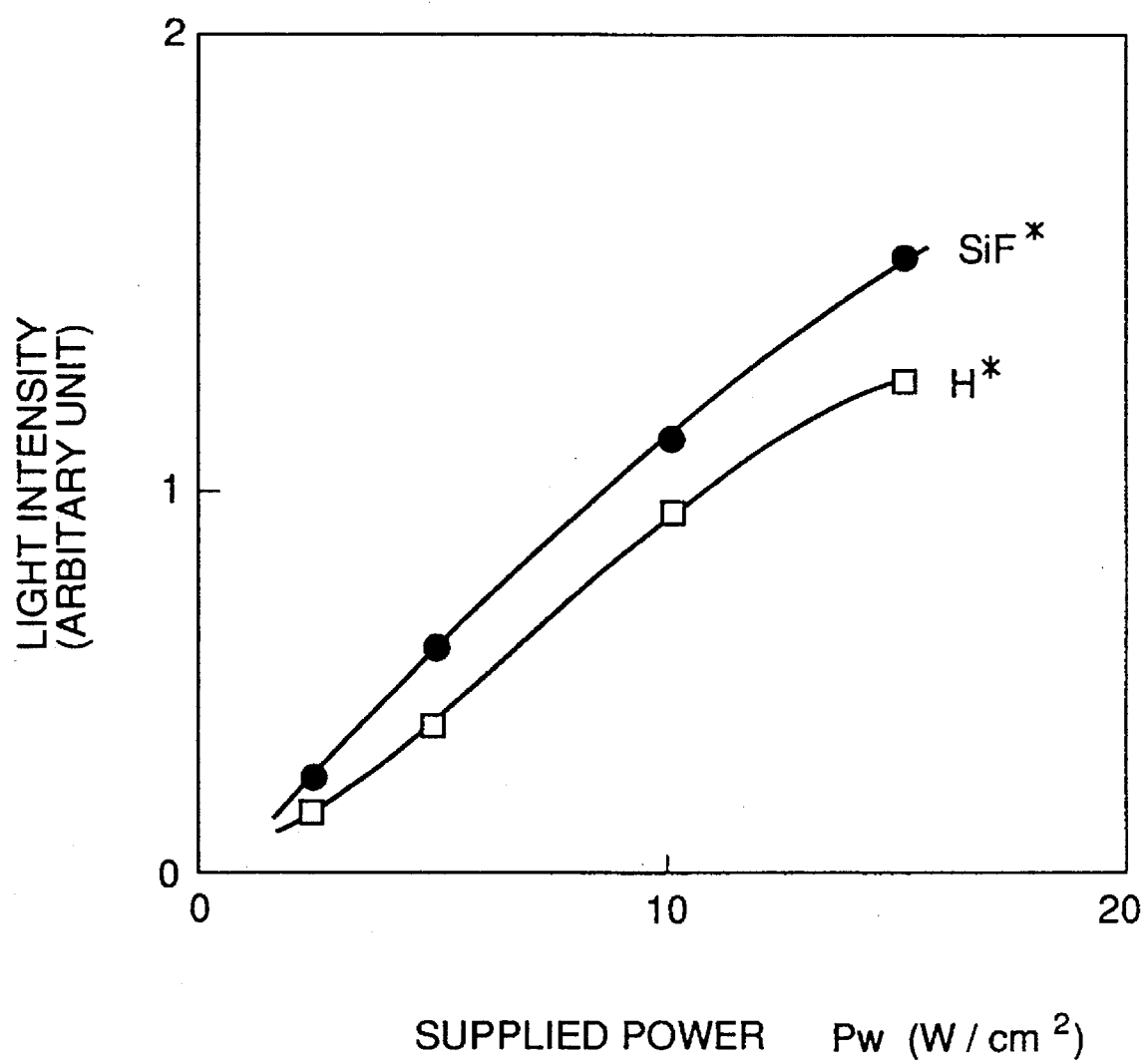
FIG. 70 illustrates an example of dependency of the light intensity [SiF*] of SiF* radicals and the light intensity [N*] of nitrogen radicals upon applied high frequency electric power $P_W$.

First, the state of the plasma at this time will be described. FIG. 69 illustrates dependency of the light intensity of the SiF* radicals upon the frequency. It can be understood that the rise of the applied frequency raises the light intensity. The reason for this can be considered that the electron density in the plasma becomes larger and the decomposition efficient has been raised similarly to the silane gas. FIG. 70 illustrates dependency of light intensity of the SiF* radicals upon the supplied electric power. The rise in the supplied electric power will raise the light intensity. In this embodiment, the applied frequency was varied from 13.56 MHz to 150 MHz.

Samples were manufactured under the conditions showing the foregoing plasma state. A glass substrate was fastened to an anode electrode in the chamber shown in FIG. 59 followed by lowering the pressure to $10^{-6}$ Torr by using the exhaust pumps 408 and 409. The substrate temperature was set to 350° C., and valves 414 and 424 were opened to flow silicon fluoride gas by 3 sccm, valves 411 and 421 were opened to flow H$_2$ gas by 40 sccm and to flow nitrogen gas by 120 sccm followed by maintaining for 30 minutes. Then, the high frequency electric power was supplied and the matching device was adjusted to commence the plasma discharge, so that the film was formed.

(b) of FIG. 61 shows the dependency of the film forming speed R upon the applied frequency f. As can be seen from the foregoing plasma emission, the gas could be sufficiently decomposed by raising the applied frequency, so that a higher film forming speed than the conventional speed could be realized.

Figure 71:
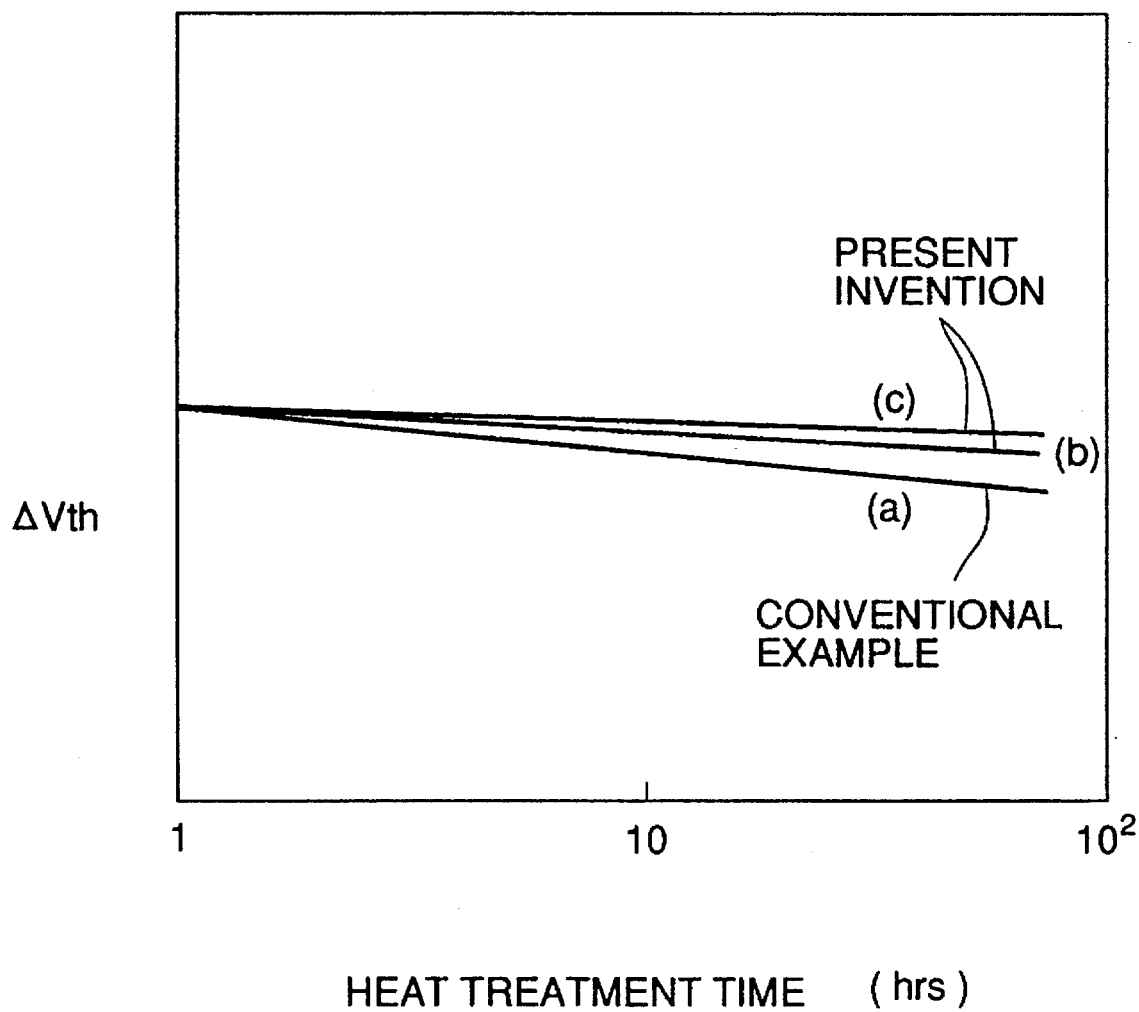
FIG. 71 illustrates an example of the Vth shift due to heat treatment.

The film thus manufactured was used to serve as the gate insulating film for a thin film transistor to be evaluated. The sole film characteristics attained are shown in Table 1. Since the process for manufacturing the device is the same as the process according to Embodiment 1, its description is omitted here. The characteristics of the device having the silicon nitride film formed at f=80 MHz are shown in (b) of FIG. 64. (c) of FIG. 65 shows the change in the threshold voltage Vth taken place when ON-operation is maintained for 100 hours. (c) of FIG. 71 shows the change in the threshold voltage Vth taken place when a heat treatment is performed. Data about the conventional device is shown in the drawing. The similar basic characteristics were to those of the conventional device were obtained. The shift of Vth due to the ON-operation was reduced. The reason for this can be considered that the impurities in the film were reduced, and defects due to this and defects due to the plasma damage at the time of forming the film were prevented. Furthermore, the carrier capture level was lowered and electron trapped by the level could be decreased. In the device according to this embodiment, hydrogen in the film is restricted, causing the diffusion of hydrogen due to heat to be prevented. Therefore, the negative directional shift of Vth due to the heat treatment could be prevented. The dependency of the shift of Vth upon the applied frequency due to the ON operation is shown in (b) of FIG. 66. The dependency of the shift of Vth upon the applied frequency due to heat is shown in (d) of FIG. 66. It can be understood that the foregoing effect can be attained at about f=30 MHz. As a result of the experiments, it can be considered that ions made incident upon the substrate could be decreased by raising the applied frequency at about f=30 MHz and the ion damage at the time of forming the film was prevented.

Embodiment 8

The distance between electrodes which is the premise of the present invention will now be described.

As described with reference to FIG. 7, if the frequency is high with respect to a certain distance d between electrodes, the film thickness distribution becomes large, resulting in a problem to arise when a large area film is formed. Accordingly, the inventors of the present invention have modified a variety of film forming parameters, resulting in a fact to be found that the distance between the electrodes affects the film thickness distribution. Furthermore, a fact was found that lengthening of the distance between the electrodes will reduce the film thickness distribution. The relationship between them was obtained under condition that the film thickness distribution T (%) in the film is included in 10% under a variety of the conditions according to the present invention, resulting in that the distribution is too large to be employed when d=2 cm. When d is larger than 3 cm, a substantially excellent distribution can be obtained if d meets the relationship f/d (cm)<30.

As shown in FIG. 8 which illustrates the relationship between the distance between the electrodes and the density of defective level in the film under a variety of conditions. It can be found that the density of the defects gradually decreases if the distance between the electrodes is 4 cm or longer. If the distance between electrodes is shorter than 4 cm, the defects rapidly increase. It is understood that the preferred distance between the electrodes is 4 cm or longer. Accordingly, the investigation was made in such a manner that the distance between the electrodes is 4 cm.

Figure 72:
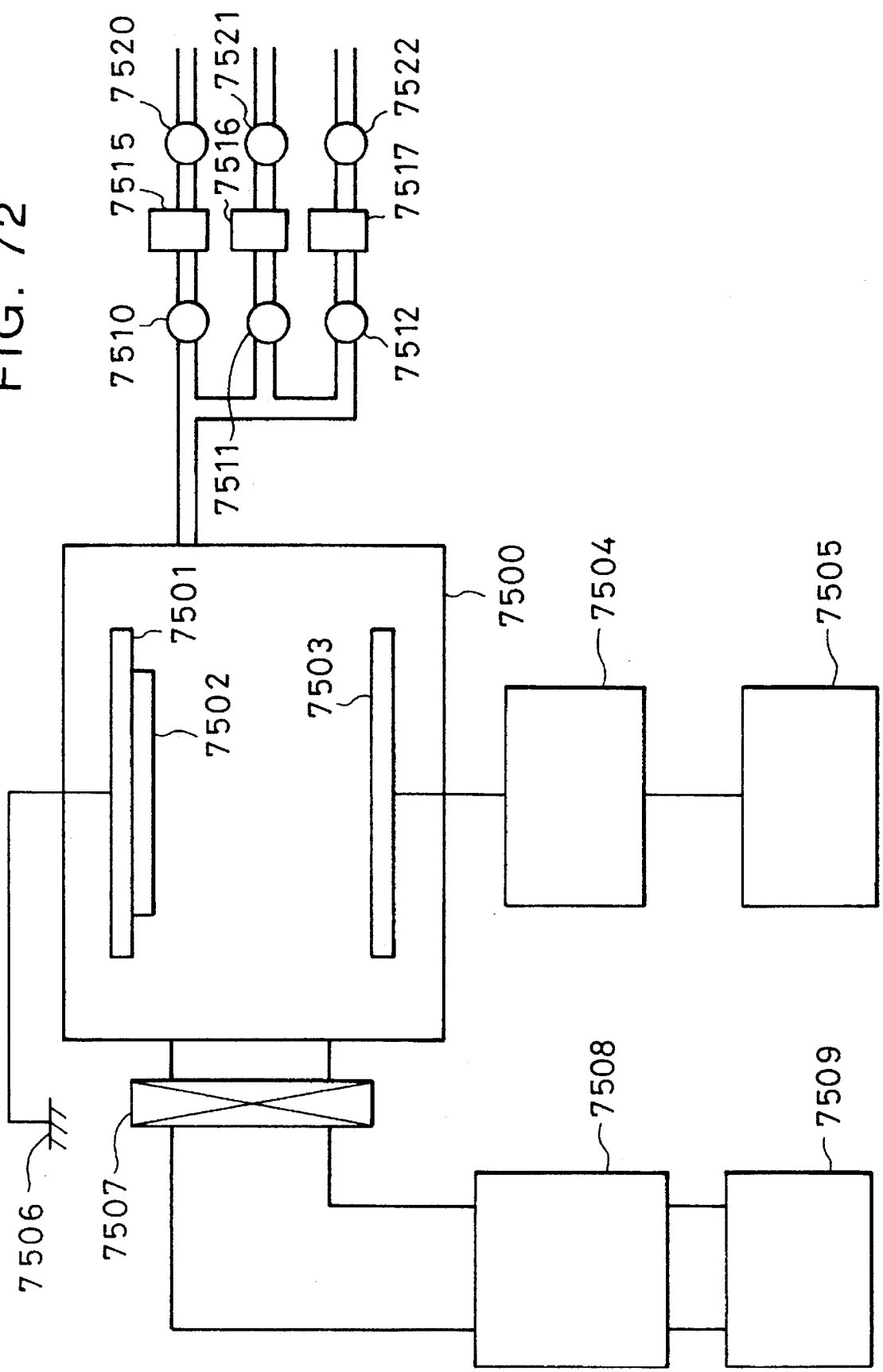
FIG. 72 is a schematic structural view which illustrates an example of a plasma CVD apparatus.

FIG. 72 illustrates the manufacturing apparatus for use in this embodiment, the apparatus having the same basic structure as the conventional parallel flat plate type plasma CVD apparatus.

As shown in FIG. 72, reference numeral 7500 represents a vacuum chamber, 7501 represents an anode electrode, 7502 represents a substrate, and 7503 represents a cathode electrode. The anode electrode 7501 is grounded. Reference numeral 7504 represents a matching device, and 7505 represents a high frequency power source, 7507 represents a gate valve, 7508 represents a turbo molecule pump, and 7509 represents a rotary pump.

First, a $SiH_4$—$NH_3$ mixture gas was diluted by $H_2$ if necessary before it is introduced into the vacuum chamber 7500. In this embodiment, 10 sccm of $SiH_4$, 200 sccm of $NH_3$ and 100 sccm of $H_2$ were introduced by using corresponding mass-flow controllers 7515, 7516 and 7517, and then the pressure was maintained at 0.2 Torr. The frequency f of the high frequency power source was varied from 13.56 MHz to 150 MHz. At this time, the electric power is sufficient to be applied by 10 $mW/cm^2$, however, it was made to be 30 $MW/cm^2$ considering the distribution and the like.

Figure 73:
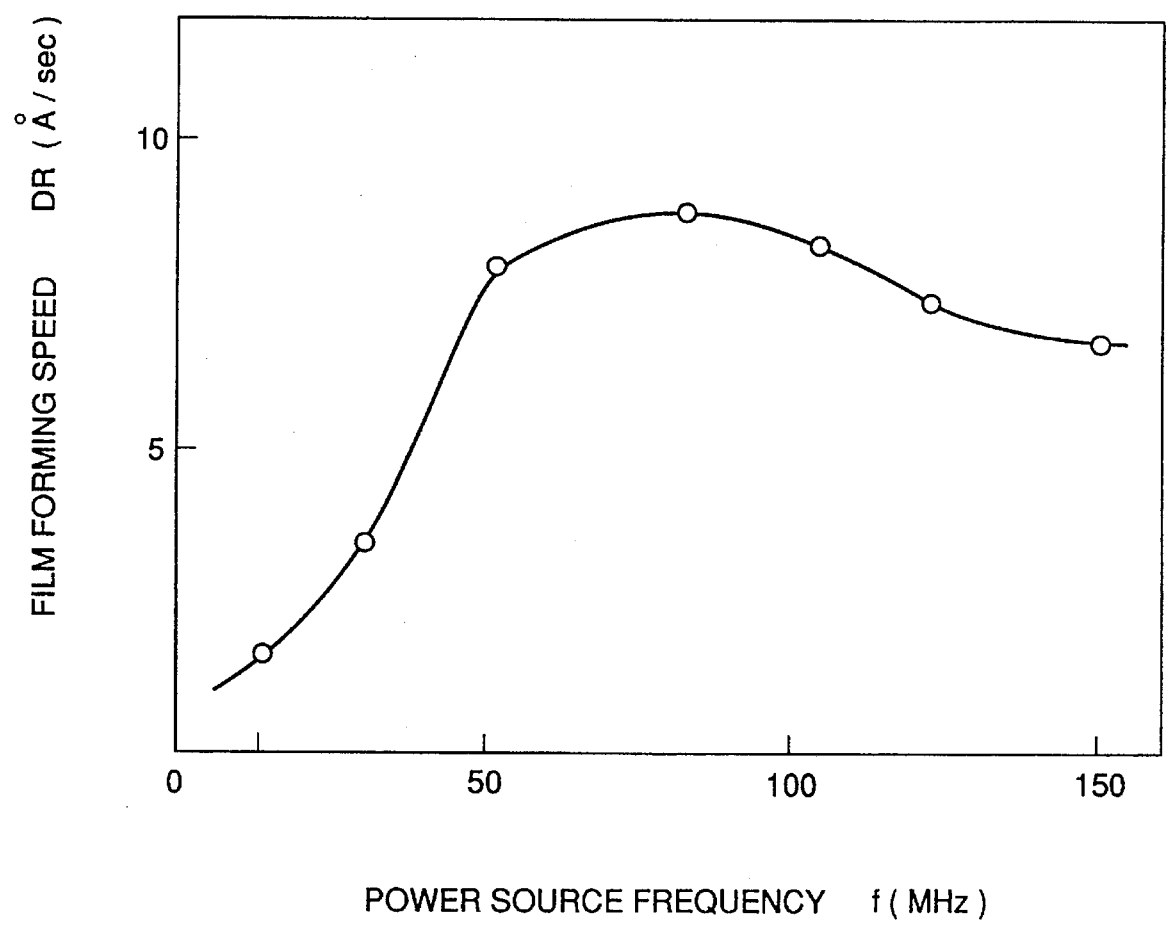
FIG. 73 illustrates an example of the relationship between the frequency and the film forming speed.
Figure 74:
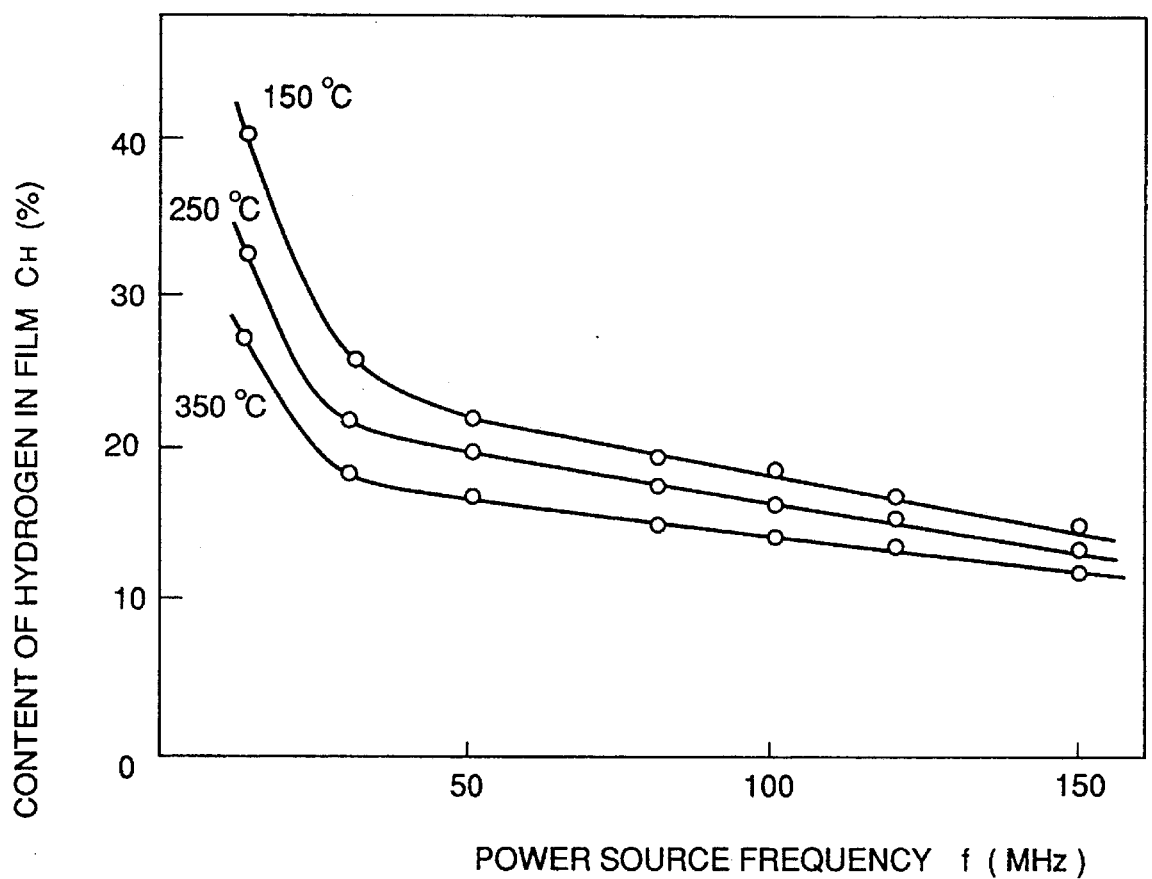
FIG. 74 illustrates an example of the relationship between the frequency and the hydrogen quantity.
Figure 75:
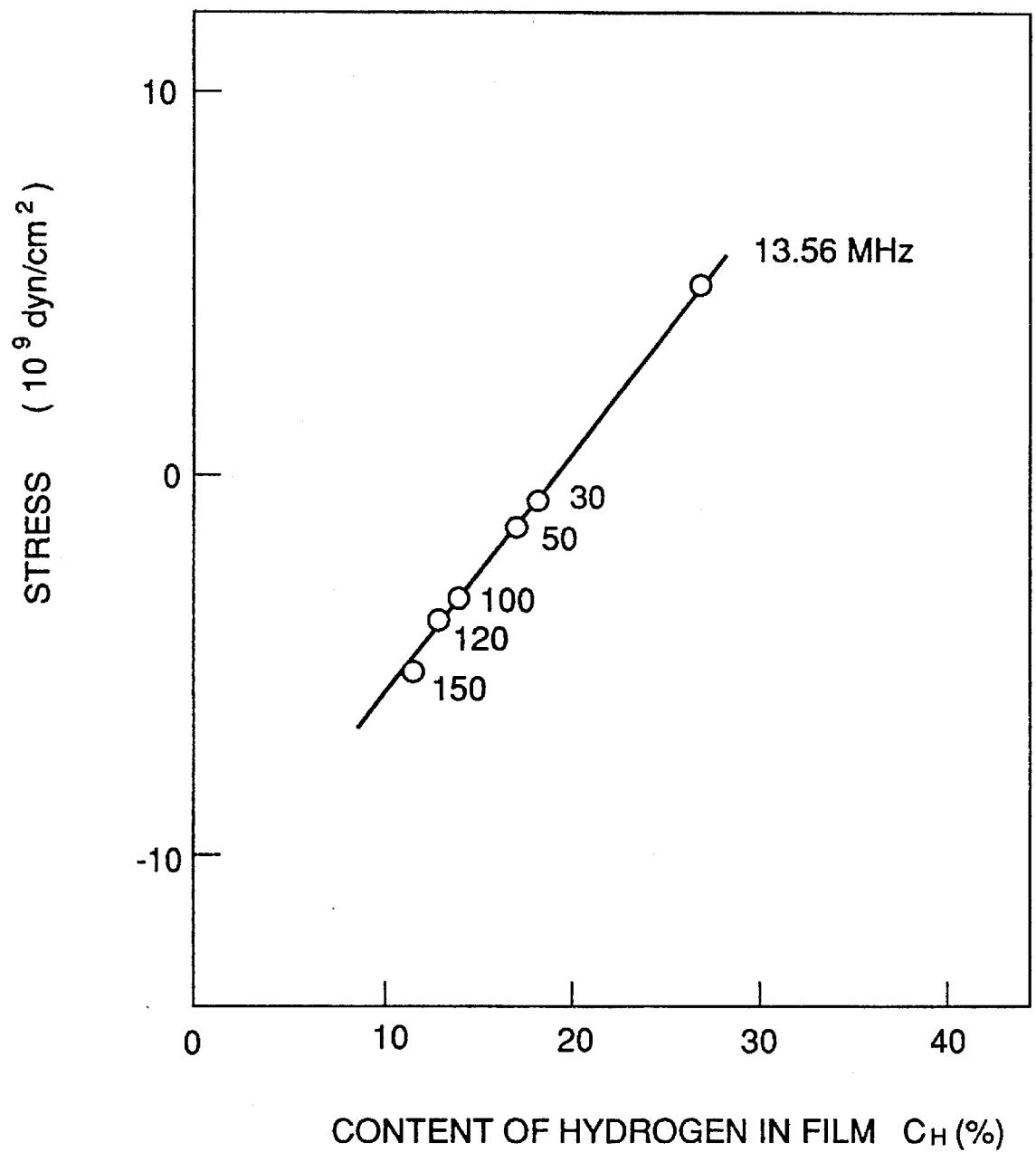
FIG. 75 illustrates an example of the relationship between the hydrogen quantity and the stress.
Figure 76:
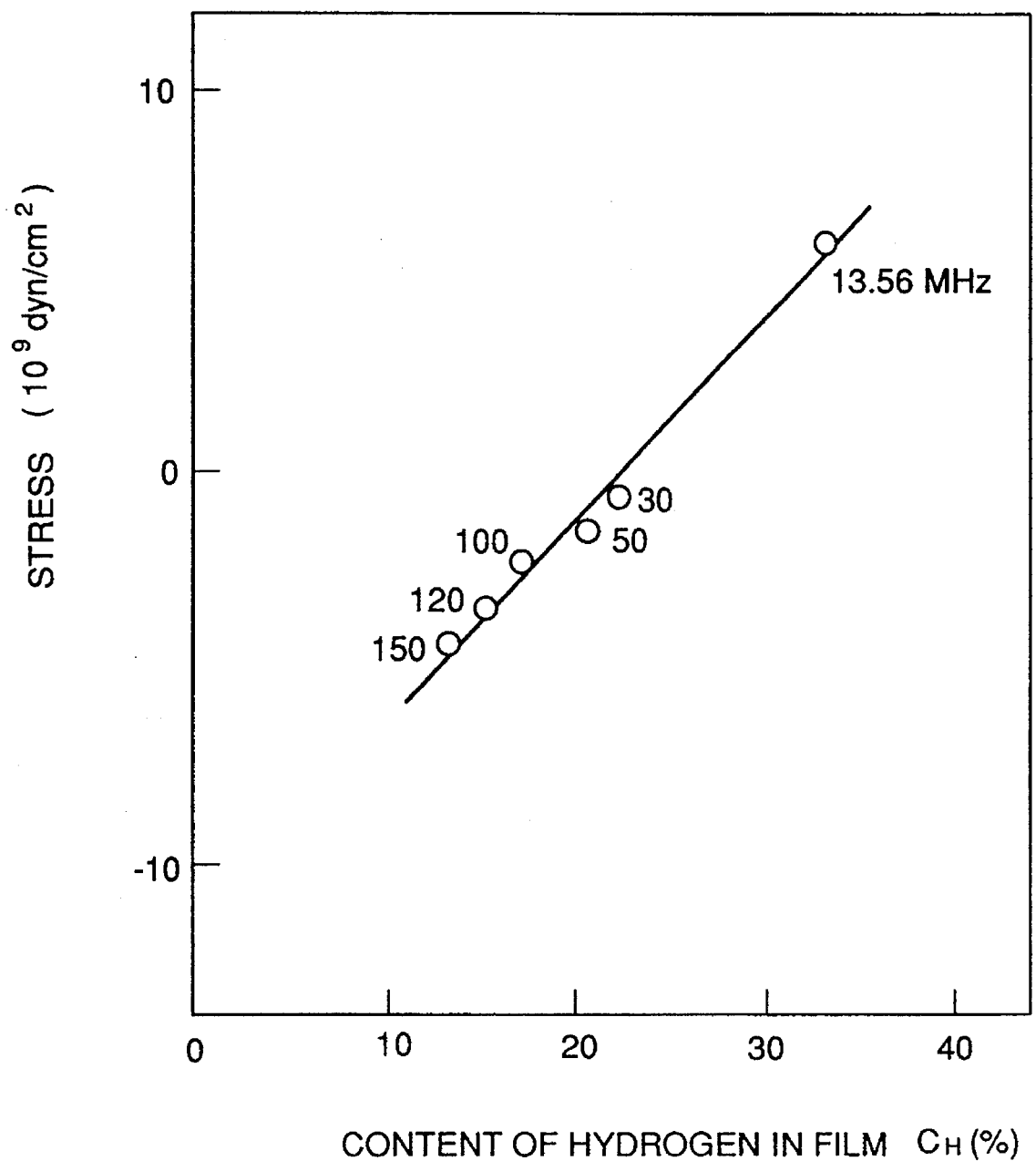
FIG. 76 illustrates an example of the relationship between the hydrogen quantity and the stress.
Figure 77:
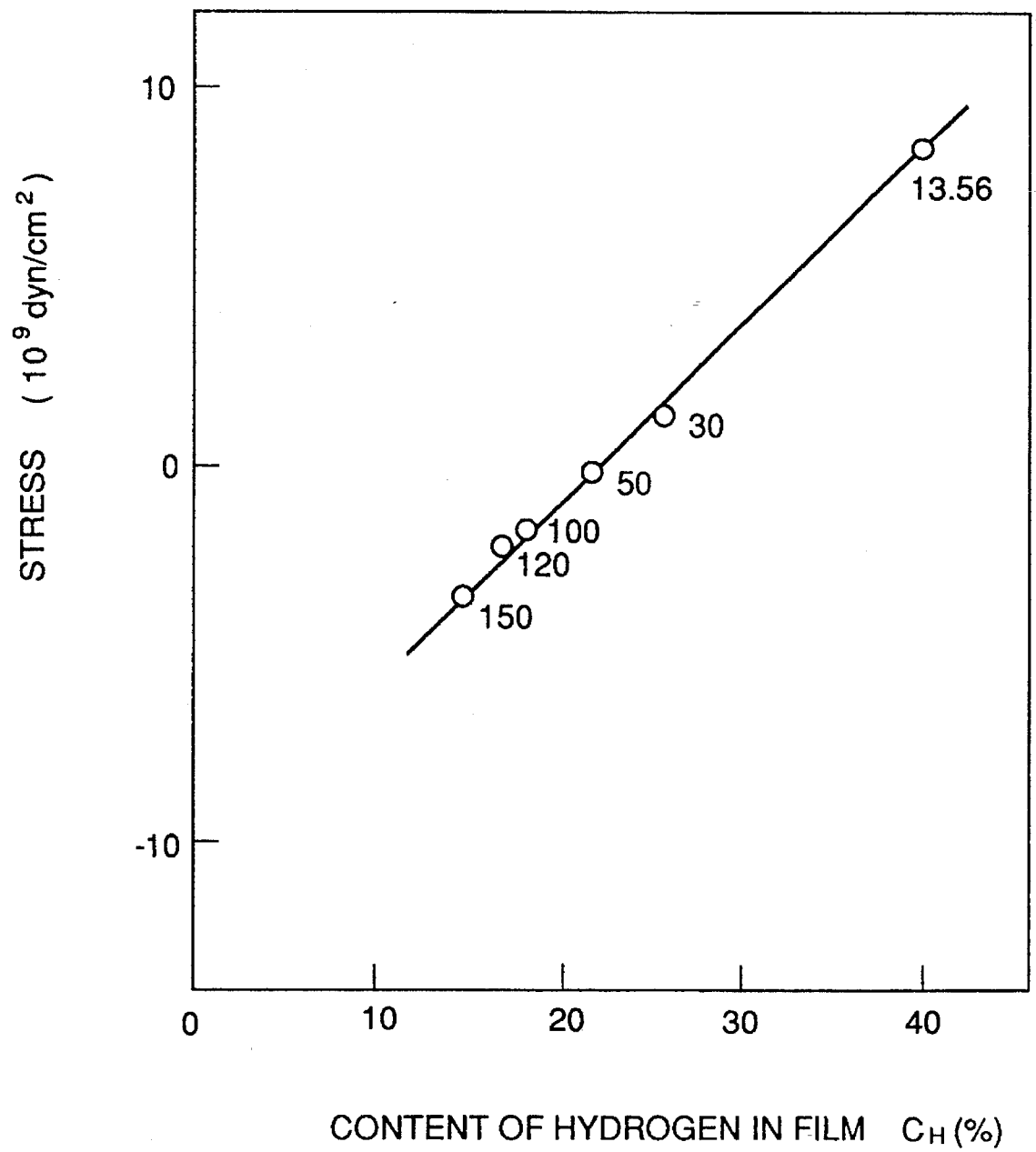
FIG. 77 illustrates an example of the relationship between the hydrogen quantity and the stress.

The relationship between the power source frequency f and the film forming speed DR is shown in FIG. 73, wherein the relationship realized when the substrate temperature Ts=350° C. is shown. Although the film forming speed does not depend upon the substrate temperature, it has a peak with respect to the frequency. The reason for this is estimated that the rise in the discharge frequency enhances the decomposition of the raw material gas, causing the film forming speed to be temporarily raised. If the frequency is further raised, the film forming speed is lowered due to the excess decomposition of the raw material gas and the precursor. The power source frequency f and the hydrogen content $C_H$ in the film at each film forming temperature is shown in FIG. 74. The relationships between the hydrogen content and the stress at substrate temperatures 350° C., 250° C. and 150° C. are shown in FIGS. 75, 76 and 77. As can be seen from FIGS. 75, 76 and 77, the somewhat compressive stress (specifically, the optimum value according to this embodiment is from $1\times10^9$ $dyn/cm^2$ to $4\times10^9$ $dyn/cm^2$) can be realized by making the frequency of the high frequency power source to be from 30 MHz to 120 MHz when the substrate temperature is from 250° C. to 350° C. at which the conventional excellent quality film can be formed.

Figure 78:
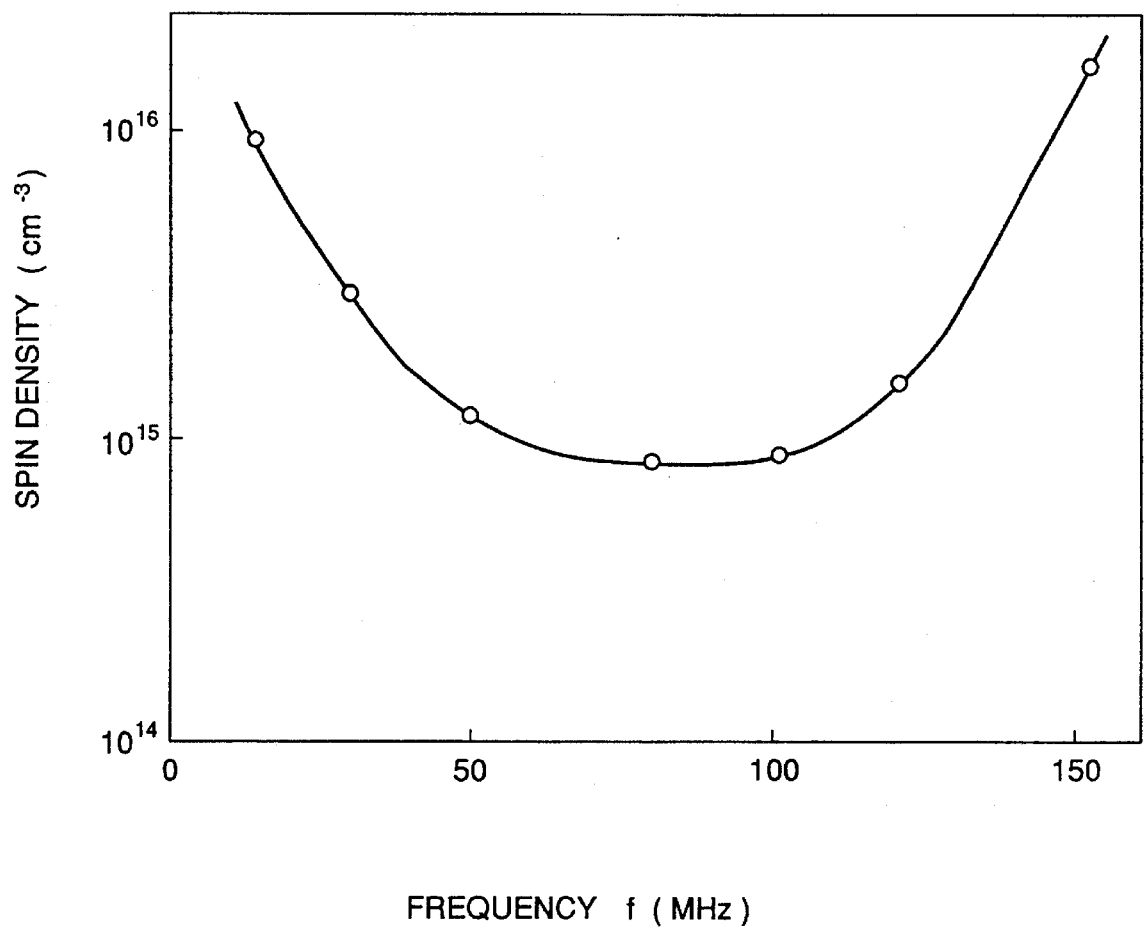
FIG. 78 illustrates an example of the relationship between the frequency and the spin density.

The relationship between the frequency and the spin density in the film is shown in FIG. 78. FIG. 78 shows the dependency upon the frequency at the substrate temperature of 350° C. If the temperature is higher than 150° C., a similar tendency was shown. That is, in a low frequency region in which the frequency f is lower than 30 MHz, damages due to ions incident upon the substrate are critical, resulting in a defective film to be formed. It can be considered from the FIG. 29 which illustrates a result obtained in such a manner that a mass analyzer was set at the position of the substrate and the incidental energy of ions flying to the foregoing position and the distribution of the quantities of incidental ions were obtained. In order to easily perform analysis, data about argon gas was obtained. As can be understood, high energy component is incident on the substrate when an RF discharge is performed by using 13.56 MHz. Also the quality of the film deteriorates in a region in which the frequency f is higher than 120 MHz. The reason for this is estimated that the shift to the higher frequency discharge decomposes excessively the raw material gas and the precursor. The foregoing region arises a problem of the thickness and the distribution of the quality of the film when a film is formed to have a large area.

As a result, if the frequency is from 30 MHz to 120 MHz, an excellent $SiN_x$ thin film can be manufactured while shifting the stress to somewhat compression side, maintaining the N/Si ratio, the optical band gap, the spin density, exhibiting high quality and excellent manufacturing facility.

Then, an embodiment of a field-effect-type transistor using the SiNx thin film manufactured by the foregoing film forming method will now be described.

Figure 79:
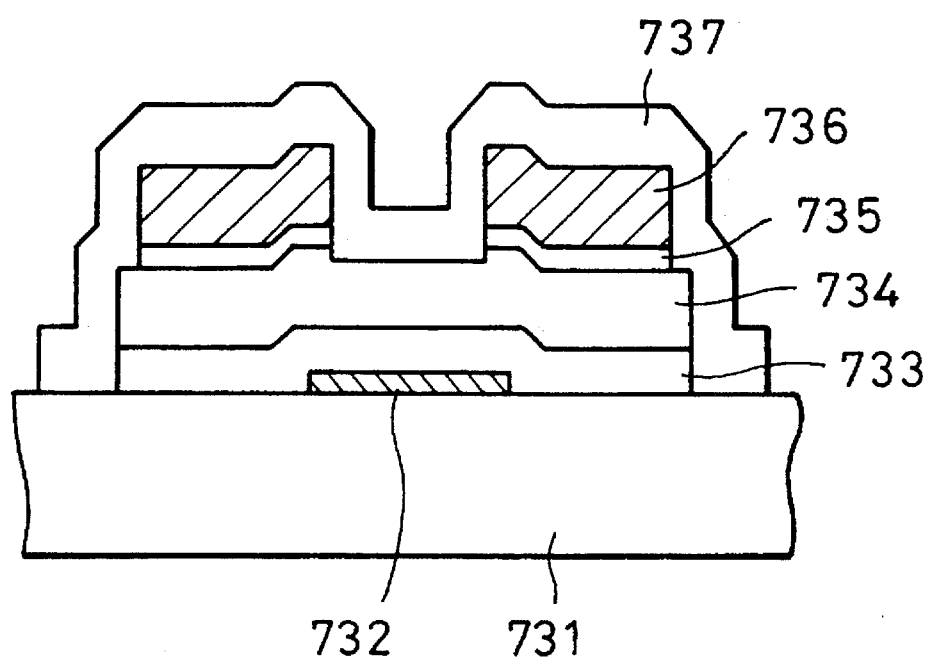
FIG. 79 is a schematic cross sectional view which illustrates the thin film transistor.

FIG. 79 is a cross sectional view which illustrates an inversed-stagger-type TFT. The TFT was manufactured by the apparatus shown in FIG. 81 and has the basic structure as that of the apparatus shown in FIG. 72.

A gate electrode 732 is formed on an insulating substrate 731. Furthermore, an insulating layer 733 and a semiconductor layer 734 are formed on the gate electrode 732. The semiconductor layer 734 has a source and drain electrode 736 while interposing an ohmic contact layer 735 thereon. Furthermore, a protection layer 737 is formed for protection. Then, a method of manufacturing the TFT will now be described with reference FIGS. 80(a) to 80(d).

Figure 80A:
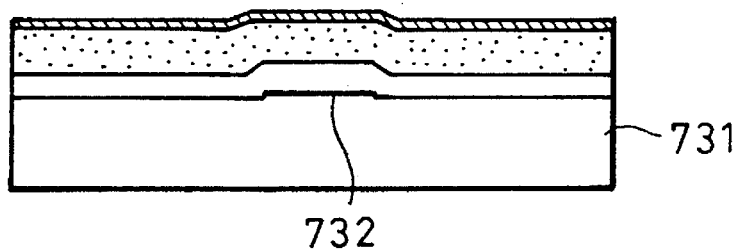
FIG. 80 is a schematic view which illustrates the process of an example of the method of manufacturing the thin film transistor.

First, a Cr thin film (about 1,000 Å) is, as shown in FIG. 80(a), on the 7059-glass substrate 731 manufactured by Coning by a sputtering apparatus followed by patterning, thus resulting in a gate electrode 732 to be formed.

Then, a plasma CVD apparatus is used to form a silicon nitride thin film SiNx (about 3,000 Å) to form a gate insulating layer 743. Then, a non-doped amorphous silicon and an i-type a-Si thin film (about 6,000 Å) to serve as a semiconductor layer 734, and phosphorus-doped microcrystal silicon and n$^+$-type μc-Si (about 1000 Å) thin films to serve as an ohmic contact layer 735 are sequentially formed by the same apparatus.

Figure 80B:
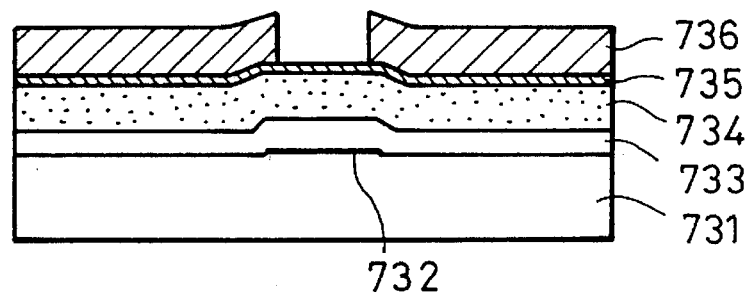

Then, as shown FIG. 80(b), an Al thin film (about 1 μm) was formed by a sputtering apparatus followed by patterning, so that a source and drain electrode 736 is formed. The channel width and the channel length L were made to be W/L=100.

Figure 80C:
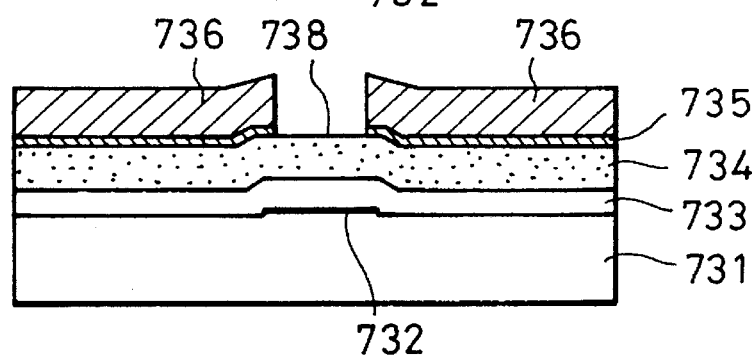

Then, as shown in FIG. 80(c), unnecessary portions of the n$^+$-type μc-Si layer are etched by reactive ion etching so that a gap portion 738 is formed.

Figure 80D:
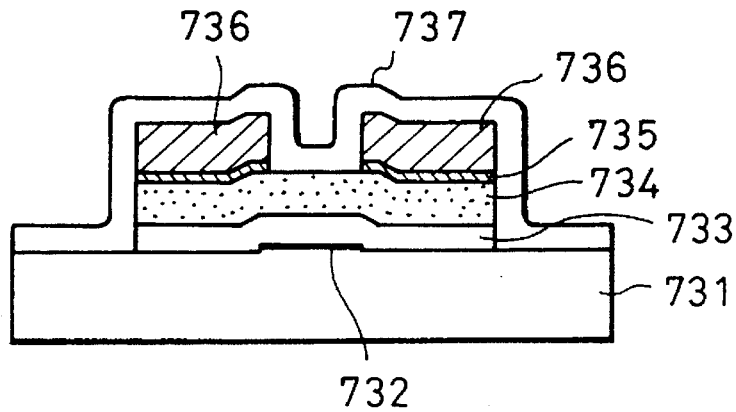

Then, as shown in FIG. 80(d), unnecessary portions of the SiNx/i-type a-Si/n$^+$-type μc-Si layer were isolated, and then the protection layer 737 was deposited, so that a thin film transistor as shown in FIG. 79 was manufactured.

A method of manufacturing the SiNx thin film, which is the essential portion of the present invention, will now be described.

Figure 81:
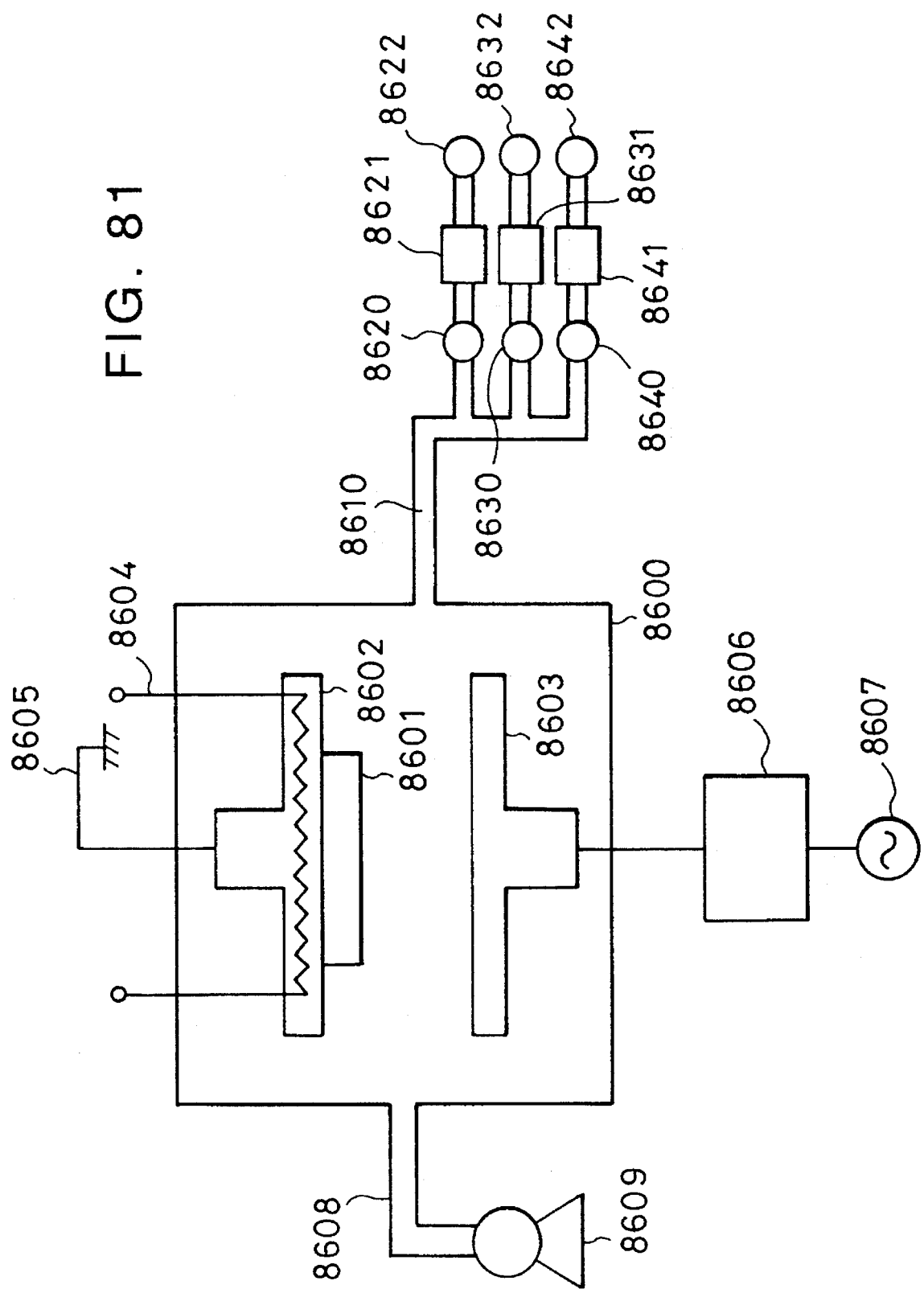
FIG. 81 is a schematic cross sectional view which illustrates the plasma CVD apparatus.

As described above, the a-Si thin film is formed by the parallel flat plate type plasma CVD apparatus arranged as shown in FIG. 81. FIG. 81 illustrates a film forming chamber for forming the SiNx thin film, where a mechanism for successively forming the SiNx/i-type a-Si/n$^+$-type μc-Si layer and the other film forming chambers are omitted from illustration. Referring to FIG. 81, reference numeral 8600 represents a vacuum chamber, 8601 represents a substrate, 8602 represents an anode electrode, 8603 represents a cathode electrode, 8604 represents a substrate heater, 8605 represents a terminal for earth, 8606 represents a matching box, 8607 represents a high frequency power source, 8608 represents an exhaust port, 8609 represents an exhaust pump, 8610 represents a raw material gas introduction port, 8620, 8630, 8640, 8622, 8632, and 8642 represent valves, and 8621, 8631 and 8641 represent mass-flow controllers.

The substrate is introduced from the precedent load chamber (omitted from illustration) in which sub-heating is performed, and the pressure in the chamber is lowered to 1×10$^{-6}$ Torr. Then, raw material gases SiH$_4$, NH$_3$ and H$_2$ were supplied by 10, 200 and 100 sccm by the mass flow controllers 8621, 8631 and 8641 followed by maintaining the pressure at 0.2 Torr or lower. Then, the substrate heater 604 is operated to maintain the temperature of the substrate at 350° C. followed by applying waves having a frequency of 80 MHz by a high frequency power source 8607 with electric power of 30 MW/cm$^2$ so that the SiNx film is formed to have a thickness of 3000 Å. After the film has been formed, the pressure in the chamber is similarly lowered to 1×10$^{-6}$ Torr or lower. Then, the substrate is sifted to the next i-type a-Si film forming chamber.

Figure 82:
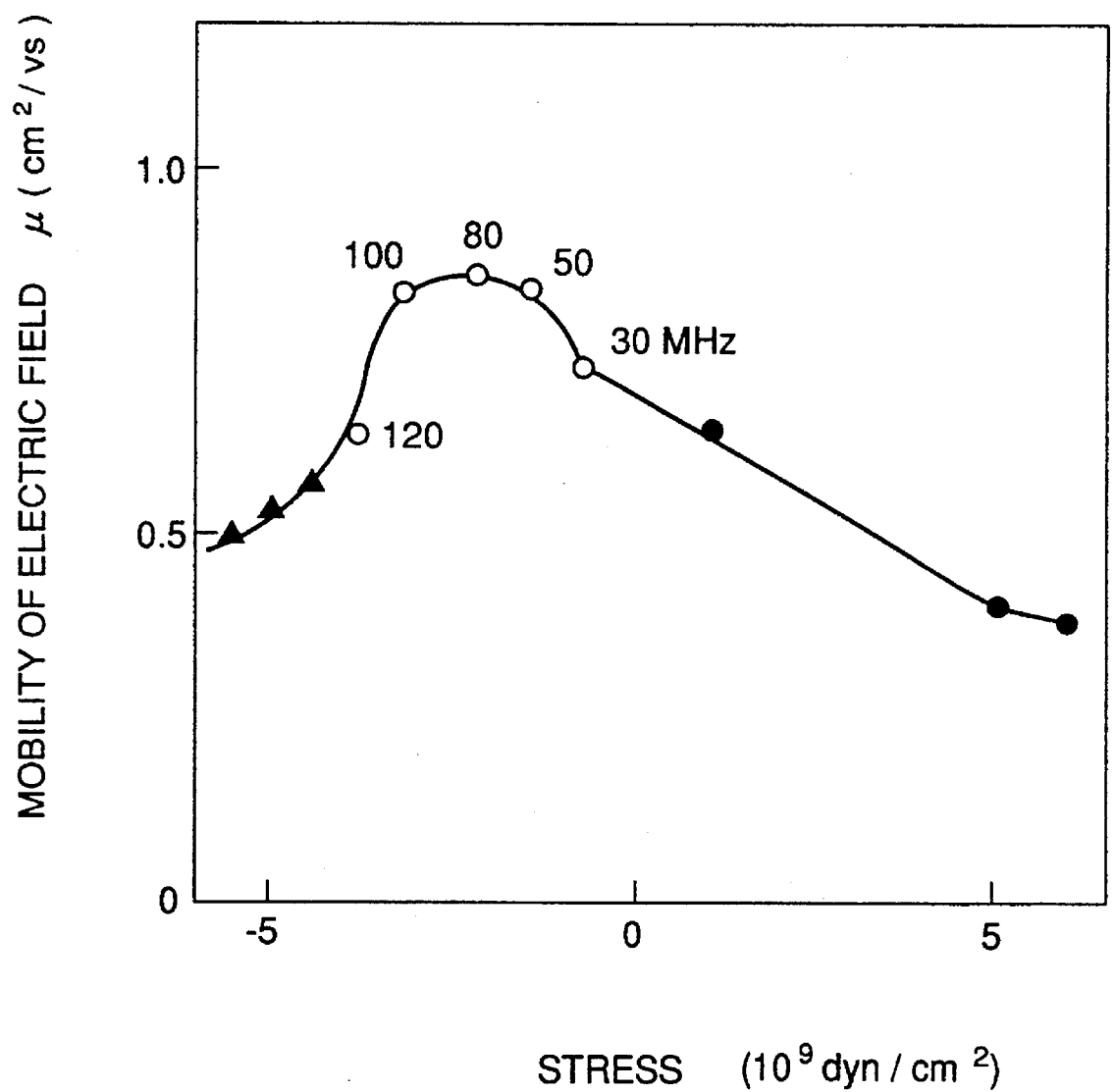
FIG. 82 illustrates an example of dependency of the electric field mobility of the TFT having the SiNx thin film according to the present invention upon the stress.

Thus, the thin film transistor can be manufactured. The high frequency discharge using 80 MHz is employed as the embodiment of the present invention. The electric field mobility μ (cm$^2$/Vsec) of the TFT using the SiNx thin film formed at each frequency f with respect to the stress of the thin film are collectively shown in FIG. 82. The electric field mobility μ can be improved extremely when the frequency f is 80 MHz, resulting in an improvement which is the twice the conventional value. The electric field mobility of NH3 and N2 of the SiNx thin film manufactured by the conventional RF plasma CVD method using 13.56 MHz are expressed by black plots o and Δ.

That is, the electric field mobility can be improved when the frequency is from 30 MHz to 120 MHz, preferably from 50 MHz to 100 MHz.

Figure 83:
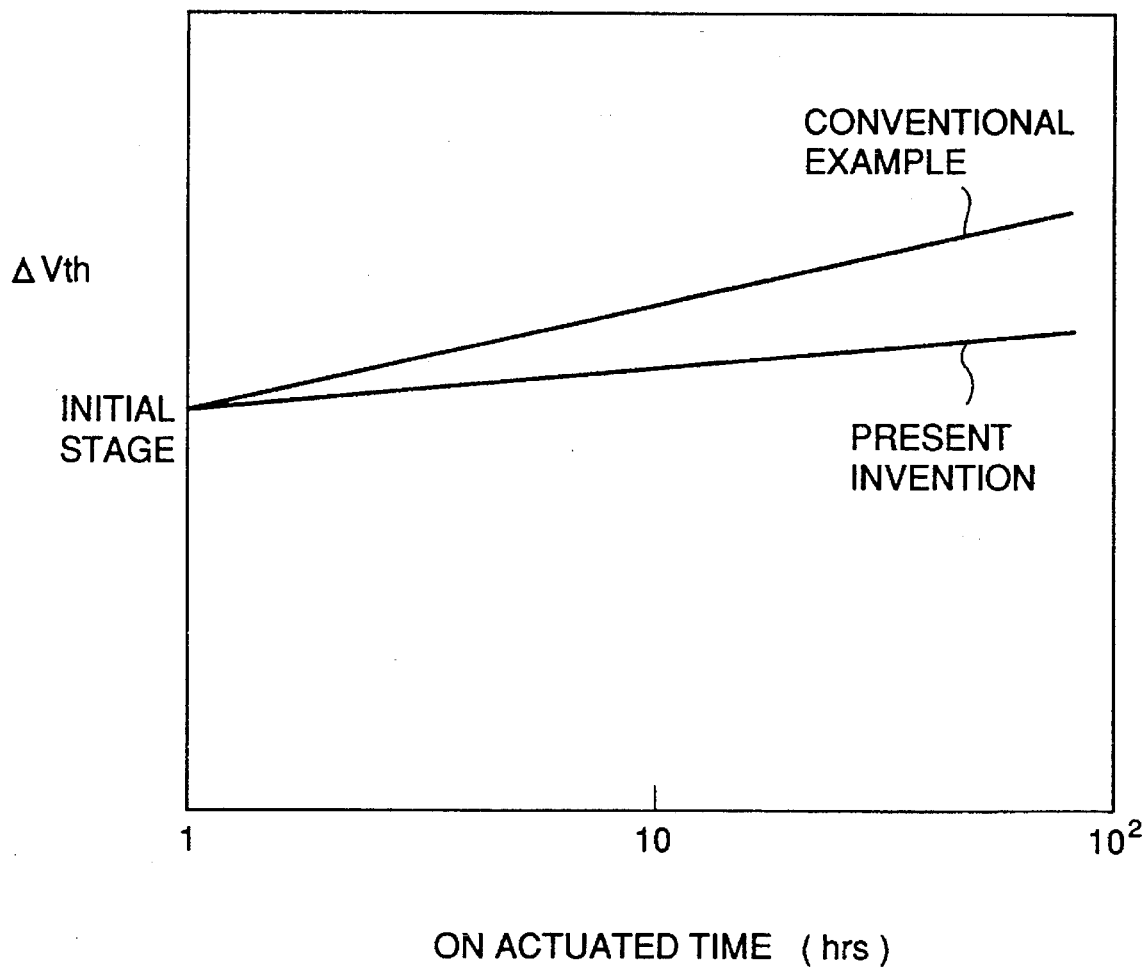
FIG. 83 illustrates an example of the change of the threshold voltage according to an example of the present invention.

The stability of the TFTs respectively manufactured at the conventional frequency of 13.56 MHz and 80 MHz was subjected to a comparison. FIG. 83 shows the change in the threshold voltage taken place when ON-state is maintained for 100 hours. An improvement in the reliability can be confirmed.

Embodiment 9

Figure 84:
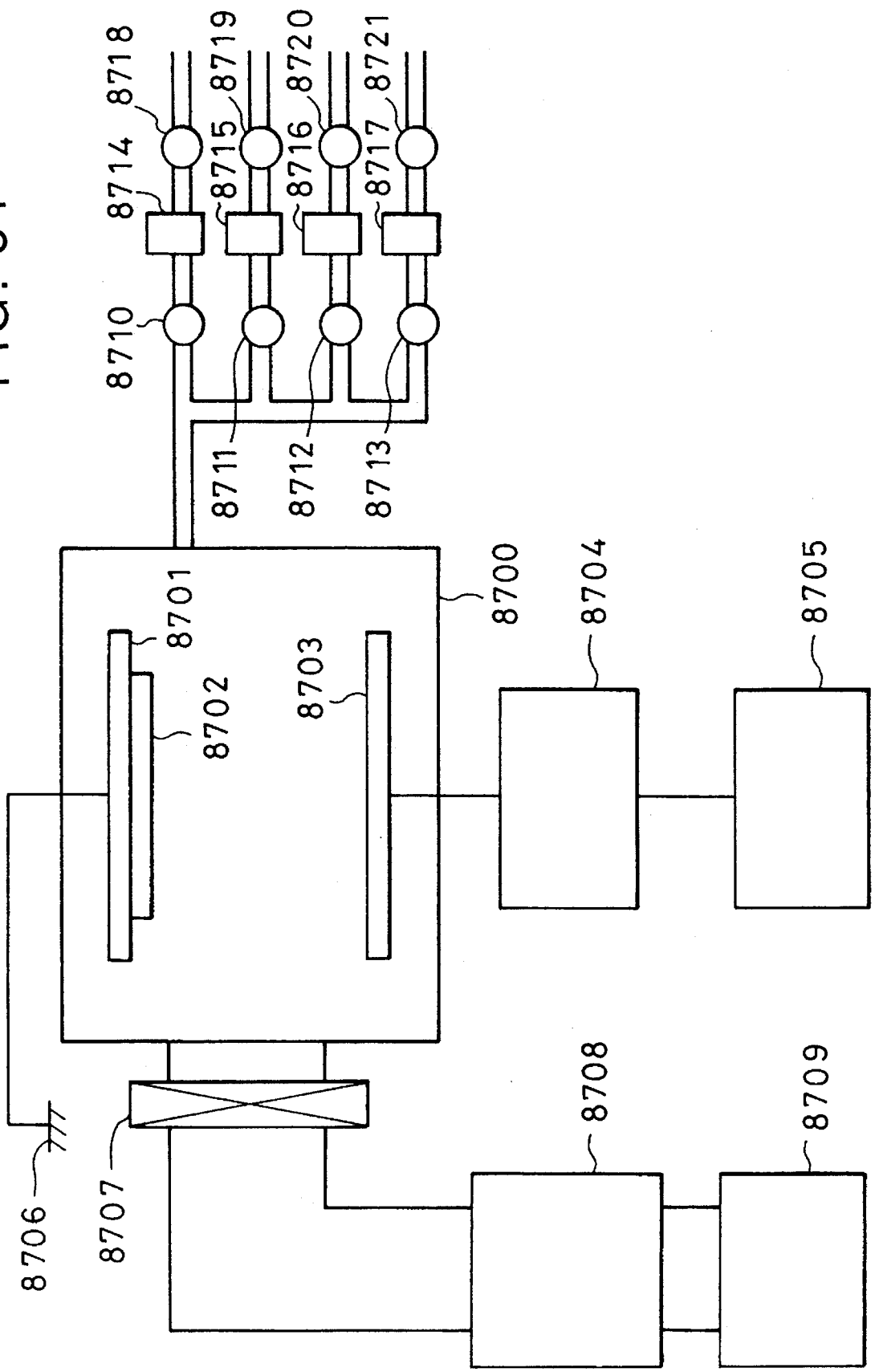
FIG. 84 is a schematic structural view which illustrates an apparatus to which the manufacturing method according to the present invention is adapted.

FIG. 84 illustrates the manufacturing apparatus according to this embodiment, and having the basic structure which is the same as the conventional parallel flat type plasma CVD apparatus.

In this embodiment, manufacturing of microcrystal silicon among non-single crystal silicon will be described.

The microcrystal means a silicon film having a structure containing crystalline particles in the film thereof while including polysilicon (polycrystal).

Referring to the drawing, reference numeral 8700 represents a vacuum chamber, 8701 represents an anode electrode, 8702 represents a substrate, and 8703 represents a cathode electrode. The anode electrode 8701 is grounded by 8706. Reference numeral 8704 represents a matching device, and 8705 represents a high frequency power source. Reference numeral 8707 represents a gate valve, 8708 represents a turbo molecular pump, and 8709 represents a rotary pump. Reference numerals 8710 and 8718 represent silane gas line valves, 8711 and 8719 represent hydrogen gas line valve, 8712 and 8720 represent phosphine gas line valve, 5113 and 5121 represent ammonia gas line valves, and 8713 and 8721 represent diborone gas line valves. Reference numerals 8714 to 8717 represent mass-flow meters.

By carefully applying and treating the VHF wave, the present invention may be applied to a variety of apparatuses such as apparatus of a type for use to manufacture the photosensitive drum as well as the parallel and flat plate type apparatus.

Figure 85:
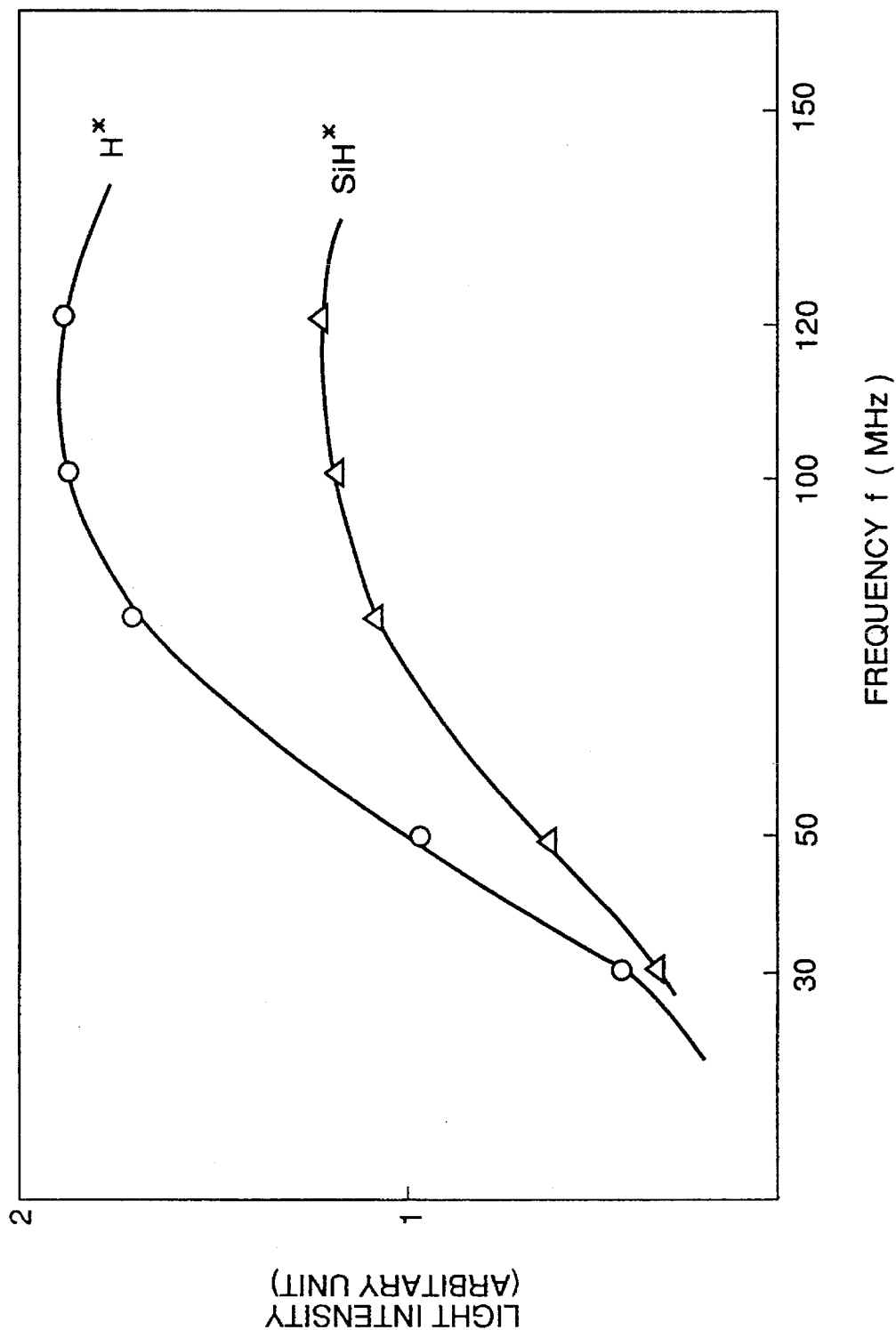
FIG. 85 illustrates an example of dependency of the light intensity [SiH*] of SiH* radicals and the light intensity [H*] of hydrogen radicals upon applied high frequency f.
Figure 86:
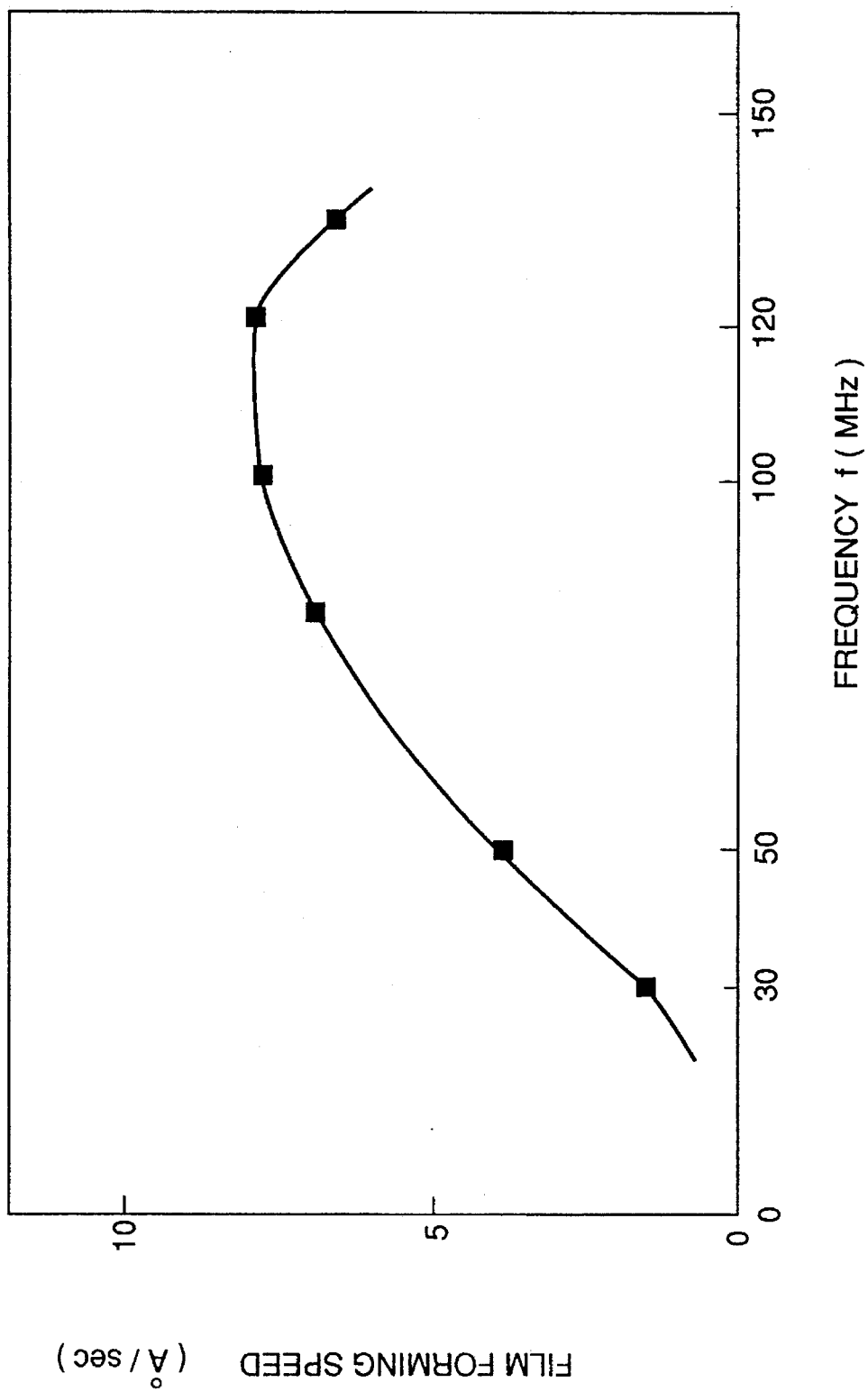
FIG. 86 illustrates an example of dependency of the film forming speed R upon the applied high frequency f.
Figure 87:
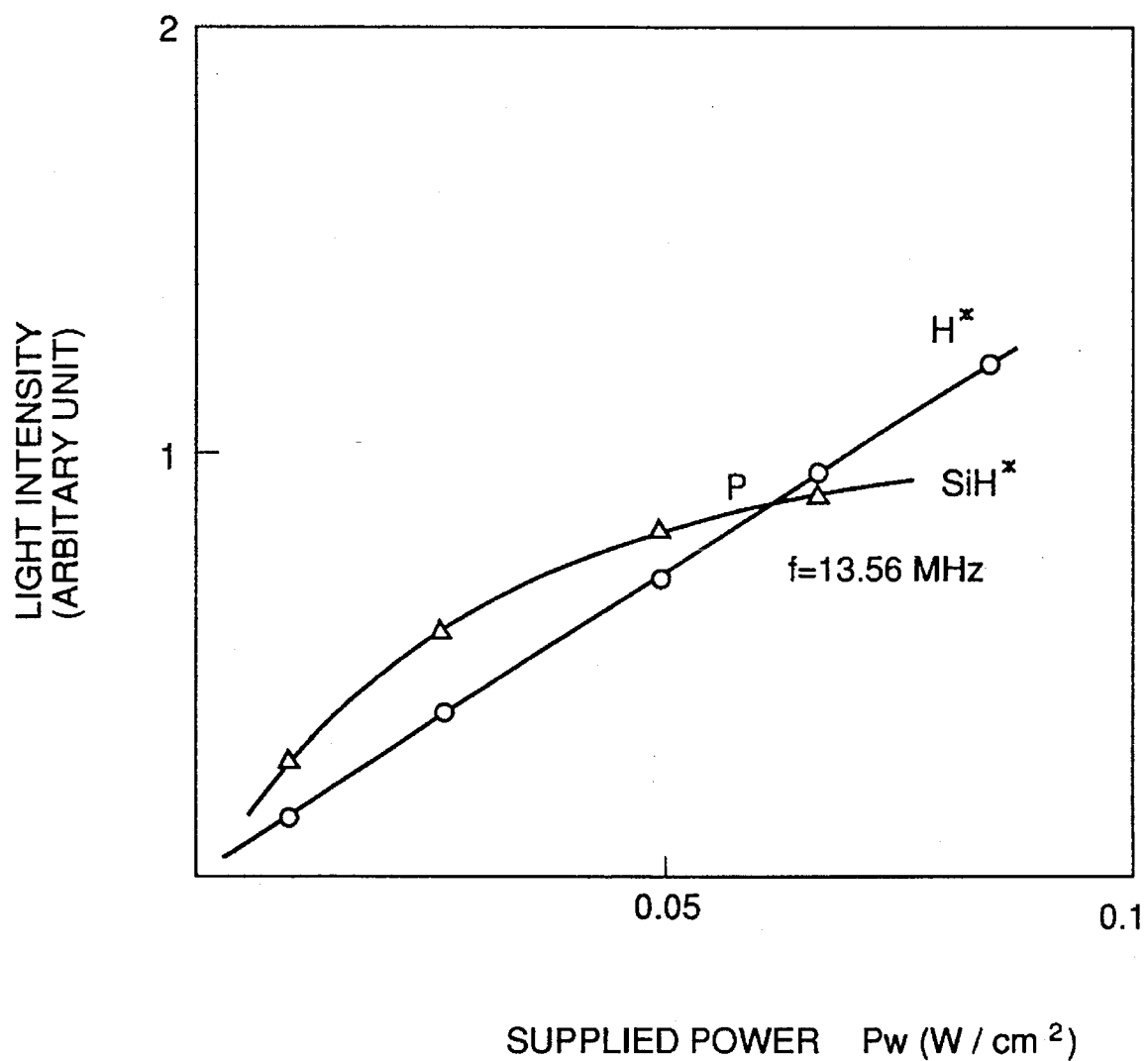
FIG. 87 illustrates an example of dependency of dependency of the light intensity [SiH*] of SiH* radicals and the light intensity [H*] of hydrogen radicals upon applied high frequency electric power $P_W$.
Figure 88:
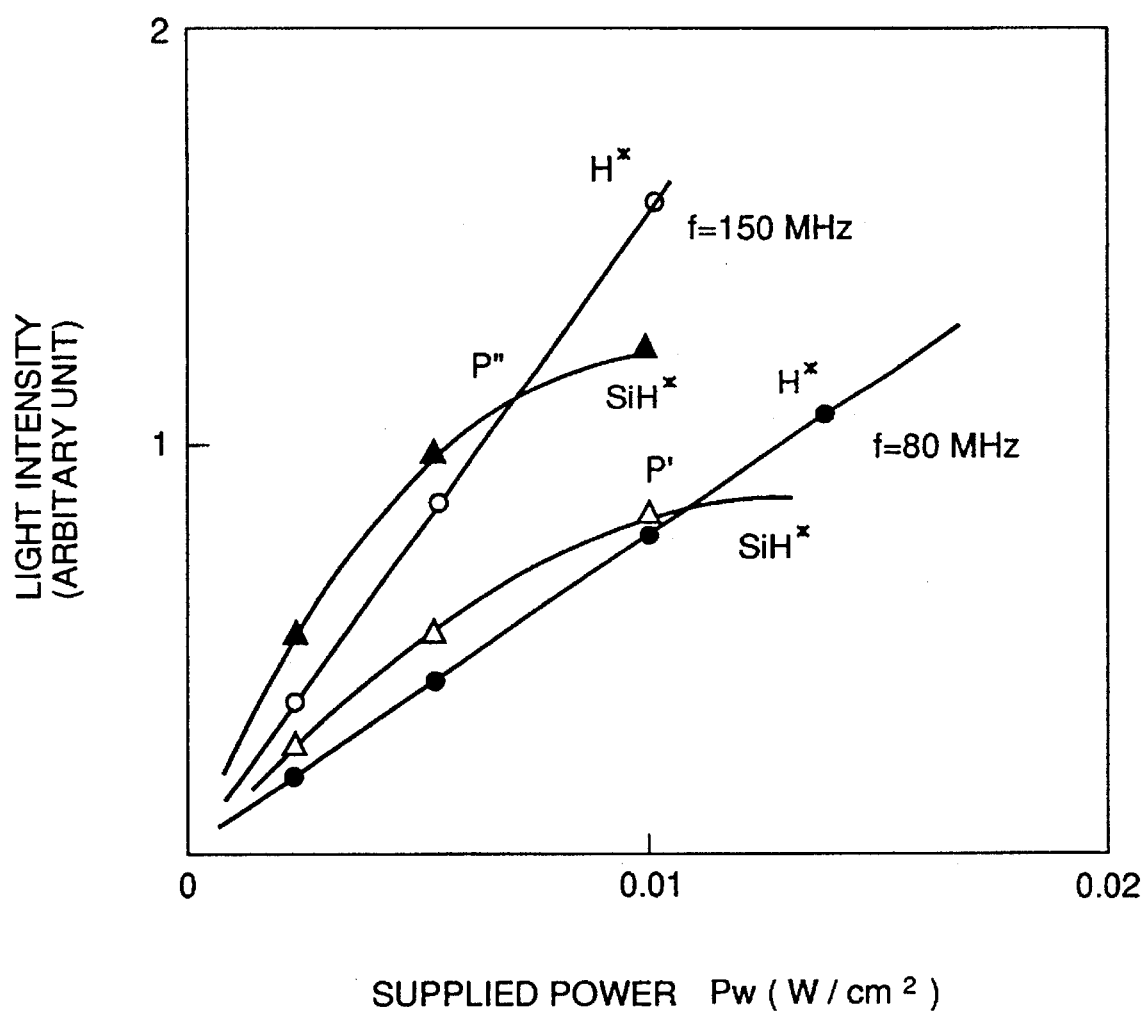
FIG. 88 illustrates an example of dependency of dependency of the light intensity [SiH*] of SiH* radicals and the light intensity [H*] of hydrogen radicals upon applied high frequency electric power $P_W$.

The principle of the manufacturing method according to this embodiment will now be described. FIG. 85 shows the dependency of the light intensity [SiH*] of the SiH* radicals (414 nm) and the light intensity [H*] of the hydrogen radicals upon the high frequency f applied. FIG. 86 shows the dependency of the film forming speed R upon the applied high frequency f. FIGS. 87 and 88 shows the dependency of the light intensity [SiH*] of the SiH* radicals and the light intensity [H*] of the hydrogen radicals upon the applied high frequency electric power P$_W$. The conditions are set at this time that the flow rate of SiH$_4$ is 3 sccm, that of hydrogen is 150 sccm and the pressure is 0.5 Torr.

As shown in FIG. 85, the rise in the applied frequency f causes the SiH* radicals and H* radicals in the plasma to start increasing at about f=30 MHz. However, a maximal value is attained at about f=80 MHz followed by a tendency of decreasing. It rapidly decreases when the frequency is higher than 120 MHz. Since the rate of the decompositions of the silane gas and the hydrogen gas depend upon the electron density ne$_{in}$ the plasma, the SiH* radicals and H* radicals generated due to the decomposition also depend upon the electron density n$_e$. Therefore, it can be considered that the electron density n$_e$ in the plasma shows the dependency upon the applied high frequency f, and the light intensity of the radicals depends as shown in FIG. 85.

As shown in FIG. 86, also the film forming speed R starts increases in proportion to the applied frequency f, resulting in the maximal value at about f=80 MHz. However, in a region higher than 100 MHz, the film thickness distribution on the substrate becomes excessive, and the polysilane can easily be generated, resulting in dust which causes pin holes to be formed easily. What is worse, the characteristics of the film were unsatisfactory and non-uniform. Therefore, it is preferable that the frequency is from 30 MHz to 100 MHz to exhibit the effect of the present invention. In general the film forming speed in the silane gas is in proportion to [SiH*] and the tendency shown in FIG. 86 depends upon the tendency of [SiH*] shown in FIG. 85.

As shown in FIGS. 87 and 88, there is a tendency of increasing both [SiH*] and [H*] when the applied high frequency electric power is enlarged, where [H*] more depends upon it as compared with [SiH*].

In general, microcrystal silicon can be manufactured under some conditions: first, [H*] in the plasma and the film forming speed R must hold a relationship [H*]/R>a (a is a constant). It means a fact that the crystallization cannot easily occur if hydrogen covers the surface of the formed film by a quantity larger than a predetermined quantity. Since the film forming speed R is in proportion to [SiH*] in a plasma using the silane gas, the foregoing condition may be rewritten as [H*]/[SiH*]>a'. The conditions according to the present invention, the value of a' was 1. The foregoing ratio is established by raising the dilution ratio of the hydrogen gas in an ordinary system.

However, it leads to a fact that the divided pressure of the silane gas is lowered, resulting in an excessive reduction in the film forming speed. Accordingly, the applied frequency is raised in the present invention to improve the efficiency of decomposing the gas for the purpose of preventing the film forming speed reduction. A higher film forming speed can be realized, and therefore the time required to compete forming of the film can be shortened. The foregoing fact is a first effect of the present invention.

When point P at which [H*]/[SiH*]=1 shown in FIGS. 87 and 88 is paid attention, the point P is shifted to the left upper portion in proportion to the rise in the applied frequency f. The applied electric power and the applied frequency f at the foregoing point are changed while substantially holding a relationship P$_W$=k/f (P$_W$: W/cm$^2$, f: MHz). Also points, at which [H*]/[SiH*]=a' is met, are similarly changed that is, a ratio [H*]/[SiH*] larger than a certain ratio can be realized at a certain frequency f by changing the applied high frequency electric power.

Figure 89:
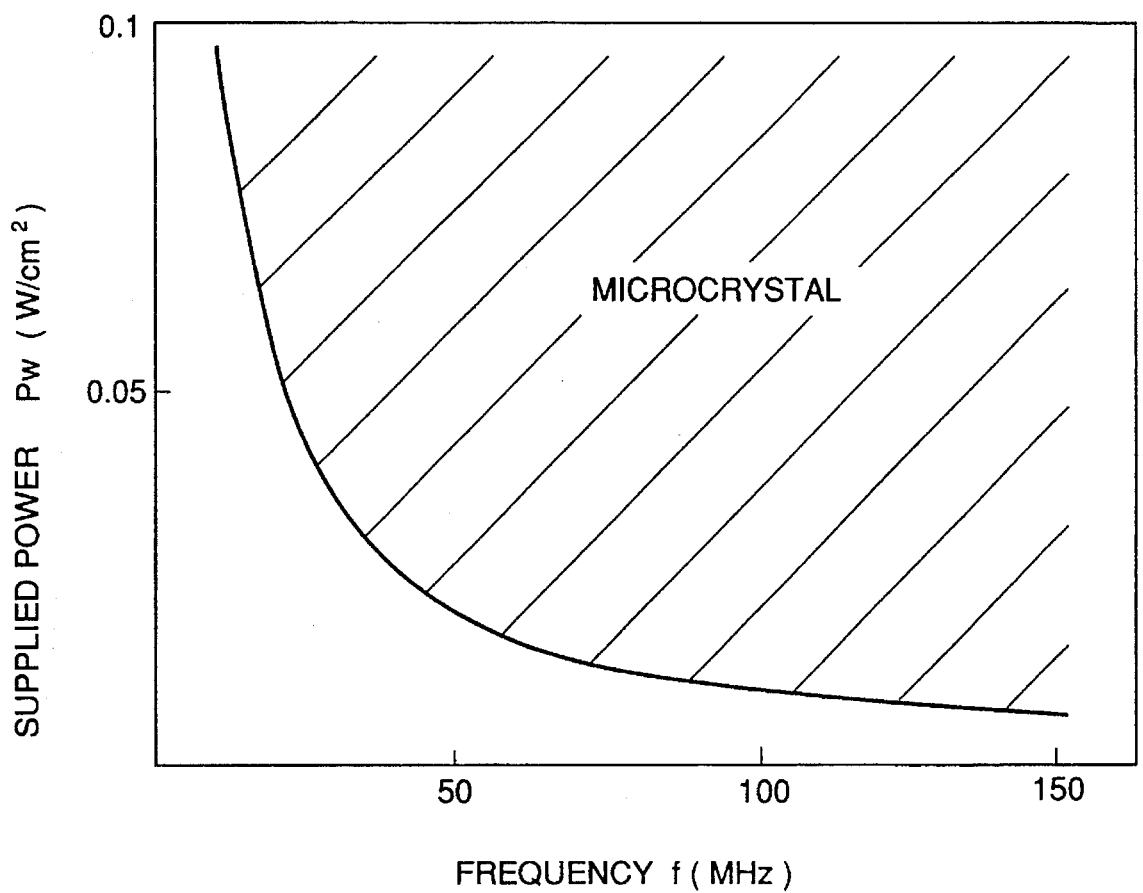
FIG. 89 illustrates an example of the relationship between the applied high frequency electric power $P_W$ and the applied high frequency f.

The aforesaid condition was obtained, resulting in a region designated by diagonal lines of FIG. 89 where a portion, the lower limit of which is a curve k=1, preferable k=10 which is somewhat deviated from the boundary region.

The aforesaid fact is a second effect of the present invention. That is, the rise of the applied frequency will enable a desired film at a wider frequency range while maintaining the conditions required to manufacture the microcrystal silicon. The aforesaid fact is very effective when a large area film is formed. That is, the size of the high frequency power source can be reduced with respect to the size of the apparatus, thus resulting in the reduction of the cost of the apparatus. In terms of the influence upon the characteristics of the film, the fact that the film can be manufactured in a region, in which the small electric power is supplied, will reduce the total energy of ions in the plasma. Therefore, the surface of the film can be protected from the damage due to the incidental ions, and, accordingly, a film having excellent characteristics can be formed.

In terms of preventing the damage caused from ions, the movement of ions in the plasma is paid attention. In general, ions in the high frequency plasma are vibrated by the electric field being oscillated by the high frequency wave in the plasma. The foregoing state can be expressed by the following equation, where A is the amplitude of the oscillating ions:

$$A \approx V/w$$

where

V: the highest speed in one period of the high frequency w: the angular frequency of the high frequency: f=2 $\pi\omega$ Assuming that a parallel and flat type film forming apparatus is used and the distance between its electrodes is d, the following condition must be satisfied:

$$d > A$$

Thus, ions in the plasma do not reach the surface of the substrate but move within the plasma. The foregoing state is usually called a state where ions are captured or trapped in the plasma. As can be seen from the foregoing relational expression, the rise of the applied high frequency enables the state where ions are trapped to be realized regardless of the size of the apparatus. As a result, the quantity of ions to be made incident on the substrate could be reduced, thus resulting in the prevention of the ion damage of the surface of the film and inside portion of the film. Furthermore, it is considered that ions influences undesirably the process of forming the microcrystal. Therefore, it is effective to form efficiently excellent microcrystal as well as the effect of simply preventing the ion damage. The present invention is intended to positively utilize the aforesaid state.

As described above, FIG. 29 illustrates the foregoing state. A mass analyzer was set at the position of the substrate and the incidental energy of ions flying to the foregoing position and the distribution of the quantities of incidental ions were obtained. In order to easily perform analysis, data about argon gas was obtained. Also the reaction gas according to the present invention basically shows a similar tendency. The conventional applied high frequency f=13.56 MHz and f=80 MHz according to the present invention are different from each other in the energy and quantity of ions made incident upon the substrate. It is apparent that the condition of f=100 MHz shows a smaller average incidental energy and small quantity of incidental ions.

As shown in FIG. 7, if the frequency f is high with respect to a certain distance d between electrodes, the distribution becomes large, resulting in a problem to arise when a large area film is formed. Accordingly, the inventors of the present invention have modified a variety of film forming parameters, resulting in a fact to be found that the distance between the electrodes affects the film thickness distribution. Furthermore, a fact was found that lengthening of the distance between the electrodes will reduce the film thickness distribution. The relationship between them was obtained under condition that the film thickness distribution T (%) in the film is included in 10% under a variety of the conditions according to the present invention, resulting in that the distribution is too large to be employed when d=2 cm. When d is larger than 3 cm, a substantially excellent distribution can be obtained if d meets the relationship f/d<30.

FIG. 8 illustrates the relationship between the distance between the electrodes and the density of defective level in the film under a variety of conditions. It can be found that the density of the defects gradually decreases if the distance between the electrodes is 4 cm or longer. Furthermore, it rapidly increases if the distance is shorter than 4 cm. It is therefore understood that the preferred distance between the electrodes is 4 cm or longer. Accordingly, the investigation was made in such a manner that the distance between the electrodes is 4 cm.

On the basis of the foregoing results of experiments and consideration, microcrystal silicon was manufactured which did not contain impurities by the manufacturing method according to the present invention.

The glass substrate 8702 was fastened to the anode electrode in the chamber 8700 followed by lowering the pressure to $10^{-6}$ Torr by using the exhaust pump 8709. The substrate temperature was set to 250° C., and the SiH$_4$ gas was allowed to flow by 3 sccm, and the H$_2$ gas was allowed to flow by 150 sccm The internal pressure of the chamber was made to be 0.5 Torr followed by maintaining for 30 minutes. Then, the high frequency electric power was supplied and the matching device was adjusted to commence the discharge for a required time, so that the film was formed.

At this time, the frequency f was set to several values between f=13.56 MHz and f=150 MHz to manufacture samples. The high frequency electric power was so set to 7 mW/cm$^2$ to 0.1 W/cm$^2$.

The crystallinity was evaluated by an X-ray analysis, resulting in all samples exhibiting crystallization. A comb-type aluminum electrode was formed on the foregoing film by evaporation and the dark conductivity and the activating energy were measured at the room temperature (25° C.). Also the optical band gaps Egopt were manufactured by using the foregoing samples.

Figure 90:
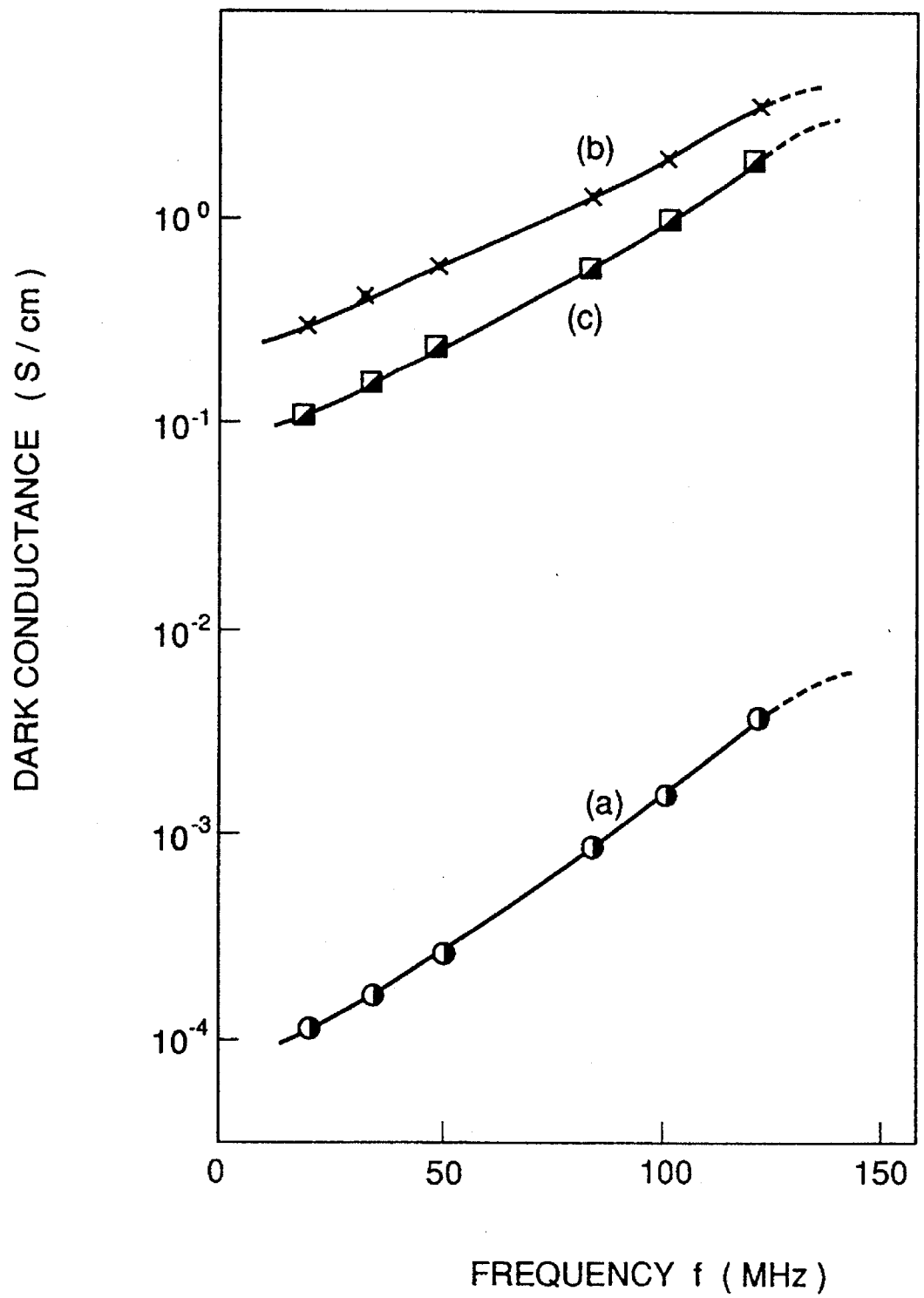
FIG. 90 illustrates an example of dependency of the dark conductivity upon the applied high frequency f.
Figure 91:
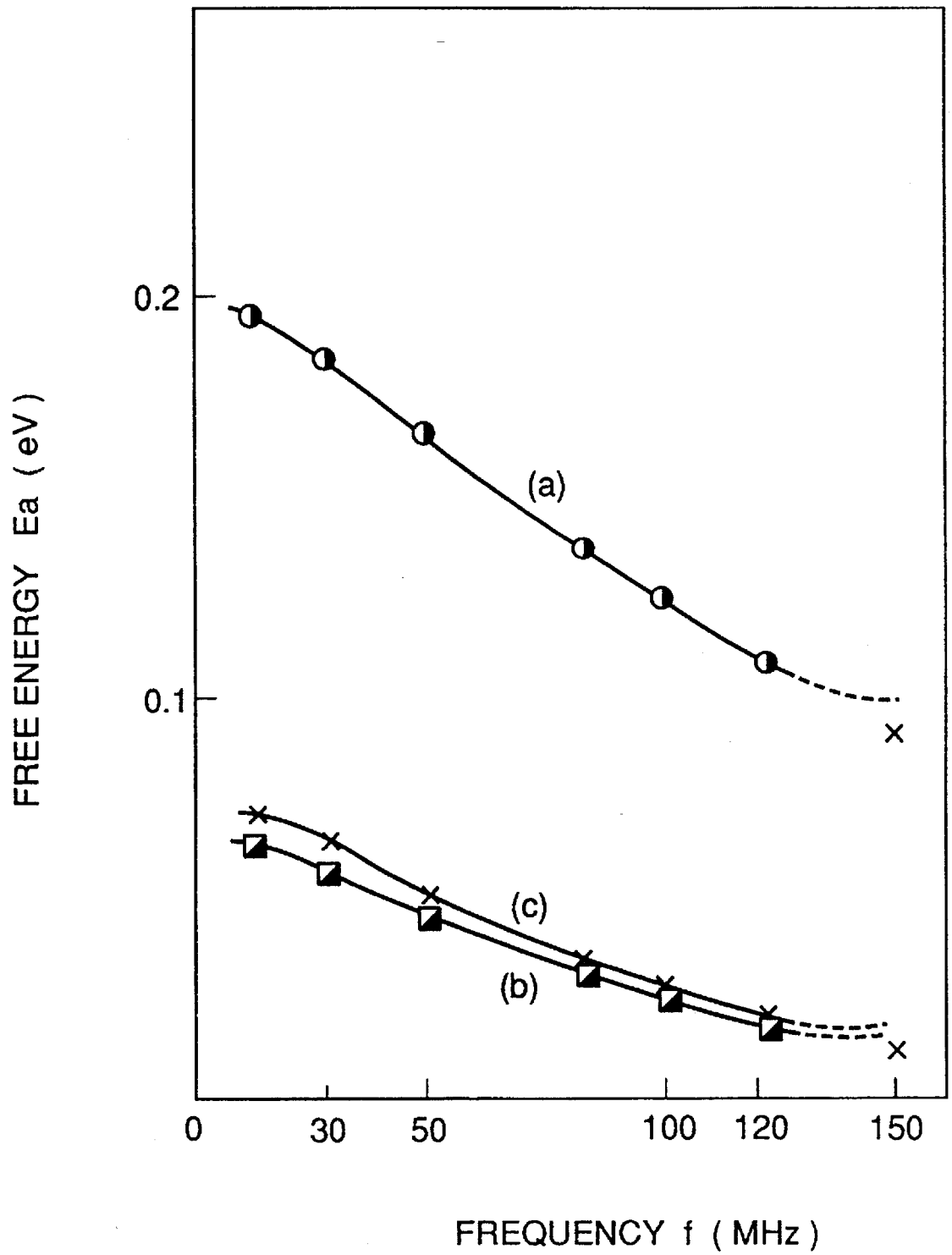
FIG. 91 illustrates an example of dependency of the activating energy upon the applied high frequency f.

The solid line (a) of FIG. 90 denotes the dependency of the dark conductivity of the film manufactured as described above upon the applied frequency. (a) of FIG. 91 shows the dependency of the activating energy upon the applied frequency. Short dash line of the drawing shows a result having unsatisfactory reproducibility because of a large quantity of dust in the film. The reason for the dust is considered that the silane gas is excessively decomposed if the frequency is higher than 100 MHz, in particular, higher than 120 MHz, resulting in polysilane to be easily generated.

As shown in FIGS. 90 and 91, the rise in the frequency applied improves the dark conductivity and reduces the activating energy. The foregoing facts are a phenomenon due to the crystallization of the film. The conditions required for crystallizing the deposited film has been present in which the quantity of ions made incident upon the surface of the substrate must be reduced. As a result of the experiment, ions in the plasma are in a state where they are trapped by raising the frequency to be applied. Therefore, it is considered that the reduction in the number and the energy of ions made incident upon the surface of the substrate as shown in FIG. 29 enhanced the crystallization.

Another effect of the present invention is to improve the initial film. In general, it has been known that the initial film of a thickness about 500 Å is a defective region in which the microcrystal does not grow sufficiently when the microcrystal silicon film is formed. It can be considered that a negative bias effects the insulating substrate at the initial state of the process of forming the film, and, accordingly, ions are incident on the substrate, causing the foregoing problem to occur. The microcrystal silicon is usually used to form a block layer and an ohmic layer of a semiconductor device while having a thickness of about 1000 Å or thinner. This leads to a fact that almost the half of the thickness of the film has insufficient characteristics.

It has been known that the foregoing initial film is changed due to the film forming conditions and the unstability of the process, causing the characteristics of the device to deteriorate or become unstable. In particular, the foregoing problems become critical in the field for manufacturing the film.

By employing the manufacturing method according to the present invention, ions are trapped into the plasma, causing the quantity of ions made incident upon the substrate to be reduced. Therefore, it has been confirmed that the method according to the present invention enables an initial film of the microcrystal silicon to have excellent characteristics.

Embodiment 10

Figure 92:
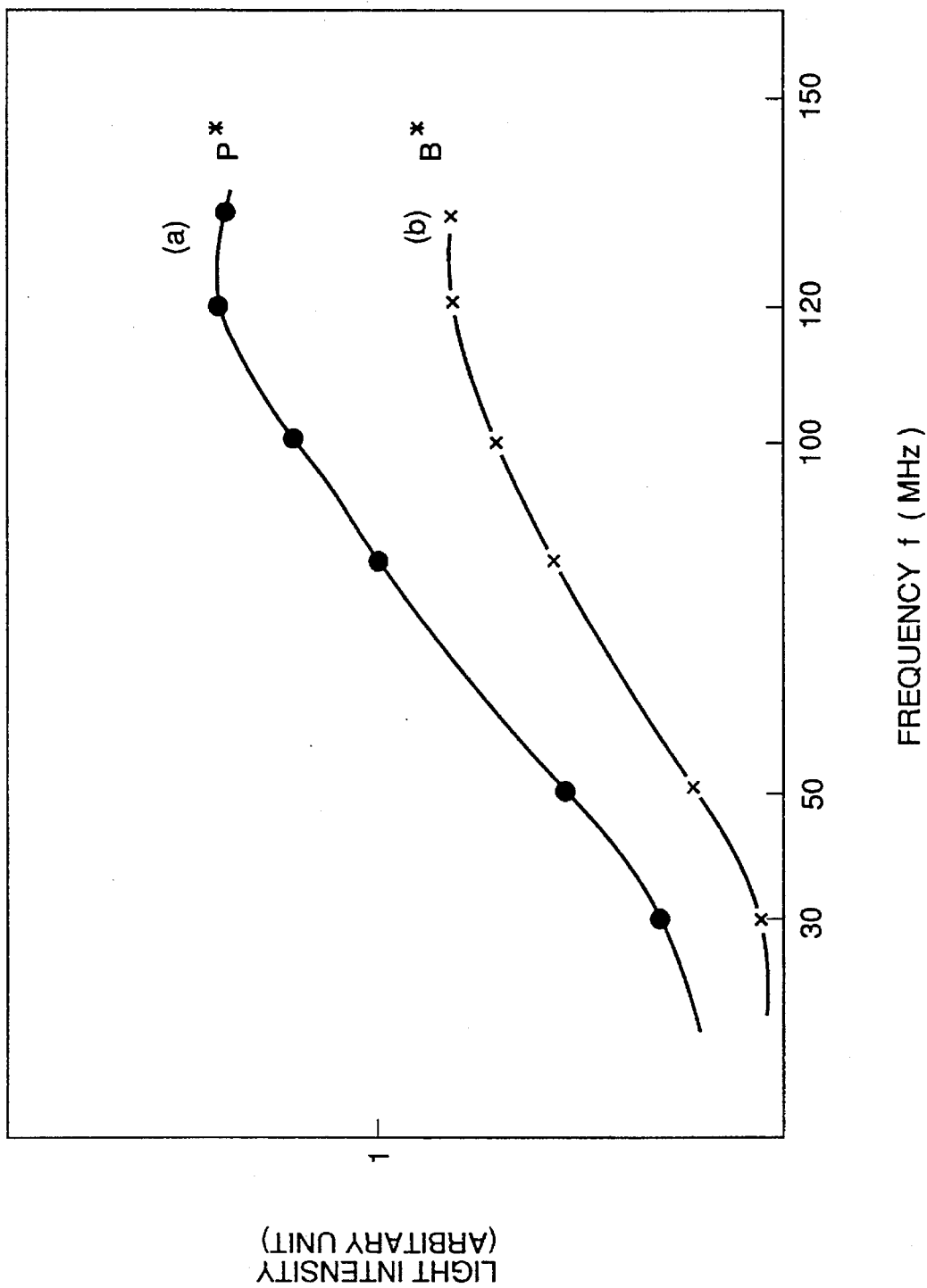
FIG. 92 illustrates an example of dependency of the doping gas radicals upon the applied high frequency f.
Figure 93:
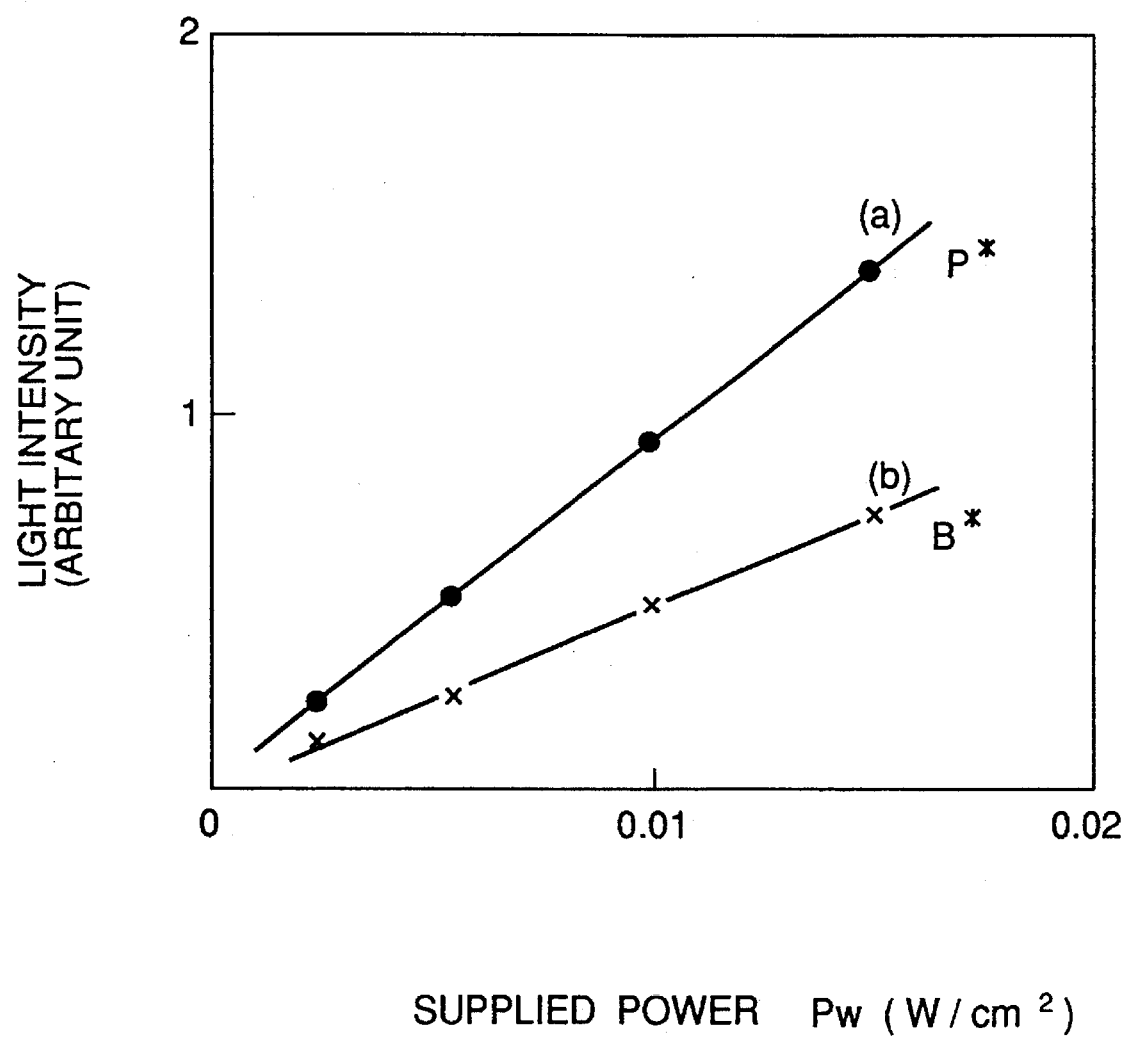
FIG. 93 illustrates an example of dependency of the doping gas radicals upon the applied high frequency electric power $P_W$.

A tenth embodiment will now be described where an n$^+$-type microcrystal silicon film containing impurities is manufactured. The state of the plasma at this time is shown. FIG. 92 shows the dependency of the light intensity of the phosphine radical upon the frequency. FIG. 93 shows the dependency of the phosphine radical upon the applied electric power. The high frequency electric power was varied from 3 mW/cm$^2$ to 100 mW/cm$^2$ at this time to manufacture samples. The frequency to be applied was varied from 13.56 MHz to 150 MHz.

The glass substrate 8702 was fastened to the anode electrode in the chamber 8700 followed by lowering the pressure to $10^{-6}$ Torr by using the exhaust pumps 8708 and 8709. The substrate temperature was set to 250° C., and the SiH$_4$ gas was allowed to flow by 3 sccm by opening the valves 8710 and 8718, the PH$_3$ gas diluted to 100 ppm by H$_2$ gas was allowed to flow by opening the valves 8712 and 8720. The internal pressure of the chamber was made to be 0.5 Torr followed by maintaining for 30 minutes and then the state in which the temperature of the substrate is stabled was waited for. Then, the high frequency electric power is supplied and the matching device was adjusted to commence the discharge for a required time, so that the film was formed to have a thickness of 1 µm. Then, the gas was discharged and the pressure was lowered to $10^{-6}$ Torr.

The crystallinity was evaluated by an X-ray analysis, resulting in all samples encountered crystallization. A comb-type aluminum electrode was formed on the foregoing film by evaporation and the dark conductivity and the activating energy were measured at the room temperature (25° C.).

Figure 94:
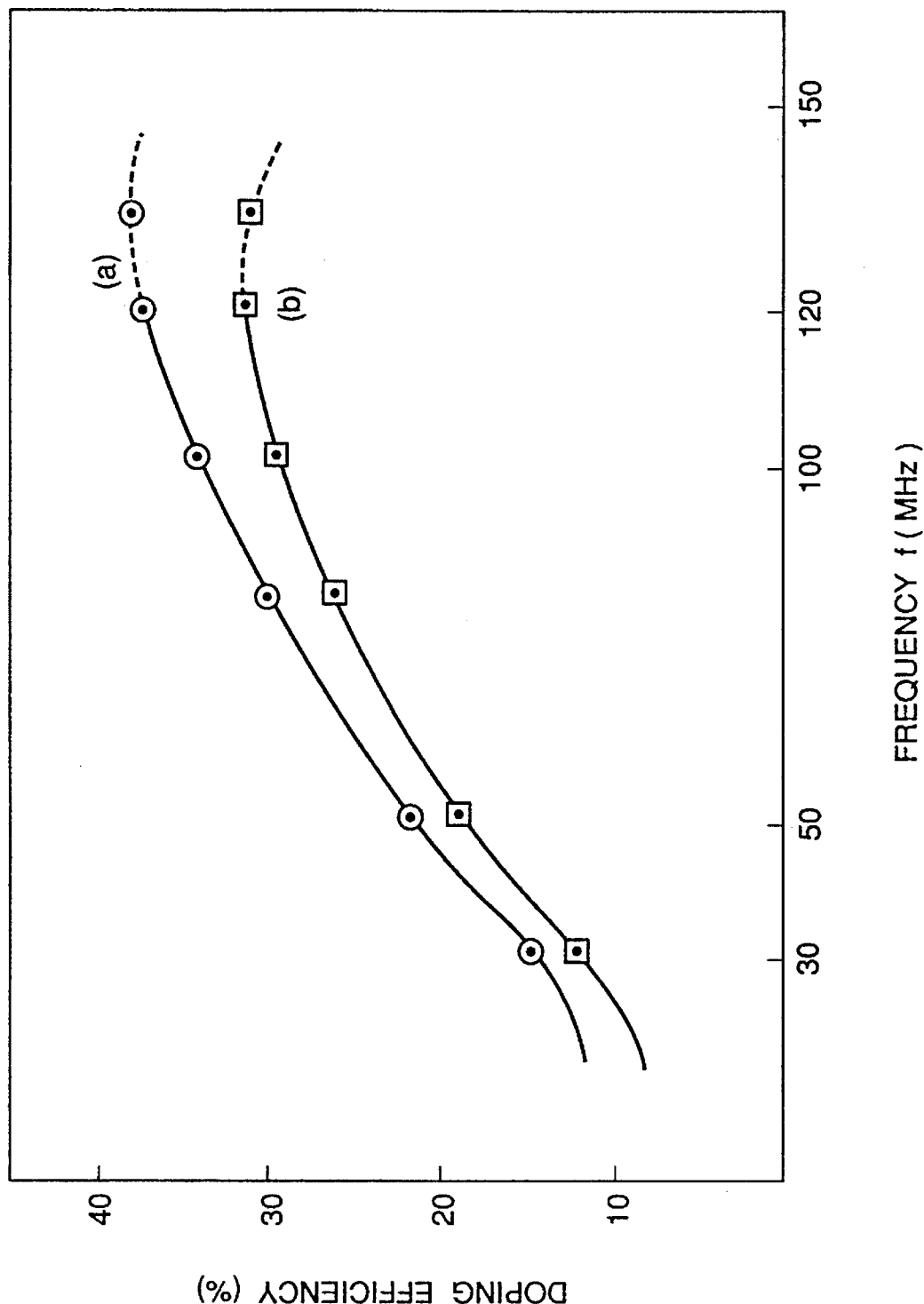
FIG. 94 illustrates an example of dependency of the doping level upon the applied high frequency f.

(b) of FIG. 90 shows the dependency of the dark conductivity of the film formed under the foregoing conditions upon the applied frequency. (b) of FIG. 91 shows the dependency of the activating energy upon the applied frequency. FIG. 94 shows the dependency of the doping efficiency upon the applied frequency. As can be understood from FIGS. 90 and 91, raising of the applied frequency raise the dark conductivity and lowers the activating energy. As can be understood from the motion of the non-doping film shown by (a), the doping efficiency is enhanced when a higher frequency is applied, resulting in the enhancement of the crystallization of the film. Therefore, phosphorus is energetically received into the film. Since also the doping efficiency is improved when the applied frequency is raised as can be seen from FIG. 94, this fact can be considered to be due to the improvement in the crystallinity.

Figure 95:
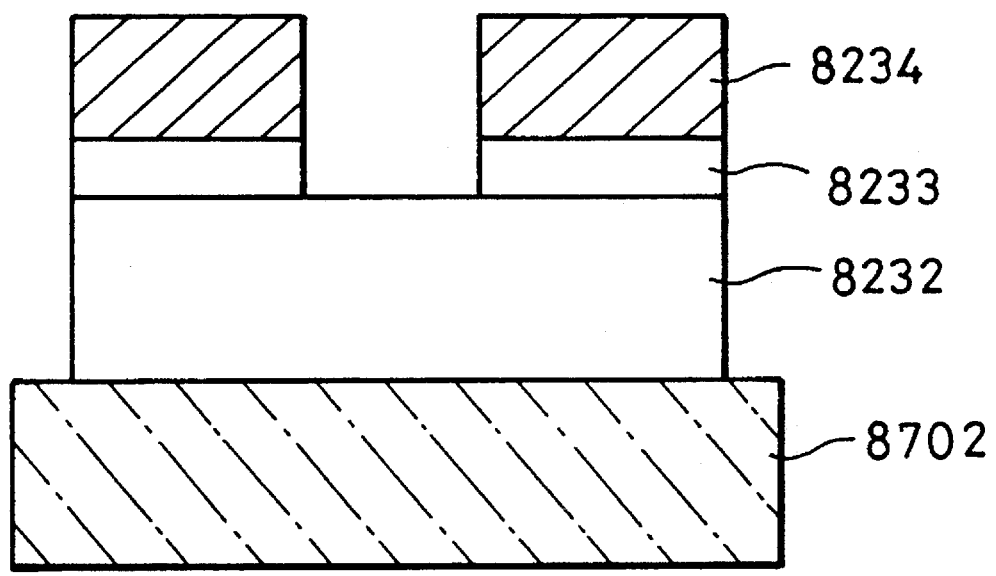
FIG. 95 is a schematic structural view which illustrates the structure of a photoconductive-type sensor according to the present invention.

Then, a film formed by using the frequency of 80 MHz is used to serve as an ohmic layer of a photoconductive-type sensor device having intrinsic amorphous silicon to serve as a photoconductive film followed by performing evaluation. FIG. 95 shows the structure of the device. Referring to FIG. 95, reference numeral 8702 represents a glass substrate, 8232 represents an amorphous silicon, 8233 represents an $n^+$-type microcrystal silicon and 8234 represents an electrode., The glass substrate 8702 was fastened to the anode electrode in the chamber 8700 shown in FIG. 84 followed by lowering the pressure to $10^{-6}$ Torr by using the exhaust pumps 8708 and 8709. The substrate temperature was set to 250° C., and the $SiH_4$ gas was allowed to flow by 3 sccm and $H_2$ gas was allowed to flow by 30 sccm. The internal pressure of the chamber was made to be 0.5 Torr followed by maintaining for 30 minutes and then the state in which the temperature of the substrate is stabled was waited for. Then, the usual high frequency of 13.56 MHz and the electric power of 10 mW/cm² was supplied and the matching device was adjusted to commence the discharge for a required time of 3.5 hours, resulting in an intrinsic amorphous silicon 8232 having a thickness of 5000 Å to be formed. Then, the gas was discharged and the pressure was lowered to $10^{-6}$ Torr.

Then, an $n^+$-type microcrystal silicon 8233 was deposited on the intrinsic amorphous silicon 8232. Then, glass substrate was held on the anode electrode in the chamber 8700. The substrate temperature was set to 250° C., and the $SiH_4$ gas was allowed to flow by 3 sccm and the phosphine gas diluted to 100 ppm by H2 gas was allowed to flow by 150 sccm. The internal pressure of the chamber was made to be 0.5 Torr followed by maintaining for 30 minutes and then the state in which the temperature of the substrate is stabled was waited for. Then, a high frequency wave of 80 MHz was supplied and the matching device was adjusted to commence the discharge for a required time, resulting in the $n^+$-type microcrystal silicon having a thickness of 1500 Å to be formed. Then, the gas was discharged and the pressure was lowered to $10^{-6}$ Torr.

Then, the substrate was ejected from the film forming apparatus, and an aluminum layer was formed by a vacuum evaporation method to have a thickness of 1 µm.

Then, the aluminum layer was patterned, and as a result of which, an electrode 8234 was formed.

Finally, the foregoing electrode 8234 was used as the mask to remove the $n^+$-type amorphous silicon by etching.

Figure 96:
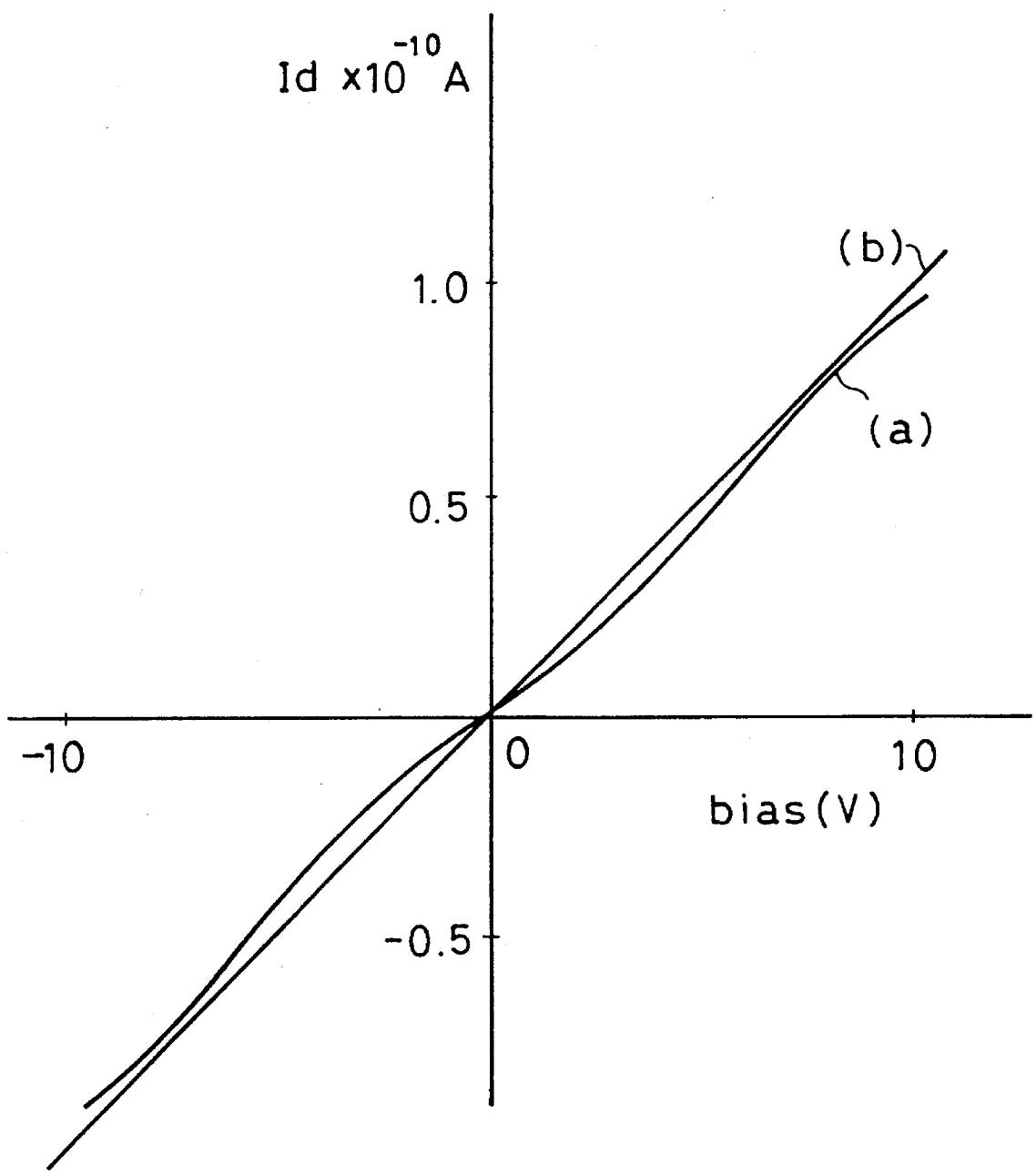
FIG. 96 illustrates an example of dependency of the dark current of the photoconductive-type sensor upon the bias.
Figure 97:
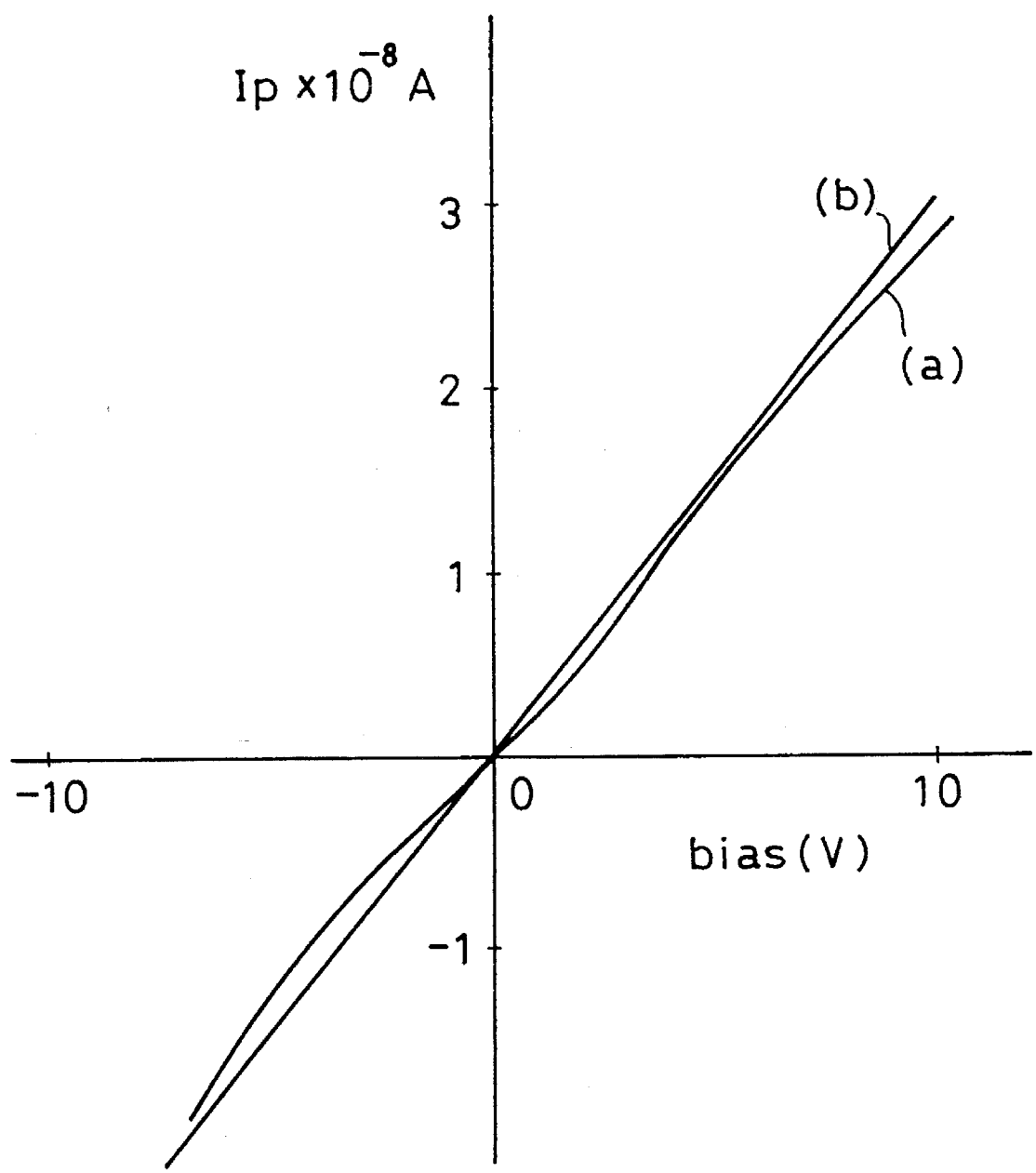
FIG. 97 illustrates an example of dependency of the photoelectric current of the photoconductive-type sensor upon the bias.

The dependency of the dark current of the device thus manufactured upon the bias is shown in (b) of FIG. 96. (b) of FIG. 97 shows the dependency of the photoelectric current upon the bias when irradiated with a light emitted from a light source, the wavelength of which was 560 (nm) and 200 (lx). (a) of FIGS. 61 and 62 show data of the conventional device, where the dark current showed non-ohmic characteristics when a low bias is applied. Also the photoelectric current showed somewhat similar characteristics. It can be considered that the foregoing fact is due to unsatisfactory joining of the intrinsic amorphous silicon layer and the $n^+$ microcrystal silicon layer. However, the method according to the present invention enabled the $n^+$ microcrystal silicon layer to be manufactured while improving the foregoing non-ohmic characteristics. Furthermore, the improvement in the $n^+$ microcrystal silicon layer enabled the junction to be formed satisfactorily. In addition, damage of the intrinsic amorphous silicon layer due to ions could be prevented and the photoelectric characteristics could be improved.

Embodiment 11

An eleventh embodiment where a $p^+$ type microcrystal silicon film was formed will now be described.

First, the state of the plasma at this time will be described. FIG. 92 show the dependency of the light intensity of boron radicals upon the frequency. Usually, an emission of boron radicals is observed the light of which cannot be visually recognized, where the light intensity rises in proportion to the applied frequency. The reason for this is considered that the density of electrons in the plasma is raised similarly to the silane gas and, accordingly, the decomposition efficiency can be improved. FIG. 93 shows the dependency of the light intensity of the boron radical upon the applied electric power. In proportion to the applied electric power, the light intensity is strengthened. In this embodiment, high frequency waves from 13.56 MHz to 150 MHz were applied.

Under the conditions for the foregoing plasma, samples were manufactured.

Then, glass substrate 8702 shown in FIG. 84 was fastened to the anode electrode in the chamber, and then the pressure in the chamber was lowered to $10^{-6}$ Torr by the exhaust pumps 8708 and 8709. The substrate temperature was then set to 200° C., and the valves 8710 and 8718 were opened to flow the silane gas by 3 sccm, and the valves 713 and 8721 were opened to flow diborane diluted to 1% by $H_2$ gas by 150 sccm followed by maintaining the pressure for 30 minutes. Then, high frequency electric power was supplied and the matching device was adjusted to commence the discharge, resulting in the film to be formed. The thickness of all samples was made to be about 1 µm.

The crystallinity was evaluated by an X-ray analysis, resulting in crystallization of all samples. A comb-type aluminum electrode was formed on the foregoing film by evaporation followed by measurements of the dark conductivity and the activating energy at the room temperature (25° C.).

(c) of FIG. 90 shows the dependency of the dark conductivity of the film formed under the foregoing conditions upon the applied frequency. (c) of FIG. 91 shows the dependency of the activating energy upon the applied frequency. The dependency of the doping efficiency upon the applied frequency was similar to phosphine. As can be understood from FIGS. 90 and 91, the rise in the applied frequency raises the dark conductivity and lowers the activating energy. As can be understood from the motion of the non-doping film shown by (a), the doping efficiency is enhanced when a higher frequency is applied, resulting in the enhancement of the crystallization of the film. Therefore, boron is energetically received into the film. Since also the doping efficiency is improved when the applied frequency is raised similarly to phosphine, this fact can be considered to be due to the improvement in the crystallinity.

Figure 98:
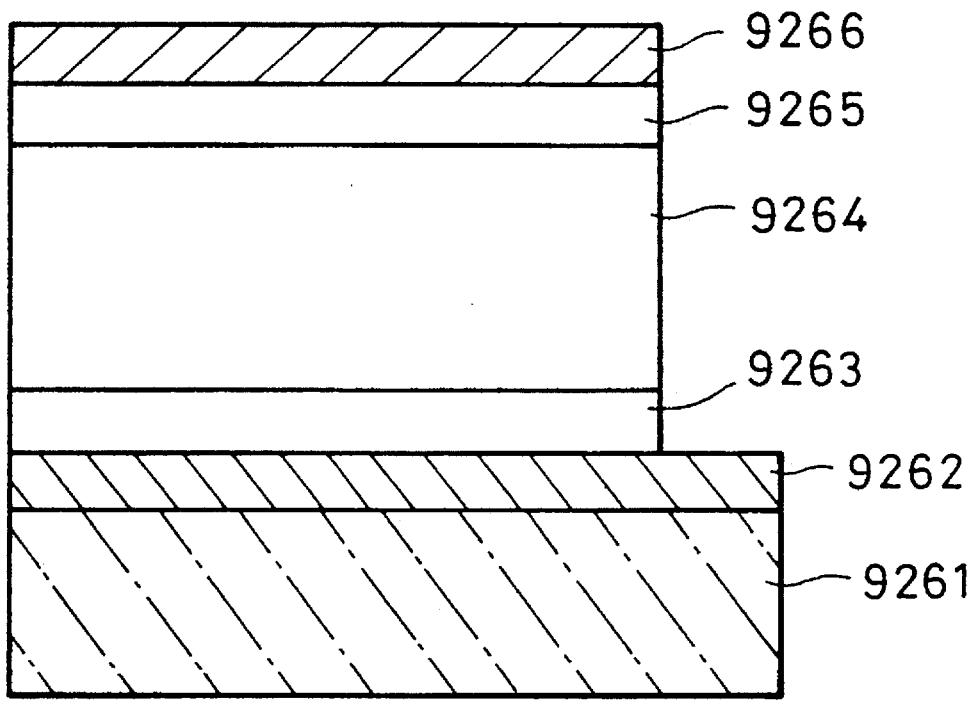
FIG. 98 is a schematic structural view which illustrates the structure of a PIN-type photodiode.

A film formed by using a frequency of 80 MHz was used to manufacture a PIN-type photodiode to evaluate the manufactured device. FIG. 98 shows the structure of the device.

First, an $n^+$-type microcrystal silicon 9263 was deposited on a substrate 9261 on which the lower electrode 9262 was formed. The substrates was held on the anode electrode in the chamber 8700 shown in FIG. 81, and the temperature of the substrates was set and maintained at 250° C. followed by flowing SiH4 gas by 3 sccm and flowing phosphine gas diluted by H2 gas to 100 ppm by 150 sccm. Then the pressure in the chamber was lowered to 0.5 Torr followed by maintaining the pressure for 30 minutes, and a fact that the temperature of the substrates was stabled was waited for. Then, high frequency electric power of 30 MW/cm² having the usual frequency of 13.56 MHz was supplied and the matching device was adjusted to commence the discharge, resulting in an n⁺-type amorphous silicon to be formed to have a thickness of 1500 Å. Then, the gas was exhausted to lower the pressure to 10⁻⁶ Torr.

Then, the substrate was held in the chamber, and the set temperature of the substrate was maintained at 250° C. Then, SiH₄ gas was allowed to flow by 3 ccm, and H₂ gas was allowed to flow by 30 sccm followed by setting the internal pressure of the chamber to 0.5 Torr, which was maintained for 30 minutes to wait for the fact that the stabilization of the substrate temperature was waited for. Then, the usual high frequency of 13.56 MHz and the electric power of 10 mW/cm² was supplied and the matching device was adjusted to commence the discharge for a required time of 3.5 hours, resulting in an intrinsic amorphous silicon 9264 having a thickness of 5000 Å to be formed. Then, the gas was discharged and the pressure was lowered to 10⁻⁶ Torr.

A p⁻ microcrystal silicon layer 9265 was deposited on the intrinsic amorphous silicon 9264. The substrate was fastened to the anode electrode in the chamber, and then the substrate temperature was set to 200° C. Then, the valves 8710 and 8718 were opened to flow silane gas by 3 sccm, and the valves 8713 and 8721 were opened to flow diborane diluted to 1% by H2 gas by 150 sccm followed by maintaining for 30 minutes. Then, high frequency electric power of a frequency of 80 MHz was supplied and the matching device was adjusted to commence the plasma discharge. As a result, a film having a thickness of 500 Å was formed.

Figure 99:
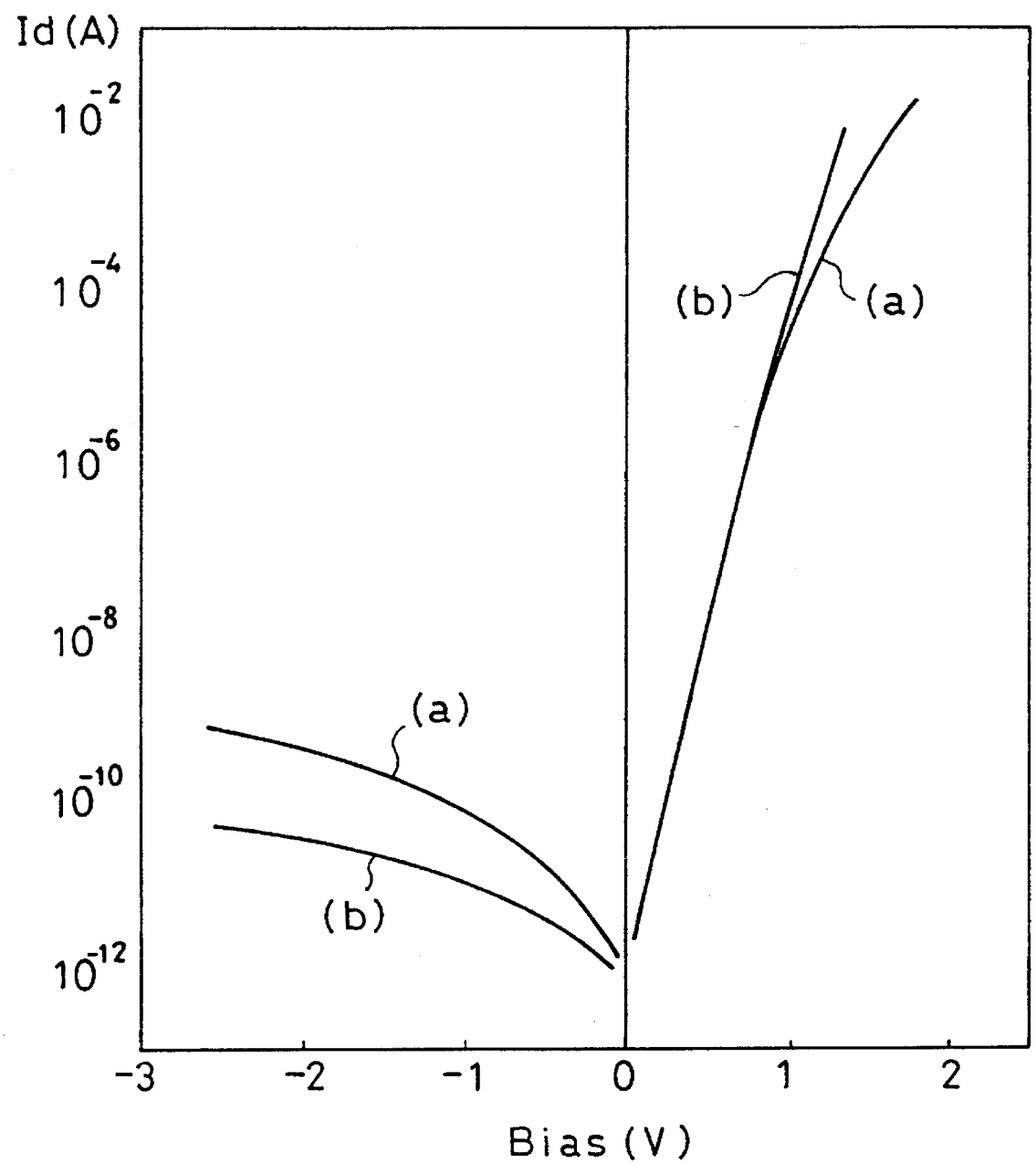
FIG. 99 illustrates an example of the diode characteristics of the PIN-type photodiode.

(b) FIG. 99 shows the characteristics of the device thus manufactured. (a) FIG. 99 shows data when the p⁺ microcrystal silicon layer was formed by the conventional manufacturing method. As can be understood from (a) of FIG. 99, the electric current at the time of the inverse bias could be reduced considerably. Furthermore, the first transition of the forward directional electric current could be improved. The reason for this can be considered that the junction between the P⁻ microcrystal silicon layer and the base intrinsic amorphous silicon layer is satisfactory formed, resulting in the blocking characteristics to be improved and the damage due to ions could be prevented.

Although Embodiments 10 and 11 were described where phosphine and diborane were used, a similar effect can be obtained by using arsine as the doping gas.

Although the manufacturing methods according to the foregoing embodiments may be arbitrarily combined. For example, the method for manufacturing the SiNx film according to the embodiment of the present invention may be employed to form the gate insulating layer of a thin film transistor or the like and the method for manufacturing the a-Si film according to the embodiment of the present invention may be employed to form the i-type semiconductor layer. It is, of course, preferable that all of the layers (the i-type semiconductor layer, n⁺-semiconductor layer and the insulating layer and the like) are formed by the manufacturing methods according to the present invention.

As described above, it is preferable that the field-effect-type transistor shown in FIG. 35 or the P-I-N-type semiconductor device is manufactured in such a manner that its functional films are continuously stacked. There arise a problem when the interface, which is an important factor for the characteristics, is control that the films are not formed at the same film forming speed and the films must be formed to have individual thicknesses. Therefore, a rate determining step must be provided at the time of the continuous film forming operation, causing a tact time to be generated.

In the foregoing device shown in FIG. 35, the process for forming the conventional i-type a-Si layer is the rate-determining step. According to the present invention, the discharge frequency is properly selected to eliminate the rate-determining step. As a result, the rate-determining step can be eliminated, the through put can be improved and therefore the cost can be cut. Furthermore, the discharge frequency adapted to form each layer is raised to improve the quality so that the through put can be improved.

If the amorphous silicon nitride film according to the present invention is used as the gate insulating film, and the non-single-crystal film according to the present invention such as the amorphous silicon film or the microcrystal silicon film is used as the semiconductor device, a TFT exhibiting excellent characteristics such as satisfactory reliability can be realized as described in addition to the effect of improving the through put.

That is, each discharge frequency may be determined in the continuous film forming process while considering the influence of each film upon the characteristics of the device and effect of cost reduction typified by the through put.

As described above, according to the present invention, the plasma CVD method is so arranged that the frequency of the high frequency power source, the electric power to be supplied and depending upon the frequency, the pressure, and the distance between the electrodes are determined. As a result, the a-Si film can be manufactured over a large area at a low cost, excellent yield, and with excellent quality. In particular, the thin film transistor, the thin film transistor type photosensor, and the solar cell can be improved to have excellent characteristics such as the mobility of the electric field and the photoelectric characteristics.

According to the present invention, the reduction of the film forming speed can be prevented and therefore satisfactory film forming speed can be realized. As a result, the manufacturing through put can be improved. Furthermore, the efficiency of decomposing the film forming gas can be improved and, accordingly, the quantity of the gas can be reduced. As a result, the gas utilization efficiency can be improved significantly. Therefore, the manufacturing cost can be reduced. Since ions which deteriorate the characteristics of the film are enclosed in the plasma at the time of forming the film, generation of defects can be prevented. Hence, a film having excellent characteristics can be formed. Since the plasma damage occurring at the interface can be prevented, excellent films can be stably provided. Furthermore, the gas removal from the chamber can be prevented, and receipt of impurities into the film can be reduced. Therefore, the defects caused from the foregoing facts can be prevented, and, therefore, an excellent film can be provided. Since the film can be formed by using smaller electric power with the conventional apparatus. Therefore, the size of the power source apparatus can easily be reduced. In particular, the cost of a large-size manufacturing apparatus can be reduced.

According to the present invention, the plasma CVD method is so arranged that the frequency of the high frequency power source and the distance between the electrodes are determined. As a result, the SiNx thin film can be manufactured over a large area at a low cost, excellent yield, and with excellent quality. In particular, the thin film transistor, the thin film transistor type photosensor, and the solar cell can be improved to have excellent characteristics such as the mobility of the electric field and the photoelectric characteristics.

According to the present invention, the reduction of the film forming speed can be prevented and therefore satisfactory film forming speed can be realized. As a result, the manufacturing through put can be improved. Furthermore, the efficiency of decomposing the film forming gas can be improved and, accordingly, the quantity of the gas can be reduced. As a result, the gas utilization efficiency can be improved significantly. Therefore, the manufacturing cost can be reduced. Since ions which deteriorate the characteristics of the film are enclosed in the plasma at the time of forming the film, generation of defects can be prevented. Hence, a film having excellent characteristics can be formed. Since the plasma damage occurring at the interface can be prevented, excellent films can be stably provided. Further, the initial film can be improved so that the unstable factor for the characteristics of the interface can be removed. Therefore, an excellent film can stably be provided. Since the film can be formed by using smaller electric power with the conventional apparatus. Therefore, the size of the power source apparatus can easily be reduced. In particular, the cost of a large-size manufacturing apparatus can be reduced.

According to the present invention, the non-single-crystal semiconductor layer is manufactured by the plasma CVD method utilizing the high frequency discharge using a frequency ranged from 30 MHz to 120 MHz. Therefore, the film can be formed over a large area, and the characteristics of the film can be improved, and the film can be formed at high speed. Furthermore, there can be provided the non-single-crystal semiconductor device capable of improving the characteristics of the interface which are the critical factor for the characteristics of the device. The present invention may be adapted to the semiconductor device having the insulating-gate-type transistor such as the TFT. If the gate insulating layer and/or the ohmic contact layer is manufactured by the plasma CVD method utilizing the high frequency discharge using the frequency of 30 MHz or higher, the non-single-crystal semiconductor device having further improved quality can be provided. By properly selecting the discharge frequency while considering the quality of each layer, the rate-determining step for each layer can be eliminated. As a result, the through put can be improved and therefore the cost can be cut. Furthermore, the discharge frequency adapted to form each layer is raised to improve the quality so that the through put can be improved.

According to the present invention, the protection layer is formed by the plasma CVD method utilizing the high frequency discharge using the frequency of 30 MHz or higher. Therefore, an excellent protection layer protected from the ion damage can be manufactured.

As described above, according to the present invention, a frequency f (MHz) in the VHF range higher than 30 MHz is used, the silane radicals can stably increased as compared with the case where the conventional RF band is used. Further, ions deteriorated the characteristics of the film are enclosed in the plasma at the time of forming the film. Therefore, the ion damage can be prevented, and the interface can be protected from the plasma damage, an excellent film can stably provided. In addition to the foregoing advantages of the VHF plasma, the substrate temperature Ts (°C.) at the time of forming the film is maintained at a high level from 300° C. to 600° C., preferably to hold the relationship Ts=kf+a ($0.1 \leq k \leq 2$, $a=300$), thus resulting in restriction of the hydrogen content in the film. Furthermore, the density of the defects in the film can be lowered. Therefore, an excellent film having a large photoconductivity and improved light deterioration prevention characteristics can be manufactured.

According to the present invention, the plasma CVD method is so arranged that the frequency of the high frequency power source is made to be 30 MHz or higher and the negative substrate bias is applied. Therefore, the a-Si thin film can be manufactured at a low cost and to have excellent quality. In particular, the thin film transistor, the thin film transistor type photosensor, and the solar cell can be improved to have excellent characteristics such as the mobility of the electric field and the photoelectric characteristics.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A method of manufacturing a non-single-crystal film containing silicon by a plasma CVD method that utilizes a high frequency discharge, said method comprising the steps of manufacturing said non-single-crystal film by the conditions of:

supplying at least a gas containing Si as a raw material gas into a film forming space;

while supplying said gas, applying high frequency power having a frequency f (MHz) selected from a range from 30 MHz to 120 MHz with $P_W$ defined by $P_W$ (W/cm$^2$)<10 (MHz W/cm$^2$)/f (MHz) between electrodes at a distance d defined by d(cm)>f (MHz)/30 MHz/cm; and discharging under film forming pressure P in the range from 0.25 Torr to 2.5 Torr.

2. A method of manufacturing a non-single-crystal film according to claim 1, wherein said non-single-crystal film is an amorphous silicon film.

3. A method of manufacturing a non-single-crystal film containing silicon by a plasma CVD method that utilizes a high frequency discharge, said method comprising the steps of manufacturing said non-single crystal film by the conditions of:

supplying at least a gas containing Si as a raw material gas into a film forming space;

while applying said gas, applying high frequency power having a frequency f (MHz) selected from a range from 30 MHz to 120 MHZ with power $P_W$ defined by $P_W$(W/cm$^2$)<10 (MHz.Wcm$^2$)/f (MHz) between electrodes at a distance d defined by d(cm)>f (MHz)/30 MHz/cm;

wherein residence time τ (sec) is from 0.05 sec to 2.5 sec; and discharging under film forming pressure P in the range from 0.25 Torr to 2.5 Torr.

4. A method of manufacturing a non-single-crystal film according to claim 3, wherein said non-single-crystal film is an amorphous silicon film.

5. A method of manufacturing a non-single-crystal film by depositing said non-single crystal film by using gas containing Si by a plasma CVD method, said method comprising the steps of manufacturing said non-single crystal film by the conditions of:

supplying at least a gas containing Si as a raw material gas into a film forming space; and while supplying said gas applying VHF waves having frequency f (MHz) selected from the range higher than 30 MHz with power $P_W$ defined by $P_W$ (W/cm$^2$)>1 (MHz.W/cm$^2$)/f (MHz) between electrodes at a distance d defined by d(cm)>(MHz)/30 (MHz)/30 (MHz/cm) to generate plasma; and wherein the ratio of the light intensity (H*) of a hydrogen radical and the light intensity (SiH*) of a silane radical is (H*)/(SiH*)>1.

6. A method of manufacturing a non-single-crystal film according to claim 5, wherein gas containing boron, gas containing phosphorus and gas containing arsenic are used as impurity gas with respect to said gas containing Si.

7. A method of manufacturing a non-single-crystal film according to claim 5, wherein said non-single-crystal film is a microcrystal silicon film.

8. A method of manufacturing a non-single-crystal film according to claim 6, wherein said non-single-crystal film is a microcrystal silicon film.

9. A method of manufacturing a non-single-crystal film according to claim 5, wherein said non-single-crystal film is a microcrystal silicon film.

10. A method of manufacturing a non-single-crystal film by depositing said non-single crystal film by using gas containing Si by a plasma chemical vapor phase method, said method comprising the steps of:

maintaining substrate temperature Ts at a level from 300° C. to 600° C.; and supplying VHF having frequency f of 30 MHz or higher to generate plasma wherein said VHF waves are so supplied that the substrate temperature Ts and said high frequency FMHz satisfy a relationship Ts=k (HMz) f (HMz)+a °C. where $0.1 \leq k(MHz) \leq 2$, a=300° C. to generate a plasma.

11. A method of manufacturing a non-single-crystal film according to claim 10, wherein said VHF waves having said high frequency f are supplied by electric power of 10/f (W/cm2) (f: MHz) to generate plasma.

12. A method of manufacturing a non-single-crystal film according to claim 10, wherein the ratio of the light intensity [H*] of a hydrogen radical and the light intensity [SiH*] of a silane radical is $[H*]/[SiH*] \leq 1$.

13. A method of manufacturing a non-single-crystal film according to claim 10, wherein distance d between electrodes satisfies a relationship f (MHz)/d (cm)<30 MHz/cm.

14. A method of manufacturing a non-single-crystal film according to claim 10, wherein said non-single-crystal film is at least a film selected from a group consisting of an amorphous silicon film and an amorphous silicon nitride film.

15. A method of manufacturing a non-single-crystal film according to claim 5, wherein said non-single-crystal film is at least a film selected from a group consisting of an amorphous silicon film and an amorphous silicon nitride film.

16. A method of manufacturing a non-single-crystal film according to claim 11, wherein said non-single-crystal film is at least a film selected from a group consisting of an amorphous silicon film and an amorphous silicon nitride film.

17. A method of manufacturing a non-single-crystal film according to claim 12, wherein said non-single-crystal film is at least a film selected from a group consisting of an amorphous silicon film and an amorphous silicon nitride film.

18. A method of manufacturing a non-single-crystal film according to claim 13, wherein said non-single-crystal film is at least a film selected from a group consisting of an amorphous silicon film and an amorphous silicon nitride film.

19. A method of manufacturing a non-single-crystal film according to claim 14, wherein said applied frequency is 120 MHz or lower.

20. A method of manufacturing a non-single-crystal film according to claim 14, wherein said film is formed by a film forming pressure of from 0.25 Torr to 2.5 Torr.

21. A method of manufacturing a non-single-crystal film according to claim 16, wherein, assuming that residence time τ (sec) for which raw material gas Q (sccm) is retained in discharge space V (cm³) is defined as $\tau=78.947 \times 10^{-3}$ [X]×sec/(Torr×min.)×V (cm³)×P (Torr) /Q (sscm), said residence time τ is ranged from 0.05 sec to 2.5 sec.

22. A method of manufacturing a non-single-crystal film by a plasma CVD method utilizing high frequency discharge, said method comprising the steps of:

providing silicon compound gas as raw material gas;

making frequency f (MHz) of a high frequency power source to be 30 MHz or higher; and applying voltage to an electrode of a substrate in such a manner that the surface of said substrate is made to be a negative potential, and wherein the relationship between distance d (cm) between electrodes and applied voltage Vb (v) to said electrode of said substrate satisfies $Vb/d \geq -12$ (v/cm).

23. A method of manufacturing a non-single-crystal film by a plasma CVD method according to claim 22, wherein the relationship between distance d (cm) between electrodes and frequency power source satisfies [f/d<30]f(MHz)/d (cm)<30 MHz/cm.

24. A method of manufacturing a non-single-crystal film by a plasma CVD method according to claim 22, wherein said non-single crystal film is an amorphous silicon film.

25. A method of manufacturing a non-single-crystal film by a plasma CVD method according to claim 23, wherein said non-single crystal film is an amorphous silicon film.

26. A method of manufacturing a non-single-crystal film by a plasma CVD method according to claim 23, wherein said frequency f of said high frequency power source is 120 MHz or lower.

27. A method of manufacturing a non-single-crystal film by a plasma CVD method according to claim 22, wherein said frequency f of said high frequency power source is from 50 to 100 MHz.

28. A method of manufacturing a non-single-crystal film for depositing an amorphous silicon nitride film by a plasma CVD method by using mixture gas of at least gas containing Si and nitrogen gas, said method comprising the step of:

applying VHF waves having frequency f MHz higher than 30 MHz to meet f (MHz)/d (cm)<30 (MHz/cm assuming that the distance between electrodes is d (cm) to generate plasma, and wherein said non-single-crystal film has a compressive stress of from $1 \times 10^9$ dyn/cm² to $4 \times 10^9$ dyn/cm².

29. A method of manufacturing a non-single-crystal film according to claim 28, wherein said mixture gas of at least gas containing Si, hydrogen gas and nitrogen gas is used.

30. A method of manufacturing a non-single-crystal film according to claim 28, wherein said mixture gas of at least gas containing Si and F and nitrogen gas is used.

31. A method of manufacturing a non-single-crystal film according to claim 28, wherein said mixture gas of at least gas containing Si and F, hydrogen gas and nitrogen gas is used.

32. A method of manufacturing a non-single-crystal film for depositing amorphous silicon nitride film by a plasma CVD method by using mixture gas containing at least a silicon compound and ammonia as raw material gas, said method comprising the step of:

applying VHF waves having frequency f higher than 30 MHz and lower than 120 MHz to meet f (MHZ)/d (cm)<30 MHz/cm assuming that the distance between electrodes is d (cm) to generate plasma, and wherein said non-single-crystal film has a compressive stress of from $1 \times 10^9$ dyn/cm$^2$ to $4 \times 10^9$ dyn/cm$^2$.

33. A method of manufacturing a non-single-crystal film according to claim 32, wherein said method of manufacturing said non-single-crystal film is used in a stacked structure with an amorphous silicon film.

34. A method of manufacturing a non-single-crystal film according to claim 11, wherein said non-single-crystal film has the density of the defects in the film of a value from $10^{14}$ to $10^{15}$/cm$^3$.

* * * * *

UNITED STATES PATENT AND TRADEMARK OFFICE
CERTIFICATE OF CORRECTION

PATENT NO. : 5,582,880

DATED : December 10, 1996

INVENTORS : CHIORI MOCHIZUKI ET AL.

It is certified that error appears in the above-identified patent and that said Letters Patent is hereby corrected as shown below:

ON THE TITLE PAGE

[57] ABSTRACT

"preferably" should read --preferable--.

COLUMN 2

Line 8, "hydrogen" should read --hydrogen,--;
  Line 25, "generations" should read --generation--.

COLUMN 10

Line 34, "gas" should read --gas of--.

COLUMN 15

Line 38, "speed." should read --speed--.

COLUMN 17

Line 17, "be" should read --been--;
  Line 41, "SiH4" should read --$SiH_4$--.

UNITED STATES PATENT AND TRADEMARK OFFICE
CERTIFICATE OF CORRECTION

PATENT NO.  : 5,582,880

DATED       : December 10, 1996

INVENTORS   : CHIORI MOCHIZUKI ET AL.

It is certified that error appears in the above-identified patent and that said Letters Patent is hereby corrected as shown below:

COLUMN 19

Line 37, "main." should read --the main.--;
Line 38, "main." should read --the main.--.

COLUMN 21

Line 5,  "eve" should read --even--;
Line 60, "illustrates; the" should read --illustrates the--.

COLUMN 22

Line 35, "large" should read --larger--;
Line 37, "excessively" should read --excessive--.

COLUMN 23

Line 34, "Silane" should read --silane--;
Line 43, "employed" should read --employing--;
Line 44, "Furthermore" should read --Furthermore,--.

COLUMN 26

Line 38, "In also" should read --Also, in--;
Line 64, "can stably be" should read --can be stably--.

UNITED STATES PATENT AND TRADEMARK OFFICE
CERTIFICATE OF CORRECTION

PATENT NO. : 5,582,880

DATED : December 10, 1996

INVENTORS : CHIORI MOCHIZUKI ET AL.

Page 3 of 8

It is certified that error appears in the above-identified patent and that said Letters Patent is hereby corrected as shown below:

COLUMN 27

Line 8, "$(MH_z)+9°C.(0.1 \le k(HM_z) \le 2,$" should read --$(HM_z)+a°C(0.1 \le k(HM_z) \le 2,$--;

COLUMN 29

Line 20, "made" should read --make--.

COLUMN 30

Line 10, "SiH3" should read --$SiH_3$--;
Line 11, "SiH3" should read --$SiH_3$--;
Line 56, "ions (second occurrence) should be deleted.

COLUMN 31

Line 11, "uss" should read --uses--;
Line 61, "estimates" should read --estimate--.

UNITED STATES PATENT AND TRADEMARK OFFICE
CERTIFICATE OF CORRECTION

PATENT NO. : 5,582,880

DATED : December 10, 1996

INVENTORS : CHIORI MOCHIZUKI ET AL.

Page 4 of 8

It is certified that error appears in the above-identified patent and that said Letters Patent is hereby corrected as shown below:

<u>COLUMN 32</u>

Line 1,   "a" should read --as--;
  Line 36, "as" should read --as a--;
  Line 42, "time. Where" should read --time, where--.

<u>COLUMN 35</u>

Line 48, "H2 gas" should read --$H_2$ gas--;
  Line 52, "stabled." should read --stabilized.--.

<u>COLUMN 37</u>

Line 10, "10m/cm$^2$." should read --10m/cm$^2$--;
  Line 29, "excessively," should read --excessive,--.

<u>COLUMN 39</u>

Line 55, "stabled." should read --stabilized.--

<u>COLUMN 40</u>

Line 2,   "stabled." should read --stabilized.--;
  Line 15, "stabled." should read --stabilized.--;
  Line 37, "due" should read --due to--.

UNITED STATES PATENT AND TRADEMARK OFFICE
CERTIFICATE OF CORRECTION

PATENT NO. : 5,582,880

DATED : December 10, 1996

INVENTORS : CHIORI MOCHIZUKI ET AL.

It is certified that error appears in the above-identified patent and that said Letters Patent is hereby corrected as shown below:

COLUMN 41

```
Line 2, "stabled." should read --stabilized.--;
Line 14,"for" should be deleted;
Line 15,"stabled." should read --stabilized.--;
Line 28,"stabled." should read --stabilized.--.
```

COLUMN 43

```
Line 55,"It" should read --it--.
```

COLUMN 45

```
Line 66,"temperature: of" should read --temperature of--.
```

COLUMN 46

```
Line 5, "sifted" should read --shifted--;
Line 15,"NH3" should read --NH₃--;
Line 16,"N2" should read --N₂--.
```

UNITED STATES PATENT AND TRADEMARK OFFICE
CERTIFICATE OF CORRECTION

PATENT NO. : 5,582,880

DATED : December 10, 1996

INVENTORS : CHIORI MOCHIZUKI ET AL.

It is certified that error appears in the above-identified patent and that said Letters Patent is hereby corrected as shown below:

COLUMN 47

Line 10, "ne$_{in}$" should read --n$_e$ in--;
  Line 66, "preferable" should read --preferably,--.

COLUMN 48

Line 53, "were" should read --was--.

COLUMN 49

Line 29, "sccm" should read --seem.-- and close up right margin;
  Line 30, Close up left margin.

COLUMN 50

Line 46, "stabled" should read --stabilized--.

COLUMN 51

Line 23, "stabled" should read --stabilized--;
  Line 35, "H2 gas" should read --H$_2$ gas--;
  Line 38, "stabled" should read --stabilized--.

UNITED STATES PATENT AND TRADEMARK OFFICE
CERTIFICATE OF CORRECTION

PATENT NO. : 5,582,880

DATED : December 10, 1996

INVENTORS : CHIORI MOCHIZUKI ET AL.   Page 7 of 8

It is certified that error appears in the above-identified patent and that said Letters Patent is hereby corrected as shown below:

COLUMN 52

Line 65, "SiH4" should read --$SiH_4$--;
  Line 66, "H2 gas" should read --$H_2$ gas--.

COLUMN 53

Line 2, "stabled" should read --stabilized--;
  Line 28, "H2 gas" should read --$H_2$ gas--;
  Line 42, "satisfactory" should read --satisfactorily--.

COLUMN 54

Line 53, "Since the" should read --The--.

COLUMN 55

Line 17, "Since the" should read --The--;
  Line 52, "can" should read --can be--;
  Line 58, "can" should read --can be--.

COLUMN 56

Line 10, "particularly," should read --particularity,--;
  Line 26, "with" should read --with power--.

UNITED STATES PATENT AND TRADEMARK OFFICE
CERTIFICATE OF CORRECTION

PATENT NO. : 5,582,880

DATED : December 10, 1996

INVENTORS : CHIORI MOCHIZUKI ET AL.

It is certified that error appears in the above-identified patent and that said Letters Patent is hereby corrected as shown below:

<u>COLUMN 57</u>

Line 45, "non-single-crystal" should read --non-single-crystal film--.

<u>COLUMN 58</u>

Line 5, "claim 16," should read -- claim 14,--;
Line 47, "f(MH$_z$)/d(cm)<30(MH$_z$/cm" should read --f(MH$_z$)/d(cm)<30 MH$_z$/cm--.

Signed and Sealed this

Ninth Day of September, 1997

Attest:

BRUCE LEHMAN

*Attesting Officer*    *Commissioner of Patents and Trademarks*